US012445109B2

(12) United States Patent
Burak et al.

(10) Patent No.: US 12,445,109 B2
(45) Date of Patent: Oct. 14, 2025

(54) STRUCTURES, ACOUSTIC WAVE RESONATORS, LAYERS, DEVICES AND SYSTEMS

(71) Applicant: QXONIX INC., Irvine, CA (US)

(72) Inventors: Dariusz Burak, Fort Collins, CO (US); Kevin J. Grannen, Selma, TX (US); Jack Lenell, Fort Collins, CO (US)

(73) Assignee: QXONIX INC., Irvine, CA (US)

(*) Notice: Subject to any disclaimer, the term of this patent is extended or adjusted under 35 U.S.C. 154(b) by 349 days.

(21) Appl. No.: 18/094,386

(22) Filed: Jan. 8, 2023

(65) Prior Publication Data

US 2023/0231539 A1 Jul. 20, 2023

Related U.S. Application Data

(63) Continuation-in-part of application No. 17/564,824, filed on Dec. 29, 2021, and a continuation-in-part of (Continued)

(51) Int. Cl.
*H03H 9/56* (2006.01)
*H03H 9/13* (2006.01)
(Continued)

(52) U.S. Cl.
CPC ............ *H03H 9/568* (2013.01); *H03H 9/131* (2013.01); *H03H 9/173* (2013.01); *H03H 9/542* (2013.01); *H03H 9/547* (2013.01)

(58) Field of Classification Search
CPC .... H03H 9/173; H03H 9/175; H03H 9/02118; H03H 9/02015; H03H 9/132; H03H 3/02;
(Continued)

(56) References Cited

U.S. PATENT DOCUMENTS 5,929,555 A 7/1999 Sugimoto et al.
5,945,770 A 8/1999 Hanafy
(Continued)

FOREIGN PATENT DOCUMENTS

JP 2007036915 A1 8/2007
WO WO 2018/022757 2/2018
(Continued)

OTHER PUBLICATIONS

Chung C-J, Chen Y-C, Cheng C-C, Kao K-S. An improvement of tilted AlN for shear and longitudinal acoustic wave. Applied Physics A: Materials Science & Processing. 2009;94(2):307-313. doi: 10.1007/s00339-008-4793-7 (Year: 2009).*
(Continued)

*Primary Examiner* — Lincoln D Donovan
*Assistant Examiner* — Tyler J Pereny

(57) ABSTRACT

Techniques for improving structures, acoustic wave resonators, layers, and devices are disclosed, including filters, oscillators and systems that may include such devices. An acoustic wave device of this disclosure may comprise a substrate and a piezoelectric resonant volume. The piezoelectric resonant volume of the acoustic wave device may have a main resonant frequency. The acoustic wave device may comprise a first distributed Bragg acoustic reflector. The first distributed Bragg acoustic reflector may comprise a first active piezoelectric layer. The main resonant frequency of the Bulk Acoustic Wave (BAW) resonator may be in a super high frequency (SHF) band. The main resonant frequency of the Bulk Acoustic Wave (BAW) resonator may be in an extremely high frequency (EHF) band.

20 Claims, 35 Drawing Sheets

Related U.S. Application Data application No. 17/380,011, filed on Jul. 20, 2021, now Pat. No. 11,863,153, said application No. 17/564,824 is a continuation-in-part of application No. 17/380,011, filed on Jul. 20, 2021, now Pat. No. 11,863,153, and a continuation of application No. PCT/US2020/043762, filed on Jul. 27, 2020, said application No. 17/380,011 is a continuation of application No. 16/940,173, filed on Jul. 27, 2020, now abandoned, and a continuation of application No. 16/940,172, filed on Jul. 27, 2020, now Pat. No. 11,101,783.

(60) Provisional application No. 63/306,299, filed on Feb. 3, 2022, provisional application No. 63/302,068, filed on Jan. 22, 2022, provisional application No. 63/302,070, filed on Jan. 22, 2022, provisional application No. 63/302,067, filed on Jan. 22, 2022, provisional application No. 62/881,061, filed on Jul. 31, 2019, provisional application No. 62/881,074, filed on Jul. 31, 2019, provisional application No. 62/881,091, filed on Jul. 31, 2019, provisional application No. 62/881,085, filed on Jul. 31, 2019, provisional application No. 62/881,087, filed on Jul. 31, 2019, provisional application No. 62/881,077, filed on Jul. 31, 2019, provisional application No. 62/881,094, filed on Jul. 31, 2019.

(51) Int. Cl.
*H03H 9/17* (2006.01)
*H03H 9/54* (2006.01)

(58) Field of Classification Search
CPC ...... H03H 3/04; H03H 9/02102; H03H 9/131; H03H 2003/021; H03H 9/0211; H03H 9/02157; H03H 9/589; H03H 9/54; H03H 9/568; H03H 9/17; H03H 9/605; H03H 9/174; H03H 9/587; H03H 9/13; H03H 9/205; H03H 2003/0428; H03H 9/02078; H03H 9/0207; H03H 9/585; H03H 2009/02165; H03H 9/02086; H03H 9/02259; H03H 9/02031; H03H 9/171; G01N 2291/0255; G01N 2291/0426; G01N 29/022; G01N 2291/0256; G01N 29/036; G01N 29/222; G01N 2291/014; G01N 33/54373; G01N 33/5438; G01N 2291/012; G01N 2291/015; G01N 29/2437; G01N 2291/0423
See application file for complete search history.

(56) References Cited

U.S. PATENT DOCUMENTS

| | | | |
|---|---|---|---|
| 6,927,651 | B2 | 8/2005 | Larson, III et al. |
| 6,975,183 | B2 | 12/2005 | Aigner et al. |
| 7,385,334 | B1 | 6/2008 | Olsson et al. |
| 7,964,144 | B1 | 6/2011 | Nordin et al. |
| 8,346,482 | B2 | 1/2013 | Fernandez |
| 8,673,121 | B2 | 3/2014 | Larson, III et al. |
| 8,796,904 | B2 | 8/2014 | Burak et al. |
| 9,065,421 | B2 | 6/2015 | Feng et al. |
| 9,243,316 | B2 | 1/2016 | Larson, III et al. |
| 9,401,692 | B2 | 7/2016 | Burak et al. |
| 9,679,765 | B2 | 6/2017 | Larson, III et al. |
| 11,575,363 | B2 * | 2/2023 | Gimenez ................ H03H 9/174 |
| 11,901,873 | B2 * | 2/2024 | Yantchev ............. H03H 9/6406 |
| 2002/0093398 | A1 | 7/2002 | Ella et al. |
| 2002/0121945 | A1 | 9/2002 | Ruby et al. |
| 2004/0140869 | A1 | 7/2004 | Marksteiner et al. |
| 2004/0183400 | A1 | 9/2004 | Aigner et al. |
| 2004/0195937 | A1 | 10/2004 | Matsubara et al. |
| 2004/0233019 | A1 | 11/2004 | Inoue et al. |
| 2005/0012568 | A1 | 1/2005 | Aigner et al. |
| 2005/0070232 | A1 | 3/2005 | Mages |
| 2005/0148065 | A1 | 7/2005 | Zhang et al. |
| 2006/0094374 | A1 | 5/2006 | Olip |
| 2006/0119230 | A1 | 6/2006 | Umeda et al. |
| 2006/0197411 | A1 | 9/2006 | Hoen et al. |
| 2006/0287195 | A1 | 12/2006 | Jerome et al. |
| 2007/0120625 | A1 | 5/2007 | Larson et al. |
| 2007/0210349 | A1 | 9/2007 | Iimura et al. |
| 2007/0222336 | A1 | 9/2007 | Grannen et al. |
| 2007/0296513 | A1 | 12/2007 | Ruile et al. |
| 2009/0045704 | A1 | 2/2009 | Barber et al. |
| 2009/0096550 | A1 | 4/2009 | Handtmann et al. |
| 2009/0256740 | A1 | 10/2009 | Teshirogi et al. |
| 2010/0073106 | A1 | 3/2010 | Stuebing et al. |
| 2010/0167416 | A1 | 7/2010 | Kaliban et al. |
| 2010/0327701 | A1 | 12/2010 | Grannen et al. |
| 2011/0043081 | A1 | 2/2011 | Safari et al. |
| 2011/0121689 | A1 | 5/2011 | Grannen et al. |
| 2011/0121916 | A1 | 5/2011 | Barbet et al. |
| 2011/0309899 | A1 | 12/2011 | Leiba et al. |
| 2012/0051976 | A1 | 3/2012 | Lu et al. |
| 2012/0096697 | A1 | 4/2012 | Grannen et al. |
| 2012/0154074 | A1 | 6/2012 | Ruby et al. |
| 2012/0201174 | A1 | 8/2012 | Jian et al. |
| 2012/0218057 | A1 | 8/2012 | Burak et al. |
| 2012/0218058 | A1 | 8/2012 | Burak et al. |
| 2012/0218059 | A1 | 8/2012 | Burak et al. |
| 2012/0218060 | A1 | 8/2012 | Burak et al. |
| 2012/0248941 | A1 | 10/2012 | Saito et al. |
| 2012/0280767 | A1 | 11/2012 | Burak et al. |
| 2012/0293278 | A1 | 11/2012 | Burak et al. |
| 2012/0319530 | A1 | 12/2012 | Burak et al. |
| 2012/0319534 | A1 | 12/2012 | Shiwakawa et al. |
| 2013/0038408 | A1 | 2/2013 | Burak et al. |
| 2013/0063226 | A1 | 3/2013 | Burak et al. |
| 2013/0063227 | A1 | 3/2013 | Burak et al. |
| 2013/0092547 | A1 | 4/2013 | Li et al. |
| 2013/0106248 | A1 | 5/2013 | Burak et al. |
| 2013/0106534 | A1 | 5/2013 | Burak et al. |
| 2013/0193808 | A1 | 8/2013 | Feng et al. |
| 2013/0314177 | A1 | 11/2013 | Burak et al. |
| 2014/0111288 | A1 | 4/2014 | Nikkel et al. |
| 2014/0118087 | A1 | 5/2014 | Burak et al. |
| 2014/0118088 | A1 | 5/2014 | Burak et al. |
| 2014/0118089 | A1 | 5/2014 | Bradley et al. |
| 2014/0118090 | A1 | 5/2014 | Grannen et al. |
| 2014/0118091 | A1 | 5/2014 | Burak et al. |
| 2014/0118092 | A1 | 5/2014 | Burak et al. |
| 2014/0125202 | A1 | 5/2014 | Choy et al. |
| 2014/0125203 | A1 | 5/2014 | Choy et al. |
| 2014/0132117 | A1 | 5/2014 | Ella et al. |
| 2014/0137815 | A1 | 5/2014 | Bi et al. |
| 2014/0152152 | A1 | 6/2014 | Burak et al. |
| 2014/0154697 | A1 | 6/2014 | Johal et al. |
| 2014/0159548 | A1 | 6/2014 | Burak et al. |
| 2014/0174908 | A1 | 6/2014 | Feng et al. |
| 2014/0175950 | A1 | 6/2014 | Zou et al. |
| 2014/0176261 | A1 | 6/2014 | Burak et al. |
| 2014/0193830 | A1 | 7/2014 | Schimidt et al. |
| 2014/0225682 | A1 | 8/2014 | Burak et al. |
| 2014/0225683 | A1 | 8/2014 | Burak et al. |
| 2014/0232486 | A1 | 8/2014 | Burak |
| 2014/0246305 | A1 | 9/2014 | Larson, III |
| 2014/0340172 | A1 | 11/2014 | Bradley et al. |
| 2014/0354109 | A1 | 12/2014 | Grannen et al. |
| 2014/0354115 | A1 | 12/2014 | Burak et al. |
| 2015/0133339 | A1 | 5/2015 | Prindle |
| 2015/0240349 | A1 | 8/2015 | Grannen |
| 2015/0244346 | A1 | 8/2015 | Feng et al. |
| 2015/0244347 | A1 | 8/2015 | Lv et al. |
| 2015/0270826 | A1 | 9/2015 | Burak |
| 2015/0280100 | A1 | 10/2015 | Burak et al. |
| 2015/0280687 | A1 | 10/2015 | Burak et al. |
| 2015/0308996 | A1 | 10/2015 | Kim et al. |
| 2015/0311046 | A1 | 10/2015 | Yeh et al. |

(56) References Cited

U.S. PATENT DOCUMENTS

| | | | |
|---|---|---|---|
| 2015/0318461 | A1 | 11/2015 | Jacobsen et al. |
| 2015/0318837 | A1 | 11/2015 | Zou et al. |
| 2015/0326200 | A1 | 11/2015 | Grannen et al. |
| 2015/0341015 | A1 | 11/2015 | Grannen et al. |
| 2015/0349743 | A1 | 12/2015 | Burak et al. |
| 2015/0349747 | A1 | 12/2015 | Burak et al. |
| 2015/0377834 | A1 | 12/2015 | Salvati et al. |
| 2016/0007893 | A1 | 1/2016 | Roberts |
| 2016/0079958 | A1 | 3/2016 | Burak |
| 2016/0087186 | A1 | 3/2016 | Burak |
| 2016/0087187 | A1 | 3/2016 | Burak |
| 2016/0118957 | A1 | 4/2016 | Burak et al. |
| 2016/0118958 | A1 | 4/2016 | Burak |
| 2016/0126930 | A1 | 5/2016 | Giovannini |
| 2016/0182011 | A1 | 6/2016 | Burak et al. |
| 2016/0301437 | A1 | 10/2016 | Pehlke |
| 2016/0308509 | A1 | 10/2016 | Burak et al. |
| 2016/0349088 | A1 | 12/2016 | Patel |
| 2017/0047907 | A1 | 2/2017 | Burak et al. |
| 2017/0063339 | A1 | 3/2017 | Burak et al. |
| 2017/0117871 | A1 | 4/2017 | Rivas et al. |
| 2017/0120242 | A1 | 5/2017 | Rivas |
| 2017/0122911 | A1 | 5/2017 | McCarran et al. |
| 2017/0122936 | A1 | 5/2017 | Rivas et al. |
| 2017/0134001 | A1 | 5/2017 | Belsick et al. |
| 2017/0134002 | A1 | 5/2017 | Rivas et al. |
| 2017/0168017 | A1 | 6/2017 | Rivas et al. |
| 2017/0168018 | A1 | 6/2017 | Morton et al. |
| 2017/0214387 | A1 | 7/2017 | Burak et al. |
| 2017/0227497 | A1 | 8/2017 | Rivas et al. |
| 2017/0261503 | A1 | 9/2017 | Murdock et al. |
| 2017/0276670 | A1 | 9/2017 | Salvati et al. |
| 2017/0288121 | A1 | 10/2017 | Burak et al. |
| 2017/0288628 | A1 | 10/2017 | Grannen et al. |
| 2017/0292950 | A1 | 10/2017 | Grinsven |
| 2017/0310304 | A1 | 10/2017 | Burak et al. |
| 2017/0347925 | A1 | 12/2017 | Wang et al. |
| 2018/0034438 | A1 | 2/2018 | Ryder et al. |
| 2018/0085787 | A1 | 3/2018 | Burak et al. |
| 2018/0097499 | A1 | 4/2018 | Rinaldi et al. |
| 2018/0138893 | A1 | 5/2018 | Caron |
| 2018/0204996 | A1 | 7/2018 | Zou et al. |
| 2018/0278236 | A1* | 9/2018 | Hurwitz .................. H01L 24/06 |
| 2018/0309425 | A1 | 10/2018 | Shealy et al. |
| 2019/0081192 | A1 | 3/2019 | Horng et al. |
| 2019/0103853 | A1 | 4/2019 | Burak et al. |
| 2019/0152995 | A1 | 5/2019 | Gunasekaran et al. |
| 2019/0187105 | A1 | 6/2019 | Ram et al. |
| 2019/0234907 | A1 | 8/2019 | Edwards et al. |
| 2019/0250198 | A1 | 8/2019 | Kenumba et al. |
| 2019/0256806 | A1 | 8/2019 | Nietfeld |
| 2020/0124625 | A1 | 4/2020 | Dunlop et al. |

FOREIGN PATENT DOCUMENTS

| | | |
|---|---|---|
| WO | 2018111532 A1 | 6/2018 |
| WO | WO 2021/021719 | 2/2021 |
| WO | WO 2021/021723 | 2/2021 |
| WO | WO 2021/021730 | 2/2021 |
| WO | WO 2021/021732 | 2/2021 |
| WO | WO 2021/021736 | 2/2021 |
| WO | WO 2021/021739 | 2/2021 |
| WO | WO 2021/021743 | 2/2021 |
| WO | WO 2021/021745 | 2/2021 |
| WO | WO 2021/021747 | 2/2021 |
| WO | WO 2021/021748 | 2/2021 |

OTHER PUBLICATIONS

International Search Report and Written Opinion for PCT/US2020/043716 mailed Oct. 20, 2020.

International Search Report and Written Opinion for PCT/US2020/043720 mailed Oct. 20, 2020.

International Search Report and Written Opinion for PCT/US2020/043740 mailed Oct. 28, 2020.

International Search Report and Written Opinion for PCT/US2020/043746 mailed Oct. 28, 2020.

International Search Report and Written Opinion for PCT/US2020/043752 mailed Oct. 27, 2020.

International Search Report and Written Opinion for PCT/US2020/043762 mailed Oct. 21, 2020.

International Search Report and Written Opinion for PCT/US2020/043760 mailed Dec. 17, 2020.

International Search Report and Written Opinion for PCT/US2020/043733 mailed Dec. 17, 2020.

International Search Report and Written Opinion for PCT/US2020/043755 mailed Dec. 18, 2020.

International Search Report and Written Opinion for PCT/US2020/043730 mailed Feb. 1, 2021.

* cited by examiner

9100

STRUCTURES, ACOUSTIC WAVE RESONATORS, LAYERS, DEVICES AND SYSTEMS

PRIORITY CLAIM

This application claims the benefit of priority to the following provisional patent applications:

(1) U.S. Provisional Patent Application Ser. No. 63/302,067 entitled "LAYERS, STRUCTURES, ACOUSTIC WAVE RESONATORS, DEVICES AND SYSTEMS" and filed on Jan. 22, 2022;

(2) U.S. Provisional Patent Application Ser. No. 63/302,068 entitled "BULK ACOUSTIC WAVE (BAW) RESONATOR, PATTERNED LAYER STRUCTURES, DEVICES AND SYSTEMS" and filed on Jan. 22, 2022;

(3) U.S. Provisional Patent Application Ser. No. 63/302,070 entitled "STRUCTURES, ACOUSTIC WAVE RESONATORS, LAYERS, DEVICES AND SYSTEMS" and filed on Jan. 22, 2022; and (4) U.S. Provisional Patent Application Ser. No. 63/306,299 entitled "LAYERS, STRUCTURES, ACOUSTIC WAVE RESONATORS, DEVICES, CIRCUITS AND SYSTEMS" and filed on Feb. 3, 2022.

Each of the provisional patent applications identified above is incorporated herein by reference in its entirety.

This application is also a continuation in part of U.S. patent application Ser. No. 17/380,011 filed Jul. 20, 2021, entitled "STRUCTURES, ACOUSTIC WAVE RESONATORS, DEVICES AND SYSTEMS TO SENSE A TARGET VARIABLE", which in turn is a continuation of U.S. patent application Ser. No. 16/940,172 filed Jul. 27, 2020 (issued as U.S. Pat. No. 11,101,783), entitled "STRUCTURES, ACOUSTIC WAVE RESONATORS, DEVICES AND SYSTEMS TO SENSE A TARGET VARIABLE, INCLUDING AS A NON-LIMITING EXAMPLE CORONAVIRUSES", which in turn claims priority to the U.S. Provisional Patent Applications:

(1) U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

(2) U.S. Provisional Patent Application Ser. No. 62/881,074, entitled "ACOUSTIC DEVICE STRUCTURES, DEVICES AND SYSTEMS" and filed on Jul. 31, 2019;

(3) U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

(4) U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

(5) U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

(6) U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and (7) U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

This application is also continuation in part of U.S. patent application Ser. No. 17/564,824 titled "STRUCTURES, ACOUSTIC WAVE RESONATORS, DEVICES AND SYSTEMS", filed Dec. 29, 2021, which in turn is a continuation of PCT Application No. PCTUS2020043762 filed Jul. 27, 2020, titled "STRUCTURES, ACOUSTIC WAVE RESONATORS, DEVICES AND SYSTEMS", which claims priority to the following provisional patent applications:

(1) U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

(2) U.S. Provisional Patent Application Ser. No. 62/881,074, entitled "ACOUSTIC DEVICE STRUCTURES, DEVICES AND SYSTEMS" and filed on Jul. 31, 2019;

(3) U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

(4) U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

(5) U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

(6) U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and (7) U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

U.S. patent application Ser. No. 17/564,824 is also a continuation in part of U.S. patent application Ser. No. 17/380,011 filed Jul. 20, 2021, entitled "STRUCTURES, ACOUSTIC WAVE RESONATORS, DEVICES AND SYSTEMS TO SENSE A TARGET VARIABLE", which in turn is a continuation of U.S. patent application Ser. No. 16/940,172 filed Jul. 27, 2020 (issued as U.S. Pat. No. 11,101,783), entitled "STRUCTURES, ACOUSTIC WAVE RESONATORS, DEVICES AND SYSTEMS TO SENSE A TARGET VARIABLE, INCLUDING AS A NON-LIMITING EXAMPLE CORONAVIRUSES", which in turn claims priority to the U.S. Provisional Patent Applications:

(1) U.S. Provisional Patent Application Ser. No. 62/881,061, entitled "BULK ACOUSTIC WAVE (BAW) RESONATOR STRUCTURES, DEVICES AND SYSTEMS" and filed on Jul. 31, 2019;

(2) U.S. Provisional Patent Application Ser. No. 62/881,074, entitled "ACOUSTIC DEVICE STRUCTURES, DEVICES AND SYSTEMS" and filed on Jul. 31, 2019;

(3) U.S. Provisional Patent Application Ser. No. 62/881,077, entitled "DOPED BULK ACOUSTIC WAVE (BAW) RESONATOR STRUCTURES, DEVICES AND SYSTEMS" and filed on Jul. 31, 2019;

(4) U.S. Provisional Patent Application Ser. No. 62/881,085, entitled "BULK ACOUSTIC WAVE (BAW) RESONATOR WITH PATTERNED LAYER STRUCTURES, DEVICES AND SYSTEMS" and filed on Jul. 31, 2019;

(5) U.S. Provisional Patent Application Ser. No. 62/881,087, entitled "BULK ACOUSTIC WAVE (BAW) REFLECTOR AND RESONATOR STRUCTURES, DEVICES AND SYSTEMS" and filed on Jul. 31, 2019;

(6) U.S. Provisional Patent Application Ser. No. 62/881,091, entitled "MASS LOADED BULK ACOUSTIC WAVE (BAW) RESONATOR STRUCTURES, DEVICES AND SYSTEMS" and filed on Jul. 31, 2019; and (7) U.S. Provisional Patent Application Ser. No. 62/881,094, entitled "TEMPERATURE COMPENSATING BULK ACOUSTIC WAVE (BAW) RESONATOR STRUCTURES, DEVICES AND SYSTEMS" and filed on Jul. 31, 2019.

Each of the applications identified above are hereby incorporated by reference in their entirety.

TECHNICAL FIELD

The present disclosure relates to acoustic resonators and to devices and to systems comprising acoustic resonators.

BACKGROUND

Bulk Acoustic Wave (BAW) resonators have enjoyed commercial success in filter applications. For example, 4G cellular phones that operate on fourth generation broadband cellular networks typically include a large number of BAW filters for various different frequency bands of the 4G network. In addition to BAW resonators and filters, also included in 4G phones are filters using Surface Acoustic Wave (SAW) resonators, typically for lower frequency band filters. SAW based resonators and filters are generally easier to fabricate than BAW based filters and resonators. However, performance of SAW based resonators and filters may decline if attempts are made to use them for higher 4G frequency bands. Accordingly, even though BAW based filters and resonators are relatively more difficult to fabricate than SAW based filters and resonators, they may be included in 4G cellular phones to provide better performance in higher 4G frequency bands what is provided by SAW based filters and resonators.

5G cellular phones may operate on newer, fifth generation broadband cellular networks. 5G frequencies include some frequencies that are much higher frequency than 4G frequencies. Such relatively higher 5G frequencies may transport data at relatively faster speeds than what may be provided over relatively lower 4G frequencies. However, previously known SAW and BAW based resonators and filters have encountered performance problems when attempts were made to use them at relatively higher 5G frequencies. Many learned engineering scholars have studied these problems, but have not found solutions. For example, performance problems cited for previously known SAW and BAW based resonators and filters include scaling issues and significant increases in acoustic losses at high frequencies.

From the above, it is seen that techniques for improving Bulk Acoustic Wave (BAW) resonator structures are highly desirable, for example for operation over frequencies higher than 4G frequencies, in particular for filters, oscillators and systems that may include such devices.

BRIEF DESCRIPTION OF THE DRAWINGS

FIG. 1AB show a simplified diagram of another bulk acoustic wave resonator structure of the present disclosure.

FIG. 1AC shows six simplified diagrams of multilayer metal acoustic reflector electrodes comprising current spreading layers (CSLs) for use in the bulk acoustic wave resonator structures of this disclosure, and a corresponding chart showing sheet resistance versus number of additional quarter wavelength current spreading layers, with results as expected from simulation.

FIG. 1AD shows three simplified diagrams of multilayer metal acoustic reflector electrodes comprising current spreading layers (CSLs) for use in the bulk acoustic wave resonator structures of this disclosure, and two corresponding charts showing acoustic reflectivity versus acoustic frequency, with results as expected from simulation.

FIG. 1A is a diagram that illustrates an example bulk acoustic wave resonator structure.

DETAILED DESCRIPTION

Figure 1A:
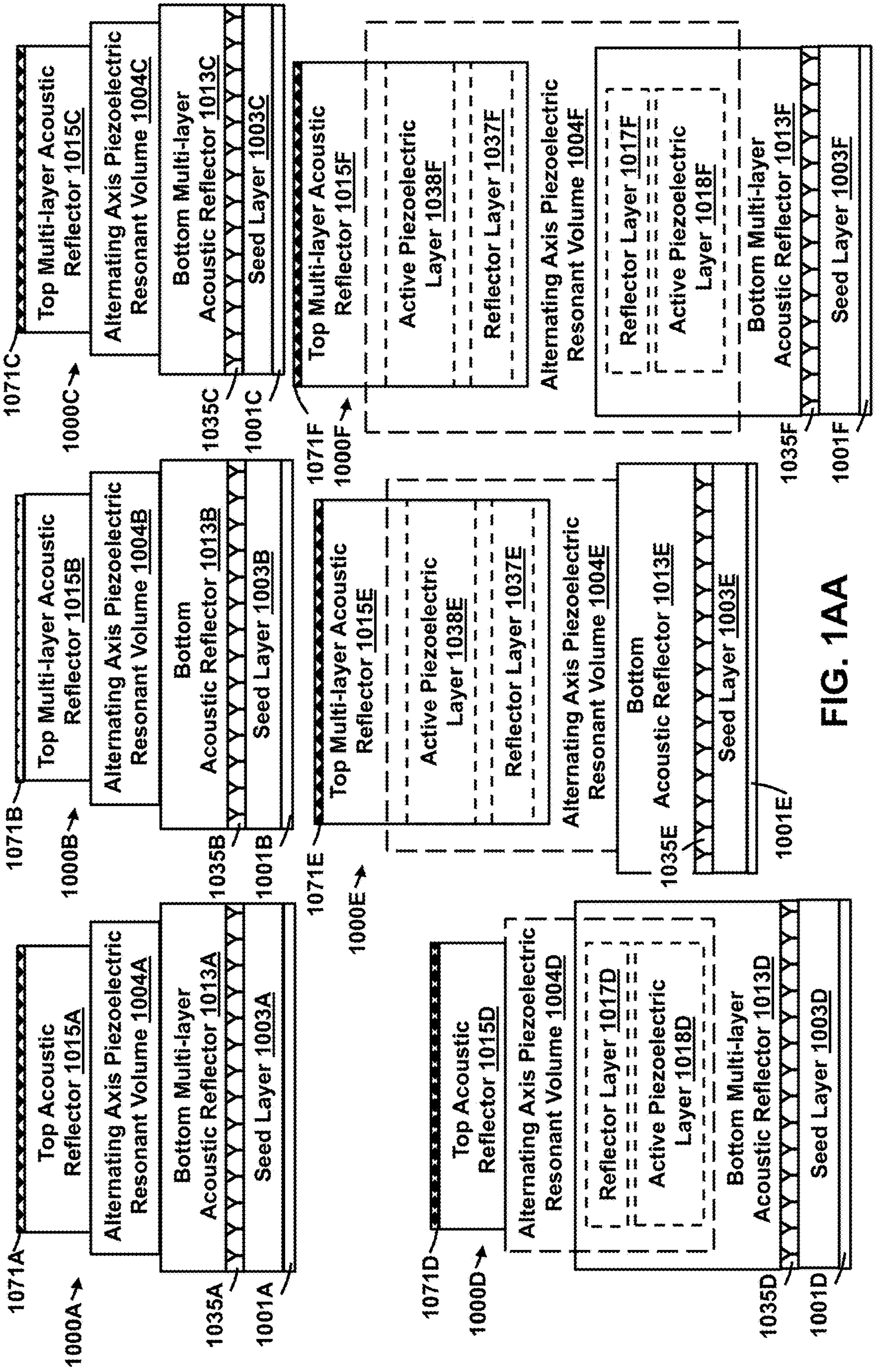
FIG. 1AA shows simplified diagrams of six bulk acoustic wave resonator structures of the present disclosure.
Figure 1A:
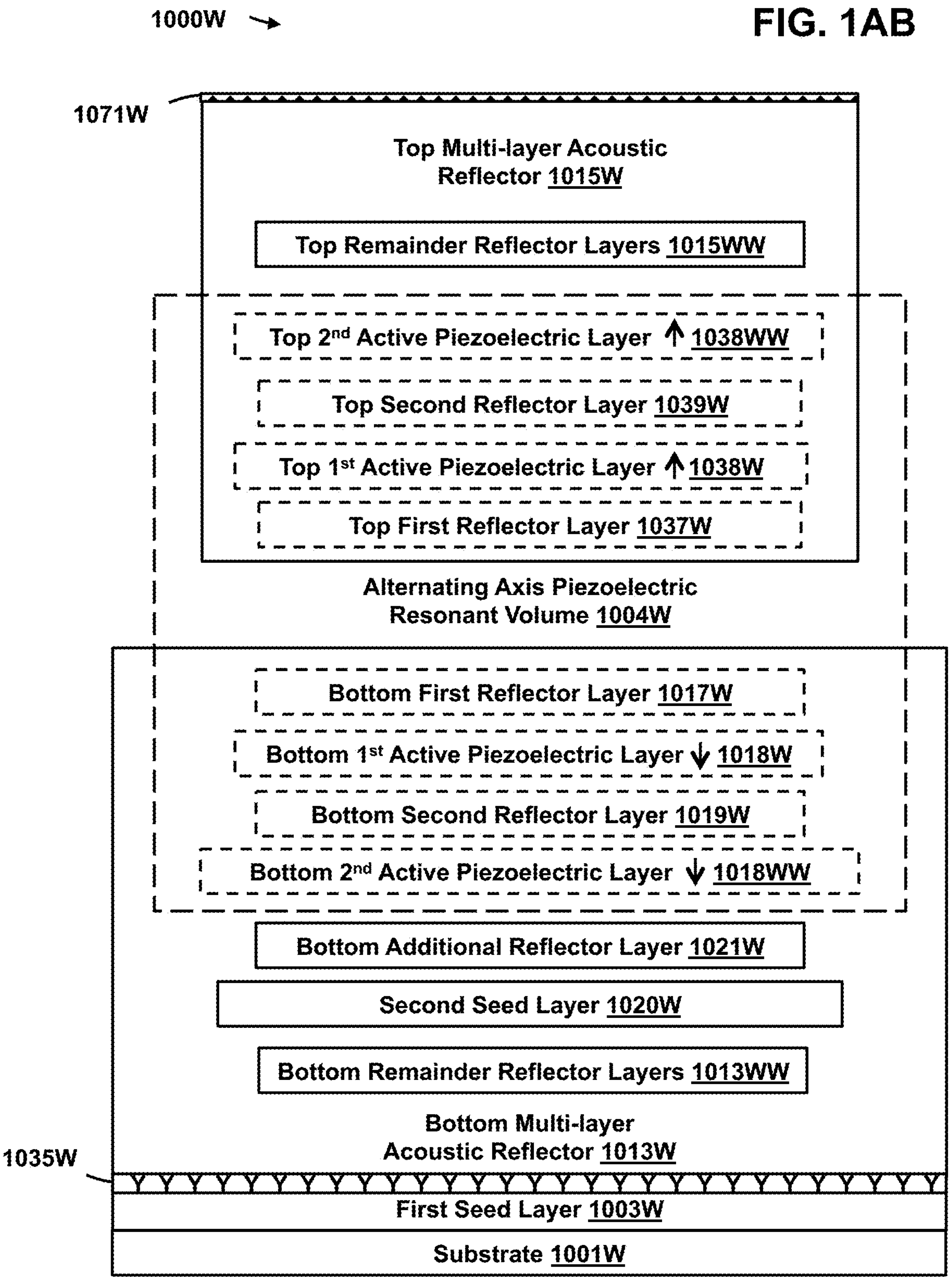
Figure 1A:
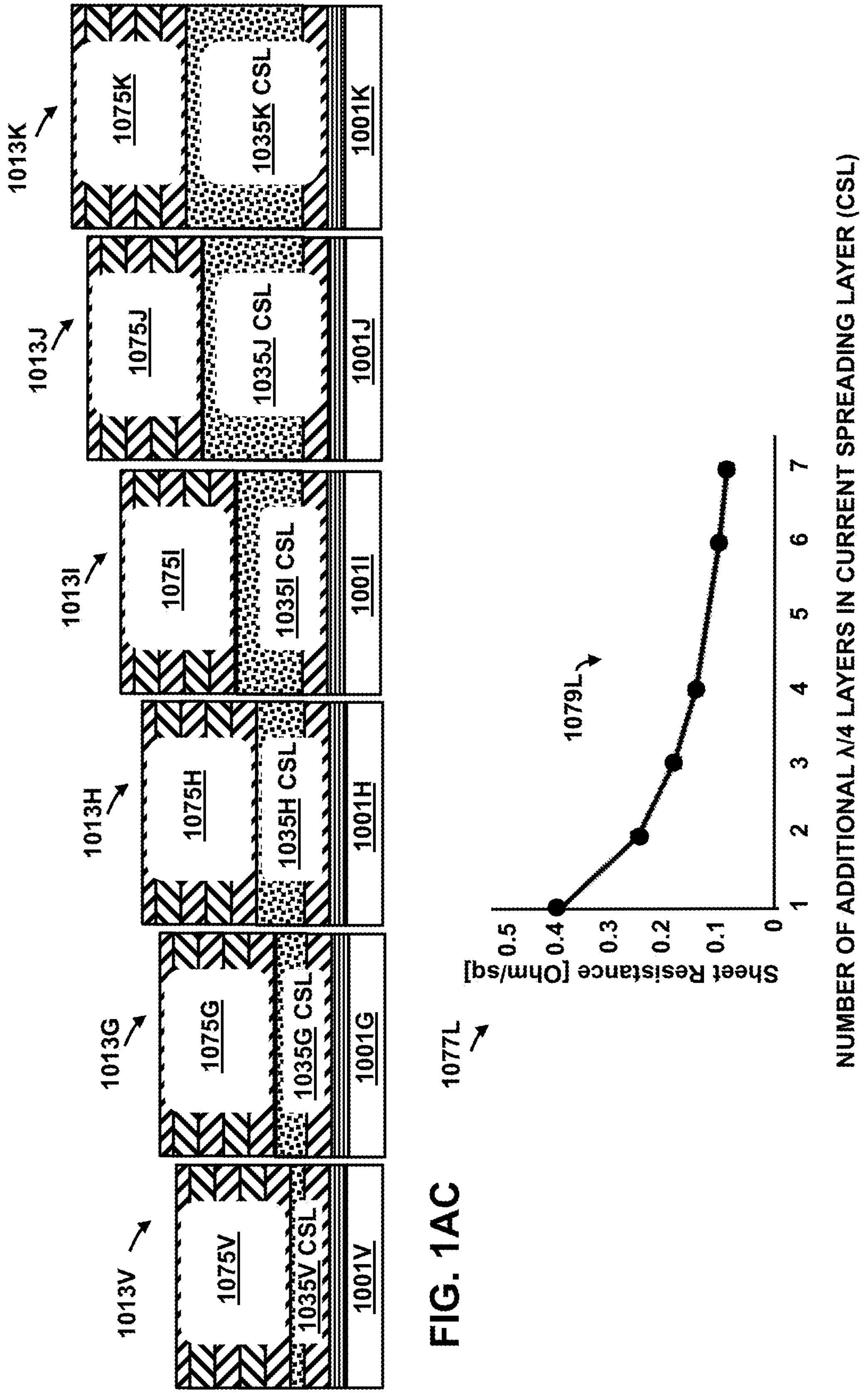
Figure 1A:
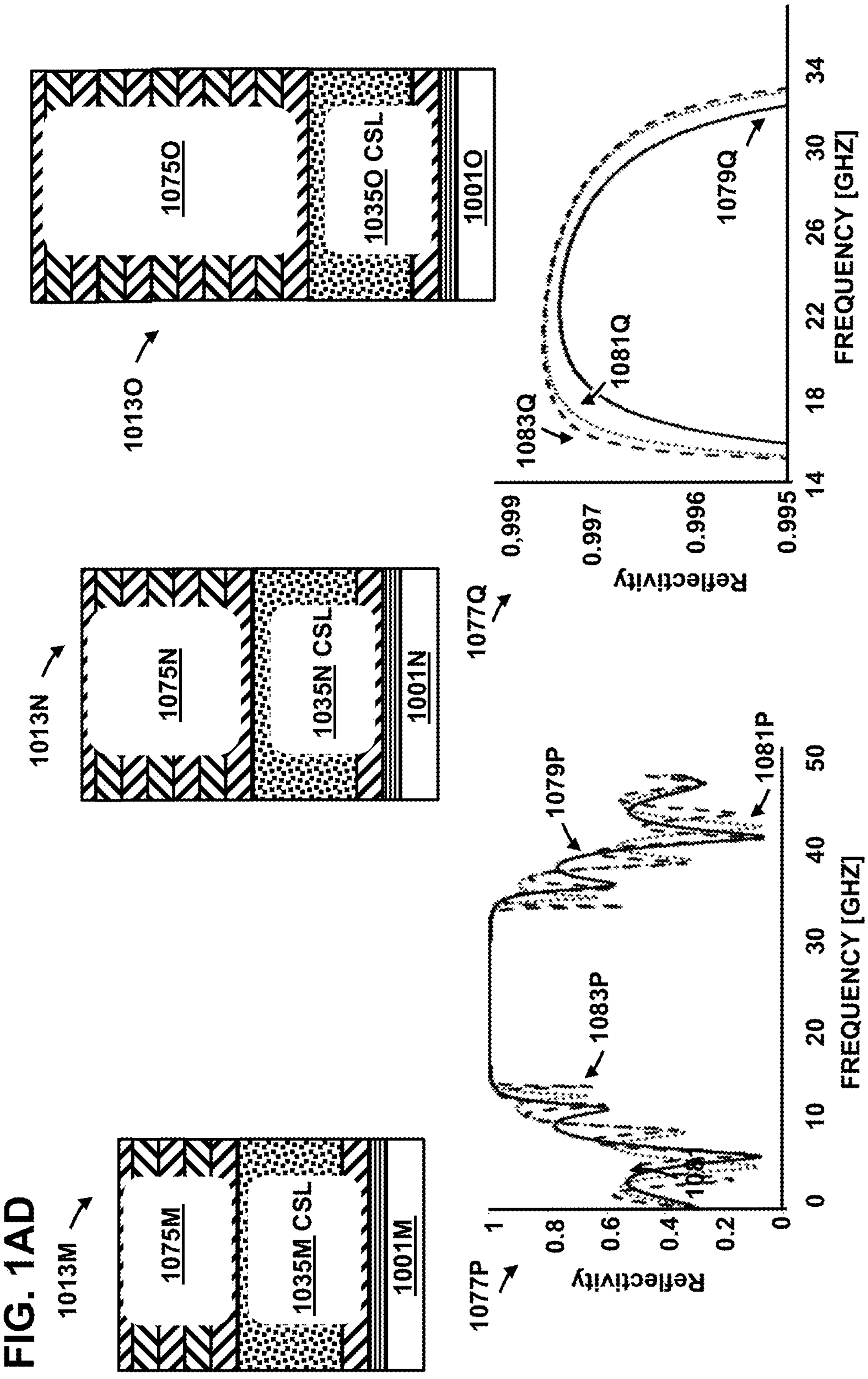
Figure 1A:
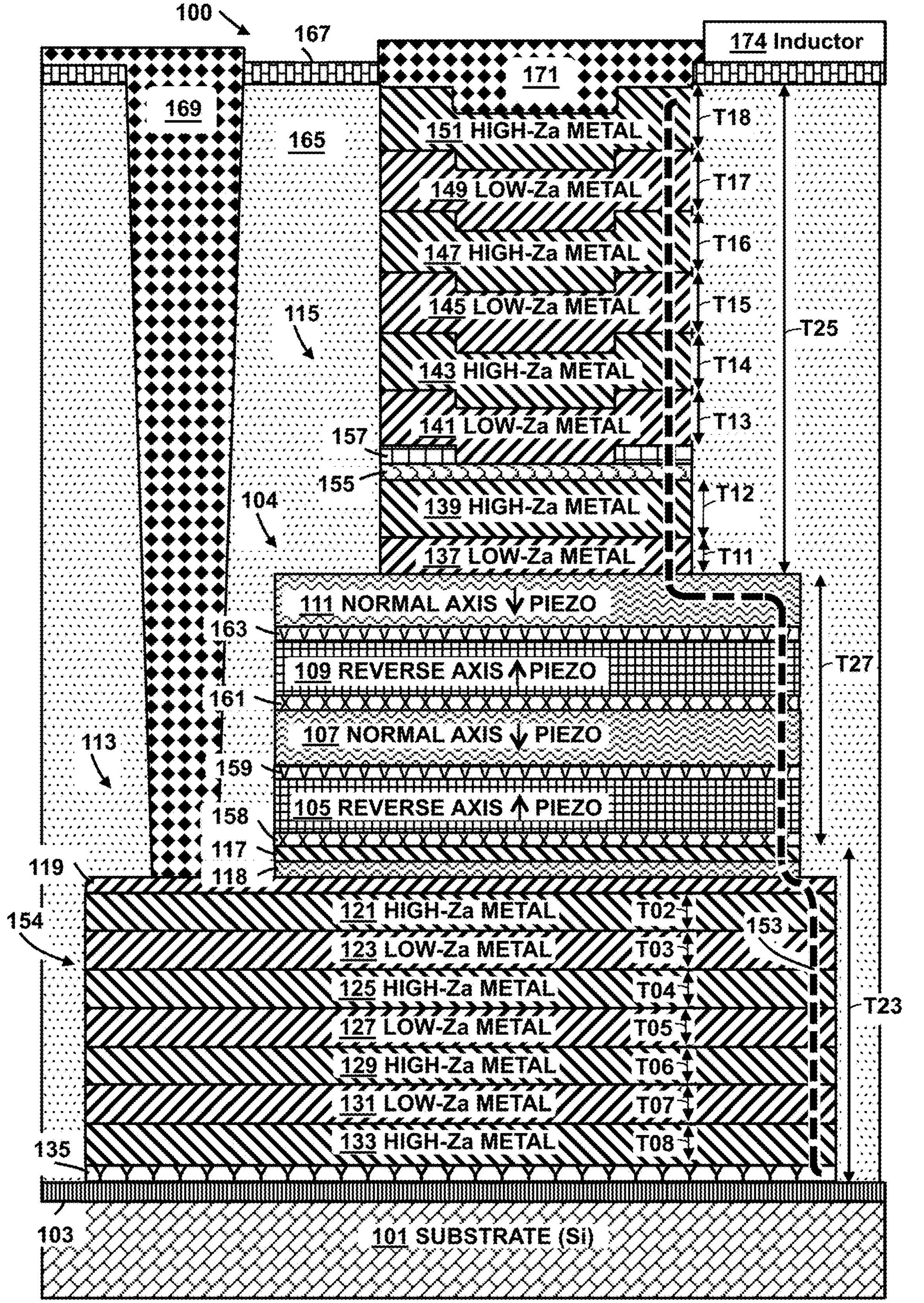

Non-limiting embodiments will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment shown where illustration is not necessary to allow understanding by those of ordinary skill in the art. In the specification, as well as in the claims, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element. The term "compensating" is to be understood as including "substantially compensating". The terms "oppose", "opposes" and "opposing" are to be understood as including "substantially oppose", "substantially opposes" and "substantially opposing" respectively. Further, as used in the specification and appended claims, and in addition to their ordinary meanings, the terms "substantial" or "substantially" mean to within acceptable limits or degree. For example, "substantially canceled" means that one skilled in the art would consider the cancellation to be acceptable. As used in the specification and the appended claims and in addition to its ordinary meaning, the term "approximately" or "about" means to within an acceptable limit or amount to one of ordinary skill in the art. For example, "approximately the same" means that one of ordinary skill in the art would consider the items being compared to be the same. As used in the specification and appended claims, the terms "a", "an" and "the" include both singular and plural referents, unless the context clearly dictates otherwise. Thus, for example, "a device" includes one device and plural devices. As used herein, the International Telecommunication Union (ITU) defines Super High Frequency (SHF) as extending between three Gigahertz (3 GHz) and thirty Gigahertz (30 GHz). The ITU defines Extremely High Frequency (EHF) as extending between thirty Gigahertz (30 GHz) and three hundred Gigahertz (300 GHz).

FIG. 1AA shows simplified diagrams of six bulk acoustic wave resonator structures 1000A, 1000B, 1000C, 1000D, 1000E, 1000F of the present disclosure. FIG. 1AB shows a simplified diagram of another bulk acoustic wave resonator structure 1000W of the present disclosure. Bulk acoustic wave resonator structures 1000A, 1000B, 1000C, 1000D, 1000E, 1000F, 1000W may comprise respective piezoelectric resonant volumes 1004A, 1004B, 1004C 1004D, 1004E, 1004F, 1004W having respective main resonant frequencies, for example, arranged over respective substrates 1001A, 1001B, 1001C, 1001D, 1001E, 1001F, 1001W (e.g., respective substrates 1001A, 1001B, 1001C, 1001D, 1001E, 1001F, 1001W. Respective piezoelectric resonant volumes 1004A, 1004B, 1004C 1004D, 1004E, 1004F, 1004W may have a plurality of piezoelectric layers, e.g., in which the plurality of piezoelectric layers may have respective piezoelectric axes, e.g., in which piezoelectric resonant volumes may comprise respective alternating piezoelectric axes arrangements. For example, respective piezoelectric resonant volumes 1004A, 1004B, 1004C 1004D, 1004E, 1004F. 1004W may comprise respective alternating axis piezoelectric resonant volumes 1004A, 1004B, 1004C 1004D, 1004E, 1004F, 1004W.

For example, respective alternating axis piezoelectric resonant volumes 1004A, 1004B, 1004C 1004D, 1004E, 1004F, 1004W may comprise respective alternating axis piezoelectric resonant volumes of, for example, respective four layers (e.g., respective four central layers) of piezoelectric material, for example, respective four layers (e.g., respective four central layers) comprising Aluminum Nitride (AlN) having a wurtzite structure. For example, respective alternating axis piezoelectric resonant volumes 1004A, 1004B, 1004C 1004D, 1004E, 1004F, 1004W may comprise respective first piezoelectric layers (e.g., respective bottom piezoelectric layers), respective second piezoelectric layers (e.g., respective first middle piezoelectric layers), respective third piezoelectric layers (e.g., respective second middle piezoelectric layers), and respective fourth piezoelectric layers (e.g., respective top piezoelectric layers). Within a given bulk acoustic wave resonator, piezoelectric layers, e.g., four piezoelectric layers, may be acoustically coupled with one another, for example, in a piezoelectrically excitable resonant mode (e.g., main resonant mode).

The example respective four piezoelectric layers of the respective piezoelectric resonant volumes volumes 1004A, 1004B, 1004C 1004D, 1004E, 1004F, 1004W may have respective alternating axis arrangements. For example, respective first piezoelectric layers (e.g., respective bottom piezoelectric layer) may have a respective first piezoelectric axis orientation (e.g., a respective reverse piezoelectric axis orientation), as discussed in greater detail subsequently herein. For example, next in the respective alternating axis arrangement of the respective piezoelectric resonant volume, may be respective second piezoelectric layers (e.g., respective first middle piezoelectric layers), which may have respective second piezoelectric axis orientation (e.g., respective normal piezoelectric axis orientation). For example, next in the alternating axis arrangement of the piezoelectric resonant volumes may be third piezoelectric layer (e.g., respective second middle piezoelectric layer), which may have respective third piezoelectric axis orientation (e.g., respective reverse piezoelectric axis orientation). Next in the respective alternating axis arrangement of the piezoelectric resonant volume may be respective fourth piezoelectric layer (e.g., respective top piezoelectric layer) may have respective fourth piezoelectric axis orientation (e.g., respective reverse piezoelectric axis orientation).

In the respective axis arrangements of the respective piezoelectric resonant volumes volumes 1004A, 1004B, 1004C 1004D, 1004E, 1004F, 1004W, respective piezoelectric axes of adjacent piezoelectric layers may substantially oppose one another (e.g., may be antiparallel, e.g., may be substantially antiparallel).

For example, first piezoelectric axis orientation (e.g., reverse piezoelectric axis orientation) of the first piezoelectric layer (e.g., bottom piezoelectric layer) may substantially oppose the second piezoelectric axis orientation (e.g., normal piezoelectric axis orientation) of the second piezoelectric layer (e.g., first middle piezoelectric layer). For example, first piezoelectric axis orientation (e.g., reverse piezoelectric axis orientation) of the first piezoelectric layer (e.g., bottom piezoelectric layer) may substantially oppose the fourth piezoelectric axis orientation (e.g., normal piezoelectric axis orientation) of the fourth piezoelectric layer (e.g., top piezoelectric layer). For example, the second piezoelectric axis orientation (e.g., normal piezoelectric axis orientation) of the second piezoelectric layer (e.g., first middle piezoelectric layer) may substantially oppose the third piezoelectric axis orientation (e.g., a reverse piezoelectric axis orientation) of the third piezoelectric layer (e.g., second middle piezoelectric layer). For example, the third piezoelectric axis orientation (e.g., a reverse piezoelectric axis orientation) of the third piezoelectric layer (e.g., second middle piezoelectric layer may substantially oppose the fourth piezoelectric axis orientation (e.g., normal piezoelectric axis orientation) of the fourth piezoelectric layer (e.g., top piezoelectric layer).

The respective piezoelectric layers of the example piezoelectric resonant volumes volumes 1004A, 1004B, 1004C 1004D, 1004E, 1004F, 1004W may have respective layer thicknesses, e.g., the first piezoelectric layer (e.g., bottom piezoelectric layer) may have a first piezoelectric layer thickness (e.g., bottom piezoelectric layer thickness), e.g., second piezoelectric layer (e.g., first middle piezoelectric layer) may have a second layer thickness (e.g., first middle piezoelectric layer thickness), e.g., third piezoelectric layer (e.g., second middle piezoelectric layer) may have a third layer thickness (e.g., second middle piezoelectric layer thickness), e.g., fourth piezoelectric layer (e.g., top piezoelectric layer) may have a fourth layer thickness (e.g., top piezoelectric layer thickness). The piezoelectric resonant volume volumes 1004A, 1004B, 1004C 1004D, 1004E, 1004F, 1004W may have the main resonant frequency. Respective first, second, third and fourth layer thicknesses (e.g., respective bottom piezoelectric layer thickness, first middle piezoelectric layer thickness, second middle piezoelectric layer thickness and top piezoelectric layer thickness) may be about a half acoustic wavelength of the respective main resonant frequencies of the piezoelectric resonant volumes 1004A, 1004B, 1004C 1004D, 1004E, 1004F, 1004W. More generally, respective first, second, third and fourth layer thicknesses (e.g., respective bottom piezoelectric layer thickness, first middle piezoelectric layer thickness, second middle piezoelectric layer thickness and top piezoelectric layer thickness) may be about an integral multiple of the half acoustic wavelength of the respective main resonant frequencies of the piezoelectric resonant volumes 1004A, 1004B, 1004C 1004D, 1004E, 1004F, 1004W.

For the bulk acoustic wave resonator structures 1000A, 1000B, 1000C, 1000D, 1000E, 1000F, 1000W (e.g., for the piezoelectric resonant volumes 1004A, 1004B, 1004C 1004D, 1004E, 1004F, 1004W) respective first, second, third and fourth piezoelectric layer thicknesses (e.g., respective bottom piezoelectric layer thickness, first middle piezoelectric layer thickness, second middle piezoelectric layer thickness and top piezoelectric layer thickness) may facilitate the main resonant frequency (e.g., the main resonant frequency of the resonant piezoelectric volume, e.g., the main resonant frequency of the alternating axis active piezoelectric volume, e.g., the main resonant frequency of the bulk acoustic wave resonator). An example twenty-four GigaHertz (24 GHz) design comprising four half acoustic wavelength piezoelectric layers is discussed in greater detail subsequently herein. However, bulk acoustic wave resonators of this disclosure are not limited to the example twenty-four GigaHertz (24 GHz) design. In the examples of this disclosure, piezoelectric layer thickness may be scaled up or down to facilitate (e.g., determine) main resonant frequency.

For example, for the bulk acoustic wave resonators having the alternating axis stack of four half acoustic wavelength thick piezoelectric layers, simulation of the 24 GHz design predicts an average passband quality factor of approximately 1600. Scaling this 24 GHz design to a 37 GHz design of four half acoustic wavelength thick piezoelectric layers, may have an average passband quality factor of approximately 1200 as predicted by simulation. Scaling this 24 GHz design to a 77 GHz of four half acoustic wavelength piezoelectric layers, may have an average passband quality factor of approximately 700 as predicted by simulation.

For example, bulk acoustic wave resonator 1000A may comprise alternating axis piezoelectric volume 1004A sandwiched between top acoustic reflector 1015A and bottom multi-layer acoustic reflector 1013A. Top acoustic reflector 1015A may comprise a top electrode layer. Top acoustic reflector 1015A may comprise a top current spreading layer 1071A.

A seed layer 1003A may be interposed between the bottom multi-layer acoustic reflector 1013A and substrate 1001A (e.g., silicon substrate 1001A). The bottom multi-layer acoustic reflector 1013A may approximate a bottom distributed Bragg reflector 1013A (e.g., a bottom distributed Bragg acoustic reflector 1013A). Accordingly, the bottom multi-layer acoustic reflector 1013A may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004A.

The bottom multi-layer acoustic reflector 1013A may comprise a plurality of bottom metal electrode layers. The bottom multi-layer acoustic reflector 1013A may comprise a bottom current spreading layer 1035A. The bottom multi-layer acoustic reflector 1013A may be a bottom multi-layer metal acoustic reflector 1013A (e.g., a bottom multi-layer metal acoustic reflector electrode 1013A). A plurality of bottom metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The bottom multi-layer metal acoustic reflector 1013A may approximate the bottom distributed Bragg reflector 1013A (e.g., the bottom distributed Bragg acoustic reflector 1013A). The alternating high/low acoustic impedance metal electrode layers may have respective thicknesses of approximately a quarter wavelength (e.g., quarter acoustic wavelength) of the main resonant frequency of the resonant piezoelectric volume 1004A.

Bulk acoustic wave resonator 1000B may comprise alternating axis piezoelectric volume 1004B sandwiched between top multi-layer acoustic reflector 1015B and bottom acoustic reflector 1013A. A seed layer 1003B may be interposed between the bottom acoustic reflector 1013B and substrate 1001B (e.g., silicon substrate 1001B). Bottom acoustic reflector 1013B may comprise a bottom electrode layer. Bottom acoustic reflector 1015B may comprise a bottom current spreading layer 1035B.

The top multi-layer acoustic reflector may approximate a top distributed Bragg reflector 1015B (e.g., a top distributed Bragg acoustic reflector 1015B). Accordingly, the top multi-layer acoustic reflector 1015B may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004B.

The top multi-layer acoustic reflector 1015B may comprise a plurality of top metal electrode layers. The top multi-layer acoustic reflector 1015B may comprise a top current spreading layer 1071B. The top multi-layer acoustic reflector 1015B may be a top multi-layer metal acoustic reflector 1015B (e.g., a top multi-layer metal acoustic reflector electrode 1015B). A plurality of top metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The top multi-layer metal acoustic reflector 1015B may approximate the top distributed Bragg reflector 1015B (e.g., the top distributed Bragg acoustic reflector 1013A). The alternating high/low acoustic impedance metal electrode layers may have respective thicknesses of approximately a quarter wavelength (e.g., quarter acoustic wavelength) of the main resonant frequency of the resonant piezoelectric volume 1004B.

Bulk acoustic wave resonator 1000C may comprise alternating axis piezoelectric volume 1004C sandwiched between top multi-layer acoustic reflector 1015C and bottom multi-layer acoustic reflector 1013C. A seed layer 1003C may be interposed between the bottom acoustic reflector 1013C and substrate 1001C (e.g., silicon substrate 1001C).

The top multi-layer acoustic reflector may approximate a top distributed Bragg reflector 1015C (e.g., a top distributed Bragg acoustic reflector 1015C). Accordingly, the top multi-layer acoustic reflector 1015C may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004C.

The top multi-layer acoustic reflector 1015C may comprise a plurality of top metal electrode layers. The top multi-layer acoustic reflector 1015C may comprise a top current spreading layer 1071C. The top multi-layer acoustic reflector 1015C may be a top multi-layer metal acoustic reflector 1015C (e.g., a top multi-layer metal acoustic reflector electrode 1015C). A plurality of top metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The top multi-layer metal acoustic reflector 1015C may approximate the top distributed Bragg reflector 1015C (e.g., the top distributed Bragg acoustic reflector 1013C). The alternating high/low acoustic impedance metal electrode layers may have respective thicknesses of approximately a quarter wavelength (e.g., quarter acoustic wavelength) of the main resonant frequency of the resonant piezoelectric volume 1004C.

The bottom multi-layer acoustic reflector 1013C may approximate a bottom distributed Bragg reflector 1013C (e.g., a bottom distributed Bragg acoustic reflector 1013C). Accordingly, the bottom multi-layer acoustic reflector 1013C may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004C.

The bottom multi-layer acoustic reflector 1013C may comprise a plurality of bottom metal electrode layers. The bottom multi-layer acoustic reflector 1013C may comprise a bottom current spreading layer 1035C. The bottom multi-layer acoustic reflector 1013C may be a bottom multi-layer metal acoustic reflector 1013C (e.g., a bottom multi-layer metal acoustic reflector electrode 1013C). A plurality of bottom metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The bottom multi-layer metal acoustic reflector 1013C may approximate the bottom distributed Bragg reflector 1013C (e.g., the bottom distributed Bragg acoustic reflector 1013C). The alternating high/low acoustic impedance metal electrode layers may have respective thicknesses of approximately a quarter wavelength (e.g., quarter acoustic wavelength) of the main resonant frequency of the resonant piezoelectric volume 1004C.

The lower left portion of FIG. 1AA shows bulk acoustic wave resonator 1000D. Bulk acoustic wave resonator 1000D may comprise alternating axis piezoelectric volume 1004D sandwiched between top acoustic reflector 1015D and bottom multi-layer acoustic reflector 1013D. Top acoustic reflector 1015D may comprise a top electrode layer. Top acoustic reflector 1015D may comprise a top current spreading layer 1071D.

A seed layer 1003D may be interposed between the bottom multi-layer acoustic reflector 1013D and substrate 1001D (e.g., silicon substrate 1001D). The bottom multi-layer acoustic reflector 1013D may approximate a bottom distributed Bragg reflector 1013D (e.g., a bottom distributed Bragg acoustic reflector 1013D). Accordingly, the bottom multi-layer acoustic reflector 1013D may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004D.

The bottom multi-layer acoustic reflector 1013D may comprise a plurality of bottom metal electrode layers. The bottom multi-layer acoustic reflector 1013D may comprise a bottom current spreading layer 1035D. The bottom multi-layer acoustic reflector 1013D may be a bottom multi-layer metal acoustic reflector 1013D (e.g., a bottom multi-layer metal acoustic reflector electrode 1013D). A plurality of bottom metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The bottom multi-layer metal acoustic reflector 1013D may approximate the bottom distributed Bragg reflector 1013D (e.g., the bottom distributed Bragg acoustic reflector 1013D). The alternating high/low acoustic impedance metal electrode layers may have respective thicknesses of approximately a quarter wavelength (e.g., quarter acoustic wavelength) of the main resonant frequency of the resonant piezoelectric volume 1004D.

For example, bottom multi-layer acoustic reflector 1013D (e.g., a bottom multi-layer metal acoustic reflector electrode 1013D) may comprise a bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D). Bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) may have a thickness of approximately a quarter wavelength (e.g., quarter acoustic wavelength) of the main resonant frequency of the resonant piezoelectric volume 1004D.

Piezoelectric layer 1018D may comprise piezoelectric material e.g., Aluminum Nitride. Piezoelectric layer 1018D may have a lower (e.g., contrasting) acoustic impedance than a relatively higher acoustic impedance of the bottom reflector layer 1017D. For example, piezoelectric layer 1018D may have a lower (e.g., contrasting) acoustic impedance than relatively higher acoustic impedance of initial bottom reflector layer 1017D. For example, piezoelectric layer 1018D may have a lower (e.g., contrasting) acoustic impedance than relatively higher acoustic impedance of bottom metal acoustic reflector electrode layer 1017D. For example, piezoelectric layer 1018D may have a lower (e.g., contrasting) acoustic impedance than bottom high acoustic impedance metal electrode layer 1017D. For example, Aluminum Nitride piezoelectric layer 1018D may have a lower (e.g., contrasting) acoustic impedance than bottom Tungsten (W) electrode layer 1017D).

Further, quarter acoustic wavelength thick piezoelectric layer 1018D, e.g., having relatively low acoustic impedance, may be sandwiched between relatively high acoustic impedance, quarter acoustic wavelength thick bottom metal (e.g., Tungsten) acoustic reflector electrode layer 1017D, and another relatively high acoustic impedance, quarter acoustic wavelength thick bottom metal (e.g., Tungsten) acoustic reflector electrode layer of the bottom distributed Bragg acoustic reflector electrode 1013D (e.g., bottom multi-layer metal acoustic reflector electrode 1013D). In other words, it should be understood that piezoelectric layer 1018D forms a portion of bottom distributed Bragg acoustic reflector electrode 1013D. In particular, since piezoelectric layer 1018D may be sandwiched between a pair of relatively high acoustic impedance metal (e.g., Tungsten) reflector electrode layers, and since acoustic impedance of piezoelectric layer 1018D (e.g., piezoelectric layer comprising Aluminum Nitride) is substantially lower (e.g., contrasting) relative to the pair of relatively high acoustic impedance metal (e.g., Tungsten) reflector electrode layers, piezoelectric layer 1018D may substantially contribute to approximating the distributed Bragg acoustic reflector electrode 1013D, and moreover, piezoelectric layer 1018D may substantially contribute to acoustic wave reflectivity of the bottom distributed Bragg acoustic reflector electrode 1013D. Further, since piezoelectric layer 1018D may have a thickness of approximately a quarter acoustic wavelength sandwiched between the pair of relatively high acoustic impedance metal (e.g., Tungsten) reflector electrode layers having respective thicknesses of approximately the quarter acoustic wavelength, piezoelectric layer 1018D may substantially contribute to approximating the distributed Bragg acoustic reflector electrode 1013D, and moreover, piezoelectric layer 1018D may substantially contribute to acoustic wave reflectivity of the bottom distributed Bragg acoustic reflector electrode 1013D.

Additionally, it should be understood that piezoelectric layer 1018D is an —active-piezoelectric layer 1018D. In addition to forming a portion of bottom multilayer acoustic reflector, —active-piezoelectric layer 1018D forms an —active-portion of alternating axis piezoelectric volume 1004D. In operation of bulk acoustic wave resonator 1000D, an oscillating electric field may be applied, e.g., via top current spreading layer 1071D and bottom current spreading layer 1035D, so as to —activate-responsive piezoelectric acoustic oscillations (e.g., the main resonant mode) in active piezoelectric layer 1018D and in remaining piezoelectric layers of alternating axis piezoelectric volume 1004D (e.g., example four piezoelectric layers of alternating axis piezoelectric volume 1004D, already discussed). As mentioned previously herein, alternating axis piezoelectric volume 1004D may comprise a first piezoelectric layer having a reverse piezoelectric axis orientation (e.g., bottom piezoelectric layer having a reverse piezoelectric axis orientation). Active piezoelectric layer 1018D may have a normal piezoelectric axis orientation. In the alternating axis piezoelectric volume 1004D, reflector layer 1017D may be interposed between active piezoelectric layer 1018D having the normal piezoelectric axis orientation and the bottom piezoelectric layer having a reverse piezoelectric axis orientation. However, in the alternating axis piezoelectric volume 1004D, active piezoelectric layer 1018D having the normal piezoelectric axis orientation may still be arranged proximate to the bottom piezoelectric layer having the reverse piezoelectric axis orientation. The normal piezoelectric axis orientation of the active piezoelectric layer 1018D may substantially oppose the reverse piezoelectric orientation of bottom piezoelectric layer of the alternating axis piezoelectric volume 1004D. The bottom piezoelectric layer having the reverse piezoelectric axis orientation may be interposed between the active piezoelectric layer 1018D having the normal piezoelectric axis orientation and the first middle piezoelectric layer having the normal piezoelectric axis orientation, so that the reverse piezoelectric orientation of bottom piezoelectric layer may substantially oppose the normal piezoelectric axis orientation of the active piezoelectric layer 1018D and the normal piezoelectric axis orientation of the first middle piezoelectric layer in the alternating axis arrangement (e.g., in the alternating axis piezoelectric volume 1004D).

As just discussed, the active piezoelectric layer 1018D may, for example, form a portion of the alternating axis piezoelectric volume 1004D (e.g., the alternating axis piezoelectric volume 1004D may comprise the active piezoelectric layer 1018D). Further, as discussed previously herein, the active piezoelectric layer 1018D may have a contrasting/relatively low acoustic impedance and may have a quarter acoustic wavelength thickness. Accordingly the active piezoelectric layer 1018D may, for example, form a portion of the bottom distributed Bragg acoustic reflector electrode 1013D (e.g., the bottom distributed Bragg acoustic reflector electrode 1013D may comprise the active piezoelectric layer 1018D).

In other words, there may be an overlap (e.g., comprising the active piezoelectric layer 1018D) between the alternating axis piezoelectric volume 1004D and the bottom distributed Bragg acoustic reflector electrode 1013D. Accordingly, in view of this overlap, in representatively illustrative FIG. 1AA, bottom multi-layer acoustic reflector 1013D is depicted in solid line, with overlapping alternating axis piezoelectric volume 1004D and overlapping active piezoelectric layer 1018D shown as overlapping and depicted in dashed line.

The bottom distributed Bragg acoustic reflector electrode 1013D, for example, comprising the active piezoelectric layer 1018D, e.g., the active piezoelectric layer 1018D forming a portion of the bottom distributed Bragg acoustic reflector electrode 1013D, may but need not facilitate a quality factor enhancement of the bulk acoustic wave resonator 1000D. Further, the active piezoelectric layer 1018D of the bottom distributed Bragg acoustic reflector electrode 1013D may facilitate grain orientation of the bottom metal acoustic reflector electrode layer 1017D arranged over the active piezoelectric layer 1018D. Moreover, the active piezoelectric layer 1018D facilitate crystal quality enhancement of the adjacent bottom piezoelectric layer of the alternating axis piezoelectric volume 1004D, via grain orientation of the bottom metal acoustic reflector electrode layer 1017D arranged over the active piezoelectric layer 1018D.

The alternating axis piezoelectric volume 1004D, for example, comprising the active piezoelectric layer 1018D, e.g., the active piezoelectric layer 1018D forming a portion of the alternating axis piezoelectric volume 1004D, e.g., the active piezoelectric layer 1018D having the normal piezoelectric axis orientation substantially opposing the reverse piezoelectric axis orientation of the proximate (e.g., adjacent) bottom piezoelectric layer, may but need not facilitate an enhancement in an electromechanical coupling of the bulk acoustic wave resonator 1000D.

In an alternative example, the active piezoelectric layer 1018D may instead have a —reverse-piezoelectric axis orientation. In the alternative example, the active piezoelectric layer 1018D having the reverse piezoelectric axis orientation may be orientated substantially the same as the reverse piezoelectric axis orientation of the proximate (e.g., adjacent) bottom piezoelectric layer. This may, but need not, facilitate a reduction in the electromechanical coupling of the bulk acoustic wave resonator 1000D.

Further, although the active piezoelectric layer 1018D has been described as having, for example, a thickness of about a quarter acoustic wavelength (e.g., of the main resonant frequency of the bulk acoustic wave resonator 1000D), the thickness of the active piezoelectric layer 1018D may be varied. For example, the active piezoelectric layer 1018D of the bottom distributed Bragg acoustic reflector electrode 1013D may have a thickness within a range from about five percent to about twenty-five percent of an acoustic wavelength of the main resonant frequency wavelength (e.g., of the main resonant frequency of the bulk acoustic wave resonator 1000D). For example, the active piezoelectric layer 1018D of the bottom distributed Bragg acoustic reflector electrode 1013D may have a thickness that is less than about five percent of the acoustic wavelength of the main resonant frequency wavelength (e.g., of the main resonant frequency of the bulk acoustic wave resonator 1000D).

Bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) may be present in the alternating axis piezoelectric volume 1004D, e.g., interposed between the alternating piezoelectric axis arrangement of the normal piezoelectric axis of active piezoelectric layer 1018D and the reverse piezoelectric axis of the bottom piezoelectric layer. For example, bottom reflector layer 1017D may be interposed between the active piezoelectric layer 1018D and the bottom piezoelectric layer, e.g., bottom reflector layer 1017D may interface with (e.g., may be acoustically coupled with) the active piezoelectric layer 1018D and the bottom piezoelectric layer of the alternating axis piezoelectric volume 1004D. Accordingly, bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) may form a portion of the alternating axis piezoelectric volume 1004D.

Bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) may be present in the bottom distributed Bragg acoustic reflector electrode 1013D. Specifically, bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) may have the thickness of about a quarter acoustic wavelength, and may have the contrasting/relatively high acoustic impedance, relative to relatively low acoustic impedance of adjacent, quarter acoustic wavelength thick active piezoelectric layer 1018D. Accordingly, bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) may form a portion of example bottom distributed Bragg acoustic reflector electrode 1013D.

In other words, there may be an overlap (e.g., comprising the bottom reflector layer 1017D) between the alternating axis piezoelectric volume 1004D and the bottom distributed Bragg acoustic reflector electrode 1013D. Accordingly, in view of this overlap, in representatively illustrative FIG. 1AA, bottom multi-layer acoustic reflector 1013D is depicted in solid line, with overlapping alternating axis piezoelectric volume 1004D and overlapping reflector layer 1017D shown as overlapping and depicted in dashed line.

The alternating axis piezoelectric volume 1004D comprising the bottom reflector layer 1017D, e.g., the bottom reflector layer 1017D forming a portion of alternating axis piezoelectric volume 1004D, may but need not facilitate a quality factor enhancement of the bulk acoustic wave resonator 1000D.

Although bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) has been described as having, for example, a thickness of about a quarter acoustic wavelength (e.g., of the main resonant frequency of the bulk acoustic wave resonator 1000D), the thickness of the bottom reflector layer 1017D may be varied. For example, bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) of the bottom distributed Bragg acoustic reflector electrode 1013D may have a thickness within a range from about five percent to about twenty-five percent of an acoustic wavelength of the main resonant frequency wavelength (e.g., of the main resonant frequency of the bulk acoustic wave resonator 1000D).

In another alternative example, bottom reflector layer 1017D (e.g., initial bottom reflector layer 1017D, e.g., bottom metal acoustic reflector electrode layer 1017D, e.g., bottom high acoustic impedance metal electrode layer 1017D, e.g., bottom Tungsten (W) electrode layer 1017D) of the bottom distributed Bragg acoustic reflector electrode 1013D may have a thickness within a range from about five percent to about forty-five percent of an acoustic wavelength of the main resonant frequency wavelength (e.g., of the main resonant frequency of the bulk acoustic wave resonator 1000D). Similarly, an adjacent bottom metal acoustic reflector electrode layer, e.g., bottom low acoustic impedance metal electrode layer, e.g., bottom Titanium (Ti) electrode layer of the bottom distributed Bragg acoustic reflector electrode 1013D may have a thickness within a range from about five percent to about forty-five percent of an acoustic wavelength of the main resonant frequency wavelength (e.g., of the main resonant frequency of the bulk acoustic wave resonator 1000D). For example, remainder bottom metal acoustic reflector electrode layers of the bottom distributed Bragg acoustic reflector electrode 1013D may have respective remainder layer thicknesses within a range from approximately five percent to about twenty-five percent of an acoustic wavelength of the main resonant frequency.

In another example, the bottom distributed Bragg acoustic reflector electrode 1013D may comprise first, second, third and fourth pairs of bottom metal acoustic reflector electrode layers, in which members of the comprises first, second, third and fourth pairs of bottom metal electrode layers have respective thicknesses within a range from approximately five percent to about forty-five percent of acoustic of a wavelength (e.g., of the main resonant frequency of the bulk acoustic wave resonator 1000D).

The bottom distributed Bragg acoustic reflector electrode 1013D may comprise first and second pairs of bottom metal acoustic reflector electrode layers having alternating acoustic impedances. Further, the bottom distributed Bragg acoustic reflector electrode 1013D may comprise first, second and third pairs of bottom metal acoustic reflector electrode layers having alternating acoustic impedances. Moreover, the bottom distributed Bragg acoustic reflector electrode 1013D may comprise first, second, third and fourth pairs of bottom metal acoustic reflector electrode layers having alternating acoustic impedances. In other words, the bottom distributed Bragg acoustic reflector electrode 1013D may comprise a bottom multilayer metal acoustic reflector electrode 1013D (e.g., having alternating acoustic impedances).

The central bottom portion of FIG. 1AA shows bulk acoustic wave resonator 1000E. Bulk acoustic wave resonator 1000E may comprise alternating axis piezoelectric volume 1004E sandwiched between bottom acoustic reflector 1013E and top multi-layer acoustic reflector 1015E. Bottom acoustic reflector 1013E may comprise a bottom electrode layer. Bottom acoustic reflector 1013E may comprise a bottom current spreading layer 1035E. A seed layer 1003E may be interposed between the bottom acoustic reflector 1013E and substrate 1001E (e.g., silicon substrate 1001E).

The top multi-layer acoustic reflector 1015E may approximate a top distributed Bragg reflector 1015E (e.g., a top distributed Bragg acoustic reflector 1015E). Accordingly, the top multi-layer acoustic reflector 1015E may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004E.

The top multi-layer acoustic reflector 1015E may comprise a plurality of top metal electrode layers. The top multi-layer acoustic reflector 1015E may comprise a top current spreading layer 1071E. The top multi-layer acoustic reflector 1015E may be a top multi-layer metal acoustic reflector 1015E (e.g., a top multi-layer metal acoustic reflector electrode 1015E). A plurality of top metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The top multi-layer metal acoustic reflector 1015E may approximate the top distributed Bragg reflector 1015E (e.g., the top distributed Bragg acoustic reflector 1015E). The alternating high/low acoustic impedance metal electrode layers may have respective thicknesses of approximately a quarter wavelength (e.g., quarter acoustic wavelength) of the main resonant frequency of the resonant piezoelectric volume 1004E.

For example, top multi-layer acoustic reflector 1015E (e.g., a top multi-layer metal acoustic reflector electrode 1015E) may comprise a top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E). Top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) may have a thickness of approximately a quarter wavelength (e.g., quarter acoustic wavelength) of the main resonant frequency of the resonant piezoelectric volume 1004E.

Piezoelectric layer 1038E may comprise piezoelectric material e.g., Aluminum Nitride. Piezoelectric layer 1038E may have a lower (e.g., contrasting) acoustic impedance than a relatively higher acoustic impedance of the top reflector layer 1037E. For example, piezoelectric layer 1038E may have a lower (e.g., contrasting) acoustic impedance than relatively higher acoustic impedance of initial top reflector layer 1037E. For example, piezoelectric layer 1038E may have a lower (e.g., contrasting) acoustic impedance than relatively higher acoustic impedance of top metal acoustic reflector electrode layer 1037E. For example, piezoelectric layer 1038E may have a lower (e.g., contrasting) acoustic impedance than top high acoustic impedance metal electrode layer 1037E. For example, Aluminum Nitride piezoelectric layer 1038E may have a lower (e.g., contrasting) acoustic impedance than top Tungsten (W) electrode layer 1037E).

Further, quarter acoustic wavelength thick piezoelectric layer 1038E, e.g., having relatively low acoustic impedance, may be sandwiched between relatively high acoustic impedance, quarter acoustic wavelength thick top metal (e.g., Tungsten) acoustic reflector electrode layer 1037E, and another relatively high acoustic impedance, quarter acoustic wavelength thick top metal (e.g., Tungsten) acoustic reflector electrode layer of the top distributed Bragg acoustic reflector electrode 1015E (e.g., top multi-layer metal acoustic reflector electrode 1015E). In other words, it should be understood that piezoelectric layer 1038E may form a portion of top distributed Bragg acoustic reflector electrode 1015E. In particular, since piezoelectric layer 1038E may be sandwiched between a pair of relatively high acoustic impedance metal (e.g., Tungsten) reflector electrode layers, and since acoustic impedance of piezoelectric layer 1038E (e.g., piezoelectric layer comprising Aluminum Nitride) is substantially lower (e.g., contrasting) relative to the pair of relatively high acoustic impedance metal (e.g., Tungsten) reflector electrode layers, piezoelectric layer 1038E may substantially contribute to approximating the top distributed Bragg acoustic reflector electrode 1015E. Moreover, piezoelectric layer 1038E may substantially contribute to acoustic wave reflectivity of the top distributed Bragg acoustic reflector electrode 1015E. Further, since piezoelectric layer 1038E may have a thickness of approximately a quarter acoustic wavelength sandwiched between the pair of relatively high acoustic impedance metal (e.g., Tungsten) reflector electrode layers having respective thicknesses of approximately the quarter acoustic wavelength, piezoelectric layer 1038E may substantially contribute to approximating the top distributed Bragg acoustic reflector electrode 1015E. Moreover, piezoelectric layer 1038E may substantially contribute to acoustic wave reflectivity of the top distributed Bragg acoustic reflector electrode 1015E. Additionally, it should be understood that piezoelectric layer 1038E is an —active-piezoelectric layer 1038E. In addition to forming a portion of top multilayer acoustic reflector 1015E, —active-piezoelectric layer 1038E forms an —active-portion of alternating axis piezoelectric volume 1004E. In operation of bulk acoustic wave resonator 1000E, an oscillating electric field may be applied, e.g., via top current spreading layer 1071E and bottom current spreading layer 1035E, so as to —activate-responsive piezoelectric acoustic oscillations (e.g., the main resonant mode) in active piezoelectric layer 1038E and in remaining piezoelectric layers of alternating axis piezoelectric volume 1004E (e.g., example four piezoelectric layers of alternating axis piezoelectric volume 1004E, already discussed). As mentioned previously herein, alternating axis piezoelectric volume 1004E may comprise a fourth piezoelectric layer having a normal piezoelectric axis orientation (e.g., top piezoelectric layer having a normal piezoelectric axis orientation). Active piezoelectric layer 1038E may have a reverse piezoelectric axis orientation. In the alternating axis piezoelectric volume 1004E, reflector layer 1037E may be interposed between active piezoelectric layer 1038E having the reverse piezoelectric axis orientation and the top piezoelectric layer having a normal piezoelectric axis orientation.

However, in the alternating axis piezoelectric volume 1004E, active piezoelectric layer 1038E having the reverse piezoelectric axis orientation may still be arranged over the top piezoelectric layer having the normal piezoelectric axis orientation (e.g., proximate to the top piezoelectric layer having the normal piezoelectric axis orientation). The reverse piezoelectric axis orientation of the active piezoelectric layer 1038E may substantially oppose the normal piezoelectric orientation of the top piezoelectric layer of the alternating axis piezoelectric volume 1004E. The top piezoelectric layer having the normal piezoelectric axis orientation may be interposed between the active piezoelectric layer 1038E having the reverse piezoelectric axis orientation and the second middle piezoelectric layer having the reverse piezoelectric axis orientation, so that the normal piezoelectric orientation of the top piezoelectric layer may substantially oppose the reverse piezoelectric axis orientation of the active piezoelectric layer 1038E and the reverse piezoelectric axis orientation of the second middle piezoelectric layer in the alternating axis arrangement (e.g., in the alternating axis piezoelectric volume 1004E).

As just discussed, the active piezoelectric layer 1038E may, for example, form a portion of the alternating axis piezoelectric volume 1004E (e.g., the alternating axis piezoelectric volume 1004E may comprise the active piezoelectric layer 1038E). Further, as discussed previously herein, the active piezoelectric layer 1038E may have a contrasting/relatively low acoustic impedance and may have a quarter acoustic wavelength thickness. Accordingly the active piezoelectric layer 1038E may, for example, form a portion of the top distributed Bragg acoustic reflector electrode 1015E (e.g., the top distributed Bragg acoustic reflector electrode 1015E may comprise the active piezoelectric layer 1038E). In other words, there may be an overlap (e.g., comprising the active piezoelectric layer 1038E) between the alternating axis piezoelectric volume 1004E and the top distributed Bragg acoustic reflector electrode 1015E. Accordingly, in view of this overlap, in representatively illustrative FIG. 1AA, top multi-layer acoustic reflector 1015E is depicted in solid line, with overlapping alternating axis piezoelectric volume 1004E and overlapping active piezoelectric layer 1038E shown as overlapping and depicted in dashed line. The top distributed Bragg acoustic reflector electrode 1015E, for example, comprising the active piezoelectric layer 1038E, e.g., the active piezoelectric layer 1038E forming a portion of the top distributed Bragg acoustic reflector electrode 1015E, may but need not facilitate a quality factor enhancement of the bulk acoustic wave resonator 1000E.

The alternating axis piezoelectric volume 1004E, for example, comprising the active piezoelectric layer 1038E, e.g., the active piezoelectric layer 1038E forming a portion of the alternating axis piezoelectric volume 1004E, e.g., the active piezoelectric layer 1038E having the reverse piezoelectric axis orientation substantially opposing the normal piezoelectric axis orientation of the proximate (e.g., adjacent) top piezoelectric layer, may but need not facilitate an enhancement in an electromechanical coupling of the bulk acoustic wave resonator 1000E.

In an alternative example, the active piezoelectric layer 1038E may instead have a —normal-piezoelectric axis orientation. In the alternative example, the active piezoelectric layer 1038E having the normal piezoelectric axis orientation may be orientated substantially the same as the normal piezoelectric axis orientation of the proximate (e.g., adjacent) top piezoelectric layer. This may, but need not, facilitate a reduction in the electromechanical coupling of the bulk acoustic wave resonator 1000E.

Further, although the active piezoelectric layer 1038E has been described as having, for example, a thickness of about a quarter acoustic wavelength (e.g., of the main resonant frequency of the bulk acoustic wave resonator 1000E), the thickness of the active piezoelectric layer 1038E may be varied. For example, the active piezoelectric layer 1038E of the top distributed Bragg acoustic reflector electrode 1015E may have a thickness within a range from about five percent to about twenty-five percent of an acoustic wavelength of the main resonant frequency wavelength (e.g., of the main resonant frequency of the bulk acoustic wave resonator 1000E). For example, the active piezoelectric layer 1038E of the top distributed Bragg acoustic reflector electrode 1015E may have a thickness that is less than about five percent of the acoustic wavelength of the main resonant frequency wavelength (e.g., of the main resonant frequency of the bulk acoustic wave resonator 1000E).

Top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) may be present in the alternating axis piezoelectric volume 1004E, e.g., interposed between the alternating piezoelectric axis arrangement of the reverse piezoelectric axis of active piezoelectric layer 1038E and the normal piezoelectric axis of the top piezoelectric layer. For example, top reflector layer 1037E may be interposed between the active piezoelectric layer 1038E and the top piezoelectric layer, e.g., top reflector layer 1037E may interface with (e.g., may be acoustically coupled with) the active piezoelectric layer 1038E and the top (e.g., fourth) piezoelectric layer of the alternating axis piezoelectric volume 1004E. Accordingly, top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) may form a portion of the alternating axis piezoelectric volume 1004E.

Top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) may be present in the top distributed Bragg acoustic reflector electrode 1015E. Specifically, top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) may have the thickness of about a quarter acoustic wavelength, and may have the contrasting/relatively high acoustic impedance, relative to relatively low acoustic impedance of adjacent, quarter acoustic wavelength thick active piezoelectric layer 1038E. Accordingly, top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) may form a portion of example top distributed Bragg acoustic reflector electrode 1015E.

In other words, there may be an overlap (e.g., comprising the top reflector layer 1037E) between the alternating axis piezoelectric volume 1004E and the top distributed Bragg acoustic reflector electrode 1015E. Accordingly, in view of this overlap, in representatively illustrative FIG. 1AA, top multi-layer acoustic reflector 1015E is depicted in solid line, with overlapping alternating axis piezoelectric volume 1004E and overlapping reflector layer 1037E shown as overlapping and depicted in dashed line.

The alternating axis piezoelectric volume 1004E comprising the top reflector layer 1037E, e.g., the top reflector layer 1037E forming a portion of alternating axis piezoelectric volume 1004E, may but need not facilitate a quality factor enhancement of the bulk acoustic wave resonator 1000E.

Although top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) has been described as having, for example, a thickness of about a quarter acoustic wavelength (e.g., of the main resonant frequency of the bulk acoustic wave resonator 1000E), the thickness of the top reflector layer 1037E may be varied. For example, top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) of the top distributed Bragg acoustic reflector electrode 1015E may have a thickness within a range from about five percent to about twenty-five percent of an acoustic wavelength of the main resonant frequency wavelength (e.g., of the main resonant frequency of the bulk acoustic wave resonator 1000E).

In another alternative example, top reflector layer 1037E (e.g., initial top reflector layer 1037E, e.g., top metal acoustic reflector electrode layer 1037E, e.g., top high acoustic impedance metal electrode layer 1037E, e.g., top Tungsten (W) electrode layer 1037E) of the top distributed Bragg acoustic reflector electrode 1015E may have a thickness within a range from about five percent to about forty-five percent of an acoustic wavelength of the main resonant frequency wavelength (e.g., of the main resonant frequency of the bulk acoustic wave resonator 1000E). Similarly, an adjacent top metal acoustic reflector electrode layer, e.g., top low acoustic impedance metal electrode layer, e.g., top Titanium (Ti) electrode layer of the top distributed Bragg acoustic reflector electrode 1015E may have a thickness within a range from about five percent to about forty-five percent of an acoustic wavelength of the main resonant frequency wavelength (e.g., of the main resonant frequency of the bulk acoustic wave resonator 1000E). For example, remainder top metal acoustic reflector electrode layers of the top distributed Bragg acoustic reflector electrode 1015E may have respective remainder layer thicknesses within a range from approximately five percent to about twenty-five percent of an acoustic wavelength of the main resonant frequency.

The lower right portion of FIG. 1AA shows bulk acoustic wave resonator 1000F. Bulk acoustic wave resonator 1000F may comprise alternating axis piezoelectric volume 1004F sandwiched between bottom multi-layer acoustic reflector 1013F and top multi-layer acoustic reflector 1015F. Bottom multi-layer acoustic reflector 1013F may comprise a bottom electrode layer. Bottom multi-layer acoustic reflector 1013F may comprise a bottom current spreading layer 1035F. A seed layer 1003F may be interposed between the bottom acoustic reflector 1013F and substrate 1001F (e.g., silicon substrate 1001F).

The top multi-layer acoustic reflector 1015F may approximate a top distributed Bragg reflector 1015F (e.g., a top distributed Bragg acoustic reflector 1015F). Accordingly, the top multi-layer acoustic reflector 1015F may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004F.

The top multi-layer acoustic reflector 1015F may comprise a plurality of top metal electrode layers. The top multi-layer acoustic reflector 1015F may comprise a top current spreading layer 1071F. The top multi-layer acoustic reflector 1015F may be a top multi-layer metal acoustic reflector 1015F (e.g., a top multi-layer metal acoustic reflector electrode 1015F). A plurality of top metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The top multi-layer metal acoustic reflector 1015F may approximate the top distributed Bragg reflector 1015F (e.g., the top distributed Bragg acoustic reflector 1015F). The alternating high/low acoustic impedance metal electrode layers may have respective thicknesses of approximately a quarter wavelength (e.g., quarter acoustic wavelength) of the main resonant frequency of the resonant piezoelectric volume 1004F.

For example, top multi-layer acoustic reflector 1015F (e.g., a top multi-layer metal acoustic reflector electrode 1015F) may comprise a top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F). Top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) may have a thickness of approximately a quarter wavelength (e.g., quarter acoustic wavelength) of the main resonant frequency of the resonant piezoelectric volume 1004F.

Top piezoelectric layer 1038F may comprise piezoelectric material e.g., Aluminum Nitride. Top piezoelectric layer 1038F may have a lower (e.g., contrasting) acoustic impedance than a relatively higher acoustic impedance of the top reflector layer 1037F. For example, top piezoelectric layer 1038F may have a lower (e.g., contrasting) acoustic impedance than relatively higher acoustic impedance of initial top reflector layer 1037F. For example, top piezoelectric layer 1038F may have a lower (e.g., contrasting) acoustic impedance than relatively higher acoustic impedance of top metal acoustic reflector electrode layer 1037F. For example, piezoelectric layer 1038F may have a lower (e.g., contrasting) acoustic impedance than top high acoustic impedance metal electrode layer 1037F. For example, top Aluminum Nitride piezoelectric layer 1038F may have a lower (e.g., contrasting) acoustic impedance than top Tungsten (W) electrode layer 1037F).

Further, top quarter acoustic wavelength thick piezoelectric layer 1038F, e.g., having relatively low acoustic impedance, may be sandwiched between relatively high acoustic impedance, quarter acoustic wavelength thick top metal (e.g., Tungsten) acoustic reflector electrode layer 1037F, and another relatively high acoustic impedance, quarter acoustic wavelength thick top metal (e.g., Tungsten) acoustic reflector electrode layer of the top distributed Bragg acoustic reflector electrode 1015F (e.g., top multi-layer metal acoustic reflector electrode 1015F). In other words, it should be understood that top piezoelectric layer 1038F may form a portion of top distributed Bragg acoustic reflector electrode 1015F. In particular, since top piezoelectric layer 1038F may be sandwiched between a pair of relatively high acoustic impedance metal (e.g., Tungsten) reflector electrode layers, and since acoustic impedance of top piezoelectric layer 1038F (e.g., piezoelectric layer comprising Aluminum Nitride) is substantially lower (e.g., contrasting) relative to the pair of relatively high acoustic impedance metal (e.g., Tungsten) reflector electrode layers, top piezoelectric layer 1038F may substantially contribute to approximating the top distributed Bragg acoustic reflector electrode 1015F. Moreover, top piezoelectric layer 1038F may substantially contribute to acoustic wave reflectivity of the top distributed Bragg acoustic reflector electrode 1015F. Further, since top piezoelectric layer 1038F may have a thickness of approximately a quarter acoustic wavelength sandwiched between the pair of relatively high acoustic impedance metal (e.g., Tungsten) reflector electrode layers having respective thicknesses of approximately the quarter acoustic wavelength, top piezoelectric layer 1038F may substantially contribute to approximating the top distributed Bragg acoustic reflector electrode 1015F. Moreover, top piezoelectric layer 1038F may substantially contribute to acoustic wave reflectivity of the top distributed Bragg acoustic reflector electrode 1015F.

Additionally, it should be understood that top piezoelectric layer 1038F is top —active-piezoelectric layer 1038F. In addition to forming a portion of top multilayer acoustic reflector 1015F, top —active-piezoelectric layer 1038F may form an —active-portion of alternating axis piezoelectric volume 1004F. In operation of bulk acoustic wave resonator 1000F, an oscillating electric field may be applied, e.g., via top current spreading layer 1071F and bottom current spreading layer 1035F, so as to —activate-responsive piezoelectric acoustic oscillations (e.g., the main resonant mode) in top active piezoelectric layer 1038F and in remaining piezoelectric layers of alternating axis piezoelectric volume 1004F (e.g., example four piezoelectric layers of alternating axis piezoelectric volume 1004F, already discussed). As mentioned previously herein, alternating axis piezoelectric volume 1004F may comprise a fourth piezoelectric layer having a normal piezoelectric axis orientation (e.g., top piezoelectric layer having a normal piezoelectric axis orientation). Top active piezoelectric layer 1038F may have a reverse piezoelectric axis orientation. In the alternating axis piezoelectric volume 1004F, reflector layer 1037F may be interposed between top active piezoelectric layer 1038F having the reverse piezoelectric axis orientation and the top piezoelectric layer having a normal piezoelectric axis orientation.

However, in the alternating axis piezoelectric volume 1004F, top active piezoelectric layer 1038F having the reverse piezoelectric axis orientation may still be arranged over the top piezoelectric layer having the normal piezoelectric axis orientation (e.g., proximate to the top piezoelectric layer having the normal piezoelectric axis orientation). The reverse piezoelectric axis orientation of the top active piezoelectric layer 1038F may substantially oppose the normal piezoelectric orientation of the top piezoelectric layer of the alternating axis piezoelectric volume 1004F. The top half acoustic wavelength thick piezoelectric layer (e.g., fourth half acoustic wavelength thick piezoelectric layer), e.g., having the normal piezoelectric axis orientation, may be interposed between the top active piezoelectric layer 1038F having the reverse piezoelectric axis orientation and the second middle half acoustic wavelength thick piezoelectric layer (e.g., the third half acoustic wavelength thick piezoelectric layer) having the reverse piezoelectric axis orientation, so that the normal piezoelectric orientation of the top piezoelectric half acoustic wavelength thick layer may substantially oppose the reverse piezoelectric axis orientation of the top active piezoelectric layer 1038F and the reverse piezoelectric axis orientation of the second middle half acoustic wavelength thick piezoelectric layer (e.g., the third half acoustic wavelength thick piezoelectric layer) in the alternating axis arrangement (e.g., in the alternating axis piezoelectric volume 1004F).

As just discussed, the top active piezoelectric layer 1038F may, for example, form a portion of the alternating axis piezoelectric volume 1004F (e.g., the alternating axis piezoelectric volume 1004F may comprise the top active piezoelectric layer 1038F). Further, as discussed previously herein, the top active piezoelectric layer 1038F may have a contrasting/relatively low acoustic impedance and may have a quarter acoustic wavelength thickness. Accordingly the top active piezoelectric layer 1038F may, for example, form a portion of the top distributed Bragg acoustic reflector electrode 1015F (e.g., the top distributed Bragg acoustic reflector electrode 1015F may comprise the top active piezoelectric layer 1038F). In other words, there may be an overlap (e.g., comprising the top active piezoelectric layer 1038F) between the alternating axis piezoelectric volume 1004F and the top distributed Bragg acoustic reflector electrode 1015F. Accordingly, in view of this overlap, in representatively illustrative FIG. 1AA, top multi-layer acoustic reflector 1015F is depicted in solid line, with overlapping alternating axis piezoelectric volume 1004F and overlapping top active piezoelectric layer 1038F shown as overlapping and depicted in dashed line. The top distributed Bragg acoustic reflector electrode 1015F, for example, comprising the top active piezoelectric layer 1038F, e.g., the top active piezoelectric layer 1038F forming a portion of the top distributed Bragg acoustic reflector electrode 1015F, may but need not facilitate a quality factor enhancement of the bulk acoustic wave resonator 1000F.

The alternating axis piezoelectric volume 1004F, for example, comprising the top active piezoelectric layer 1038F, e.g., the top active piezoelectric layer 1038F forming a portion of the alternating axis piezoelectric volume 1004F, e.g., the top active piezoelectric layer 1038F having the reverse piezoelectric axis orientation substantially opposing the normal piezoelectric axis orientation of the proximate (e.g., adjacent) top piezoelectric layer, may but need not facilitate an enhancement in an electromechanical coupling of the bulk acoustic wave resonator 1000F.

In an alternative example, the top active piezoelectric layer 1038F may instead have a —normal-piezoelectric axis orientation. In the alternative example, the top active piezoelectric layer 1038F having the normal piezoelectric axis orientation may be orientated substantially the same as the normal piezoelectric axis orientation of the proximate (e.g., adjacent) top piezoelectric layer. This may, but need not, facilitate a reduction in the electromechanical coupling of the bulk acoustic wave resonator 1000F.

Further, although the top active piezoelectric layer 1038F has been described as having, for example, a thickness of about a quarter acoustic wavelength (e.g., of the main resonant frequency of the bulk acoustic wave resonator 1000F), the thickness of the top active piezoelectric layer 1038F may be varied. For example, the top active piezoelectric layer 1038F of the top distributed Bragg acoustic reflector electrode 1015F may have a thickness within a range from about five percent to about twenty-five percent of an acoustic wavelength of the main resonant frequency wavelength (e.g., of the main resonant frequency of the bulk acoustic wave resonator 1000F). For example, the top active piezoelectric layer 1038F of the top distributed Bragg acoustic reflector electrode 1015F may have a thickness that is less than about five percent of the acoustic wavelength of the main resonant frequency wavelength (e.g., of the main resonant frequency of the bulk acoustic wave resonator 1000F).

Top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) may be present in the alternating axis piezoelectric volume 1004F, e.g., interposed between the alternating piezoelectric axis arrangement of the reverse piezoelectric axis of top active piezoelectric layer 1038F and the normal piezoelectric axis of the top piezoelectric layer. For example, top reflector layer 1037F may be interposed between the top active piezoelectric layer 1038F and the top piezoelectric layer, e.g., top reflector layer 1037F may interface with (e.g., may be acoustically coupled with) the top active piezoelectric layer 1038F and the top (e.g., fourth) piezoelectric layer of the alternating axis piezoelectric volume 1004F. Accordingly, top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) may form a portion of the alternating axis piezoelectric volume 1004F.

Top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) may be present in the top distributed Bragg acoustic reflector electrode 1015F. Specifically, top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) may have the thickness of about a quarter acoustic wavelength, and may have the contrasting/relatively high acoustic impedance, relative to relatively low acoustic impedance of adjacent, quarter acoustic wavelength thick top active piezoelectric layer 1038F. Accordingly, top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) may form a portion of example top distributed Bragg acoustic reflector electrode 1015F.

In other words, there may be an overlap (e.g., comprising the top reflector layer 1037F) between the alternating axis piezoelectric volume 1004F and the top distributed Bragg acoustic reflector electrode 1015F. Accordingly, in view of this overlap, in representatively illustrative FIG. 1AA, top multi-layer acoustic reflector 1015F is depicted in solid line, with overlapping alternating axis piezoelectric volume 1004F and overlapping reflector layer 1037F shown as overlapping and depicted in dashed line.

The alternating axis piezoelectric volume 1004F comprising the top reflector layer 1037F, e.g., the top reflector layer 1037F forming a portion of alternating axis piezoelectric volume 1004F, may but need not facilitate a quality factor enhancement of the bulk acoustic wave resonator 1000F.

Although top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) has been described as having, for example, a thickness of about a quarter acoustic wavelength (e.g., of the main resonant frequency of the bulk acoustic wave resonator 1000F), the thickness of the top reflector layer 1037F may be varied. For example, top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) of the top distributed Bragg acoustic reflector electrode 1015F may have a thickness within a range from about five percent to about twenty-five percent of an acoustic wavelength of the main resonant frequency wavelength (e.g., of the main resonant frequency of the bulk acoustic wave resonator 1000F).

In another alternative example, top reflector layer 1037F (e.g., initial top reflector layer 1037F, e.g., top metal acoustic reflector electrode layer 1037F, e.g., top high acoustic impedance metal electrode layer 1037F, e.g., top Tungsten (W) electrode layer 1037F) of the top distributed Bragg acoustic reflector electrode 1015F may have a thickness within a range from about five percent to about forty-five percent of an acoustic wavelength of the main resonant frequency wavelength (e.g., of the main resonant frequency of the bulk acoustic wave resonator 1000F). Similarly, an adjacent top metal acoustic reflector electrode layer, e.g., top low acoustic impedance metal electrode layer, e.g., top Titanium (Ti) electrode layer of the top distributed Bragg acoustic reflector electrode 1015F may have a thickness within a range from about five percent to about forty-five percent of an acoustic wavelength of the main resonant frequency wavelength (e.g., of the main resonant frequency of the bulk acoustic wave resonator 1000F). For example, remainder top metal acoustic reflector electrode layers of the top distributed Bragg acoustic reflector electrode 1015F may have respective remainder layer thicknesses within a range from approximately five percent to about twenty-five percent of an acoustic wavelength of the main resonant frequency.

Similarly, the bottom multi-layer acoustic reflector 1013F may comprise a plurality of bottom metal electrode layers. The bottom multi-layer acoustic reflector 1013F may comprise a bottom current spreading layer 1035F. The bottom multi-layer acoustic reflector 1013F may be a bottom multi-layer metal acoustic reflector 1013F (e.g., a bottom multi-layer metal acoustic reflector electrode 1013F). A plurality of bottom metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The bottom multi-layer metal acoustic reflector 1013F may approximate the bottom distributed Bragg reflector 1013F (e.g., the bottom distributed Bragg acoustic reflector 1013F).

The alternating high/low acoustic impedance metal electrode layers may have respective thicknesses of approximately a quarter wavelength (e.g., quarter acoustic wavelength) of the main resonant frequency of the resonant piezoelectric volume 1004F.

For example, bottom multi-layer acoustic reflector 1013F (e.g., a bottom multi-layer metal acoustic reflector electrode 1013F) may comprise a bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F). Bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) may have a thickness of approximately a quarter wavelength (e.g., quarter acoustic wavelength) of the main resonant frequency of the resonant piezoelectric volume 1004F.

Bottom piezoelectric layer 1018F may comprise piezoelectric material e.g., Aluminum Nitride. Bottom piezoelectric layer 1018F may have a lower (e.g., contrasting) acoustic impedance than a relatively higher acoustic impedance of the bottom reflector layer 1017F. For example, bottom piezoelectric layer 1018F may have a lower (e.g., contrasting) acoustic impedance than relatively higher acoustic impedance of initial bottom reflector layer 1017F. For example, bottom piezoelectric layer 1018F may have a lower (e.g., contrasting) acoustic impedance than relatively higher acoustic impedance of bottom metal acoustic reflector electrode layer 1017F. For example, bottom piezoelectric layer 1018F may have a lower (e.g., contrasting) acoustic impedance than bottom high acoustic impedance metal electrode layer 1017F. For example, bottom Aluminum Nitride piezoelectric layer 1018F may have a lower (e.g., contrasting) acoustic impedance than bottom Tungsten (W) electrode layer 1017F).

Further, bottom quarter acoustic wavelength thick piezoelectric layer 1018F, e.g., having relatively low acoustic impedance, may be sandwiched between relatively high acoustic impedance, quarter acoustic wavelength thick bottom metal (e.g., Tungsten) acoustic reflector electrode layer 1017F, and another relatively high acoustic impedance, quarter acoustic wavelength thick bottom metal (e.g., Tungsten) acoustic reflector electrode layer of the bottom distributed Bragg acoustic reflector electrode1013F (e.g., bottom multi-layer metal acoustic reflector electrode 1013F). In other words, it should be understood that bottom piezoelectric layer 1018F may form a portion of bottom distributed Bragg acoustic reflector electrode 1013F. In particular, since bottom piezoelectric layer 1018F may be sandwiched between a pair of relatively high acoustic impedance metal (e.g., Tungsten) reflector electrode layers, and since acoustic impedance of bottom piezoelectric layer 1018F (e.g., bottom piezoelectric layer 1018F comprising Aluminum Nitride) is substantially lower (e.g., contrasting) relative to the pair of relatively high acoustic impedance metal (e.g., Tungsten) reflector electrode layers, bottom piezoelectric layer 1018F may substantially contribute to approximating the bottom distributed Bragg acoustic reflector electrode 1013F, and moreover, bottom piezoelectric layer 1018F may substantially contribute to acoustic wave reflectivity of the bottom distributed Bragg acoustic reflector electrode 1013F. Further, since bottom piezoelectric layer 1018F may have a thickness of approximately a quarter acoustic wavelength sandwiched between the pair of relatively high acoustic impedance metal (e.g., Tungsten) reflector electrode layers having respective thicknesses of approximately the quarter acoustic wavelength, bottom piezoelectric layer 1018F may substantially contribute to approximating the distributed Bragg acoustic reflector electrode 1013F, and moreover, bottom piezoelectric layer 1018F may substantially contribute to acoustic wave reflectivity of the bottom distributed Bragg acoustic reflector electrode 1013F.

Additionally, it should be understood that bottom piezoelectric layer 1018F is a bottom-active-piezoelectric layer 1018F. In addition to forming a portion of bottom multilayer acoustic reflector, bottom-active-piezoelectric layer 1018F forms an —active-portion of alternating axis piezoelectric volume 1004F. In operation of bulk acoustic wave resonator 1000F, an oscillating electric field may be applied, e.g., via top current spreading layer 1071F and bottom current spreading layer 1035F, so as to —activate-responsive piezoelectric acoustic oscillations (e.g., the main resonant mode) in bottom active piezoelectric layer 1018F and in remaining piezoelectric layers of alternating axis piezoelectric volume 1004F (e.g., example four piezoelectric layers of alternating axis piezoelectric volume 1004F, already discussed). As mentioned previously herein, alternating axis piezoelectric volume 1004F may comprise a first piezoelectric layer having a reverse piezoelectric axis orientation (e.g., bottom piezoelectric layer having a reverse piezoelectric axis orientation). Bottom active piezoelectric layer 1018F may have a normal piezoelectric axis orientation. In the alternating axis piezoelectric volume 1004F, reflector layer 1017F may be interposed between bottom active piezoelectric layer 1018F having the normal piezoelectric axis orientation and the bottom piezoelectric layer having a reverse piezoelectric axis orientation. However, in the alternating axis piezoelectric volume 1004F, bottom active piezoelectric layer 1018F having the normal piezoelectric axis orientation may still be arranged proximate to the bottom half acoustic wavelength thick piezoelectric layer having the reverse piezoelectric axis orientation. The normal piezoelectric axis orientation of the bottom active piezoelectric layer 1018F may substantially oppose the reverse piezoelectric orientation of bottom piezoelectric layer of the alternating axis piezoelectric volume 1004F. The bottom half acoustic wavelength thick piezoelectric layer having the reverse piezoelectric axis orientation may be interposed between the bottom active piezoelectric layer 1018F having the normal piezoelectric axis orientation and the first middle half acoustic wavelength thick piezoelectric layer having the normal piezoelectric axis orientation, so that the reverse piezoelectric orientation of bottom half acoustic wavelength thick piezoelectric layer may substantially oppose the normal piezoelectric axis orientation of the bottom active piezoelectric layer 1018F and the normal piezoelectric axis orientation of first middle half acoustic wavelength thick piezoelectric layer (e.g., in the alternating axis piezoelectric volume 1004F).

As just discussed, the bottom active piezoelectric layer 1018F may, for example, form a portion of the alternating axis piezoelectric volume 1004F (e.g., the alternating axis piezoelectric volume 1004F may comprise the bottom active piezoelectric layer 1018F). Further, as discussed previously herein, the bottom active piezoelectric layer 1018F may have a contrasting/relatively low acoustic impedance and may have a quarter acoustic wavelength thickness. Accordingly the bottom active piezoelectric layer 1018F may, for example, form a portion of the bottom distributed Bragg acoustic reflector electrode 1013F (e.g., the bottom distributed Bragg acoustic reflector electrode 1013F may comprise the bottom active piezoelectric layer 1018F).

In other words, there may be an overlap (e.g., comprising the bottom active piezoelectric layer 1018F) between the alternating axis piezoelectric volume 1004F and the bottom distributed Bragg acoustic reflector electrode 1013F. Accordingly, in view of this overlap, in representatively illustrative FIG. 1AA, bottom multi-layer acoustic reflector 1013F is depicted in solid line, with overlapping alternating axis piezoelectric volume 1004F and overlapping bottom active piezoelectric layer 1018F shown as overlapping and depicted in dashed line.

The bottom distributed Bragg acoustic reflector electrode 1013F, for example, comprising the bottom active piezoelectric layer 1018F, e.g., the bottom active piezoelectric layer 1018F forming a portion of the bottom distributed Bragg acoustic reflector electrode 1013F, may but need not facilitate a quality factor enhancement of the bulk acoustic wave resonator 1000F. Further, the bottom active piezoelectric layer 1018F of the bottom distributed Bragg acoustic reflector electrode 1013F may facilitate grain orientation of the bottom metal acoustic reflector electrode layer 1017F arranged over the bottom active piezoelectric layer 1018F. Moreover, the bottom active piezoelectric layer 1018F facilitate crystal quality enhancement of the adjacent bottom piezoelectric layer of the alternating axis piezoelectric volume 1004F, via grain orientation of the bottom metal acoustic reflector electrode layer 1017F arranged over the bottom active piezoelectric layer 1018F.

The alternating axis piezoelectric volume 1004F, for example, comprising the bottom active piezoelectric layer 1018F, e.g., the bottom active piezoelectric layer 1018F forming a portion of the alternating axis piezoelectric volume 1004F, e.g., the bottom active piezoelectric layer 1018F having the normal piezoelectric axis orientation substantially opposing the reverse piezoelectric axis orientation of the proximate (e.g., adjacent) bottom piezoelectric layer, may but need not facilitate an enhancement in an electromechanical coupling of the bulk acoustic wave resonator 1000F.

In an alternative example, the bottom active piezoelectric layer 1018F may instead have a —reverse-piezoelectric axis orientation. In the alternative example, the bottom active piezoelectric layer 1018F having the reverse piezoelectric axis orientation may be orientated substantially the same as the reverse piezoelectric axis orientation of the proximate (e.g., adjacent) bottom piezoelectric layer. This may, but need not, facilitate a reduction in the electromechanical coupling of the bulk acoustic wave resonator 1000F.

Further, although the bottom active piezoelectric layer 1018F has been described as having, for example, a thickness of about a quarter acoustic wavelength (e.g., of the main resonant frequency of the bulk acoustic wave resonator 1000F), the thickness of the bottom active piezoelectric layer 1018F may be varied. For example, the bottom active piezoelectric layer 1018F of the bottom distributed Bragg acoustic reflector electrode 1013F may have a thickness within a range from about five percent to about twenty-five percent of an acoustic wavelength of the main resonant frequency wavelength (e.g., of the main resonant frequency of the bulk acoustic wave resonator 1000F). For example, the bottom active piezoelectric layer 1018F of the bottom distributed Bragg acoustic reflector electrode 1013F may have a thickness that is less than about five percent of the acoustic wavelength of the main resonant frequency wavelength (e.g., of the main resonant frequency of the bulk acoustic wave resonator 1000F).

Bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) may be present in the alternating axis piezoelectric volume 1004F, e.g., interposed between the alternating piezoelectric axis arrangement of the normal piezoelectric axis of bottom active piezoelectric layer 1018F and the reverse piezoelectric axis of the bottom piezoelectric layer. For example, bottom reflector layer 1017F may be interposed between the bottom active piezoelectric layer 1018F and the bottom piezoelectric layer, e.g., bottom reflector layer 1017F may interface with (e.g., may be acoustically coupled with) the bottom active piezoelectric layer 1018F and the bottom piezoelectric layer of the alternating axis piezoelectric volume 1004F. Accordingly, bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) may form a portion of the alternating axis piezoelectric volume 1004F.

Bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) may be present in the bottom distributed Bragg acoustic reflector electrode 1013F. Specifically, bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) may have the thickness of about a quarter acoustic wavelength, and may have the contrasting/relatively high acoustic impedance, relative to relatively low acoustic impedance of adjacent, quarter acoustic wavelength thick bottom active piezoelectric layer 1018F. Accordingly, bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) may form a portion of example bottom distributed Bragg acoustic reflector electrode 1013F.

In other words, there may be an overlap (e.g., comprising the bottom reflector layer 1017F) between the alternating axis piezoelectric volume 1004F and the bottom distributed Bragg acoustic reflector electrode 1013F. Accordingly, in view of this overlap, in representatively illustrative FIG. 1AA, bottom multi-layer acoustic reflector 1013F is depicted in solid line, with overlapping alternating axis piezoelectric volume 1004F and overlapping reflector layer 1017F shown as overlapping and depicted in dashed line.

The alternating axis piezoelectric volume 1004F comprising the bottom reflector layer 1017F, e.g., the bottom reflector layer 1017F forming a portion of alternating axis piezoelectric volume 1004F, may but need not facilitate a quality factor enhancement of the bulk acoustic wave resonator 1000F.

Although bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) has been described as having, for example, a thickness of about a quarter acoustic wavelength (e.g., of the main resonant frequency of the bulk acoustic wave resonator 1000F), the thickness of the bottom reflector layer 1017F may be varied. For example, bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) of the bottom distributed Bragg acoustic reflector electrode 1013F may have a thickness within a range from about five percent to about twenty-five percent of an acoustic wavelength of the main resonant frequency wavelength (e.g., of the main resonant frequency of the bulk acoustic wave resonator 1000F).

In another alternative example, bottom reflector layer 1017F (e.g., initial bottom reflector layer 1017F, e.g., bottom metal acoustic reflector electrode layer 1017F, e.g., bottom high acoustic impedance metal electrode layer 1017F, e.g., bottom Tungsten (W) electrode layer 1017F) of the bottom distributed Bragg acoustic reflector electrode 1013F may have a thickness within a range from about five percent to about forty-five percent of an acoustic wavelength of the main resonant frequency wavelength (e.g., of the main resonant frequency of the bulk acoustic wave resonator 1000F). Similarly, an adjacent bottom metal acoustic reflector electrode layer, e.g., bottom low acoustic impedance metal electrode layer, e.g., bottom Titanium (Ti) electrode layer of the bottom distributed Bragg acoustic reflector electrode 1013F may have a thickness within a range from about five percent to about forty-five percent of an acoustic wavelength of the main resonant frequency wavelength (e.g., of the main resonant frequency of the bulk acoustic wave resonator 1000F). For example, remainder bottom metal acoustic reflector electrode layers of the bottom distributed Bragg acoustic reflector electrode 1013F may have respective remainder layer thicknesses within a range from approximately five percent to about twenty-five percent of an acoustic wavelength of the main resonant frequency.

In another example, the bottom distributed Bragg acoustic reflector electrode 1013F may comprise first, second, third and fourth pairs of bottom metal acoustic reflector electrode layers, in which members of the comprises first, second, third and fourth pairs of bottom metal electrode layers have respective thicknesses within a range from approximately five percent to about forty-five percent of a wavelength (e.g., of the main resonant frequency of the bulk acoustic wave resonator 1000F).

The bottom distributed Bragg acoustic reflector electrode 1013F may comprise first and second pairs of bottom metal acoustic reflector electrode layers having alternating acoustic impedances. Further, the bottom distributed Bragg acoustic reflector electrode 1013F may comprise first, second and third pairs of bottom metal acoustic reflector electrode layers having alternating acoustic impedances. Moreover the bottom distributed Bragg acoustic reflector electrode 1013F may comprise first, second, third and fourth pairs of bottom metal acoustic reflector electrode layers having alternating acoustic impedances. In other words, the bottom distributed Bragg acoustic reflector electrode 1013F may comprise a bottom multilayer metal acoustic reflector electrode 1013F (e.g., having alternating acoustic impedances).

FIG. 1AB shows bulk acoustic wave resonator 1000W. Bulk acoustic wave resonator 1000W may comprise alternating axis piezoelectric volume 1004W sandwiched between bottom multi-layer acoustic reflector 1013W and top multi-layer acoustic reflector 1015W. Bottom multi-layer acoustic reflector 1013W may comprise a bottom electrode layer. Bottom multi-layer acoustic reflector 1013W may comprise a bottom current spreading layer 1035W. A first seed layer 1003F may be interposed between the bottom acoustic reflector 1013W and substrate 1001W (e.g., silicon substrate 1001W).

The top multi-layer acoustic reflector 1015W may approximate a top distributed Bragg reflector 1015W (e.g., a top distributed Bragg acoustic reflector 1015W). Accordingly, the top multi-layer acoustic reflector 1015W may comprise alternating high/low acoustic impedance layers. The alternating high/low acoustic impedance layers may have respective thicknesses of approximately a quarter wavelength (e.g., quarter acoustic wavelength) of the main resonant frequency of the resonant piezoelectric volume 1004W.

The top multi-layer acoustic reflector 1015W may comprise a plurality of top metal electrode layers. The top multi-layer acoustic reflector 1015W may comprise a top current spreading layer 1071W. The top multi-layer acoustic reflector 1015W may be a top multi-layer metal acoustic reflector 1015W (e.g., a top multi-layer metal acoustic reflector electrode 1015W). A plurality of top metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The top multi-layer metal acoustic reflector 1015W may approximate the top distributed Bragg reflector 1015W (e.g., the top distributed Bragg acoustic reflector 1015W). The alternating high/low acoustic impedance metal electrode layers may have respective thicknesses of approximately a quarter wavelength (e.g., quarter acoustic wavelength) of the main resonant frequency of the resonant piezoelectric volume 1004W.

For example, top multi-layer acoustic reflector 1015W (e.g., a top multi-layer metal acoustic reflector electrode 1015W) may comprise a top first reflector layer 1037W (e.g., initial top reflector layer 1037W, e.g., top first metal acoustic reflector electrode layer 1037W, e.g., top first high acoustic impedance metal electrode layer 1037W, e.g., top first Tungsten (W) electrode layer 1037W). Top first reflector layer 1037W (e.g., initial top reflector layer 1037W, e.g., top first metal acoustic reflector electrode layer 1037W, e.g., top first high acoustic impedance metal electrode layer 1037W, e.g., top first Tungsten (W) electrode layer 1037W) may have a thickness of approximately a quarter wavelength (e.g., quarter acoustic wavelength) of the main resonant frequency of the resonant piezoelectric volume 1004W.

Top multi-layer acoustic reflector 1015W (e.g., a top multi-layer metal acoustic reflector electrode 1015W) may further comprise a top second reflector layer 1039W (e.g., additional top reflector layer 1039W, e.g., top second metal acoustic reflector electrode layer 1039W, e.g., top second high acoustic impedance metal electrode layer 1039W, e.g., top second Tungsten (W) electrode layer 1039W). Top second reflector layer 1039W (e.g., additional top reflector layer 1039W, e.g., top second metal acoustic reflector electrode layer 1039W, e.g., top second high acoustic impedance metal electrode layer 1039W, e.g., top second Tungsten (W) electrode layer 1039F) may have a thickness of approximately a quarter wavelength (e.g., quarter acoustic wavelength) of the main resonant frequency of the resonant piezoelectric volume 1004W.

Top first piezoelectric layer 1038W and top second piezoelectric layer 1038WW may comprise piezoelectric material e.g., Aluminum Nitride. Top first piezoelectric layer 1038W and top second piezoelectric layer 1038WW may have respective lower (e.g., contrasting) acoustic impedances than respective relatively higher acoustic impedances of the top first reflector layer 1037W and top second reflector layer 1039W. For example, top first piezoelectric layer 1038W and top second piezoelectric layer 1038WW may have respective lower (e.g., contrasting) acoustic impedances than respective relatively higher acoustic impedances of initial top reflector layer 1037W and additional top reflector layer 1039W. For example, top first piezoelectric layer 1038W and top second piezoelectric layer 1038WW may have respective lower (e.g., contrasting) acoustic impedances than relatively higher respective acoustic impedances of top first metal acoustic reflector electrode layer 1037W. For example, top first piezoelectric layer 1038W and top second piezoelectric layer 1038WW may have lower (e.g., contrasting) respective acoustic impedances than that of top first high acoustic impedance metal electrode layer 1037W and top second high acoustic impedance metal electrode layer 1039W. For example, top first Aluminum Nitride piezoelectric layer 1038W and top second Aluminum Nitride piezoelectric layer 1038WW may have lower (e.g., contrasting) respective acoustic impedances than that of top first Tungsten (W) electrode layer 1037W and top second Tungsten (W) electrode layer 1037W). (In other alternative examples, Titanium (Ti) may be used as a relatively low acoustic impedance material, and top first Aluminum Nitride piezoelectric layer 1038W may be used as a relatively higher acoustic impedance material. In yet other alternative examples, top first Aluminum Nitride piezoelectric layer 1038W may be placed at an interface between relatively low acoustic impedance material layer (e.g., Titanium (Ti) layer) and relatively high acoustic impedance material layer (e.g., Tungsten (W) layer)).

Further, top first quarter acoustic wavelength thick piezoelectric layer 1038W, e.g., having relatively low acoustic impedance, may be sandwiched between relatively high acoustic impedance, quarter acoustic wavelength thick top first metal (e.g., Tungsten) acoustic reflector electrode layer 1037W, and relatively high acoustic impedance, quarter acoustic wavelength thick top second metal (e.g., Tungsten) acoustic reflector electrode layer 1039W, of the top distributed Bragg acoustic reflector electrode 1015W (e.g., top multi-layer metal acoustic reflector electrode 1015W). In other words, it should be understood that top first piezoelectric layer 1038W may form a portion of top distributed Bragg acoustic reflector electrode 1015W. In particular, since top first piezoelectric layer 1038W may be sandwiched between a pair of relatively high acoustic impedance metal (e.g., Tungsten) reflector electrode layers 1037W, 1039W, and since acoustic impedance of top first piezoelectric layer 1038W (e.g., piezoelectric layer comprising Aluminum Nitride) is substantially lower (e.g., contrasting) relative to the pair of relatively high acoustic impedance metal (e.g., Tungsten) reflector electrode layers 1037W, 1039W, top first piezoelectric layer 1038W may substantially contribute to approximating the top distributed Bragg acoustic reflector electrode 1015W. Moreover, top first piezoelectric layer 1038W may substantially contribute to acoustic wave reflectivity of the top distributed Bragg acoustic reflector electrode 1015W. Further, since top first piezoelectric layer 1038W may have a thickness of approximately a quarter acoustic wavelength sandwiched between the pair of relatively high acoustic impedance metal (e.g., Tungsten) reflector electrode layers 1037W, 1039W having respective thicknesses of approximately the quarter acoustic wavelength, top first piezoelectric layer 1038W may substantially contribute to approximating the top distributed Bragg acoustic reflector electrode 1015W. Moreover, top first piezoelectric layer 1038W may substantially contribute to acoustic wave reflectivity of the top distributed Bragg acoustic reflector electrode 1015W.

Similarly top second quarter acoustic wavelength thick piezoelectric layer 1038WW, e.g., having relatively low acoustic impedance, may be sandwiched between relatively high acoustic impedance, quarter acoustic wavelength thick top second metal (e.g., Tungsten) acoustic reflector electrode layer 1039W, and another relatively high acoustic impedance, quarter acoustic wavelength thick top metal (e.g., Tungsten) acoustic reflector electrode layer of remainder reflector layers 1015WW of the top distributed Bragg acoustic reflector electrode 1015W (e.g., of top multi-layer metal acoustic reflector electrode 1015W). Accordingly, top second piezoelectric layer 1038WW, e.g., having relatively low acoustic impedance, may be sandwiched between a pair of relatively high acoustic impedance metal (e.g., Tungsten) reflector electrode layers, e.g., said pair comprising top second metal (e.g., Tungsten) acoustic reflector electrode layer 1039W, and another relatively high acoustic impedance metal (e.g., Tungsten) acoustic reflector electrode layer, e.g., of the remainder reflector layers 1015WW of the top distributed Bragg acoustic reflector electrode 1015W (e.g., of top multi-layer metal acoustic reflector electrode 1015W).

In other words, it should be understood that top second piezoelectric layer 1038WW may form a portion of top distributed Bragg acoustic reflector electrode 1015W. In particular, since top second piezoelectric layer 1038WW may be sandwiched between the pair of relatively high acoustic impedance metal (e.g., Tungsten) reflector electrode layers just discussed, and since acoustic impedance of top second piezoelectric layer 1038WW (e.g., piezoelectric layer comprising Aluminum Nitride) is substantially lower (e.g., contrasting) relative to the pair of relatively high acoustic impedance metal (e.g., Tungsten) reflector electrode layers, top second piezoelectric layer 1038WW may substantially contribute to approximating the top distributed Bragg acoustic reflector electrode 1015W. Moreover, top second piezoelectric layer 1038WW may substantially contribute to acoustic wave reflectivity of the top distributed Bragg acoustic reflector electrode 1015W. Further, since top second piezoelectric layer 1038WW may have a thickness of approximately a quarter acoustic wavelength sandwiched between the pair of relatively high acoustic impedance metal (e.g., Tungsten) reflector electrode layers having respective thicknesses of approximately the quarter acoustic wavelength, top second piezoelectric layer 1038WW may substantially contribute to approximating the top distributed Bragg acoustic reflector electrode 1015W. Moreover, top second piezoelectric layer 1038WW may substantially contribute to acoustic wave reflectivity of the top distributed Bragg acoustic reflector electrode 1015W.

Additionally, it should be understood that top first piezoelectric layer 1038W and top first piezoelectric layer 1038WW, are —active-, e.g., top first-active-piezoelectric layer 1038W, e.g., top second-active-piezoelectric layer 1038WW. In addition to forming respective portions of top multilayer acoustic reflector 1015W, top first-active-piezoelectric layer 1038W and top second-active-piezoelectric layer 1038WW may form respective —active-portions of alternating axis piezoelectric volume 1004W. In operation of bulk acoustic wave resonator 1000W, an oscillating electric field may be applied, e.g., via top current spreading layer 1071W and bottom current spreading layer 1035W, so as to —activate-responsive piezoelectric acoustic oscillations (e.g., the main resonant mode) in top first active piezoelectric layer 1038W, in top second active piezoelectric layer 1038WW, and in half acoustic wavelength thick piezoelectric layers of alternating axis piezoelectric volume 1004W (e.g., example four central half acoustic wavelength thick piezoelectric layers of alternating axis piezoelectric volume 1004W, as discussed previously herein). For example, alternating axis piezoelectric volume 1004W may comprise a fourth central half acoustic wavelength thick piezoelectric layer having a normal piezoelectric axis orientation (e.g., top half acoustic wavelength thick piezoelectric layer having a normal piezoelectric axis orientation). Top first active piezoelectric layer 1038W and top second active piezoelectric layer 1038WW may have the reverse piezoelectric axis orientation (as depicted using upward pointed arrows).

In the alternating axis piezoelectric volume 1004W, top first reflector layer 1037W may be interposed between top active piezoelectric layer 1038W having the reverse piezoelectric axis orientation and the top central piezoelectric layer (e.g., fourth central piezoelectric layer, e.g., fourth half acoustic wavelength thick piezoelectric layer) having the normal piezoelectric axis orientation. In the alternating axis piezoelectric volume 1004W, top second reflector layer 1039W may be interposed between top first active piezoelectric layer 1038W having the reverse piezoelectric axis orientation and the top second active piezoelectric layer 1038WW having the reverse piezoelectric axis orientation.

In the alternating axis piezoelectric volume 1004W, top first active piezoelectric layer 1038W having the reverse piezoelectric axis orientation may be arranged over the top piezoelectric layer (e.g., top half acoustic wavelength thick piezoelectric layer, e.g., fourth half acoustic wavelength thick piezoelectric layer) having the normal piezoelectric axis orientation (e.g., proximate to the fourth piezoelectric layer having the normal piezoelectric axis orientation). The reverse piezoelectric axis orientation of the top first active piezoelectric layer 1038W may substantially oppose the normal piezoelectric orientation of the top half acoustic wave thick piezoelectric layer of the alternating axis piezoelectric volume 1004W. Similarly, the reverse piezoelectric axis orientation of the top second active piezoelectric layer 1038WW may substantially oppose the normal piezoelectric orientation of the top half acoustic wave thick piezoelectric layer of the alternating axis piezoelectric volume 1004W.

The top half acoustic wave thick piezoelectric layer (e.g., fourth half acoustic wave thick piezoelectric layer) having the normal piezoelectric axis orientation may be interposed between the top first active piezoelectric layer 1038W, e.g., having the reverse piezoelectric axis orientation, and the second middle half acoustic wavelength thick piezoelectric layer, e.g., having the reverse piezoelectric axis orientation, so that the normal piezoelectric orientation of the top half acoustic wavelength thick piezoelectric layer may substantially oppose the reverse piezoelectric axis orientation of the top first active piezoelectric layer 1038W and the reverse piezoelectric axis orientation of second middle half acoustic wavelength thick piezoelectric layer in the alternating axis arrangement (e.g., in the alternating axis piezoelectric volume 1004W).

As just discussed, the top first active piezoelectric layer 1038W and the top second active piezoelectric layer 1038WW may, for example, form a portion of the alternating axis piezoelectric volume 1004W (e.g., the alternating axis piezoelectric volume 1004W may comprise the top active piezoelectric layer 1038F). Further, as discussed previously herein, the top first active piezoelectric layer 1038W and the top second active piezoelectric layer 1038WW may have a contrasting/relatively low acoustic impedance and may have a quarter acoustic wavelength thickness. Accordingly, the top first active piezoelectric layer 1038W and the top second active piezoelectric layer 1038WW may, for example, form a portion of the top distributed Bragg acoustic reflector electrode 1015W (e.g., the top distributed Bragg acoustic reflector electrode 1015W may comprise the top first active piezoelectric layer 1038W and the top second active piezoelectric layer 1038WW).

In other words, there may be top overlap (e.g., comprising the top first active piezoelectric layer 1038W and the top second active piezoelectric layer 1038WW) between the alternating axis piezoelectric volume 1004W and the top distributed Bragg acoustic reflector electrode 1015W. Accordingly, in view of this top overlap, in representatively illustrative FIG. 1AB, top multi-layer acoustic reflector 1015W is depicted in solid line, with overlapping alternating axis piezoelectric volume 1004W and overlapping top first active piezoelectric layer 1038W and overlapping top second active piezoelectric layer 1038WW shown as overlapping and depicted in dashed line. The top distributed Bragg acoustic reflector electrode 1015W, for example, comprising the top first and second active piezoelectric layers 1038W, 1038WW, e.g., the top first and second active piezoelectric layers 1038W, 1038WW forming respective portions of the top distributed Bragg acoustic reflector electrode 1015W, may but need not facilitate a quality factor enhancement of the bulk acoustic wave resonator 1000W.

The alternating axis piezoelectric volume 1004W, for example, comprising the top first and second active piezoelectric layers 1038W, 1038WW, e.g., the top first and second active piezoelectric layers 1038W, 1038WW forming respective portions of the alternating axis piezoelectric volume 1004W, e.g., the top first and second active piezoelectric layer 1038W, 1038WW having the reverse piezoelectric axis orientation substantially opposing the normal piezoelectric axis orientation of the proximate (e.g., adjacent) fourth half acoustic wavelength thick piezoelectric layer, may but need not facilitate an enhancement in an electromechanical coupling of the bulk acoustic wave resonator 1000W.

In an alternative example, the top first and second active piezoelectric layers 1038W, 1038WW may instead have a —normal-piezoelectric axis orientation. In the alternative example, the top first and second active piezoelectric layers 1038W, 1038WW having the normal piezoelectric axis orientation may be orientated substantially the same as the normal piezoelectric axis orientation of the proximate (e.g., adjacent) fourth half acoustic wavelength thick piezoelectric layer. This may, but need not, facilitate a reduction in the electromechanical coupling of the bulk acoustic wave resonator 1000W.

Further, although the top first and second active piezoelectric layers 1038W, 1038WW has been described as having, for example, a thickness of about a quarter acoustic wavelength (e.g., of the main resonant frequency of the bulk acoustic wave resonator 1000W), the thickness of the top first and second active piezoelectric layers 1038W, 1038WW may be varied. For example, the top first and second active piezoelectric layers 1038W, 1038WW of the top distributed Bragg acoustic reflector electrode 1015W may have respective thicknesses within a range from about five percent to about twenty-five percent of an acoustic wavelength of the main resonant frequency wavelength (e.g., of the main resonant frequency of the bulk acoustic wave resonator 1000W). For example, the top first and second active piezoelectric layers 1038W, 1038WW of the top distributed Bragg acoustic reflector electrode 1015W may have respective thicknesses that are less than about five percent of the acoustic wavelength of the main resonant frequency wavelength (e.g., of the main resonant frequency of the bulk acoustic wave resonator 1000W).

Top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) may be present in the alternating axis piezoelectric volume 1004W. For example, top first reflector layer 1037W may be interposed between the top first active piezoelectric layer 1038F and the fourth half acoustic wavelength thick piezoelectric layer, e.g., top first reflector layer 1037F may interface with (e.g., may be acoustically coupled with) the top active piezoelectric layer 1038F and the fourth half acoustic wavelength thick piezoelectric layer of the alternating axis piezoelectric volume 1004W. Accordingly, top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) may form respective portions of the alternating axis piezoelectric volume 1004W.

Top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) may be present in the top distributed Bragg acoustic reflector electrode 1015W. Specifically, top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) may have respective thicknesses of about a quarter acoustic wavelength, and may have the contrasting/relatively high acoustic impedance, for example, relative to relatively low acoustic impedance of adjacent, quarter acoustic wavelength thick top first and second active piezoelectric layers 1038W, 1038WW. Accordingly, top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) may form respective portions of example top distributed Bragg acoustic reflector electrode 1015W.

In other words, there may be top overlap (e.g., comprising top first and second reflector layers 1037W, 1039W) between the alternating axis piezoelectric volume 1004W and the top distributed Bragg acoustic reflector electrode 1015W. Accordingly, in view of this top overlap, in representatively illustrative FIG. 1AB, top multi-layer acoustic reflector 1015W is depicted in solid line, with overlapping alternating axis piezoelectric volume 1004W and overlapping top first and second reflector layers 1037W, 1038W shown as overlapping and depicted in dashed line.

The alternating axis piezoelectric volume 1004W comprising the top first and second reflector layers 1037W, 1039W, e.g., the top first and second reflector layers 1037W, 1039W forming respective portions of alternating axis piezoelectric volume 1004W, may but need not facilitate a quality factor enhancement of the bulk acoustic wave resonator 1000W.

Although top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) have been described as having, for example, respective thicknesses of about a quarter acoustic wavelength (e.g., of the main resonant frequency of the bulk acoustic wave resonator 1000W), the thickness of the top first and second reflector layers 1037W, 1039W may be varied. For example, top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) of the top distributed Bragg acoustic reflector electrode 1015W may have a thickness within a range from about five percent to about twenty-five percent of an acoustic wavelength of the main resonant frequency wavelength (e.g., of the main resonant frequency of the bulk acoustic wave resonator 1000W).

In another alternative example, top first and second reflector layers 1037W, 1039W (e.g., top first and second metal acoustic reflector electrode layers 1037W, 1039W, e.g., top first and second high acoustic impedance metal electrode layers 1037W, 1039W, e.g., top first and second Tungsten (W) electrode layers 1037W, 1039W) of the top distributed Bragg acoustic reflector electrode 1015W may have respective thicknesses within a range from about five percent to about forty-five percent of an acoustic wavelength of the main resonant frequency wavelength (e.g., of the main resonant frequency of the bulk acoustic wave resonator 1000W). Adjacent top remainder metal acoustic reflector electrode layers 1015WW of the top distributed Bragg acoustic reflector electrode 1015W may have respective remainder layer thicknesses within a range from approximately five percent to about twenty-five percent of an acoustic wavelength of the main resonant frequency.

The bottom multi-layer acoustic reflector 1013W shown in FIG. 1AB may comprise a plurality of bottom metal electrode layers. The bottom multi-layer acoustic reflector 1013W may comprise a bottom current spreading layer 1035W. The bottom multi-layer acoustic reflector 1013W may be a bottom multi-layer metal acoustic reflector 1013W (e.g., a bottom multi-layer metal acoustic reflector electrode 1013W). A plurality of bottom metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The bottom multi-layer metal acoustic reflector 1013W may approximate the bottom distributed Bragg reflector 1013W (e.g., the bottom distributed Bragg acoustic reflector 1013W). The alternating high/low acoustic impedance metal electrode layers may have respective thicknesses of approximately a quarter wavelength (e.g., quarter acoustic wavelength) of the main resonant frequency of the resonant piezoelectric volume 1004W.

For example, bottom multi-layer acoustic reflector 1013W (e.g., bottom multi-layer metal acoustic reflector electrode 1013W) may comprise bottom first and second reflector layers 1017W, 1019W (e.g., bottom first and second metal acoustic reflector electrode layers 1017W, 1019W, e.g., bottom first and second high acoustic impedance metal electrode layers 1017W, 1019W, e.g., bottom first and second Tungsten (W) electrode layers 1017W, 1019W). Bottom first and second reflector layers 1017W (e.g., bottom first and second metal acoustic reflector electrode layers 1017W, 1019W, e.g., bottom first and second high acoustic impedance metal electrode layers 1017W, 1019W, e.g., bottom first and second Tungsten (W) electrode layers 1017W, 1019W) may have respective thicknesses of approximately a quarter wavelength (e.g., quarter acoustic wavelength) of the main resonant frequency of the resonant piezoelectric volume 1004W.

Bottom first and second piezoelectric layers 1018W, 1018WW may comprise piezoelectric material e.g., Aluminum Nitride. Bottom first and second piezoelectric layers 1018W, 1018WW may have relatively lower (e.g., contrasting) respective acoustic impedances than relatively higher acoustic impedances of bottom first and second reflector layers 1017W, 1019W. For example, bottom first and second piezoelectric layers 1018W, 1018WW may have lower (e.g., contrasting) respective acoustic impedances than relatively higher respective acoustic impedances of bottom first and second reflector layers 1017W, 1019W. For example, bottom first and second piezoelectric layers 1018W, 1018WW may have lower (e.g., contrasting) respective acoustic impedance than relatively higher respective acoustic impedances of bottom first and second metal acoustic reflector electrode layers 1017W, 1019W. For example, bottom first and second piezoelectric layers 1018W, 1018WW may have lower (e.g., contrasting) respective acoustic impedances than bottom first and second high acoustic impedance metal acoustic reflector electrode layers 1017W, 1019W. For example, bottom first and second Aluminum Nitride piezoelectric layers 1018W, 1018WW may have lower (e.g., contrasting) respective acoustic impedances than bottom first and second Tungsten (W) electrode layers 1017W, 1019W).

Further, bottom first and second quarter acoustic wavelength thick piezoelectric layers 1018W, 1018WW, e.g., having relatively low acoustic impedance, may be interleaved with relatively high acoustic impedance, quarter acoustic wavelength thick bottom first and second metal (e.g., Tungsten) acoustic reflector electrode layers 1017W, 1019W of the bottom distributed Bragg acoustic reflector electrode1013W (e.g., bottom multi-layer metal acoustic reflector electrode 1013W). In other words, it should be understood that bottom first and second piezoelectric layers 1018W, 1018WW may form respective portions of bottom distributed Bragg acoustic reflector electrode 1013W. In particular, since bottom first and second piezoelectric layers 1018W, 1018WW may be interleaved a pair of relatively high acoustic impedance metal (e.g., Tungsten) reflector electrode layers 1017W, 1019W, and since respective acoustic impedances of bottom first and second piezoelectric layers 1018W, 1018WW (e.g., bottom first and second piezoelectric layers 1018W, 1018WW comprising Aluminum Nitride) are substantially lower (e.g., contrasting) relative to the pair of relatively high acoustic impedance metal (e.g., Tungsten) reflector electrode layers 1017W, 1018W, bottom first and second piezoelectric layers 1018W, 1018WW may substantially contribute to approximating the bottom distributed Bragg acoustic reflector electrode 1013W, and moreover, bottom piezoelectric layer 1018F may substantially contribute to acoustic wave reflectivity of the bottom distributed Bragg acoustic reflector electrode 1013W. Further, since bottom first and second piezoelectric layers 1018W, 1018WW may have respective thicknesses of approximately a quarter acoustic wavelength interleaved the pair of relatively high acoustic impedance metal (e.g., Tungsten) reflector electrode layers 1017W, 1018W having respective thicknesses of approximately the quarter acoustic wavelength, bottom first and second piezoelectric layers 1018W, 1018WW may substantially contribute to approximating the distributed Bragg acoustic reflector electrode 1013W, and moreover, bottom first and second piezoelectric layer 1018W, 1018WW may substantially contribute to acoustic wave reflectivity of the bottom distributed Bragg acoustic reflector electrode 1013W.

Additionally, it should be understood that bottom first and second piezoelectric layers 1018W, 1018WW are bottom first and second-active-piezoelectric layers 1018W, 1018WW. In addition to forming respective portions of bottom multilayer acoustic reflector 1013W, bottom first and second-active-piezoelectric layers 1018W, 1018WW form respective —active-portions of alternating axis piezoelectric volume 1004W. In operation of bulk acoustic wave resonator 1000W, an oscillating electric field may be applied, e.g., via top current spreading layer 1071W and bottom current spreading layer 1035W, so as to —activate-responsive piezoelectric acoustic oscillations (e.g., the main resonant mode) in bottom first and second active piezoelectric layers 1018W, 1018WW and in half acoustic wavelength thick piezoelectric layers of alternating axis piezoelectric volume 1004W (e.g., example four half acoustic wavelength thick piezoelectric layers of alternating axis piezoelectric volume 1004W, already discussed). As mentioned previously herein, alternating axis piezoelectric volume 1004W may comprise a first half acoustic wavelength thick piezoelectric layer having a reverse piezoelectric axis orientation (e.g., bottom half acoustic wavelength thick piezoelectric layer having a reverse piezoelectric axis orientation). Bottom first and second active piezoelectric layers 1018W, 1018WW may have respective normal piezoelectric axis orientation (e.g., as illustrated by downward pointing arrows). In the alternating axis piezoelectric volume 1004W, bottom first and second reflector layers 1017W, 1019W may be interleaved with bottom first and second active piezoelectric layers 1018W, 1018WW having the normal piezoelectric axis orientation.

In the alternating axis piezoelectric volume 1004W, bottom first and second active piezoelectric layers 1018W, 1018WW having respective normal piezoelectric axis orientations may be arranged proximate to the bottom half acoustic wavelength thick piezoelectric layer having the reverse piezoelectric axis orientation. The respective normal piezoelectric axis orientations of the bottom first and second active piezoelectric layers 1018W, 1018WW may substantially oppose the reverse piezoelectric orientation of bottom half acoustic wavelength thick piezoelectric layer of the alternating axis piezoelectric volume 1004W. The bottom piezoelectric layer having the reverse piezoelectric axis orientation may be interposed between the first middle half acoustic wavelength thick piezoelectric layer having the normal piezoelectric axis orientation and the bottom first and second active piezoelectric layers 1018W, 1018WW having respective normal piezoelectric axis orientations, so that the reverse piezoelectric orientation of bottom half acoustic wavelength thick piezoelectric layer may substantially oppose the normal piezoelectric axis orientation of the bottom first and second active piezoelectric layer 1018W, 1018WW and the normal piezoelectric axis orientation of first middle half acoustic wavelength thick piezoelectric layer in the alternating axis arrangement (e.g., in the alternating axis piezoelectric volume 1004W).

As just discussed, the bottom first and second active piezoelectric layers 1018W, 1018WW may, for example, form a portion of the alternating axis piezoelectric volume 1004W (e.g., the alternating axis piezoelectric volume 1004W may comprise the bottom and second active piezoelectric layers 1018W, 1018WW). Further, as discussed previously herein, the bottom first and second active piezoelectric layers 1018W, 1018WW may have respective contrasting/relatively low acoustic impedances and may have respective quarter acoustic wavelength thicknesses. Accordingly the bottom first and second active piezoelectric layer 1018W, 1018WW may, for example, form respective portions of bottom distributed Bragg acoustic reflector electrode 1013W (e.g., bottom distributed Bragg acoustic reflector electrode 1013W may comprise the bottom first and second active piezoelectric layers 1018W, 1018WW).

In other words, there may be a bottom overlap (e.g., comprising the bottom first and second active piezoelectric layers 1018W, 1018WW) between the alternating axis piezoelectric volume 1004W and the bottom distributed Bragg acoustic reflector electrode 1013W. Accordingly, in view of this bottom overlap, in representatively illustrative FIG. 1AB, bottom multi-layer acoustic reflector 1013W is depicted in solid line, with overlapping alternating axis piezoelectric volume 1004W and overlapping bottom first active piezoelectric layer 1018W and overlapping bottom second active piezoelectric layer 1018WW shown as overlapping and depicted in dashed line.

The bottom distributed Bragg acoustic reflector electrode 1013W, for example, comprising the bottom first and second active piezoelectric layers 1018W, 1018WW, e.g., the bottom first and second active piezoelectric layers 1018W, 1018W forming respective portions of the bottom distributed Bragg acoustic reflector electrode 1013W, may but need not facilitate a quality factor enhancement of the bulk acoustic wave resonator 1000W. Further, the bottom first and second active piezoelectric layers 1018W, 1018WW of the bottom distributed Bragg acoustic reflector electrode 1013W may facilitate respective grain orientations of the bottom first and second metal acoustic reflector electrode layers 1017W, 1019W. Moreover, the bottom first and second active piezoelectric layers 1018W, 1018W may facilitate crystal quality enhancement of the adjacent bottom half acoustic wavelength thick piezoelectric layer of the alternating axis piezoelectric volume 1004W, via grain orientation of the bottom first and second metal acoustic reflector electrode layers 1017W, 1019W.

The alternating axis piezoelectric volume 1004W, for example, comprising the bottom first and second active piezoelectric layers 1018W, 1018WW, e.g., the bottom first and second active piezoelectric layers 1018W, 1018WW forming respective portions of the alternating axis piezoelectric volume 1004W, e.g., the bottom first and second active piezoelectric layers 1018W, 1018WW having respective normal piezoelectric axis orientations substantially opposing the reverse piezoelectric axis orientation of the proximate (e.g., adjacent) bottom half acoustic wavelength thick piezoelectric layer, may but need not facilitate an enhancement in an electromechanical coupling of the bulk acoustic wave resonator 1000W.

In an alternative example, the bottom and second active piezoelectric layers 1018W, 1018WW may instead have —reverse-piezoelectric axis orientations. In the alternative example, the bottom first and second active piezoelectric layers 1018W, 1018WW having the reverse piezoelectric axis orientation may be orientated substantially the same as the reverse piezoelectric axis orientation of the proximate (e.g., adjacent) bottom half acoustic wavelength thick piezoelectric layer. This may, but need not, facilitate a reduction in the electromechanical coupling of the bulk acoustic wave resonator 1000W.

Further, although the bottom first and second active piezoelectric layers 1018W, 1018WW have been described as having, for example, respective thicknesses of about a quarter acoustic wavelength (e.g., of the main resonant frequency of the bulk acoustic wave resonator 1000W), the respective thicknesses of the bottom first and second active piezoelectric layer 1018W, 1018WW may be varied. For example, the bottom first and second active piezoelectric layers 1018W, 1018WW of the bottom distributed Bragg acoustic reflector electrode 1013W may have respective thicknesses within a range from about five percent to about twenty-five percent of an acoustic wavelength of the main resonant frequency wavelength (e.g., of the main resonant frequency of the bulk acoustic wave resonator 1000W). For example, the bottom first and second active piezoelectric layers 1018W, 1018WW of the bottom distributed Bragg acoustic reflector electrode 1013W may have respective thicknesses that may be less than about five percent of the acoustic wavelength of the main resonant frequency wavelength (e.g., of the main resonant frequency of the bulk acoustic wave resonator 1000W).

Bottom first and second reflector layers 1017W, 1019W may be present in the alternating axis piezoelectric volume 1004W. For example, bottom first and second reflector layers 1017W, 1019W may be interleaved with the bottom first and second active piezoelectric layers 1018W, 1018WW and the bottom half acoustic wavelength thick piezoelectric layer. Accordingly, bottom first and second reflector layers 1017W, 1019W may form respective portions of the alternating axis piezoelectric volume 1004W.

Bottom first and second reflector layers 1017W, 1019W may be present in the bottom distributed Bragg acoustic reflector electrode 1013W. Specifically, bottom first and second reflector layers 1017W, 1019W may have respective thicknesses of about a quarter acoustic wavelength, and may have the contrasting/relatively high respective acoustic impedances, relative to relatively low respective acoustic impedances of adjacent, quarter acoustic wavelength thick bottom first and second active piezoelectric layers 1018W, 1018WW. Accordingly, bottom first and second reflector layers 1017W, 1019W may form respective portions of example bottom distributed Bragg acoustic reflector electrode 1013W.

In other words, there may be bottom overlap (e.g., comprising the bottom first and second reflector layers 1017W, 1019W) between the alternating axis piezoelectric volume 1004W and the bottom distributed Bragg acoustic reflector electrode 1013W. Accordingly, in view of this bottom overlap, in representatively illustrative FIG. 1AB, bottom multilayer acoustic reflector 1013W is depicted in solid line, with overlapping alternating axis piezoelectric volume 1004W and overlapping first reflector layer 1017W and overlapping second reflector layer 1019W are shown as overlapping and depicted in dashed line.

The alternating axis piezoelectric volume 1004W comprising the bottom first and second reflector layers 1017W, 1019W e.g., the bottom first and second reflector layers 1017W, 1019W forming respective portions of alternating axis piezoelectric volume 1004W, may but need not facilitate a quality factor enhancement of the bulk acoustic wave resonator 1000W.

Although bottom first and second reflector layers 1017W, 1019W have been described as having, for example, respective thicknesses of about a quarter acoustic wavelength (e.g., of the main resonant frequency of the bulk acoustic wave resonator 1000W), respective thickness of the bottom first and second reflector layers 1017W, 1019W may be varied. For example, bottom first and second reflector layers 1017W, 1019W of the bottom distributed Bragg acoustic reflector electrode 1013W may have respective thicknesses within a range from about five percent to about twenty-five percent of an acoustic wavelength of the main resonant frequency wavelength (e.g., of the main resonant frequency of the bulk acoustic wave resonator 1000W).

In another example, bottom first and second reflector layers 1017W, 1019W of the bottom distributed Bragg acoustic reflector electrode 1013W may have respective thicknesses within a range from about five percent to about forty-five percent of an acoustic wavelength of the main resonant frequency wavelength (e.g., of the main resonant frequency of the bulk acoustic wave resonator 1000W). Remainder bottom metal acoustic reflector electrode layers 1013WW of the bottom distributed Bragg acoustic reflector electrode 1013W may have respective remainder layer thicknesses within a range from approximately five percent to about twenty-five percent of an acoustic wavelength of the main resonant frequency.

In another example, the bottom distributed Bragg acoustic reflector electrode 1013W may comprise first, second, third and fourth pairs of bottom metal acoustic reflector electrode layers. First, second, third and fourth pairs of bottom metal electrode layers may have respective thicknesses within a range from approximately five percent to about forty-five percent of a wavelength (e.g., of the main resonant frequency of the bulk acoustic wave resonator 1000W).

The bottom distributed Bragg acoustic reflector electrode 1013W may comprise first and second pairs of bottom metal acoustic reflector electrode layers having alternating acoustic impedances. Further, the bottom distributed Bragg acoustic reflector electrode 1013W may comprise first, second and third pairs of bottom metal acoustic reflector electrode layers having alternating acoustic impedances. Moreover the bottom distributed Bragg acoustic reflector electrode 1013W may comprise first, second, third and fourth pairs of bottom metal acoustic reflector electrode layers having alternating acoustic impedances. In other words, the bottom distributed Bragg acoustic reflector electrode 1013W may comprise a bottom multilayer metal acoustic reflector electrode 1013W (e.g., having alternating acoustic impedances).

The bottom distributed Bragg acoustic reflector electrode 1013W may comprise a bottom additional reflector layer 1021W (e.g., bottom additional metal acoustic reflector layer 1012W) interposed between a second seed layer 1020W and bottom second active piezoelectric layer 1021W. Second seed layer 1020W may be interposed between bottom additional reflector layer 1021W and bottom remainder reflector layers 1013WW. (In other alternative examples, Titanium (Ti) may be used as a relatively low acoustic impedance material, and bottom first Aluminum Nitride piezoelectric layer 1017W may be used as a relatively higher acoustic impedance material. In yet other alternative examples, bottom first Aluminum Nitride piezoelectric layer 1017W may be placed at an interface between relatively low acoustic impedance material layer (e.g., Titanium (Ti) layer) and relatively high acoustic impedance material layer (e.g., Tungsten (W) layer)).

FIG. 1AC shows six simplified diagrams of multilayer metal acoustic reflector electrodes 1013V and 1013G through 1013K comprising five metal electrode layers in an alternating acoustic impedance arrangement 1075V and 1075G through 1075K (e.g, three Tungsten metal electrode layers alternating with two Titanium layers) over current spreading layers (CSLs) 1035V and 1035F through 1035K. Respective seed layers may be interposed between substrates 1001V and 1001G through 1001K (e.g., silicon substrates 1001V and 1001G through 1001K) and current spreading layers (CSLs) 1035V and 1035G through 1035K. As discussed in detail subsequently herein, current spreading layers (CSLs) 1035V and 1035G through 1035K may comprise a varying number of additional quarter wavelength current spreading layers for use in bulk acoustic wave resonator structures of this disclosure. FIG. 1AC also includes a chart 1077L showing sheet resistance corresponding to the varying number of additional quarter wavelength current spreading layers for the multilayer metal acoustic reflector electrodes 1013V and 1013G through 1013K, with results as expected from simulation. The multilayer metal acoustic reflector electrodes 1013V and 1013G through 1013K shown in FIG. 1AC may be employed in example millimeter acoustic wave resonators (e.g., 24 GigaHertz bulk acoustic wave resonators) of this disclosure, e.g., bulk acoustic wave resonators having main resonant frequencies in a millimeter wave band, e.g., bulk acoustic wave resonators having main resonant frequencies of about 24 GigaHertz. As a general matter, quarter wavelength layer thickness for layers may be understood as corresponding to quarter acoustic wavelength for the main resonant frequency of a given bulk acoustic wave resonator.

For example, a first bottom multilayer metal acoustic reflector electrode 1013V may comprise a first additional quarter wavelength current spreading layer in a first bottom current spreading layer 1035V. First bottom current spreading layer 1035V may be bilayer, for example, comprising a quarter wavelength thick layer of Aluminum (Al) over a quarter wavelength thick layer of Tungsten (W). For example, a second bottom multilayer metal acoustic reflector electrode 1013G may comprise two additional quarter wavelength current spreading layer in a second bottom current spreading layer 1035G. Second bottom current spreading layer 1035G may be bilayer, for example, comprising two quarter wavelength thick layer of Aluminum (Al) over a quarter wavelength thick layer of Tungsten (W). For example, a third bottom multilayer metal acoustic reflector electrode 1013H may comprise three additional quarter wavelength current spreading layer in a third bottom current spreading layer 1035H. Third bottom current spreading layer 1035H may be bilayer, for example, comprising three quarter wavelength thick layer of Aluminum (Al) over a quarter wavelength thick layer of Tungsten (W).

For example, a fourth bottom multilayer metal acoustic reflector electrode 1013I may comprise a fourth additional quarter wavelength current spreading layer in a fourth bottom current spreading layer 1035I. Fourth bottom current spreading layer 1035I may be bilayer, for example, comprising four-quarter wavelength thick layer of Aluminum (Al) over a quarter wavelength thick layer of Tungsten (W). For example, a fifth bottom multilayer metal acoustic reflector electrode 1013J may comprise a sixth additional quarter wavelength current spreading layer in a fifth bottom current spreading layer 1035J. Fifth bottom current spreading layer 1035G may be bilayer, for example, comprising six quarter wavelength thick layer of Aluminum (Al) over a quarter wavelength thick layer of Tungsten (W). For example, a sixth bottom multilayer metal acoustic reflector electrode 1013K may comprise a seventh additional quarter wavelength current spreading layer in a sixth bottom current spreading layer 1035K. Sixth bottom current spreading layer 1035K may be bilayer, for example, comprising seven quarter wavelength thick layer of Aluminum (Al) over a quarter wavelength thick layer of Tungsten (W). Incrementally increasing current spreading layer thickness from the first bottom current spreading layer 1035F to the sixth bottom current spreading layer 1035K may increase thickness, for example may increase current spreading layer thickness of one additional quarter wavelength thickness (e.g., in first bottom current spreading layer 1035F) to seven additional quarter wavelength thickness (e.g., sixth bottom current spreading layer 1035K). This increase in current spreading thickness may increase electrical conductivity, as reflected in decreasing sheet resistance as shown in chart 1077L.

Chart 1077L shows sheet resistance versus varying number of additional quarter wavelength current spreading layers 1079L for the multilayer metal acoustic reflector electrodes 1013V and 1013G through 1013K, with results as expected from simulation. For example, as shown in chart 1077L, simulation predicts sheet resistance of approximately forty-two hundredths of an Ohm per square corresponding to the multilayer metal acoustic reflector electrode 1013V comprising one additional quarter wavelength (Lambda/4) layer in current spreading layer 1035V. For example, as shown in chart 1077L, simulation predicts sheet resistance of approximately twenty-seven hundredths of an Ohm per square corresponding to the multilayer metal acoustic reflector electrode 1013G comprising two additional quarter wavelength (Lambda/4) layers in current spreading layer 1035G. For example, as shown in chart 1077L, simulation predicts sheet resistance of approximately twenty hundredths of an Ohm per square corresponding to the multilayer metal acoustic reflector electrode 1013H comprising three additional quarter wavelength (Lambda/4) layers in current spreading layer 1035H. For example, as shown in chart 1077L, simulation predicts sheet resistance of approximately fifteen hundredths of an Ohm per square corresponding to the multilayer metal acoustic reflector electrode 1013I comprising four additional quarter wavelength (Lambda/4) layers in current spreading layer 1035I. For example, as shown in chart 1077L, simulation predicts sheet resistance of approximately eleven hundredths of an Ohm per square corresponding to the multilayer metal acoustic reflector electrode 1013J comprising six additional quarter wavelength (Lambda/4) layers in current spreading layer 1035J. For example, as shown in chart 1077L, simulation predicts sheet resistance of approximately nine hundredths of an Ohm per square corresponding to the multilayer metal acoustic reflector electrode 1013K comprising seven additional quarter wavelength (Lambda/4) layers in current spreading layer 1035K.

FIG. 1AD shows three simplified diagrams of multilayer metal acoustic reflector electrodes 1013M through 1013O comprising varying number of metal electrode layers in alternating acoustic impedance arrangements 1075M through 1075O. For example, multilayer metal acoustic reflector electrode 1013M comprises a first arrangement 1075M of a Tungsten metal electrode layer over two alternating pairs of Titanium and Tungsten layers. For example, multilayer metal acoustic reflector electrode 1013N comprises a second arrangement 1075N of a Tungsten metal electrode layer over three alternating pairs of Titanium and Tungsten layers. For example, multilayer metal acoustic reflector electrode 1013O comprises a third arrangement 1075O of a Tungsten metal electrode layer over five alternating pairs of Titanium and Tungsten layers. For example, current spreading layers (CSLs) 1035M through 1035O may be bilayer, for example, comprising six quarter wavelength thick layer of Aluminum (Al) over a quarter wavelength thick layer of Tungsten (W). Respective seed layers may be interposed between substrates 1001M through 1001O (e.g., silicon substrates 1001M through 1001O) and current spreading layers (CSLs) 1035M through 1035O.

Two corresponding charts 1077P, 1077Q show acoustic reflectivity versus acoustic frequency, with results as expected from simulation. Chart 1077P shows wideband acoustic reflectivity in a wideband scale ranging from zero to fifty GigaHertz. Chart 1077Q shows acoustic reflectivity in a scale ranging from fourteen to thirty-four GigaHertz. For example, as depicted in solid line and shown in traces 1079P, 1079Q, simulation predicts a peak reflectivity of about 0.99825 at a frequency of about 22.3 GigaHertz for multilayer metal acoustic reflector electrode 1013M comprising the first arrangement 1075M of the Tungsten metal electrode layer over two alternating pairs of Titanium and Tungsten layers, in which the first arrangement 1075M is over current spreading layer (CSL) 1035M. For example, as depicted in dotted line and shown in traces 1081P, 1081Q, simulation predicts a peak reflectivity of about 0.99846 at a frequency of about 22.1 GigaHertz for multilayer metal acoustic reflector electrode 1013N comprising the second arrangement 1075N of the Tungsten metal electrode layer over three alternating pairs of Titanium and Tungsten layers, in which the second arrangement 1075N is over current spreading layer (CSL) 1035N. For example, as depicted in dashed line and shown in traces 1083P, 1083Q simulation predicts a peak reflectivity of about 0.99848 at a frequency of about 20.7 GigaHertz for multilayer metal acoustic reflector electrode 1013O comprising the third arrangement 1075O of the Tungsten metal electrode layer over five alternating pairs of Titanium and Tungsten layers, in which the third arrangement 1075O is over current spreading layer (CSL) 1035O. As shown in charts 1077P, 1077Q, acoustic reflectivity may increase with increasing number of pairs of alternating acoustic impedance metal layers.

FIG. 1A is a diagram that illustrates an example bulk acoustic wave resonator structure 100. FIGS. 4A through 4G show alternative example bulk acoustic wave resonators, 400A through 400G, to the example bulk acoustic wave resonator structure 100 shown in FIG. 1A. The foregoing are shown in simplified cross sectional views. The resonator structures are formed over a substrate 101, 401A through 401G (e.g., silicon substrate 101, 401A, 401B, 401D through 401F, e.g., silicon carbide substrate 401C). In some examples, the substrate may further comprise a seed layer 103, 403A, 403B, 403D through 403F, formed of, for example, aluminum nitride (AlN), or another suitable material (e.g., silicon dioxide ($SiO_2$), aluminum oxide ($Al_2O_3$), silicon nitride ($Si_3N_4$), amorphous silicon (a-Si), silicon carbide (SiC)), having an example thickness in a range from approximately one hundred Angstroms (100 A) to approximately one micron (1 um) on the silicon substrate. In some other examples, the seed layer 103, 403A, 403B, 403D through 403F may also be at least partially formed of electrical conductivity enhancing material such as Aluminum (Al) or Gold (Au). For example, the seed layer 103, 403A, 403B, 403D through 403F may comprise aluminum nitride (AlN) over a bottom current spreading layer (CSL) of electrical conductivity enhancing material such as Aluminum (Al) or Gold (Au). As mentioned previously current spreading layers (CSLs) may be bilayers, for example Aluminum over Tungsten. For example, FIG. 1A and FIGS. 4A, 4B, and 4D through 4F show bottom current spreading layers 135, 435A, 435B, 435D, 435E, and 435F over seed layers 103, 403A, 403B, 403D, 403E and 403F.

The example resonators 100, 400A through 400G, include a respective stack 104, 404A through 404G, of an example four layers of piezoelectric material, for example, four layers of Aluminum Nitride (AlN) having a wurtzite structure. For example, FIG. 1A and FIGS. 4A through 4G show a bottom piezoelectric layer 105, 405A through 405G, a first middle piezoelectric layer 107, 407A through 407G, a second middle piezoelectric layer 109, 409A through 409G, and a top piezoelectric layer 111, 411A through 411G. A mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may comprise bottom piezoelectric layer 105, 405A through 405G. The mesa structure 104, 404A through 404G (e.g., first mesa structure 104, 404A through 404G) may comprise first middle piezoelectric layer 107, 407A through 407G. The mesa structure 104, 404A through 404G (e.g., first mesa structure 104, 404A through 404G) may comprise second middle piezoelectric layer 109, 409A through 409G. The mesa structure 104, 404A through 404G (e.g., first mesa structure 104, 404A through 404G) may comprise top piezoelectric layer 111, 411A through 411G. Although piezoelectric aluminum nitride may be used, alternative examples may comprise alternative piezoelectric materials, e.g., doped Aluminum Nitride, e.g., Zinc Oxide, e.g., Lithium Niobate, e.g., Lithium Tantalate, e.g., Gallium Nitride, e.g., Aluminum Gallium Nitride.

The example four layers of piezoelectric material in the respective stack 104, 404A through 404G of FIG. 1A and FIGS. 4A through 4G may have an alternating axis arrangement in the respective stack 104, 404A through 404G. For example the bottom piezoelectric layer 105, 405A through 405G may have a reverse axis orientation, which is depicted in the figures using an upward directed arrow. Next in the alternating axis arrangement of the respective stack 104, 404A through 404G, the first middle piezoelectric layer 107, 407A through 407G may have a normal axis orientation, which is depicted in the figures using a downward directed arrow. Next in the alternating axis arrangement of the respective stack 104, 404A through 404G, the second middle piezoelectric layer 109, 409A through 409G may have the reverse axis orientation, which is depicted in the figures using the upward directed arrow. Next in the alternating axis arrangement of the respective stack 104, 404A through 404G, the top piezoelectric layer 111, 411A through 411G may have the normal axis orientation, which is depicted in the figures using the downward directed arrow.

For example, polycrystalline thin film AlN may be grown in a crystallographic c-axis negative polarization, or normal axis orientation perpendicular relative to the substrate surface using reactive magnetron sputtering of an Aluminum target in a nitrogen atmosphere. However, as will be discussed in greater detail subsequently herein, changing sputtering conditions, for example by adding oxygen, a first polarizing layer (e.g., an Aluminum Oxynitride layer, e.g., a first polarizing layer comprising oxygen, e.g., a first polarizing layer comprising Aluminum Oxynitride) may reverse the axis orientation of the piezoelectric layer to a crystallographic c-axis positive polarization, or reverse axis, orientation perpendicular relative to the substrate surface.

For example, as shown in FIG. 1A and FIGS. 4A through 4G, a first piezoelectric layer (e.g., a bottom piezoelectric layer 105, 405A through 405G) may interface with (e.g., may be sputter deposited on) the first polarizing layer (e.g., first polarizing layer 158, 458A through 458G) to facilitate (e.g., to determine) the reverse axis orientation of the first piezoelectric layer (e.g., to facilitate/determine the reverse axis orientation of the bottom piezoelectric layer 105, 405A through 405G). For example, the first polarizing layer may be a first polarizing seed layer (e.g., first polarizing seed layer 158, 458A through 458G) to facilitate orienting the reverse axis orientation of the first piezoelectric layer (e.g., to facilitate orienting the reverse axis orientation of the bottom piezoelectric layer 105, 405A through 405G), as the first piezoelectric layer interfaces with (e.g., may be sputter deposited on) the first polarizing layer. The first polarizing layer 158, 458A through 458G may be a first polarizing interposer layer 158, 458A through 458G, e.g., interposed between bottom piezoelectric layer 105, 405A through 405G and substrate 101, 401A through 401G.

The first polarizing layer (e.g., first polarizing layer 158, 458A through 458G, e.g., first polarizing seed layer 158, 458A through 458G) may comprise oxygen (e.g., may comprise an oxygen nitride, e.g., may comprise an aluminum oxynitride). Alternatively or additionally the first polarizing layer (e.g., first polarizing layer 158, 458A through 458G, e.g., first polarizing seed layer 158, 458A through 458G) may comprise Aluminum Silicon Nitride (e.g., AlSiN). For example, percentage of Silicon of the Aluminum Silicon Nitride (e.g., AlSiN) may be less than about fifteen (15) percent and more than one (1) percent. Alternatively or additionally the first polarizing layer (e.g., first polarizing layer 158, 458A through 458G, e.g., first polarizing seed layer 158, 458A through 458G) may comprise a nitride comprising Aluminum and Silicon Magnesium, e.g., Al(SiMg)N, in which a ratio of Magnesium to Silicon may be less than 1 (Mg/Si ratio<1), e.g., Al(SiMg)N, in which a ratio of Magnesium to Silicon may be less than 0.3 (Mg/Si ratio<0.3), e.g., Al(SiMg)N, in which a ratio of Magnesium to Silicon may be greater than 0.2 (Mg/Si ratio>0.2), e.g., Al(SiMg)N, in which a ratio of Magnesium to Silicon may be greater than 0.15 (Mg/Si ratio>0.15), in which both Mg and Si may be more than 15% and less than 30% in Al(SiMg)N.

The first polarizing layer 158, 458A through 458G may have suitable thickness, for example, taking into account acoustic material properties to facilitate performance of the piezoelectric stack 104, 404A through 404G of the bulk acoustic wave resonators 100, 400A through 400G. For example, resonator fabrication and testing may facilitate determining suitable thickness, for example, taking into account acoustic material properties to facilitate performance of the piezoelectric stack 104, 404A through 404G of the bulk acoustic wave resonators 100, 400A through 400G. Alternatively or additionally Finite Element Modeling (FEM) simulations and varying parameters in fabrication prior to subsequent testing may help to optimize first polarizing layer 158, 458A through 458G thickness and material designs for the piezoelectric stack 104, 404A through 404G. A minimum thickness for first polarizing layer 158, 458A through 458G may be about one mono-layer, or about five Angstroms (5 A). The first polarizing layer 158, 458A through 458G thickness may be less than about five-hundred Angstroms (500 A) for a twenty-four Gigahertz (24 GHz) resonator design, with thickness scaling inversely with frequency for alternative resonator designs.

As shown in FIG. 1A and FIGS. 4A through 4G, a second polarizing layer (e.g., second polarizing layer 159, 459A through 459G) may be arranged over (e.g., may be sputter deposited on) the first piezoelectric layer (e.g., the bottom piezoelectric layer 105, 405A through 405G). A second piezoelectric layer (e.g., a first middle piezoelectric layer 107, 407A through 407G) may interface with (e.g., may be sputter deposited on) the second polarizing layer (e.g., second polarizing layer 159, 459A through 459G) to facilitate (e.g., to determine) the normal axis orientation of the second piezoelectric layer (e.g., to facilitate/determine the normal axis orientation of the first middle piezoelectric layer 107, 407A through 407G). For example, the second polarizing layer may be a second polarizing seed layer (e.g., second polarizing seed layer 159, 459A through 459G) to facilitate orienting the normal axis orientation of the second piezoelectric layer (e.g., to facilitate orienting the normal axis orientation of the first middle piezoelectric layer 107, 407A through 407G), as the second piezoelectric layer interfaces with (e.g., may be sputter deposited on) the second polarizing layer. The second polarizing layer 159, 459A through 459G may be a second polarizing interposer layer, e.g., interposed between e.g., sandwiched between, the first middle piezoelectric layer 107, 407A through 407G and the bottom piezoelectric layer 105, 405A through 405G.

The second polarizing layer 159, 459A through 459G may comprise metal. For example, second polarizing layer 159, 459A through 459G may comprise Titanium (Ti). For example, second polarizing layer 159, 459A through 459G may comprise relatively high acoustic impedance metal (e.g., relatively high acoustic impedance metals e.g., Tungsten (W), e.g., Molybdenum (Mo), e.g., Ruthenium (Ru)).

The second polarizing layer 159, 459A through 459G may comprise a dielectric (e.g. second polarizing dielectric layer 159, 459A through 459G). The second polarizing layer 159, 459A through 459G may comprise Aluminum Oxide, e.g., Al2O3 (or other stoichiometry). The second polarizing layer 159, 459A through 459G may comprise Aluminum and may comprise Magnesium and may comprise Silicon, e.g., AlMgSi. The second polarizing layer 159, 459A through 459G may comprise nitrogen, e.g, Al(SiMg)N (e.g., with Mg/Si ratio>1, e.g., with Mg/Si ratio<3). For example, second polarizing layer 159, 459A through 459G may comprise a dielectric that has a positive acoustic velocity temperature coefficient, e.g., to facilitate acoustic velocity increasing with increasing temperature of the dielectric. The second polarizing layer 159, 459A through 459G may comprise, for example, silicon dioxide.

The second polarizing layer 159, 459A through 459G may comprise a nitride. The second polarizing layer 159, 459A through 459G may comprise a doped nitride. The second polarizing layer 159, 459A through 459G may comprise Aluminum Nitride doped with a suitable percentage of a suitable dopant (e.g., Scandium, e.g., Magnesium Zirconium, e.g., Magnesium Hafnium, e.g., Magnesium Niobium). For example, the second polarizing layer 159, 459A through 459G may comprise Aluminum Scandium Nitride (AlScN). For example, Scandium doping of Aluminum Nitride may be within a range from a fraction of a percent of Scandium to thirty percent Scandium. For example, Magnesium Zirconium doping of Aluminum nitride may be within a range from a fraction of a percent of Magnesium and a fraction of a percent of Zirconium to for example twenty percent or less of Magnesium and to twenty percent or less of Zirconium, for example Al(Mg0.5Zr0.5)0.25N). For example, Magnesium Hafnium doping of Aluminum nitride may be within a range from a fraction of a percent of Magnesium and a fraction of a percent of Hafnium to for example twenty percent or less of Magnesium and twenty percent or less of Hafnium, for example e.g., Al(Mg0.5Hf0.5)0.25N. For example, Magnesium Niobium doping of Aluminum nitride may be within a range from a fraction of a percent of Magnesium and a fraction of a percent of Niobium to for example forty percent or less of Magnesium and forty percent or less of Niobium, for example e.g., Al(Mg0.5Nb0.5)0.8N.

The second polarizing layer 159, 459A through 459G may comprise a semiconductor. The second polarizing layer 159, 459A through 459G may comprise doped Aluminum Nitride, as just discussed. The second polarizing layer 159, 459A through 459G may comprise sputtered Silicon, e.g., may comprise amorphous Silicon, e.g., may comprise polycrystalline Silicon, which may be dry etched using Fluorine chemistry.

The second polarizing layer 159, 459A through 459G may have suitable thickness, for example, taking into account acoustic material properties to facilitate performance of the piezoelectric stack 104, 404A through 404G of the bulk acoustic wave resonators 100, 400A through 400G. For example, resonator fabrication and testing may facilitate determining suitable thickness, for example, taking into account acoustic material properties to facilitate performance of the piezoelectric stack 104, 404A through 404G of the bulk acoustic wave resonators 100, 400A through 400G. Alternatively or additionally Finite Element Modeling (FEM) simulations and varying parameters in fabrication prior to subsequent testing may help to optimize second polarizing layer 159, 459A through 459G thickness and material designs for the piezoelectric stack 104, 404A through 404G. A minimum thickness for second polarizing layer 159, 459A through 459G may be about one mono-layer, or about five Angstroms (5 A). The second polarizing layer 159, 459A through 459G thickness may be greater or less than about five-hundred Angstroms (500 A) for a twenty-four Gigahertz (24 GHz) resonator design, with thickness scaling inversely with frequency for alternative resonator designs.

As shown in FIG. 1A and FIGS. 4A through 4G, a third polarizing layer (e.g., third polarizing layer 161, 461A through 461G) may be arranged over (e.g., may be sputter deposited on) the second piezoelectric layer (e.g., the first middle piezoelectric layer 107, 407A through 407G). As shown in FIG. 1A and FIGS. 4A through 4G, a third piezoelectric layer (e.g., second middle piezoelectric layer 109, 409A through 409G) may interface with (e.g., may be sputter deposited on) the third polarizing layer (e.g., third polarizing layer 161, 461A through 461G) to facilitate (e.g., to determine) the reverse axis orientation of the third piezoelectric layer (e.g., to facilitate/determine the reverse axis orientation of the second middle piezoelectric layer 109, 409A through 409G). For example, the third polarizing layer may be a third polarizing seed layer (e.g., third polarizing seed layer 161, 461A through 461G) to facilitate orienting the reverse axis orientation of the third piezoelectric layer (e.g., to facilitate orienting the reverse axis orientation of the second middle piezoelectric layer 109, 409A through 409G), as the third piezoelectric layer interfaces with (e.g., may be sputter deposited on) the third polarizing layer. The third polarizing layer 161, 461A through 461G may be a third polarizing interposer layer 161, 461A through 461G, e.g., interposed between second middle piezoelectric layer 109, 409A through 409G and the first middle piezoelectric layer 107, 407A through 407G, e.g., sandwiched between second middle piezoelectric layer 109, 409A through 409G and the first middle piezoelectric layer 107, 407A through 407G.

Both third polarizing layer 161, 461A through 461G and first polarizing layer 158, 458A through 458G are generally directed to facilitating (e.g., to determining) the reverse axis orientation. Accordingly, previous discussions herein about suitable materials and thickness for the first polarizing layer 158, 458A through 458G may likewise be applicable to third polarizing layer 161, 461A through 461G. For brevity and clarity, such discussions are referenced and incorporated rather than repeated in full.

As shown in FIG. 1A and FIGS. 4A through 4G, a fourth polarizing layer (e.g., fourth polarizing layer 163, 463A through 463G) may be arranged over (e.g., may be sputter deposited on) the third piezoelectric layer (e.g., the second middle piezoelectric layer 109, 409A through 409G). A fourth piezoelectric layer (e.g., a top piezoelectric layer 111, 411A through 411G) may interface with (e.g., may be sputter deposited on) the fourth polarizing layer (e.g., fourth polarizing layer 163, 463A through 463G) to facilitate (e.g., to determine) the normal axis orientation of the fourth piezoelectric layer (e.g., to facilitate/determine the normal axis orientation of the top piezoelectric layer 107, 407A through 407G). For example, the fourth polarizing layer may be a fourth polarizing seed layer (e.g., fourth polarizing seed layer 163, 463A through 463G) to facilitate orienting the normal axis orientation of the fourth piezoelectric layer (e.g., to facilitate orienting the normal axis orientation of the top piezoelectric layer 107, 407A through 407G), as the fourth piezoelectric layer interfaces with (e.g., may be sputter deposited on) the fourth polarizing layer. The fourth polarizing layer 163, 463A through 463G may be a fourth polarizing interposer layer, e.g., interposed between e.g., sandwiched between, the second middle piezoelectric layer 109, 409A through 409G and the top piezoelectric layer 111, 411A through 411G.

Both fourth polarizing layer 163, 463A through 463G and second polarizing layer 159, 459A through 459G are generally directed to facilitating (e.g., to determining) the normal axis orientation. Accordingly, previous discussions herein about suitable materials and thickness for the second polarizing layer 159, 459A through 459G may likewise be applicable to fourth polarizing layer 163, 463A through 463G. For brevity and clarity, such discussions are referenced and incorporated rather than repeated in full.

In the example resonators 100, 400A through 400G, of FIG. 1A and FIGS. 4A through 4G, the bottom piezoelectric layer 105, 405A through 405G, may have a piezoelectrically excitable resonance mode (e.g., main resonance mode) at a resonant frequency (e.g., main resonant frequency) of the example resonators. Similarly, the first middle piezoelectric layer 107, 407A through 407G, may have its piezoelectrically excitable resonance mode (e.g., main resonance mode) at the resonant frequency (e.g., main resonant frequency) of the example resonators. Similarly, the second middle piezoelectric layer 109, 409A through 409G, may have its piezoelectrically excitable resonance mode (e.g., main resonance mode) at the resonant frequency (e.g., main resonant frequency) of the example resonators. Similarly, the top piezoelectric layer 111, 411A through 411G, may have its piezoelectrically excitable main resonance mode (e.g., main resonance mode) at the resonant frequency (e.g., main resonant frequency) of the example resonators. Accordingly, the top piezoelectric layer 111, 411A through 411G, may have its piezoelectrically excitable main resonance mode (e.g., main resonance mode) at the resonant frequency (e.g., main resonant frequency) with the bottom piezoelectric layer 105, 405A through 405G, the first middle piezoelectric layer 107, 407A through 407G, and the second middle piezoelectric layer 109, 409A through 409G.

The bottom piezoelectric layer 105, 405A through 405G, may be acoustically coupled with the first middle piezoelectric layer 107, 407A through 407G, in the piezoelectrically excitable resonance mode (e.g., main resonance mode) at the resonant frequency (e.g., main resonant frequency) of the example resonators 100, 400A through 400G. The reverse axis of bottom piezoelectric layer 105, 405A through 405G, in opposing the normal axis of the first middle piezoelectric layer 107, 407A through 407G, may cooperate for the piezoelectrically excitable resonance mode (e.g., main resonance mode) at the resonant frequency (e.g., main resonant frequency) of the example resonators. The first middle piezoelectric layer 107, 407A through 407G, may be sandwiched between the bottom piezoelectric layer 105, 405A through 405G, and the second middle piezoelectric layer 109, 409A through 409G, for example, in the alternating axis arrangement in the respective stack 104, 404A through 404G. For example, the normal axis of the first middle piezoelectric layer 107, 407A through 407G, may oppose the reverse axis of the bottom piezoelectric layer 105, 405A through 405G, and the reverse axis of the second middle piezoelectric layer 109, 409A-409G. In opposing the reverse axis of the bottom piezoelectric layer 105, 405A through 405G, and the reverse axis of the second middle piezoelectric layer 109, 409A through 409G, the normal axis of the first middle piezoelectric layer 107, 407A through 407G, may cooperate for the piezoelectrically excitable resonance mode (e.g., main resonance mode) at the resonant frequency (e.g., main resonant frequency) of the example resonators.

The second middle piezoelectric layer 109, 409A through 409G, may be sandwiched between the first middle piezoelectric layer 107, 407A through 407G, and the top piezoelectric layer 111, 411A through 411G, for example, in the alternating axis arrangement in the respective stack 104, 404A through 404G. For example, the reverse axis of the second middle piezoelectric layer 109, 409A through 409G, may oppose the normal axis of the first middle piezoelectric layer 107, 407A through 407G, and the normal axis of the top piezoelectric layer 111, 411A through 411G. In opposing the normal axis of the first middle piezoelectric layer 107, 407A through 407G, and the normal axis of the top piezoelectric layer 111, 411A through 411G, the reverse axis of the second middle piezoelectric layer 109, 409A through 409G, may cooperate for the piezoelectrically excitable resonance mode (e.g., main resonance mode) at the resonant frequency (e.g., main resonant frequency) of the example resonators. Similarly, the alternating axis arrangement of the bottom piezoelectric layer 105, 405A through 405G, and the first middle piezoelectric layer 107, 407A through 407G, and the second middle piezoelectric layer 109, 409A through 409G, and the top piezoelectric layer 111, 411A-411G, in the respective stack 104, 404A through 404G may cooperate for the piezoelectrically excitable resonance mode (e.g., main resonance mode) at the resonant frequency (e.g., main resonant frequency) of the example resonators. Despite differing in their alternating axis arrangement in the respective stack 104, 404A through 404G, the bottom piezoelectric layer 105, 405A through 405G and the first middle piezoelectric layer 107, 407A through 407G, and the second middle piezoelectric layer 109, 409A through 409G, and the top piezoelectric layer 111, 411A through 411G, may all comprise the same piezoelectric material, e.g., Aluminum Nitride (AlN).

Respective piezoelectric layers of example piezoelectric resonant volumes, e.g., piezoelectric stacks 104, 404A through 404G, may have respective layer thicknesses of approximately a half wavelength of the main resonant frequency, e.g., the bottom piezoelectric layer 105, 405A through 405G may have bottom piezoelectric layer thickness, e.g., the first middle piezoelectric layer 107, 407A through 407G may have first middle piezoelectric layer thickness, e.g., second middle piezoelectric layer 109, 409A through 409G may have second middle piezoelectric layer thickness, e.g., top piezoelectric layer 111, 411A through 411G may have top piezoelectric layer thickness.

For example, the bottom piezoelectric layer thickness may about a half wavelength of the main resonant frequency. In other examples, the bottom piezoelectric layer thickness may about an integral multiple of the half wavelength of the main resonant frequency.

For example, the first middle piezoelectric layer thickness may about a half wavelength of the main resonant frequency. In other examples, the first middle piezoelectric layer thickness may about an integral multiple of the half wavelength of the main resonant frequency.

For example, the second middle piezoelectric layer thickness may about a half wavelength of the main resonant frequency. In other examples, the second middle piezoelectric layer thickness may about an integral multiple of the half wavelength of the main resonant frequency.

For example, the top piezoelectric layer thickness may about a half wavelength of the main resonant frequency. In other examples, the top piezoelectric layer thickness may about an integral multiple of the half wavelength of the main resonant frequency.

In the examples of this disclosure, piezoelectric layer thickness may be scaled up or down to facilitate (e.g., determine) main resonant frequency. For example, respective piezoelectric layers (e.g., respective layers of piezoelectric material) in the piezoelectric stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a Super High Frequency (SHF) band or an Extremely High Frequency (EHF) band (e.g., respective resonant frequencies that are in a Super High Frequency (SHF) band, e.g., respective resonant frequencies that are in an Extremely High Frequency (EHF) band). For example, respective layers of piezoelectric material in the stack 104, 404A through 404G, of FIG. 1A and FIGS. 4A through 4G may have respective layer thicknesses so that (e.g., selected so that) the respective bulk acoustic wave resonators 100, 400A through 400G may have respective resonant frequencies that are in a millimeter wave band.

The example resonators 100, 400A through 400G, of FIG. 1A and FIGS. 4A through 4G may comprise: a bottom acoustic reflector 113, 413A through 413G, including an acoustically reflective bottom electrode stack of a plurality of bottom metal electrode layers; and a top acoustic reflector 115, 415A through 415G, including an acoustically reflective top electrode stack of a plurality of top metal electrode layers. Accordingly, the bottom acoustic reflector 113, 413A through 413G, may be a bottom multilayer acoustic reflector, and the top acoustic reflector 115, 415A through 415G, may be a top multilayer acoustic reflector. The piezoelectric layer stack 104, 404A through 404G, may be sandwiched between the plurality of bottom metal electrode layers of the bottom acoustic reflector 113, 413A through 413G, and the plurality of top metal electrode layers of the top acoustic reflector 115, 415A through 415G. For example, top acoustic reflector electrode 115, 415A through 415G and bottom acoustic reflector electrode 113, 413A through 413G may abut opposite sides of a resonant volume 104, 404A through 404G (e.g., piezoelectric layer stack 104, 404A through 404G) free of any interposing electrode. The piezoelectric layer stack 104, 404A through 404G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency). For example, such excitation may be done by using the plurality of bottom metal electrode layers of the bottom acoustic reflector 113, 413A through 413G and the plurality of top metal electrode layers of the top acoustic reflector 115, 415A through 415G to apply an oscillating electric field having a frequency corresponding to the resonant frequency (e.g., main resonant frequency) of the piezoelectric layer stack 104, 404A through 404G, and of the example resonators 100, 400A through 400G.

For example, the bottom piezoelectric layer 105, 405A through 405G, may be electrically and acoustically coupled with the plurality of bottom metal electrode layers of the bottom acoustic reflector 113, 413A through 413G and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G. Further, the bottom piezoelectric layer 105, 405A through 405G and the first middle piezoelectric layer 107, 407A through 407G, may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the bottom piezoelectric layer 105, 405A through 405G, acoustically coupled with the first middle piezoelectric layer 107, 407A through 407G. Additionally, the first middle piezoelectric layer 107, 407A-407G, may be sandwiched between the bottom piezoelectric layer 105, 405A through 405G and the second middle piezoelectric layer 109, 409A through 409G, and may be electrically and acoustically coupled with the plurality of bottom metal electrode layers of the bottom acoustic reflector 113, 413A through 413G, and the plurality of top metal electrode layers of the top acoustic reflector 115, 415A through 415G, to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G.

The acoustically reflective bottom electrode stack of the plurality of bottom metal electrode layers of the bottom acoustic reflector 113, 413A through 413G, may have an alternating arrangement of low acoustic impedance metal layer and high acoustic impedance metal layer. For example, an initial bottom metal electrode layer 121, 421A through 421G, may comprise a relatively high acoustic impedance metal, for example, Tungsten having an acoustic impedance of about 100 MegaRayls, or for example, Molybdenum having an acoustic impedance of about 65 MegaRayls. The acoustically reflective bottom electrode stack of the plurality of bottom metal electrode layers of the bottom acoustic reflector 113, 413A through 413G may approximate a metal distributed Bragg acoustic reflector. The plurality of metal bottom electrode layers of the bottom acoustic reflector may be electrically coupled (e.g., electrically interconnected) with one another. The acoustically reflective bottom electrode stack of the plurality of bottom metal electrode layers may operate together as a multilayer (e.g., bilayer, e.g., multiple layer) bottom electrode for the bottom acoustic reflector 113, 413A through 413G.

Next in the alternating arrangement of low acoustic impedance metal layer and high acoustic impedance metal layer of the acoustically reflective bottom electrode stack, may be a first pair of bottom metal electrode layers 123, 423A through 423G and 125, 425A through 425G. A first member 123, 423A through 423G, of the first pair of bottom metal electrode layers may comprise a relatively low acoustic impedance metal, for example, Titanium having an acoustic impedance of about 27 MegaRayls, or for example, Aluminum having an acoustic impedance of about 18 MegaRayls. A second member 125, 425A through 425G, of the first pair of bottom metal electrode layers may comprise the relatively high acoustic impedance metal, for example, Tungsten or Molybdenum. Accordingly, the first pair of bottom metal electrode layers 123, 423A through 423G, and 125, 425A through 425G, of the bottom acoustic reflector 113, 413A through 413G, may be different metals, and may have respective acoustic impedances that are different from one another so as to provide a reflective acoustic impedance mismatch at the resonant frequency (e.g., main resonant frequency). Similarly, the initial bottom metal electrode layer 119, 419A through 419G, and the first member of the first pair of bottom metal electrode layers 123, 423A through 423G, of the bottom acoustic reflector 113, 413A through 413G, may be different metals, and may have respective acoustic impedances that are different from one another so as to provide a reflective acoustic impedance mismatch at the resonant frequency (e.g., main resonant frequency).

The alternating arrangement of low acoustic impedance metal layer and high acoustic impedance metal layer of the acoustically reflective bottom electrode stack, may comprise a second pair of bottom metal electrode layers 127, 427D, 129, 429D. This may respectively comprise the relatively low acoustic impedance metal and the relatively high acoustic impedance metal. The alternating arrangement of low acoustic impedance metal layer and high acoustic impedance metal layer of the acoustically reflective bottom electrode stack, may comprise a third pair of bottom metal electrode layers 131, 133. This may respectively comprise the relatively low acoustic impedance metal and the relatively high acoustic impedance metal.

Respective thicknesses of the bottom metal electrode layers may be related to wavelength (e.g., acoustic wavelength) for the main resonant frequency of the example bulk acoustic wave resonators, 100, 400A through 400G. Further, various embodiments for resonators having relatively higher resonant frequency (higher main resonant frequency) may have relatively thinner bottom metal electrode thicknesses, e.g., scaled thinner with relatively higher resonant frequency (e.g., higher main resonant frequency). Similarly, various alternative embodiments for resonators having relatively lower resonant frequency (e.g., lower main resonant frequency) may have relatively thicker bottom metal electrode layer thicknesses, e.g., scaled thicker with relatively lower resonant frequency (e.g., lower main resonant frequency).

For example, a layer thickness of the initial bottom metal electrode layer 121, 421A through 421G, may be about one eighth of a wavelength (e.g., one eighth of an acoustic wavelength) at the main resonant frequency of the example resonator. For example, if molybdenum is used as the high acoustic impedance metal and the main resonant frequency of the resonator is twenty-four gigahertz (e.g., 24 GHz), then using the one eighth of the wavelength (e.g., one eighth of the acoustic wavelength) provides the layer thickness of the initial bottom metal electrode layer 121, 421A through 421G, as about three hundred and thirty Angstroms (330 A). In the foregoing illustrative but non-limiting example, the one eighth of the wavelength (e.g., the one eighth of the acoustic wavelength) at the main resonant frequency was used for determining the layer thickness of the initial bottom metal electrode layer 121, 421A-421G, but it should be understood that this layer thickness may be varied to be thicker or thinner in various other alternative example embodiments.

Respective layer thicknesses, T03 through T08, shown in FIG. 1A for members of the pairs of bottom metal electrode layers may be about an odd multiple (e.g., 1×, 3×, etc). of a quarter of a wavelength (e.g., one quarter of the acoustic wavelength) at the main resonant frequency of the example resonator. However, the foregoing may be varied. For example, members of the pairs of bottom metal electrode layers of the bottom acoustic reflector may have respective layer thickness that correspond to from about one eighth to about one half wavelength at the resonant frequency, or an odd multiple (e.g., 1×, 3×, etc). thereof.

In an example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the pairs as about six hundred and thirty Angstroms (630 A). Similarly, respective layer thicknesses for members of the pair(s) of bottom metal electrode layers shown in FIGS. 4A through 4G may likewise be about one quarter of the wavelength (e.g., one quarter of the acoustic wavelength) of the main resonant frequency of the example resonator, and these respective layer thicknesses may likewise be determined for members of the pairs of bottom metal electrode layers for the high and low acoustic impedance metals employed.

For example, bottom acoustic reflector 113, 413A, 413B, 413D, 413E, 413F and 413G may further comprise bottom current spreading layer 135, 435A, 435B, 435D, 435E, 435F and 435G as shown in FIG. 1A and FIGS. 4A, 4B, and 4D through 4G. Bottom current spreading layer 135, 435A, 435B, 435D, 435E, 435F and 435G may be bilayer, as discussed previously herein. For example bottom current spreading layer 135, 435A, 435B, 435D, 435E, 435F and 435G may comprise an additional pair of bottom metal electrode layers. For example bottom current spreading layer 135 may comprise a fourth pair of bottom metal electrode layers. Bottom current spreading layer 135, 435A, 435B, 435D, 435E, 435F and 435G may respectively comprise a relatively low acoustic impedance metal having a relatively high conductivity, for example Aluminum and the relatively high acoustic impedance metal, for example Tungsten. Previous discussions herein about suitable materials and thickness for the example bilayers of bottom current spreading are likewise applicable to bottom current spreading layer 135, 435A, 435B, 435D, 435E, 435F and 435G shown in FIG. 1A and FIGS. 4A, 4B, and 4D through 4G. For brevity and clarity, such discussions are referenced and incorporated rather than repeated in full.

The bottom piezoelectric layer 105, 405A through 405G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the bottom piezoelectric layer 105, 405A through 405G.

Similarly, the first middle piezoelectric layer 107, 407A through 407G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the first middle piezoelectric layer 107, 407A through 407G. The second middle piezoelectric layer 109, 409A through 409G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the second middle piezoelectric layer 109, 409A through 409G. The top piezoelectric layer 109, 409A through 409G, may be electrically and acoustically coupled with the initial bottom metal electrode layer 121, 421A through 421G, and pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G), to excite the piezoelectrically excitable resonance mode (e.g., main resonance mode) at the resonant frequency (e.g., main resonant frequency) of the top piezoelectric layer 109, 409A through 409G.

Another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G), may comprise initial bottom metal electrode layer 117, 417A through 417G. The another mesa structure 113, 413A through 413G, (e.g., second mesa structure 113, 413A through 413G), may comprise one or more pair(s) of bottom metal electrode layers (e.g., first pair of bottom metal electrode layers 123, 423A through 423G, 125, 425A through 425G, e.g., second pair of bottom metal electrode layers 127, 427D, 129, 429D, e.g., third pair of bottom metal electrode layers 131, 133, e.g., bilayer current spreading layer 135, 435A, 435B, 435D, 435E, 435F, 435G).

Respective alternating axis piezoelectric volumes 104, 404A through 404G may comprise the respective piezoelectric layer stacks 104, 404A through 404G, as discussed previously herein.

The bottom multi-layer acoustic reflector 113, 413A through 413G may approximate a bottom distributed Bragg reflector 113, 413A through 413G (e.g., a bottom distributed Bragg acoustic reflector 113, 413A through 413G). Accordingly, the bottom multi-layer acoustic reflector 113, 413A through 413G may comprise alternating high/low acoustic impedance layers. The alternating high/low acoustic impedance layers may comprise layers having respective thicknesses of approximately a quarter wavelength (e.g., quarter acoustic wavelength) of the main resonant frequency of the resonant piezoelectric volume 104, 404A through 404G.

The bottom multi-layer acoustic reflector 113, 413A through 413G may comprise a plurality of bottom metal electrode layers. The bottom multi-layer acoustic reflector 113, 413A through 413G may be a bottom multi-layer metal acoustic reflector 113, 413A through 413G (e.g., a bottom multi-layer metal acoustic reflector electrode 113, 413A through 413G). A plurality of bottom metal acoustic reflector electrode layers may comprise the alternating acoustic impedance arrangement of high acoustic impedance metal layers (e.g., Tungsten (W) layers) and low acoustic impedance metal layers (e.g., Titanium (Ti) layers). The bottom multi-layer metal acoustic reflector 113, 413A through 413G may approximate the bottom distributed Bragg reflector 113, 413A through 413G (e.g., the bottom distributed Bragg acoustic reflector 113, 413A through 413G). As discussed previously herein, the alternating high/low acoustic impedance metal electrode layers may comprise layer having respective thicknesses of approximately a quarter wavelength (e.g., quarter acoustic wavelength) of the main resonant frequency of the resonant piezoelectric volume 104, 404A through 404G.

For example, bottom multi-layer acoustic reflector 113, 413A through 413G (e.g., bottom multi-layer metal acoustic reflector electrode 113, 413A through 413G) may comprise a bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G). Bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) may have a thickness of approximately a quarter wavelength (e.g., quarter acoustic wavelength) of the main resonant frequency of the resonant piezoelectric volume 104, 404A through 404G.

Piezoelectric layer 118, 418A through 418G may comprise piezoelectric material e.g., Aluminum Nitride. Piezoelectric layer 118, 418A through 418G may have a lower (e.g., contrasting) acoustic impedance than a relatively higher acoustic impedance of the bottom reflector layer 117, 417A through 417G. For example, piezoelectric layer 118, 418A through 418G may have a lower (e.g., contrasting) acoustic impedance than relatively higher acoustic impedance of initial bottom reflector layer 117, 417A through 417G. For example, piezoelectric layer 118, 418A through 418G may have a lower (e.g., contrasting) acoustic impedance than relatively higher acoustic impedance of bottom metal acoustic reflector electrode layer 117, 417A through 417G. For example, piezoelectric layer 118, 418A through 418G may have a lower (e.g., contrasting) acoustic impedance than bottom high acoustic impedance metal electrode layer 117, 417A through 417G. For example, Aluminum Nitride piezoelectric layer 118, 418A through 418G may have a lower (e.g., contrasting) acoustic impedance than bottom Tungsten (W) electrode layer 117, 417A through 417G).

Further, a bilayer relatively low acoustic impedance structure comprising piezoelectric layer 118, 418A through 418G (e.g., having relatively low acoustic impedance) and relatively low acoustic impedance (e.g., Titanium (Ti)) bottom metal reflector electrode layer 119, 419A through 419G may have a combined thickness of about quarter acoustic wavelength, e.g., for the bilayer structure. In examples of bulk acoustic wave resonators 100, 400A through 400G designed for main resonant frequency of about twenty four GigaHertz (24 GHz): bottom low acoustic impedance metal (e.g., Ti) reflector electrode layer 119, 419A through 419G may have a thickness of approximately five hundred and twenty five Angstrom (525 A), and relatively low acoustic impedance piezoelectric (e.g., AlN) layer 118, 418A through 418G may have a thickness of approximately three hundred Angstrom (300 A). This bilayer relatively low acoustic impedance structure may have a combined thickness of about a quarter acoustic wavelength at the twenty four GigaHertz (24 GHz) main resonant frequency.

In contrast, for examples of bulk acoustic wave resonators 100, 400A through 400G designed for main resonant frequency of about twenty four GigaHertz (24 GHz), quarter wavelength thick Titanium layers e.g., bottom low acoustic impedance metal reflector electrode layer 123, 423A through 423G, may be about six hundred and twenty five Angstrom (625 A) thick. This is about quarter wavelength thick Titanium layer may be about one hundred Angstroms (100 A) thicker than the approximately five hundred and twenty five Angstrom (525 A) bottom low acoustic impedance metal (e.g., Ti) reflector electrode layer 119, 419A through 419G. Conceptually speaking, the design of bottom low acoustic impedance metal (e.g., Ti) reflector electrode layer 119, 419A through 419G may have a reduced portion (e.g., one hundred Angstroms (100 A) reduced portion) relative to quarter wavelength thick Titanium layers e.g., bottom metal (e.g, Ti) reflector electrode layer 123, 423A through 423G. Conceptually speaking, in the design of the bilayer relatively low acoustic impedance structure, the reduced portion (e.g., one hundred Angstroms (100 A) reduced portion) may be replaced with the three hundred Angstrom (300 A) thick, relatively low acoustic impedance piezoelectric (e.g., AlN) layer 118, 418A through 418G, so as to provide the quarter acoustic wavelength combined thickness for the bilayer structure.

Bilayer relatively low acoustic impedance structure comprising piezoelectric layer 118, 418A through 418G (e.g., having relatively low acoustic impedance) and relatively low acoustic impedance (e.g., Titanium (Ti)) bottom metal reflector electrode layer 119, 419A through 419G has just been discussed. This relatively low acoustic impedance bilayer structure may be sandwiched between relatively high acoustic impedance, quarter acoustic wavelength thick bottom metal (e.g., Tungsten) acoustic reflector electrode layer 117, 417A through 417G, and another relatively high acoustic impedance, quarter acoustic wavelength thick bottom metal (e.g., Tungsten) acoustic reflector electrode layer 121, 421A through 421G of the bottom distributed Bragg acoustic reflector electrode113, 413A through 413G (e.g., bottom multi-layer metal acoustic reflector electrode 113, 413A through 413G). In other words, it should be understood that piezoelectric layer 118, 418A through 418G forms a portion of bottom distributed Bragg acoustic reflector electrode 113, 413A through 413G. In particular, since the bilayer structure comprising piezoelectric layer 118, 418A through 418G may be sandwiched between a pair of relatively high acoustic impedance metal (e.g., Tungsten) reflector electrode layers, and since acoustic impedance of piezoelectric layer 118, 418A through 418G (e.g., piezoelectric layer comprising Aluminum Nitride) is substantially lower (e.g., contrasting) relative to the pair of relatively high acoustic impedance metal (e.g., Tungsten) reflector electrode layers, piezoelectric layer 118, 418A through 418G may substantially contribute to approximating the distributed Bragg acoustic reflector electrode 113, 413A through 413G. Moreover, piezoelectric layer 118, 418A through 418G may substantially contribute to acoustic wave reflectivity of the bottom distributed Bragg acoustic reflector electrode 113, 413A through 413G. Further, since the relatively low acoustic bilayer structure comprising piezoelectric layer 118, 418A through 418G may have a thickness of approximately a quarter acoustic wavelength sandwiched between the pair of relatively high acoustic impedance metal (e.g., Tungsten) reflector electrode layers having respective thicknesses of approximately the quarter acoustic wavelength, piezoelectric layer 118, 418A through 418G may substantially contribute to approximating the distributed Bragg acoustic reflector electrode 113, 413A through 413G. Accordingly, piezoelectric layer 118, 418A through 418G may substantially contribute to acoustic wave reflectivity of the bottom distributed Bragg acoustic reflector electrode 113, 413A through 413G.

Additionally, it should be understood that piezoelectric layer 118, 418A through 418G is an —active-piezoelectric layer 118, 418A through 418G. In addition to forming a portion of bottom multilayer acoustic reflector, —active-piezoelectric layer 118, 418A through 418G forms an —active-portion of alternating axis piezoelectric volume 104, 404A through 404G. In operation of bulk acoustic wave resonator 100, 400A through 400G, an oscillating electric field may be applied, e.g., via top current spreading layer 171, 471A through 471G and bottom current spreading layer 135, 435A through 435G, so as to —activate-responsive piezoelectric acoustic oscillations (e.g., the main resonant mode) in active piezoelectric layer 118, 418A through 418G and in remaining piezoelectric layers of alternating axis piezoelectric volume 104, 404A through 404G (e.g., example four piezoelectric layers of alternating axis piezoelectric volume 104, 404A through 404G, already discussed). As mentioned previously herein, alternating axis piezoelectric volume 104, 404A through 404G may comprise a first piezoelectric layer 105, 405A through 405G having a reverse piezoelectric axis orientation (e.g., bottom piezoelectric layer 105, 405A through 405G having a reverse piezoelectric axis orientation). Active piezoelectric layer 118, 418A through 418G may have a normal piezoelectric axis orientation. In the alternating axis piezoelectric volume 104, 404A through 404G, reflector layer 117, 417A through 417G may be interposed between active piezoelectric layer 118, 418A through 418G having the normal piezoelectric axis orientation and the bottom piezoelectric layer 105, 405A through 405G having the reverse piezoelectric axis orientation. However, in the alternating axis piezoelectric volume 104, 404A through 404G, active piezoelectric layer 118, 418A through 418G having the normal piezoelectric axis orientation may still be arranged proximate to the bottom piezoelectric layer 104, 404A through 404G having the reverse piezoelectric axis orientation. The normal piezoelectric axis orientation of the active piezoelectric layer 118, 418A through 418G may substantially oppose the reverse piezoelectric orientation of bottom piezoelectric layer 104, 404A through 404G of the alternating axis piezoelectric volume 104, 404A through 404G. The bottom piezoelectric layer 104, 404A through 404G having the reverse piezoelectric axis orientation may be interposed between the active piezoelectric layer 118, 418A through 418G having the normal piezoelectric axis orientation and the first middle piezoelectric layer 107, 407A through 407G having the normal piezoelectric axis orientation, so that the reverse piezoelectric orientation of bottom piezoelectric layer 104, 404A through 404G may substantially oppose the normal piezoelectric axis orientation of the active piezoelectric layer 118, 418A through 418G and the normal piezoelectric axis orientation of the first middle piezoelectric layer 107, 407A through 407G in the alternating axis arrangement (e.g., in the alternating axis piezoelectric volume 104, 404A through 404G).

As just discussed, the active piezoelectric layer 118, 418A through 418G may, for example, form a portion of the alternating axis piezoelectric volume 104, 404A through 404G (e.g., the alternating axis piezoelectric volume 104, 404A through 404G may comprise the active piezoelectric layer 118, 418A through 418G). Further, as discussed previously herein, the active piezoelectric layer 118, 418A through 418G may have a contrasting/relatively low acoustic impedance and may form at least a portion of a quarter acoustic wavelength thickness, e.g., bilayer structure. Accordingly the active piezoelectric layer 118, 418A through 418G may, for example, form a portion of the bottom distributed Bragg acoustic reflector electrode 113, 413A through 413G (e.g., the bottom distributed Bragg acoustic reflector electrode 113, 413A through 413G may comprise the active piezoelectric layer 118, 418A through 418G). In other words, there may be an overlap (e.g., comprising the active piezoelectric layer 118, 418A through 418G) between the alternating axis piezoelectric volume 104, 404A through 404G and the bottom distributed Bragg acoustic reflector electrode 113, 413A through 413G.

The bottom distributed Bragg acoustic reflector electrode 113, 413A through 413G, for example, comprising the active piezoelectric layer 118, 418A through 418G, e.g., the active piezoelectric layer 118, 418A through 418G forming a portion of the bottom distributed Bragg acoustic reflector electrode 113, 413A through 413G, may, but need not facilitate a quality factor enhancement of the bulk acoustic wave resonator 100, 400A through 400G. Further, the active piezoelectric layer 118, 418A through 418G of the bottom distributed Bragg acoustic reflector electrode 113, 413A through 413G may facilitate grain orientation (e.g., in sputter deposition) of the bottom metal acoustic reflector electrode layer 117, 417A through 417G arranged over the active piezoelectric layer 118, 418A through 418G. Moreover, the active piezoelectric layer 118, 418A through 418G facilitate crystal quality enhancement (e.g., in sputter deposition) of the adjacent bottom piezoelectric layer 105, 405A through 405G of the alternating axis piezoelectric volume 104, 404A through 404G, via grain orientation of the bottom metal acoustic reflector electrode layer 117, 417A through 417G arranged over the active piezoelectric layer 118, 418A through 418G.

The alternating axis piezoelectric volume 104, 404A through 404G, for example, comprising the active piezoelectric layer 118, 418A through 418G, e.g., the active piezoelectric layer 118, 418A through 418G forming a portion of the alternating axis piezoelectric volume 104, 404A through 404G, e.g., the active piezoelectric layer 118, 418A through 418G having the normal piezoelectric axis orientation substantially opposing the reverse piezoelectric axis orientation of the proximate (e.g., adjacent) bottom piezoelectric layer 105, 405A through 405G, may, but need not facilitate an enhancement in an electromechanical coupling of the bulk acoustic wave resonator 100, 400A through 400G.

In an alternative example, the active piezoelectric layer 118, 418A through 418G may instead have a —reverse-piezoelectric axis orientation. In the alternative example, the active piezoelectric layer 118, 418A through 418G having the reverse piezoelectric axis orientation may be orientated substantially the same as the reverse piezoelectric axis orientation of the proximate (e.g., adjacent) bottom piezoelectric layer 105, 405A through 405G. This may, but need not, facilitate a reduction in the electromechanical coupling of the bulk acoustic wave resonator 100, 400A through 400G.

Further, although a bilayer relatively low acoustic impedance structure comprising the active piezoelectric layer 118, 418A through 418G has been described as having, for example, a thickness of about a quarter acoustic wavelength (e.g., of the main resonant frequency of the bulk acoustic wave resonator 100, 400A through 400G), the thickness, e.g., of the bilayer structure, e.g., of the active piezoelectric layer 118, 418A through 418G, may be varied. For example, the active piezoelectric layer 118, 418A through 418G of the bottom distributed Bragg acoustic reflector electrode 113, 413A through 413G may have a thickness within a range from about five percent to about twenty-five percent of an acoustic wavelength of the main resonant frequency wavelength (e.g., of the main resonant frequency of the bulk acoustic wave resonator 100, 400A through 400G). For example, the active piezoelectric layer 118, 418A through 418G of the bottom distributed Bragg acoustic reflector electrode 113, 413A through 413G may have a thickness that is less than about five percent of the acoustic wavelength of the main resonant frequency wavelength (e.g., of the main resonant frequency of the bulk acoustic wave resonator 100, 400A through 400G).

Bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) may be present in the alternating axis piezoelectric volume 104, 404A through 404G, e.g., interposed between the alternating piezoelectric axis arrangement of the normal piezoelectric axis of active piezoelectric layer 118, 418A through 418G and the reverse piezoelectric axis of the bottom piezoelectric layer 105, 405A through 405G. For example, bottom reflector layer 117, 417A through 417G may be interposed between the active piezoelectric layer 118, 418A through 418G and the bottom piezoelectric layer 105, 405A through 405G, e.g., bottom reflector layer 117, 417A through 417G may interface with (e.g., may be acoustically coupled with) the active piezoelectric layer 118, 418A through 418G and the bottom piezoelectric layer 105, 405A through 405G of the alternating axis piezoelectric volume 104, 404A through 404G. Accordingly, bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) may form a portion of the alternating axis piezoelectric volume 104, 404A through 404G.

Bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) may be present in the bottom distributed Bragg acoustic reflector electrode 113, 413A through 413G. Specifically, bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) may have the thickness of about a quarter acoustic wavelength, and may have the contrasting/relatively high acoustic impedance, relative to relatively low acoustic impedance of adjacent, quarter acoustic wavelength thick bilayer structure comprising active piezoelectric layer 118, 418A through 418G. Accordingly, bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) may form a portion of example bottom distributed Bragg acoustic reflector electrode 113, 413A through 413G. In other words, there may be an overlap (e.g., comprising the bottom reflector layer 117, 417A through 417G) between the alternating axis piezoelectric volume 104, 404A through 404G and the bottom distributed Bragg acoustic reflector electrode 113, 413A through 413G.

For example, the second mesa structure 113, 413A through 413G of bottom distributed Bragg acoustic reflector electrode 113, 413A through 413G may comprise bottom metal reflector electrode layers (e.g., bottom low acoustic impedance metal reflector electrode layer 119, 419A through 419G, e.g., bottom high acoustic impedance metal reflector electrode layer 121, 421A through 421G, e.g., bottom low acoustic impedance metal reflector electrode layer 123, 423A through 423G, e.g., bottom high acoustic impedance metal reflector electrode layer 125, 425A through 425G). However, due the overlap just discussed, bottom high acoustic impedance metal electrode layer 117, 417A through 417G of the bottom distributed Bragg acoustic reflector electrode 113, 413A through 413G may be present in the first mesa structure 104, 404A through 404, of the alternating axis piezoelectric volume 104, 404A through 404G.

The alternating axis piezoelectric volume 104, 404A through 404G comprising the bottom reflector layer 117, 417A through 417G, e.g., the bottom reflector layer 117, 417A through 417G forming a portion of alternating axis piezoelectric volume 104, 404A through 404G, may, but need not facilitate a quality factor enhancement of the bulk acoustic wave resonator 100, 400A through 400G.

Although bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) has been described as having, for example, a thickness of about a quarter acoustic wavelength (e.g., of the main resonant frequency of the bulk acoustic wave resonator 100, 400A through 400G), the thickness of the bottom reflector layer 117, 417A through 417G may be varied. For example, bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) of the bottom distributed Bragg acoustic reflector electrode 113, 413A through 413G may have a thickness within a range from about five percent to about twenty-five percent of an acoustic wavelength of the main resonant frequency wavelength (e.g., of the main resonant frequency of the bulk acoustic wave resonator 100, 400A through 400G).

In another alternative example, bottom reflector layer 117, 417A through 417G (e.g., initial bottom reflector layer 117, 417A through 417G, e.g., bottom metal acoustic reflector electrode layer 117, 417A through 417G, e.g., bottom high acoustic impedance metal electrode layer 117, 417A through 417G, e.g., bottom Tungsten (W) electrode layer 117, 417A through 417G) of the bottom distributed Bragg acoustic reflector electrode 113, 413A through 413G may have a thickness within a range from about five percent to about forty-five percent of an acoustic wavelength of the main resonant frequency wavelength (e.g., of the main resonant frequency of the bulk acoustic wave resonator 100, 400A through 400G). Similarly, an adjacent bottom metal acoustic reflector electrode layer 119, 419A through 419G, e.g., bottom low acoustic impedance metal electrode layer, e.g., bottom Titanium (Ti) electrode layer 119, 419A through 419G of the bottom distributed Bragg acoustic reflector electrode 113, 413A through 413G may have a thickness within a range from about five percent to about forty-five percent of an acoustic wavelength of the main resonant frequency wavelength (e.g., of the main resonant frequency of the bulk acoustic wave resonator 100, 400A through 400G). For example, remainder bottom metal acoustic reflector electrode layers (e.g., bottom high acoustic impedance metal reflector electrode layer 121, 421A through 421G, e.g., bottom low acoustic impedance metal reflector electrode layer 123, 423A through 423G, e.g., bottom high acoustic impedance metal reflector electrode layer 125, 425A through 425G) of the bottom distributed Bragg acoustic reflector electrode 113, 413A through 413G may have respective remainder layer thicknesses within a range from approximately five percent to about twenty-five percent of an acoustic wavelength of the main resonant frequency.

In another example, the bottom distributed Bragg acoustic reflector electrode 113, 413A through 413G may comprise first, second, third and fourth pairs of bottom metal acoustic reflector electrode layers, in which the first, second, third and fourth pairs of bottom metal electrode layers may have respective thicknesses within a range from approximately five percent to about forty-five percent of a wavelength (e.g., of the main resonant frequency of the bulk acoustic wave resonator 100, 400A through 400G).

The bottom distributed Bragg acoustic reflector electrode 113, 413A through 413G may comprise first and second pairs of bottom metal acoustic reflector electrode layers having alternating acoustic impedances. Further, the bottom distributed Bragg acoustic reflector electrode 113, 413A through 413G may comprise first, second and third pairs of bottom metal acoustic reflector electrode layers having alternating acoustic impedances. Moreover, the bottom distributed Bragg acoustic reflector electrode 113, 413A through 413G may comprise first, second, third and fourth pairs of bottom metal acoustic reflector electrode layers having alternating acoustic impedances. In other words, the bottom distributed Bragg acoustic reflector electrode 113, 413A through 413G may comprise a bottom multilayer metal acoustic reflector electrode 113, 413A through 413G (e.g., having alternating acoustic impedances).

Similar to what has been discussed for the bottom electrode stack, likewise the top electrode stack of the plurality of top metal electrode layers of the top acoustic reflector 115, 415A through 415G, may have the alternating arrangement of low acoustic impedance metal layer and high acoustic impedance metal layers. The top electrode stack of the plurality of top metal electrode layers of the top acoustic reflector 115, 415A through 415G, may approximate a top distributed Bragg acoustic reflector, e.g., a top metal distributed Bragg acoustic reflector. The plurality of top metal electrode layers of the top acoustic reflector may be electrically coupled (e.g., electrically interconnected) with one another. The acoustically reflective top electrode stack of the plurality of top metal electrode layers may operate together as a multi-layer (e.g., bi-layer, e.g., multiple layer) top electrode for the top acoustic reflector 115, 415A through 415G. Next in the alternating arrangement of low acoustic impedance metal layer and high acoustic impedance metal layer of the acoustically reflective top electrode stack, may be a first pair of top metal electrode layers 137, 437A through 437G, and 139, 439A through 439G. A first member 137, 437A through 437G, of the first pair of top metal electrode layers may comprise the relatively low acoustic impedance metal, for example, Titanium or Aluminum. A second member 139, 439A through 439G, of the first pair of top metal electrode layers may comprise the relatively high acoustic impedance metal, for example, Tungsten or Molybdenum. Accordingly, the first pair of top metal electrode layers 137, 437A through 437G, 139, 439A through 439G, of the top acoustic reflector 115, 415A through 415G, may be different metals, and may have respective acoustic impedances that are different from one another so as to provide a reflective acoustic impedance mismatch at the resonant frequency (e.g., main resonant frequency). Similarly, the first member of the first pair of top metal electrode layers 137, 437A through 437G, of the top acoustic reflector 115, 415A through 415G, may be different metals, and may have respective acoustic impedances that are different from one another so as to provide a reflective acoustic impedance mismatch at the resonant frequency (e.g., main resonant frequency).

Next in the alternating arrangement of low acoustic impedance metal layer and high acoustic impedance metal layer of the acoustically reflective top electrode stack, a second pair of top metal electrode layers 141, 441A through 441G, and 143, 443A through 443G, may respectively comprise the relatively low acoustic impedance metal and the relatively high acoustic impedance metal. Accordingly, members of the first and second pairs of top metal electrode layers 137, 437A through 437G, 139, 439A through 439G, 141, 441A through 441G, 143, 443A through 443G, may have respective acoustic impedances in the alternating arrangement to provide a corresponding plurality of reflective acoustic impedance mismatches. Next in the alternating arrangement of low acoustic impedance metal layer and high acoustic impedance metal layer of the acoustically reflective top electrode stack, a third pair of top metal electrode layers 145, 445A through 445C, and 147, 447A through 447C, may respectively comprise the relatively low acoustic impedance metal and the relatively high acoustic impedance metal. Next in the alternating arrangement of low acoustic impedance metal layer and high acoustic impedance metal layer of the acoustically reflective top electrode stack, a fourth pair of top metal electrode layers 149, 449A through 449C, 151, 451A through 451C, may respectively comprise the relatively low acoustic impedance metal and the relatively high acoustic impedance metal.

Additionally, the top electrode stack of the plurality of top metal electrode layers of the top acoustic reflector 115, 415A through 415G, may comprise at least a portion of top current spreading layer 171, 471A through 471G. Top current spreading layer 171 may be integrally coupled with top electrical interconnect 171. This may electrically coupled (e.g., integrally coupled with) integrated inductor 174, 474A, 474B, 474C. Top current spreading layer 171 may comprise a gold layer. Previous discussions herein about suitable materials, layer structures and thickness(es) for the example top current spreading are likewise applicable to top current spreading layer 171, 471A through 471G. For brevity and clarity, such discussions are referenced and incorporated rather than repeated in full.

Top current spreading layer 171 may be integrally coupled with top electrical interconnect 171. This may be electrically coupled (e.g., integrally coupled with) integrated inductor 174, 474A, 474B, 474C. Top current spreading layer 171 may comprise a gold layer.

For example, the bottom piezoelectric layer 105, 405A through 405G, may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., fourth pair of top metal electrode layers, 149, 449A through 449C, 151, 451A through 451C, e.g., top current spreading layer 171, 471A through 471G), to excite the piezoelectrically excitable resonance mode (e.g., main resonance mode) at the resonant frequency (e.g., main resonant frequency) of the bottom piezoelectric layer 105, 405A through 405G.

Further, the bottom piezoelectric layer 105, 405A through 405G and the first middle piezoelectric layer 107, 407A through 407G may be electrically and acoustically coupled with and pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., fourth pair of top metal electrode layers, 149, 449A through 449C, 151, 451A through 451C, e.g., top current spreading layer 171, 471A through 471G), to excite the piezoelectrically excitable resonance mode (e.g., main resonance mode) at the resonant frequency (e.g., main resonant frequency) of the bottom piezoelectric layer 105, 405A through 405G acoustically coupled with the first middle piezoelectric layer 107, 407A through 407G. Additionally, the first middle piezoelectric layer 107, 407A through 407G, may be sandwiched between the bottom piezoelectric layer 105, 405A through 405G, and the second middle piezoelectric layer 109, 409A through 409G, and may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., fourth pair of top metal electrode layers, 149, 449A through 449C, 151, 451A through 451C, e.g., top current spreading layer 171, 471A through 471G), to excite the piezoelectrically excitable resonance mode (e.g., main resonance mode) at the resonant frequency (e.g., main resonant frequency) of the first middle piezoelectric layer 107, 407A through 407G, sandwiched between the bottom piezoelectric layer 105, 405A through 405G, and the second middle piezoelectric layer 109, 409A through 409G. Additionally, the second middle piezoelectric layer 109, 409A through 409G, may be sandwiched between the second middle piezoelectric layer 109, 409A through 409G, and the top piezoelectric layer 111, 411A through 411G and may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, e.g., fourth pair of top metal electrode layers, 149, 449A through 449C, 151, 451A through 451C, e.g., top current spreading layer 171, 471A through 471G), to excite the piezoelectrically excitable resonance mode (e.g., main resonance mode) at the resonant frequency (e.g., main resonant frequency) of the second middle piezoelectric layer 109, 409A through 409G, sandwiched between the second middle piezoelectric layer 109, 409A through 409G and the top piezoelectric layer 111, 411A through 411G. The top piezoelectric layer 111, 411A through 411G, may be arranged over the second middle piezoelectric layer 109, 409A through 409G, and may be electrically and acoustically coupled with the pair(s) of top metal electrode layers (e.g., first pair of top metal electrode layers 137, 437A through 437G, 139, 439A through 439G, e.g., second pair of top metal electrode layers 141, 441A through 441G, 143, 443A through 443G, e.g., third pair of top metal electrode layers 145, 445A through 445C, 147, 447A through 447C, fourth pair of top metal electrode layers, 149, 449A through 449C, 151, 451A through 451C, e.g., top current spreading layer 171, 471A through 471G), to excite the piezoelectrically excitable resonance mode (e.g., main resonance mode) at the resonant frequency (e.g., main resonant frequency) of the top piezoelectric layer 111, 411A through 411G, arranged over the second middle piezoelectric layer 109, 409A.

Yet another mesa structure 115, 415A through 415G, (e.g., third mesa structure 115, 415A through 415G), may comprise the top acoustic reflector 115, 415A through 415G, or a portion of the top acoustic reflector 115, 415A through 415G. The yet another mesa structure 115, 415A through 415C, (e.g., third mesa structure 115, 415A through 415C), may comprise one or more pair(s) of top metal electrode layers (e.g., first pair of top metal electrode layers 137, 437A through 437C, 139, 439A through 439C, e.g., second pair of top metal electrode layers 141, 441A through 441C, 143, 443A through 443C, e.g., third pair of top metal electrode layers 145, 445A through 445C, 147, 447A through 447C, e.g., fourth pair of top metal electrode layers 149, 449A through 449C, 151, 451A through 451C).

For example in the figures, the first member of the first pair of top metal electrode layers 137, 437A through 437G, of the top acoustic reflector 115, 415A through 415G, is depicted as relatively thinner (e.g., thickness T11 of the first member of the first pair of top metal electrode layers 137, 437A through 437G is depicted as relatively thinner) than thickness of remainder top acoustic layers (e.g., than thicknesses T12 through T18 of remainder top metal electrode layers). For example, a thickness T11 may be about 60 Angstroms, 60 A, lesser, e.g., substantially lesser, than an odd multiple (e.g., 1×, 3×, etc). of a quarter of a wavelength (e.g., 70 Angstroms lesser than one quarter of the acoustic wavelength) for the first member of the first pair of top metal electrode layers 137, 437A through 437G. For example, if Titanium is used as the low acoustic impedance metal for a 24 GHz resonator (e.g., resonator having a main resonant frequency of about 24 GHz), a thickness T11 may be about 570 Angstroms, 570 A, for the first member of the first pair of top metal electrode layers 137, 437A through 437G, of the top acoustic reflector 115, 415A through 415G, while respective layer thicknesses, T12 through T18, shown in the figures for corresponding members of the pairs of top metal electrode layers may be substantially thicker than T11. Such arrangement of thicknesses and materials e.g., may facilitate enhanced quality factor, e.g., may facilitate suppression of parasitic resonances, e.g., around the main resonant frequency of the example bulk acoustic wave resonators, 100, 400A through 400G.

Accordingly, like the respective layer thicknesses of the bottom metal electrode layers, respective thicknesses of the top metal electrode layers may likewise be related to wavelength (e.g., acoustic wavelength) for the main resonant frequency of the example bulk acoustic wave resonators, 100, 400A through 400G. Further, various embodiments for resonators having relatively higher main resonant frequency may have relatively thinner top metal electrode thicknesses, e.g., scaled thinner with relatively higher main resonant frequency. Similarly, various alternative embodiments for resonators having relatively lower main resonant frequency may have relatively thicker top metal electrode layer thicknesses, e.g., scaled thicker with relatively lower main resonant frequency. Respective layer thicknesses, T12 through T18, shown in FIG. 1A for corresponding members of the pairs of top metal electrode layers may be about an odd multiple (e.g., 1×, 3×, etc). of a quarter of a wavelength (e.g., one quarter of an acoustic wavelength) of the main resonant frequency of the example resonator. Similarly, respective layer thicknesses for corresponding members of the pairs of top metal electrode layers shown in FIGS. 4A through 4G may likewise be about one quarter of a wavelength (e.g., one quarter of an acoustic wavelength) at the main resonant frequency of the example resonator multiplied by an odd multiplier (e.g., 1×, 3×, etc)., and these respective layer thicknesses may likewise be determined for members of the pairs of top metal electrode layers for the high and low acoustic impedance metals employed. However, the foregoing may be varied. For example, members of the pairs of top metal electrode layers of the top acoustic reflector may have respective layer thickness within a range from an odd multiple (e.g., 1×, 3×, etc). of about one eighth to an odd multiple (e.g., 1×, 3×, etc). of about one half wavelength at the resonant frequency.

In an example, if Tungsten is used as the high acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the high impedance metal electrode layer members of the pairs as about five hundred and forty Angstroms (540 A). For example, if Titanium is used as the low acoustic impedance metal, and the main resonant frequency of the resonator is twenty-four gigahertz (e.g., 24 GHz), then using the one quarter of the wavelength (e.g., one quarter of the acoustic wavelength) provides the layer thickness of the low impedance metal electrode layer members of the second, third and fourth pairs as about six hundred and thirty Angstroms (630 A). Similarly, respective layer thicknesses for members of the remainder pairs of top metal electrode layers shown in FIGS. 4A through 4G (e.g., second, third and fourth pairs) may likewise be about one quarter of the wavelength (e.g., one quarter of the acoustic wavelength) of the main resonant frequency of the example resonator, and these respective layer thicknesses may likewise be determined for members of the pairs of top metal electrode layers for the high and low acoustic impedance metals employed.

As shown in the figures, a second member 139, 439A through 439G of the first pair of top metal electrode layers may have a relatively high acoustic impedance (e.g., high acoustic impedance metal layer 139, 439A through 439G, e.g. tungsten metal layer 139, 439A through 439G). A first member 137, 437A through 437G of the first pair of top metal electrode layers may have a relatively low acoustic impedance (e.g., low acoustic impedance metal layer 137, 437A through 437G, e.g., titanium metal layer 137, 437A through 437G). This relatively low acoustic impedance of the first member 137, 437A through 437G of the first pair may be relatively lower than the acoustic impedance of the second member 139, 439A through 439G of the first pair. The first member 137, 437A through 437G having the relatively lower acoustic impedance may abut a first layer of piezoelectric material (e.g. may abut top piezoelectric layer 111, 411A through 411G, e.g. may abut piezoelectric stack 104, 404A through 404G). This arrangement may facilitate suppressing parasitic lateral resonances in operation of the BAW resonator. The first member 137, 437A through 437G having the relatively lower acoustic impedance may be arranged nearest to a first layer of piezoelectric material (e.g. may be arranged nearest to top piezoelectric layer 111, 411A through 411G, e.g. may be arranged nearest to piezoelectric stack 104, 404A through 404G) relative to other top acoustic layers of the top acoustic reflector 115, 415A through 415G (e.g. relative to the second member 139, 439A through 439G of the first pair of top metal electrode layers, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C). This arrangement may facilitate suppressing parasitic lateral resonances in operation of the BAW resonator.

The bottom acoustic reflector 113, 413A through 413G, may have a thickness dimension T23 extending along the stack of bottom electrode layers. For the example of the 24 GHz resonator, the thickness dimension T23 of the bottom acoustic reflector may be about five thousand Angstroms (5,000 A). The top acoustic reflector 115, 415A through 415G, may have a thickness dimension T25 extending along the stack of top electrode layers. For the example of the 24 GHz resonator, the thickness dimension T25 of the top acoustic reflector may be about five thousand Angstroms (5,000 A). The piezoelectric layer stack 104, 404A through 404G, may have a thickness dimension T27 extending along the piezoelectric layer stack 104, 404A through 404G. For the example of the 24 GHz resonator, the thickness dimension T27 of the piezoelectric layer stack may be about eight thousand Angstroms (8,000 A).

In the example resonators 100, 400A through 400G, of FIG. 1A and FIGS. 4A through 4G, a notional heavy dashed line is used in depicting an etched edge region 153, 453A through 453G, associated with the example resonators 100, 400A through 400G. Similarly, a laterally opposing etched edge region 154, 454A through 454G is arranged laterally opposing or opposite from the notional heavy dashed line depicting the etched edge region 153, 453A through 453G. The etched edge region may, but need not, assist with acoustic isolation of the resonators. The etched edge region may, but need not, help with avoiding acoustic losses for the resonators. The etched edge region 153, 453A through 453G, (and the laterally opposing etched edge region 154, 454A through 454G) may extend along the thickness dimension T27 of the piezoelectric layer stack 104, 404A through 404G. The etched edge region 153, 453A through 453G, may extend through (e.g., entirely through or partially through) the piezoelectric layer stack 104, 404A through 404G. Similarly, the laterally opposing etched edge region 154, 454A through 454G may extend through (e.g., entirely through or partially through) the piezoelectric layer stack 104, 404A through 404G. The etched edge region 153, 453A through 453G, (and the laterally opposing etched edge region 154, 454A through 454G) may extend through (e.g., entirely through or partially through) the bottom piezoelectric layer 105, 405A through 405G. The etched edge region 153, 453A through 453G, (and the laterally opposing etched edge region 154, 454A through 454G) may extend through (e.g., entirely through or partially through) the first middle piezoelectric layer 107, 407A through 407G. The etched edge region 153, 453A through 453G, (and the laterally opposing etched edge region 154, 454A through 454G) may extend through (e.g., entirely through or partially through) the second middle piezoelectric layer 109, 409A through 409G. The etched edge region 153, 453A through 453G, (and the laterally opposing etched edge region 154, 454A through 454G) may extend through (e.g., entirely through or partially through) the top piezoelectric layer 111, 411A through 411G.

The etched edge region 153, 453A through 453G, (and the laterally opposing etched edge region 154, 454A through 454G) may extend along the thickness dimension T23 of the bottom acoustic reflector 113, 413A through 413G. The etched edge region 153, 453A through 453G, (and the laterally opposing etched edge region 154, 454A through 454G) may extend through (e.g., entirely through or partially through) the bottom acoustic reflector 113, 413A through 413G. The etched edge region 153, 453A through 453G, (and the laterally opposing etched edge region 154, 454A through 454G) may extend through (e.g., entirely through or partially through) the initial bottom metal electrode layers, 121, 421A through 421G. The etched edge region 153, 453A through 453G (and the laterally opposing etched edge region 154, 454A through 454G) may extend through (e.g., entirely through or partially through) the first pair of bottom metal electrode layers, 123, 423A through 423G, 125, 425A through 425G. The etched edge region 153, 453D (and the laterally opposing etched edge region 154, 454D) may extend through (e.g., entirely through or partially through) the second pair of bottom metal electrode layers, 127, 427D, 129, 429D. The etched edge region 153 (and the laterally opposing etched edge region 154) may extend through (e.g., entirely through or partially through) the third pair of bottom metal electrode layers, 131, 133. The etched edge region 153, 453A 453B, 453D, 453E, 453F and 453G (and the laterally opposing etched edge region 154, 454A 454B, 454D, 454E, 453F and 454G) may extend through (e.g., entirely through or partially through) another pair of bottom metal electrode layers comprising the bilayer bottom current spreading layer 135, 435A 435B, 435D, 435E, 435F and 435G.

The etched edge region 153, 453A through 453G (and the laterally opposing etched edge region 154, 454A through 454G) may extend along the thickness dimension T25 of the top acoustic reflector 115, 415A through 415G. The etched edge region 153, 453A through 453G (and the laterally opposing etched edge region 154, 454A through 454G) may extend through (e.g., entirely through or partially through) the top acoustic reflector 115, 415A through 415G. The etched edge region 153, 453A through 453G (and the laterally opposing etched edge region 154, 454A through 454G) may extend through (e.g., entirely through or partially through) the first pair of top metal electrode layers, 137, 437A through 437G, 139, 439A through 49G. The etched edge region 153, 453A through 453C (and the laterally opposing etched edge region 154, 454A through 454C) may extend through (e.g., entirely through or partially through) the second pair of top metal electrode layers, 141, 441A through 441C, 143, 443A through 443C. The etched edge region 153, 453A through 453C (and the laterally opposing etched edge region 154, 454A through 454C) may extend through (e.g., entirely through or partially through) the third pair of top metal electrode layers, 145, 445A through 445C, 147, 447A through 447C. The etched edge region 153, 453A through 453C (and the laterally opposing etched edge region 154, 454A through 454C) may extend through (e.g., entirely through or partially through) the fourth pair of top metal electrode layers, 149, 449A through 449C, 151, 451A through 451C.

As mentioned previously, mesa structure 104, 404A through 404G (e.g., first mesa structure 104, 404A through 404G) may comprise the respective stack 104, 404A through 404G, of the example four layers of piezoelectric material. The mesa structure 104, 404A through 404G (e.g., first mesa structure 104, 404A through 404G) may extend laterally between (e.g., may be formed between) etched edge region 153, 453A through 453G and laterally opposing etched edge region 154, 454A through 454G. As mentioned previously, another mesa structure 113, 413A through 413G, (e.g., second mesa structure 113, 413A through 413G), may comprise the bottom acoustic reflector 113, 413A through 413G. The another mesa structure 113, 413A through 413G, (e.g., second mesa structure 113, 413A through 413G) may extend laterally between (e.g., may be formed between) etched edge region 153, 453A through 453G and laterally opposing etched edge region 154, 454A through 454G. As mentioned previously, yet another mesa structure 115, 415A through 415G, (e.g., third mesa structure 115, 415A through 415G), may comprise the top acoustic reflector 115, 415A through 415G or a portion of the top acoustic reflector 115, 415A through 415G. The yet another mesa structure 115, 415A through 415G, (e.g., third mesa structure 115, 415A through 415G) may extend laterally between (e.g., may be formed between) etched edge region 153, 453A through 453G and laterally opposing etched edge region 154, 454A through 454G. In some example resonators 100, 400A, 400B, 400D through 400F, the second mesa structure corresponding to the bottom acoustic reflector 113, 413A, 413B, 413D through 413F may be laterally wider than the first mesa structure corresponding to the stack 104, 404A, 404B, 404D through 404F, of the example four layers of piezoelectric material. In some example resonators 100, 400A through 400C, the first mesa structure corresponding to the stack 104, 404A through 404C, of the example four layers of piezoelectric material may be laterally wider than the third mesa structure corresponding to the top acoustic reflector 115, 415A through 415C. In some example resonators 400D through 400G, the first mesa structure corresponding to the stack 404D through 404G, of the example four layers of piezoelectric material may be laterally wider than a portion of the third mesa structure corresponding to the top acoustic reflector 415D through 415G.

An optional mass load layer 155, 455A through 455G, may be added to the example resonators 100, 400A through 400G. For example, filters may include series connected resonator designs and shunt connected resonator designs that may include mass load layers. For example, for ladder band pass filter designs, the shunt resonator may include a sufficient mass load layer so that the parallel resonant frequency (Fp) of the shunt resonator approximately matches the series resonant frequency (Fs) of the series resonator design. Thus the series resonator design (without the mass load layer) may be used for the shunt resonator design, but with the addition of the mass load layer 155, 455A through 455G, for the shunt resonator design. By including the mass load layer, the design of the shunt resonator may be approximately downshifted, or reduced, in frequency relative to the series resonator by a relative amount approximately corresponding to the electromechanical coupling coefficient (Kt2) of the shunt resonator. For the example resonators 100, 400A through 400G, the optional mass load layer 155, 455A through 455G, may be arranged in the top acoustic reflector 115, 415A through 415G, above the first pair of top metal electrode layers. A metal may be used for the mass load. A dense metal such as Tungsten may be used for the mass load 155, 455A through 455G. An example thickness dimension of the optional mass load layer 155, 455A through 455G, may be about one hundred Angstroms (100 A).

However, it should be understood that the thickness dimension of the optional mass load layer 155, 455A through 455G, may be varied depending on how much mass loading is desired for a particular design and depending on which metal is used for the mass load layer. Since there may be less acoustic energy in the top acoustic reflector 115, 415A through 415G, at locations further away from the piezoelectric stack 104, 404A through 404G, there may be less acoustic energy interaction with the optional mass load layer, depending on the location of the mass load layer in the arrangement of the top acoustic reflector. Accordingly, in alternative arrangements where the mass load layer is further away from the piezoelectric stack 104, 404A through 404G, such alternative designs may use more mass loading (e.g., thicker mass load layer) to achieve the same effect as what is provided in more proximate mass load placement designs. Also, in other alternative arrangements the mass load layer may be arranged relatively closer to the piezoelectric stack 104, 404A through 404G. Such alternative designs may use less mass loading (e.g., thinner mass load layer). This may achieve the same or similar mass loading effect as what is provided in previously discussed mass load placement designs, in which the mass load is arranged less proximate to the piezoelectric stack 104, 404A through 404G. Similarly, since Titanium (Ti) or Aluminum (Al) is less dense than Tungsten (W) or Molybdenum (Mo), in alternative designs where Titanium or Aluminum is used for the mass load layer, a relatively thicker mass load layer of Titanium (Ti) or Aluminum (Al) is needed to produce the same mass load effect as a mass load layer of Tungsten (W) or Molybdenum (Mo) of a given mass load layer thickness. Moreover, in alternative arrangements both shunt and series resonators may be additionally mass-loaded with considerably thinner mass loading layers (e.g., having thickness of about one tenth of the thickness of a main mass loading layer) in order to achieve specific filter design goals, as may be appreciated by one skilled in the art.

The example resonators 100, 400A through 400G, of FIG. 1A and FIGS. 4A through 4G may include a plurality of lateral features 157, 457A through 457G, (e.g., patterned layer 157, 457A through 457G, e.g., step mass features 157, 457A through 457G), sandwiched between two top metal electrode layers (e.g., between the second member 139, 439A through 439G, of the first pair of top metal electrode layers and the first member 141, 441A through 441G, of the second pair of top metal electrode layers) of the top acoustic reflector 115, 415A through 415G. As shown in the figures, the plurality of lateral features 157, 457A through 457G, of patterned layer 157, 457A through 457G may comprise step features 157, 457A through 457G (e.g., step mass features 157, 457A through 457G). As shown in the figures, the plurality of lateral features 157, 457A through 457G, may be arranged proximate to lateral extremities (e.g., proximate to a lateral perimeter) of the top acoustic reflector 115, 415A through 415G. At least one of the lateral features 157, 457A through 457G, may be arranged proximate to where the etched edge region 153, 453A through 453G, extends through the top acoustic reflector 115, 415A through 415G.

After the lateral features 157, 457A through 457G, are formed, they may function as a step feature template, so that subsequent top metal electrode layers formed on top of the lateral features 157, 457A through 457G, may retain step patterns imposed by step features of the lateral features 157, 457A through 457G. For example, the second pair of top metal electrode layers 141, 441A through 441G, 143, 443A through 443G, the third pair of top metal electrode layers 145, 445A through 445C, 147, 447A through 447C, and the fourth pair of top metal electrodes 149, 449A through 449C, 151, 451A through 451C, may retain step patterns imposed by step features of the lateral features 157, 457A through 457G. The plurality of lateral features 157, 457A through 457G, may add a layer of mass loading. The plurality of lateral features 157, 457A through 457G, may be made of a patterned metal layer (e.g., a patterned layer of Tungsten (W), Molybdenum (Mo), Titanium (Ti) or Aluminum (Al)). In alternative examples, the plurality of lateral features 157, 457A through 457G, may be made of a patterned dielectric layer (e.g., a patterned layer of Silicon Nitride (SiN), Silicon Dioxide (SiO2) or Silicon Carbide (SiC)). The plurality of lateral features 157, 457A through 457G, may, but need not, limit parasitic lateral acoustic modes (e.g., facilitate suppression of spurious modes) of the example resonators 100, 400A through 400G. Thickness of the patterned layer of the lateral features 157, 457A through 457G, (e.g., thickness of the patterned layers 157, 457A through 457G) may be adjusted, e.g., may be determined as desired. For example, for the 24 GHz resonator, thickness may be adjusted within a range from about fifty Angstroms (50 A) to about five hundred Angstroms (500 A). Lateral step width of the lateral features 157, 457A through 457G (e.g., width of the step mass features 157, 457A through 457G) may be adjusted down, for example, from about two microns (2 um). The foregoing may be adjusted to balance a design goal of limiting parasitic lateral acoustic modes (e.g., facilitating suppression of spurious modes) of the example resonators 100, 400A through 400G as well as increasing average quality factor above the series resonance frequency against other design considerations e.g., maintaining desired average quality factor below the series resonance frequency.

In the example bulk acoustic wave resonator 100 shown in FIG. 1A, the patterned layer 157 may comprise Tungsten (W) (e.g., the step mass feature 157 of the patterned layer may comprise Tungsten (W)). A suitable thickness of the patterned layer 157 (e.g., thickness of the step mass feature 157) and lateral width of features of the patterned layer 157 may vary based on various design parameters e.g., material selected for the patterned layer 157, e.g., the desired resonant frequency of the given resonant design, e.g., effectiveness in facilitating spurious mode suppression. For an example of 24 GHz design of the bulk acoustic wave resonator 100 shown in FIG. 1A in which the patterned layer comprises Tungsten (W), a suitable thickness of the patterned layer 157 (e.g., thickness of the step mass feature 157) may be 200 Angstroms and lateral width of features of the patterned layer 157 (e.g., lateral width of the step mass feature 157) may be 0.8 microns, may facilitate suppression of the average strength of the spurious modes in the passband by approximately fifty percent (50%), as estimated by simulation relative to similar designs without the benefit of patterned layer 157.

In the example resonators 100, 400A through 400C, of FIG. 1A and FIGS. 4A through 4C, a planarization layer 165, 465A through 465C may be included. A suitable material may be used for planarization layer 165, 465A through 465C, for example Silicon Dioxide (SiO2), Hafnium Dioxide (HfO2), polyimide, or BenzoCyclobutene (BCB). An isolation layer 167, 467A through 467C, may also be included and arranged over the planarization layer 165, 465A-465C. A suitable low dielectric constant (low-k), low acoustic impedance (low-Za) material may be used for the isolation layer 167, 467A through 467C, for example polyimide, or BenzoCyclobutene (BCB).

In the example resonators 100, 400A through 400G, of FIG. 1A and FIGS. 4A through 4G, a bottom electrical interconnect 169, 469A through 469G, may be included to interconnect electrically with (e.g., electrically contact with) the bottom acoustic reflector 113, 413A through 413G, stack of the plurality of bottom metal electrode layers. A top electrical interconnect 171, 471A through 471G, may be integrally coupled with top current spreading layer 171 to interconnect electrically with the plurality of top metal electrode layers of the top acoustic reflector 115, 415A through 415G. The bottom electrical interconnect 169, 469A through 469G, and the top electrical interconnect 171, 471A through 471G, may comprise a suitable material, for example, gold (Au). Top electrical interconnect 171, 471A through 471G may have some acoustic coupling, but also may be substantially acoustically isolated from the stack 104, 404A through 404G of the example four layers of piezoelectric material by the top multi-layer metal acoustic reflector electrode 115, 415A through 415G. Top electrical interconnect 171, 471A through 471G may have dimensions selected so that the top electrical interconnect 171, 471A through 471G approximates a fifty ohm electrical transmission line at the main resonant frequency of the bulk acoustic wave resonator 100, 400A through 400G. Top electrical interconnect 171, 471A through 471G may have a thickness that is substantially thicker than a thickness of a pair of top metal electrode layers of the top multi-layer metal acoustic reflector electrode 115, 415A through 415G (e.g., thicker than thickness of the first pair of top metal electrode layers 137, 437A through 437G, 139, 439A through 439G). Top electrical interconnect 171, 471A through 471G may have a thickness within a range from about one hundred Angstroms (100 A) to about five micrometers (5 um). For example, top electrical interconnect 171, 471A through 471G may have a thickness of about two thousand Angstroms (2000 A).

Figure 1B:
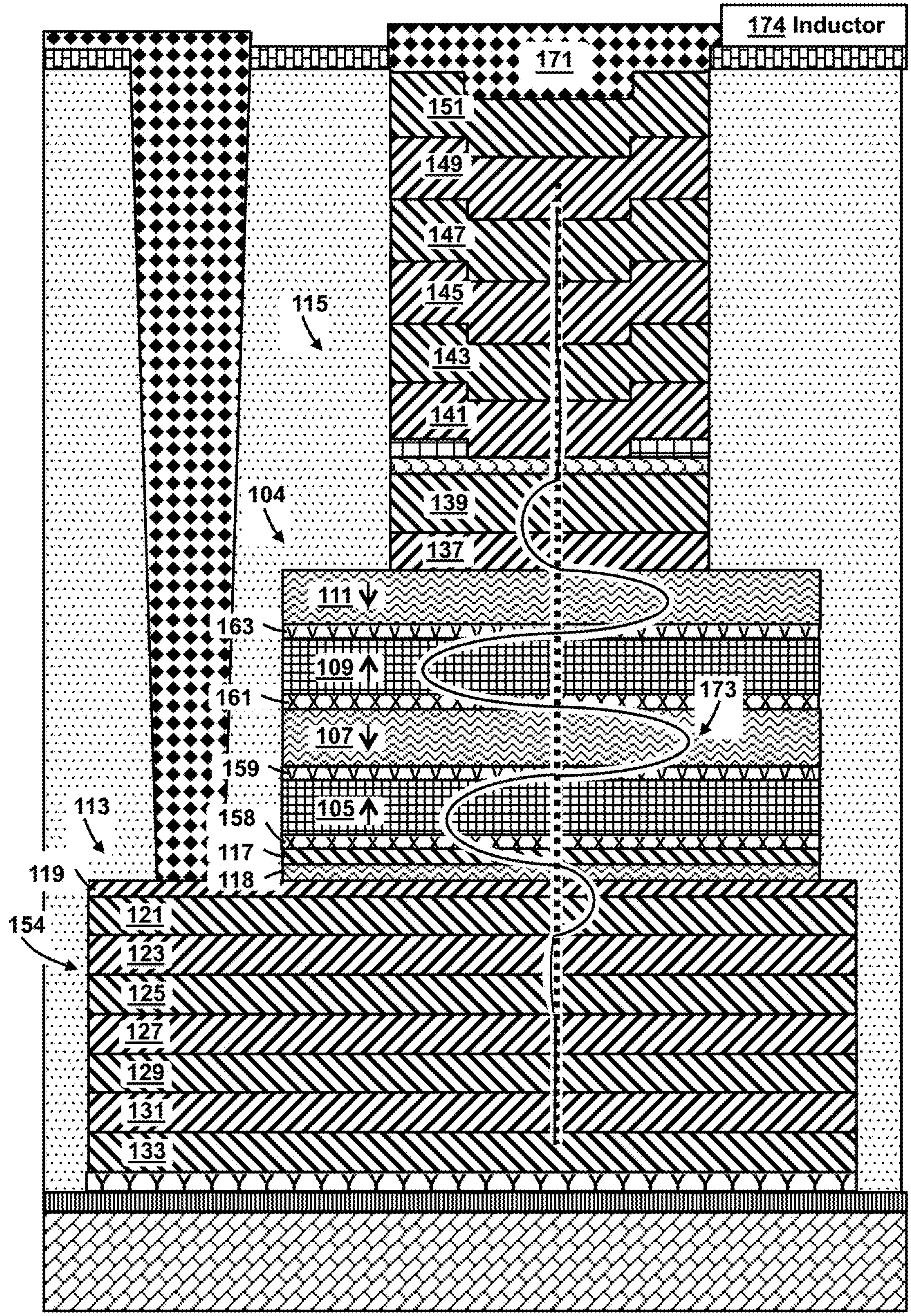
FIG. 1B is a simplified view of FIG. 1A that illustrates acoustic stress profile during electrical operation of the bulk acoustic wave resonator structure shown in FIG. 1A.

FIG. 1B is a simplified view of FIG. 1A that illustrates an example of acoustic stress distribution during electrical operation of the bulk acoustic wave resonator structure shown in FIG. 1A. A notional curved line schematically depicts vertical (Tzz) stress distribution 173 through stack 104 of the example four piezoelectric layers, 105, 107, 109, 111. The stress 173 is excited by the oscillating electric field applied via the top acoustic reflector 115 stack of the plurality of top metal electrode layers 137, 139, 141, 143, 145, 147, 149, 151, and the bottom acoustic reflector 113 stack of the plurality of bottom metal electrode layers 119, 121, 123, 125, 127, 129, 131, 133. The stress 173 has maximum values inside the stack 104 of piezoelectric layers, while exponentially tapering off within the top acoustic reflector 115 and the bottom acoustic reflector 113. Notably, acoustic energy confined in the resonator structure 100 is proportional to stress magnitude.

As discussed previously herein, the example four piezoelectric layers, 105, 107, 109, 111 in the stack 104 may have an alternating axis arrangement in the stack 104. For example the bottom piezoelectric layer 105 may have the reverse axis orientation, which is depicted in FIG. 1B using the upward directed arrow. Next in the alternating axis arrangement of the stack 104, the first middle piezoelectric layer 107 may have the normal axis orientation, which is depicted in FIG. 1B using the downward directed arrow. Next in the alternating axis arrangement of the stack 104, the second middle piezoelectric layer 109 may have the reverse axis orientation, which is depicted in FIG. 1B using the upward directed arrow. Next in the alternating axis arrangement of the stack 104, the top piezoelectric layer 111 may have the normal axis orientation, which is depicted in FIG. 1B using the downward directed arrow. For the alternating axis arrangement of the stack 104, stress 173 excited by the applied oscillating electric field causes reverse axis piezoelectric layers (e.g., bottom and second middle piezoelectric layers 105, 109) to be in extension, while normal axis piezoelectric layers (e.g., first middle and top piezoelectric layers 107, 111) to be in compression. Accordingly, FIG. 1B shows peaks of stress 173 on the right side of the heavy dashed line to depict compression in normal axis piezoelectric layers (e.g., first middle and top piezoelectric layers 107, 111), while peaks of stress 173 are shown on the left side of the heavy dashed line to depict extension in reverse axis piezoelectric layers (e.g., bottom and second middle piezoelectric layers 105, 109). Active piezoelectric layer 118 may have a normal piezoelectric axis orientation. This may substantially oppose the reverse piezoelectric axis orientation of bottom piezoelectric layer 105.

In operation of the BAW resonator shown in FIG. 1B, peaks of standing wave acoustic energy may correspond to absolute value of peaks of stress 173 as shown in FIG. 1B (e.g., peaks of standing wave acoustic energy may correspond to squares of absolute value of peaks of stress 173 as shown in FIG. 1B). Standing wave acoustic energy may be coupled into the multi-layer metal top acoustic reflector electrode 115 shown in FIG. 1B in operation of the BAW resonator. A second member 139 of the first pair of top metal electrode layers may have a relatively high acoustic impedance (e.g., high acoustic impedance metal layer 139, e.g., tungsten layer 139). A first member 137 of the first pair of top metal electrode layers may have a relatively low acoustic impedance (e.g., low acoustic impedance metal layer 137, e.g., titanium layer 137). Accordingly, the first member 137 of the first pair of top metal electrode layers may have acoustic impedance that is relatively lower than the acoustic impedance of the second member 139. The first member 137 having the relatively lower acoustic impedance may be arranged, for example as shown in FIG. 1B, sufficiently proximate to a first layer of piezoelectric material (e.g. sufficiently proximate to top layer of piezoelectric material 111, e.g., sufficiently proximate to stack of piezoelectric material 104) so that standing wave acoustic energy to be in the first member 137 is greater than respective standing wave acoustic energy to be in other respective layers of the multi-layer metal top acoustic reflector electrode 115 in operation of the BAW resonator (e.g., greater than standing wave acoustic energy in the second member 139 of the first pair of top metal electrode layers, e.g., greater than standing wave acoustic energy in the first member 141 of the second pair of top metal electrode layers, e.g., greater than standing wave acoustic energy in the second member 143 of the second pair of top metal electrode layers, e.g., greater than standing wave acoustic energy in the first member 145 of the third pair of top metal electrode layers, e.g., greater than standing wave acoustic energy in the second member 147 of the third pair of top metal electrode layers, e.g., greater than standing wave acoustic energy in the first member 149 of the fourth pair of top metal electrodes, e.g., greater than standing wave acoustic energy in the second member 151 of the fourth pair of top metal electrodes). This may facilitate suppressing parasitic lateral resonances in operation of the BAW resonator shown in FIG. 1B.

Figure 1C:
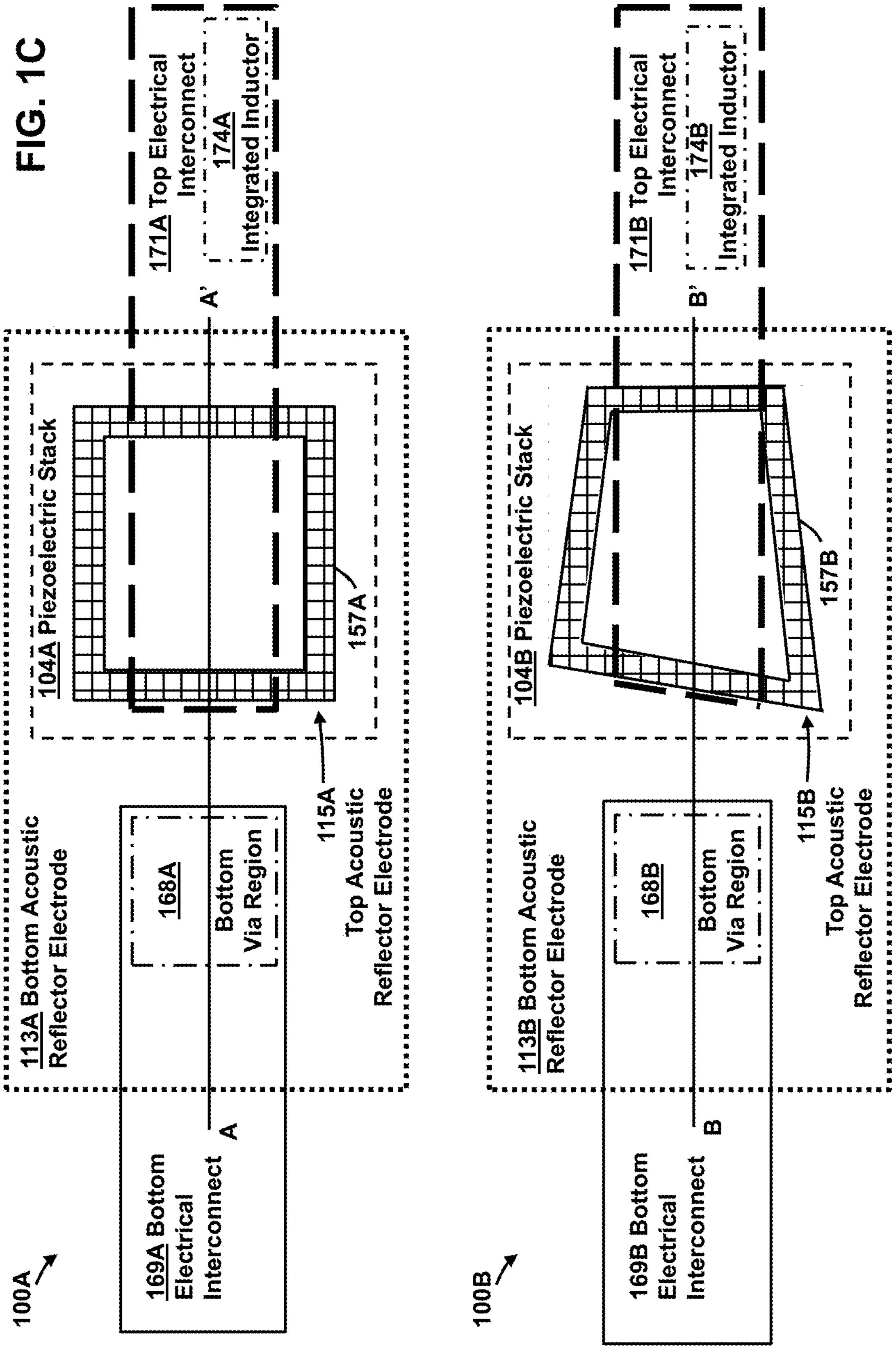
FIG. 1C shows a simplified top plan view of a bulk acoustic wave resonator structure corresponding to the cross sectional view of FIG. 1A, and also shows another simplified top plan view of an alternative bulk acoustic wave resonator structure.

FIG. 1C shows a simplified top plan view of a bulk acoustic wave resonator structure 100A corresponding to the cross sectional view of FIG. 1A, and also shows another simplified top plan view of an alternative bulk acoustic wave resonator structure 100B. The bulk acoustic wave resonator structure 100A includes the stack 104A of four layers of piezoelectric material e.g., having the alternating piezoelectric axis arrangement of the four layers of piezoelectric material. The stack 104A of piezoelectric layers may be sandwiched between the bottom acoustic reflector electrode 113A and the top acoustic reflector electrode 115A. The bottom acoustic reflector electrode may comprise the stack of the plurality of bottom metal electrode layers of the bottom acoustic reflector electrode 113A, e.g., having the alternating arrangement of low acoustic impedance bottom metal electrode layers and high acoustic impedance bottom metal layers. Similarly, the top acoustic reflector electrode 115A may comprise the stack of the plurality of top metal electrode layers of the top acoustic reflector electrode 115A, e.g., having the alternating arrangement of low acoustic impedance top metal electrode layers and high acoustic impedance top metal electrode layers. The top acoustic reflector electrode 115A may include a patterned layer 157A. The patterned layer 157A may approximate a frame shape (e.g., rectangular frame shape) proximate to a perimeter (e.g., rectangular perimeter) of top acoustic reflector electrode 115A as shown in simplified top plan view in FIG. 1C. This patterned layer 157A, e.g., approximating the rectangular frame shape in the simplified top plan view in FIG. 1C, corresponds to the patterned layer 157 shown in simplified cross sectional view in FIG. 1A. Top electrical interconnect 171A extends over (e.g., electrically contacts) top acoustic reflector electrode 115A. Bottom electrical interconnect 169A extends over (e.g., electrically contacts) bottom acoustic reflector electrode 113A through bottom via region 168A. Integrated inductor 174A may be electrically coupled with top electrical interconnect 171A.

FIG. 1C also shows another simplified top plan view of an alternative bulk acoustic wave resonator structure 100B. Similarly, the bulk acoustic wave resonator structure 100B includes the stack 104B of four layers of piezoelectric material e.g., having the alternating piezoelectric axis arrangement of the four layers of piezoelectric material. The stack 104B of piezoelectric layers may be sandwiched between the bottom acoustic reflector electrode 113B and the top acoustic reflector electrode 115B. The bottom acoustic reflector electrode may comprise the stack of the plurality of bottom metal electrode layers of the bottom acoustic reflector electrode 113B, e.g., having the alternating arrangement of low acoustic impedance bottom metal electrode layers and high acoustic impedance bottom metal layers. Similarly, the top acoustic reflector electrode 115B may comprise the stack of the plurality of top metal electrode layers of the top acoustic reflector electrode 115B, e.g., having the alternating arrangement of low acoustic impedance top metal electrode layers and high acoustic impedance top metal electrode layers. The top acoustic reflector electrode 115B may include a patterned layer 157B. The patterned layer 157B may approximate a frame shape (e.g., apodized frame shape) proximate to a perimeter (e.g., apodized perimeter) of top acoustic reflector electrode 115B as shown in simplified top plan view in FIG. 1C. The apodized frame shape may be a frame shape in which substantially opposing extremities are not parallel to one another. This patterned layer 157B, e.g., approximating the apodized frame shape in the simplified top plan view in FIG. 1C, is an alternative embodiment corresponding to the patterned layer 157 shown in simplified cross sectional view in FIG. 1A. Top electrical interconnect 171B extends over (e.g., electrically contacts) top acoustic reflector electrode 115B. Bottom electrical interconnect 169B extends over (e.g., electrically contacts) bottom acoustic reflector electrode 113B through bottom via region 168B. Integrated inductor 174B may be electrically coupled with top electrical interconnect 171B.

Figure 1E:
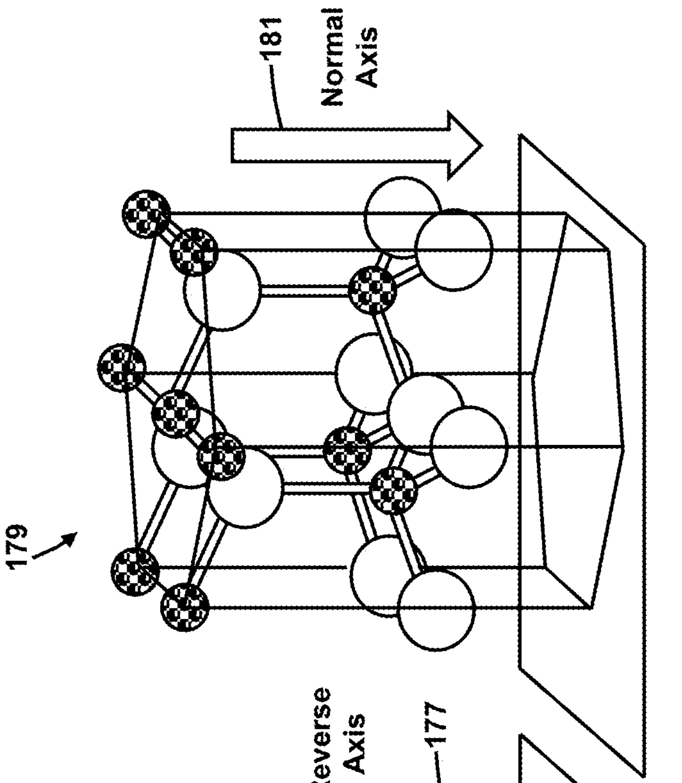
FIG. 1E is a perspective view of an illustrative model of a crystal structure of AlN in piezoelectric material of layers in FIG. 1A having normal axis orientation of positive polarization.
Figure 1D:
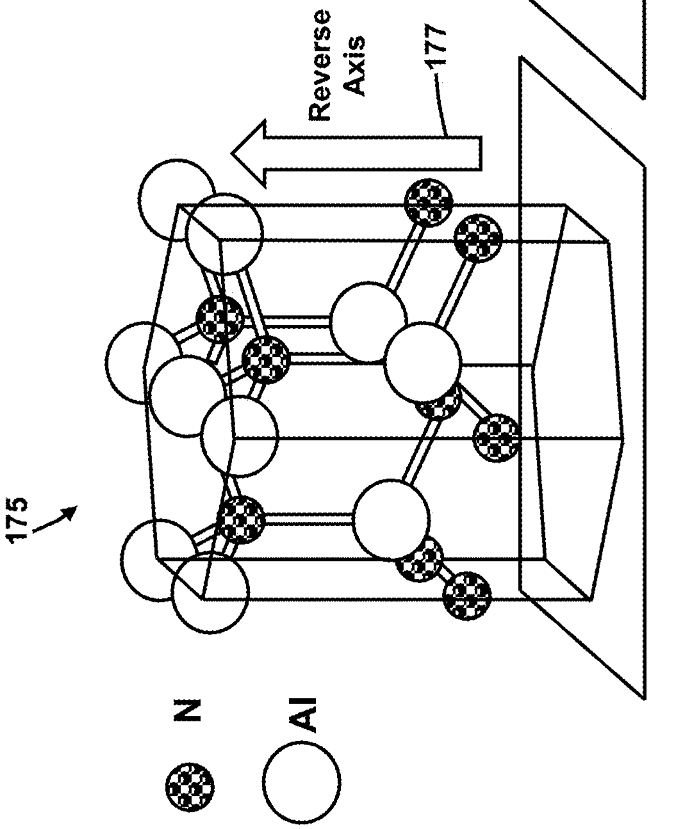
FIG. 1D is a perspective view of an illustrative model of a crystal structure of AlN in piezoelectric material of layers in FIG. 1A having reverse axis orientation of negative polarization.

In FIGS. 1D and 1E, Nitrogen (N) atoms are depicted with a hatching style, while Aluminum (Al) atoms are depicted without a hatching style. FIG. 1D is a perspective view of an illustrative model of a reverse axis crystal structure 175 of Aluminum Nitride, AlN, in piezoelectric material of layers in FIG. 1A, e.g., having reverse axis orientation of negative polarization. For example, first middle and top piezoelectric layers 107, 111 discussed previously herein with respect to FIGS. 1A and 1B are reverse axis piezoelectric layers. By convention, when the first layer of normal axis crystal structure 175 is a Nitrogen, N, layer and second layer in an upward direction (in the depicted orientation) is an Aluminum, Al, layer, the piezoelectric material including the reverse axis crystal structure 175 is said to have crystallographic c-axis negative polarization, or reverse axis orientation as indicated by the upward pointing arrow 177. For example, polycrystalline thin film Aluminum Nitride, AlN, may be grown in the crystallographic c-axis negative polarization, or reverse axis, orientation perpendicular relative to the substrate surface using reactive magnetron sputtering of an aluminum target in a nitrogen atmosphere, and by introducing oxygen into the gas atmosphere of the reaction chamber during fabrication at the position where the flip to the reverse axis is desired. An inert gas, for example, Argon may also be included in a sputtering gas atmosphere, along with the nitrogen and oxygen.

For example, a predetermined amount of oxygen containing gas may be added to the gas atmosphere over a short predetermined period of time or for the entire time the reverse axis layer is being deposited. The oxygen containing gas may be diatomic oxygen containing gas, such as oxygen (O2). Proportionate amounts of the Nitrogen gas (N2) and the inert gas may flow, while the predetermined amount of oxygen containing gas flows into the gas atmosphere over the predetermined period of time. For example, N2 and Ar gas may flow into the reaction chamber in approximately a 3:1 ratio of N2 to Ar, as oxygen gas also flows into the reaction chamber. For example, the predetermined amount of oxygen containing gas added to the gas atmosphere may be in a range from about a thousandth of a percent (0.001%) to about ten percent (10%), of the entire gas flow. The entire gas flow may be a sum of the gas flows of argon, nitrogen and oxygen, and the predetermined period of time during which the predetermined amount of oxygen containing gas is added to the gas atmosphere may be in a range from about a quarter (0.25) second to a length of time needed to create an entire layer, for example. For example, based on mass-flows, the oxygen composition of the gas atmosphere may be about 2 percent when the oxygen is briefly injected. This results in an aluminum oxynitride (ALON) portion of the final monolithic piezoelectric layer, integrated in the Aluminum Nitride, AlN, material, having a thickness in a range of about 5 nm to about 20 nm, which is relatively oxygen rich and very thin. Alternatively, the entire reverse axis piezoelectric layer may be aluminum oxynitride.

FIG. 1E is a perspective view of an illustrative model of a normal axis crystal structure 179 of Aluminum Nitride, AlN, in piezoelectric material of layers in FIG. 1A, e.g., having normal axis orientation of positive polarization. For example, bottom and second middle piezoelectric layers 105, 109 discussed previously herein with respect to FIGS. 1A and 1B are normal axis piezoelectric layers. By convention, when the first layer of the reverse axis crystal structure 179 is an Al layer and second layer in an upward direction (in the depicted orientation) is an N layer, the piezoelectric material including the reverse axis crystal structure 179 is said to have a c-axis positive polarization, or normal axis orientation as indicated by the downward pointing arrow 181. For example, polycrystalline thin film MN may be grown in the crystallographic c-axis positive polarization, or normal axis, orientation perpendicular relative to the substrate surface by using reactive magnetron sputtering of an Aluminum target in a nitrogen atmosphere.

Figure 2A:
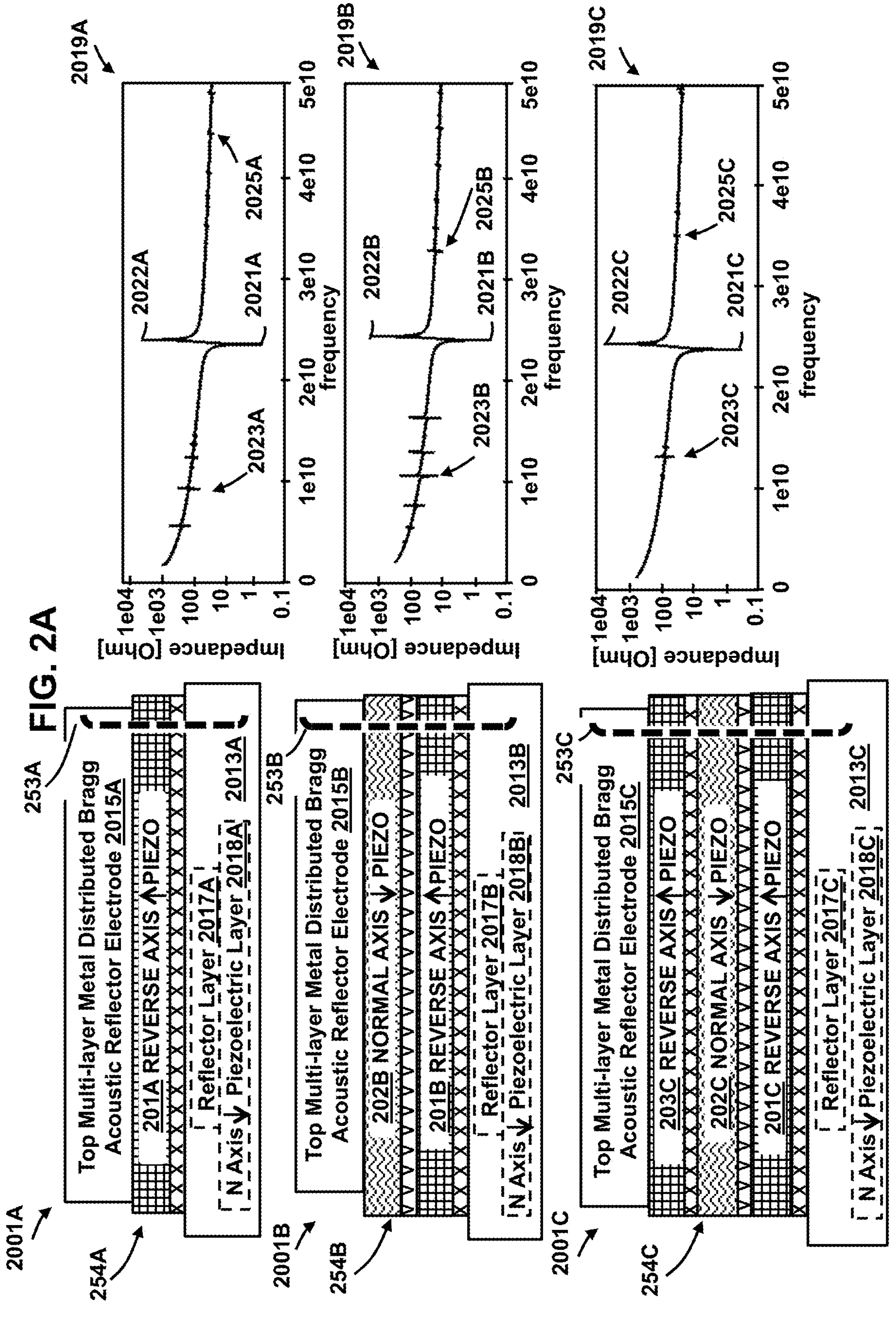
FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis piezoelectric layers, and their respective corresponding impedance versus frequency response during electrical operation, as predicted by simulation.
Figure 2B:
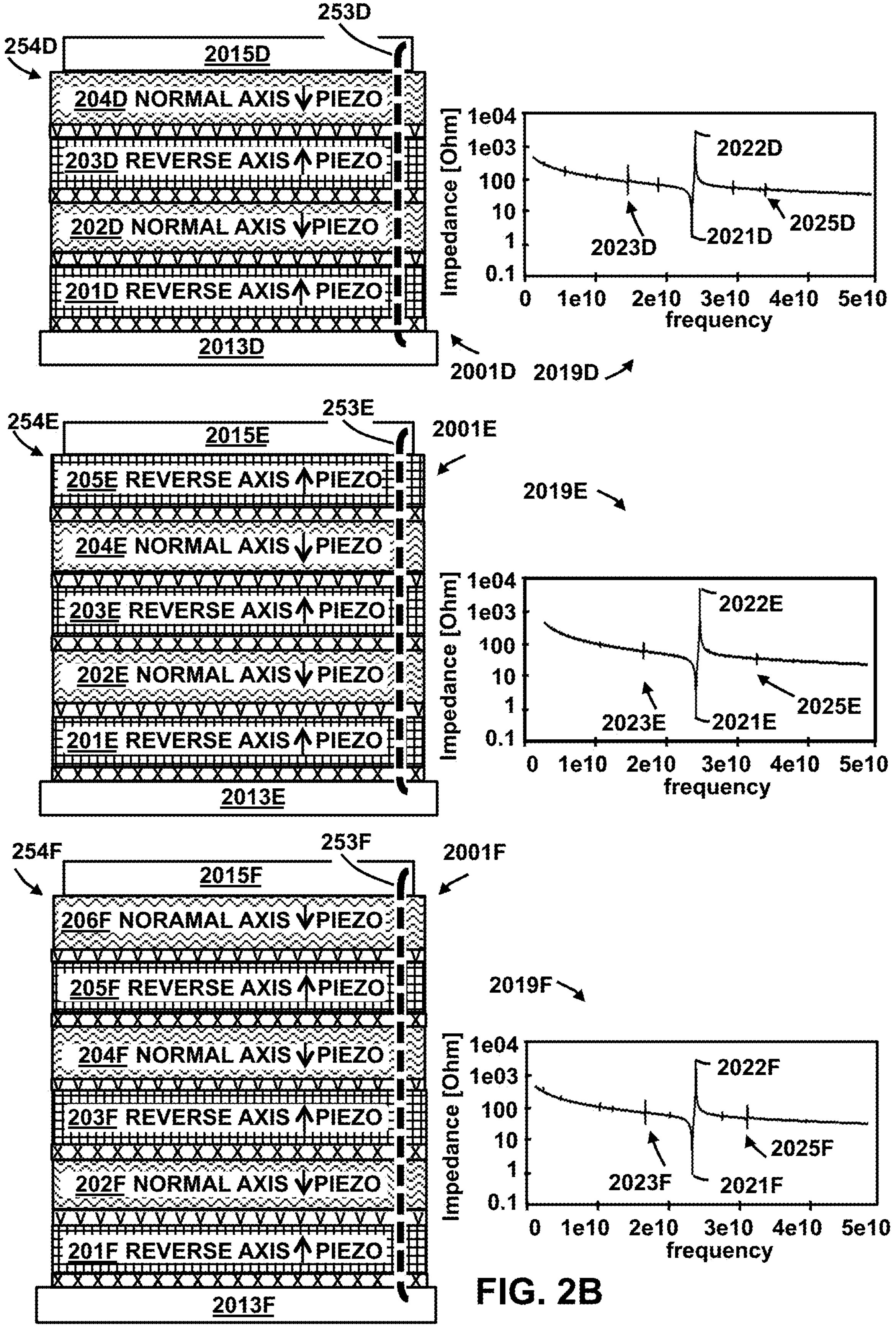
Figure 2C:
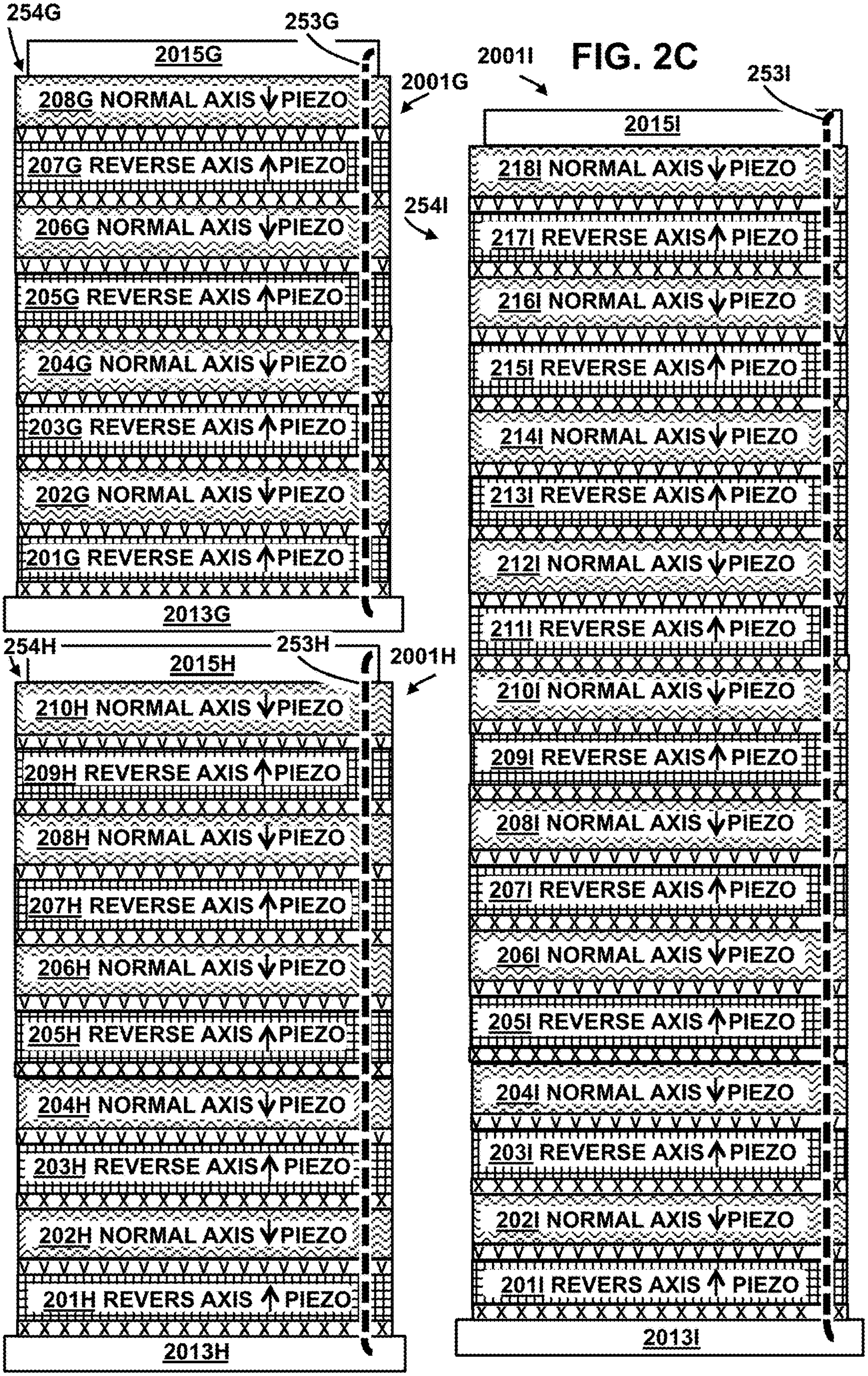
FIG. 2C shows additional alternative bulk acoustic wave resonator structures with additional numbers of alternating axis piezoelectric layers.

FIGS. 2A and 2B show a further simplified view of a bulk acoustic wave resonator similar to the bulk acoustic wave resonator structure shown in FIG. 1A along with its corresponding impedance versus frequency response during its electrical operation, as well as alternative bulk acoustic wave resonator structures with differing numbers of alternating axis piezoelectric layers, and their respective corresponding impedance versus frequency response during electrical operation. FIG. 2C shows additional alternative bulk acoustic wave resonator structures with additional numbers of alternating axis piezoelectric layers. Bulk acoustic wave resonators 2001A through 2001I may, but need not be, bulk acoustic millimeter wave resonators 2001A through 2001I, operable with a main resonance mode having a main resonant frequency that is a millimeter wave frequency (e.g., twenty-four Gigahertz, 24 GHz) in a millimeter wave frequency band. As defined herein, millimeter wave means a wave having a frequency within a range extending from eight Gigahertz (8 GHz) to three hundred Gigahertz (300 GHz), and millimeter wave band means a frequency band spanning this millimeter wave frequency range from eight Gigahertz (8 GHz) to three hundred Gigahertz (300 GHz). Similarly, as defined herein, bulk acoustic millimeter wave resonator (or more generally, an acoustic millimeter wave device) means a bulk acoustic wave resonator (or more generally, an acoustic wave device) having a main resonant frequency (e.g., main series resonant frequency) within a range extending from eight Gigahertz (8 GHz) to three hundred Gigahertz (300 GHz). As defined herein, millimeter acoustic wave filter means a filter comprising a bulk acoustic wave resonator (or more generally, comprising an acoustic wave device) having a main resonant frequency (e.g., main series resonant frequency) within a range extending from eight Gigahertz (8 GHz) to three hundred Gigahertz (300 GHz). Bulk acoustic wave resonators 2001A through 2001I may, but need not be, bulk acoustic Super High Frequency (SHF) wave resonators 2001A through 2001I or bulk acoustic Extremely High Frequency (EHF) wave resonators 2001A through 2001I, as the terms Super High Frequency (SHF) and Extremely High Frequency (EHF) are defined by the International Telecommunications Union (ITU). For example, bulk acoustic wave resonators 2001A through 2001I may be bulk acoustic Super High Frequency (SHF) wave resonators 2001A through 2001I operable with a main resonance mode having a main resonant frequency that is a Super High Frequency (SHF) (e.g., twenty-four Gigahertz, 24 GHz) in a Super High Frequency (SHF) wave frequency band. Piezoelectric layer thicknesses may be selected to determine the main resonant frequency of bulk acoustic Super High Frequency (SHF) wave resonators 2001A through 2001I in the Super High Frequency (SHF) wave band (e.g., twenty-four Gigahertz, 24 GHz main resonant frequency).

Similarly, layer thicknesses of Super High Frequency (SHF) reflector layers (e.g., layer thickness of bottom multi-layer metal distributed Bragg acoustic reflector electrodes 2013A through 2013I, e.g., layer thickness of top multi-layer metal distributed Bragg acoustic reflector electrodes 2015A through 2015I) may be selected to determine peak acoustic reflectivity of such SHF reflectors at a frequency, e.g., peak reflectivity resonant frequency, within the Super High Frequency (SHF) wave band (e.g., a twenty-four Gigahertz, 24 GHz peak reflectivity resonant frequency). Alternatively, bulk acoustic wave resonators 2001A through 2001I may be bulk acoustic Extremely High Frequency (EHF) wave resonators 2001A through 2001I operable with a main resonance mode having a main resonant frequency that is an Extremely High Frequency (EHF) wave band (e.g., thirty-nine Gigahertz, 39 GHz main resonant frequency, e.g., seventy-seven Gigahertz, 77 GHz main resonant frequency) in an Extremely High Frequency (EHF) wave frequency band. As discussed previously herein, piezoelectric layer thicknesses may be selected to determine the main resonant frequency of bulk acoustic Extremely High Frequency (EHF) wave resonators 2001A through 2001I in the Extremely High Frequency (EHF) wave band (e.g., thirty-nine Gigahertz, 39 GHz main resonant frequency, e.g., seventy-seven Gigahertz, 77 GHz main resonant frequency). Similarly, layer thicknesses of Extremely High Frequency (EHF) reflector layers (e.g., layer thickness of bottom multi-layer metal distributed Bragg acoustic reflector electrodes 2013A through 2013I, e.g., layer thickness of top multi-layer metal distributed Bragg acoustic reflector electrodes 2015A through 2015I) may be selected to determine peak acoustic reflectivity of such EHF reflectors at a frequency, e.g., peak reflectivity resonant frequency, within the Extremely High Frequency (EHF) wave band (e.g., a thirty-nine Gigahertz, 39 GHz peak reflectivity resonant frequency, e.g., seventy-seven Gigahertz, 77 GHz main resonant frequency).

The general structures of the top multi-layer metal distributed Bragg acoustic reflector electrodes and the bottom multi-layer metal distributed Bragg acoustic reflector electrodes have already been discussed previously herein with respect of FIGS. 1A and 1B. As already discussed, these structures are directed to respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to one quarter wavelength (e.g., one quarter acoustic wavelength) at a main resonant frequency of the resonator. Accordingly, it should be understood that the bulk acoustic wave resonators 2001A, 2001B, 2000C shown in FIG. 2A include respective top multi-layer metal distributed Bragg acoustic reflector electrodes 2015A, 2015B, 2015C and bottom multi-layer metal distributed Bragg acoustic reflector electrodes 2013A, 2013B, 2013C, in which the respective pairs of metal electrode layers have layer thicknesses corresponding to a quarter wavelength (e.g., one quarter of an acoustic wavelength) at respective main resonant frequencies of the respective bulk acoustic wave resonators 2001A, 2001B, 2001C. Further, as shown in FIG. 2A, bottom multi-layer metal distributed Bragg acoustic reflector electrodes 2013A, 2013B, 2013C may comprise respective active piezoelectric layers 2018A, 2018B, 2018C (e.g., having respective thicknesses of approximately a quarter acoustic wavelength, e.g., having respective normal piezoelectric axis orientations). For example, bottom multi-layer metal distributed Bragg acoustic reflector electrodes 2013A, 2013B, 2013C may comprise respective bottom high acoustic impedance metal acoustic reflector electrode layers 2017A, 2017B, 2017C.

Respective bottom high acoustic impedance metal acoustic reflector electrode layers 2017A, 2017B, 2017C may be interposed between respective active piezoelectric layers 2018A, 2018B, 2018C and respective half acoustic wavelength thick piezoelectric layers (e.g., piezoelectric layer 201A having the reverse piezoelectric axis orientation, e.g., piezoelectric layer 201B having the reverse piezoelectric axis orientation, e.g., piezoelectric layer 201C having the reverse piezoelectric axis orientation). Respective normal piezoelectric orientation of the active piezoelectric layers 2018A, 2018B, 2018C may substantially oppose the respective reverse piezoelectric orientations of adjacent half acoustic wavelength thick piezoelectric layers 201A 201B, 201B.

Shown in FIG. 2A is a bulk acoustic wave resonator 2001A including the reverse axis piezoelectric layer 201A sandwiched between top multi-layer metal distributed Bragg acoustic reflector electrode 2015A and bottom multi-layer metal distributed Bragg acoustic reflector electrode 2013A. Also shown in FIG. 2A is bulk acoustic wave resonator 2001B including a reverse axis piezoelectric layer 201B and a normal axis piezoelectric layer 202B arranged in a two piezoelectric layer alternating stack arrangement sandwiched between top multi-layer metal distributed Bragg acoustic reflector electrode 2015B and bottom multi-layer metal distributed Bragg acoustic reflector electrode 2013B. A bulk acoustic wave resonator 2001C includes a reverse axis piezoelectric layer 201C, a normal axis piezoelectric layer 202C, and another reverse axis piezoelectric layer 203C arranged in a three piezoelectric layer alternating stack arrangement sandwiched between top multi-layer metal distributed Bragg acoustic reflector electrode 2015C and bottom multi-layer metal distributed Bragg acoustic reflector electrode 2013C.

Included in FIG. 2B is bulk acoustic wave resonator 2001D in a further simplified view similar to the bulk acoustic wave resonator structure shown in FIGS. 1A and 1B and including a reverse axis piezoelectric layer 201D, a normal axis piezoelectric layer 202D, and another reverse axis piezoelectric layer 203D, and another normal axis piezoelectric layer 204D arranged in a four piezoelectric layer alternating stack arrangement sandwiched between top multi-layer metal distributed Bragg acoustic reflector electrode 2015D and bottom multi-layer metal distributed Bragg acoustic reflector electrode 2013D. A bulk acoustic wave resonator 2001E includes a reverse axis piezoelectric layer 201E, a normal axis piezoelectric layer 202E, another reverse axis piezoelectric layer 203E, another normal axis piezoelectric layer 204E, and yet another reverse axis piezoelectric layer 205E arranged in a five piezoelectric layer alternating stack arrangement sandwiched between top multi-layer metal distributed Bragg acoustic reflector electrode 2015E and bottom multi-layer metal distributed Bragg acoustic reflector electrode 2013E. A bulk acoustic wave resonator 2001F includes a reverse axis piezoelectric layer 201F, a normal axis piezoelectric layer 202F, another revere axis piezoelectric layer 203F, another normal axis piezoelectric layer 204F, yet another reverse axis piezoelectric layer 205F, and yet another normal axis piezoelectric layer 206F arranged in a six piezoelectric layer alternating stack arrangement sandwiched between top multi-layer metal distributed Bragg acoustic reflector electrode 2015F and bottom multi-layer metal distributed Bragg acoustic reflector electrode 2013F.

Bottom multi-layer metal distributed Bragg acoustic reflector electrodes 2013D, 2013E, 2013F may be structured and may be arranged similarly to bottom multi-layer metal distributed Bragg acoustic reflector electrodes discussed previously herein, for example, bottom multi-layer metal distributed Bragg acoustic reflector electrodes 2013A, 2013B, 2013C. For example bottom multi-layer metal distributed Bragg acoustic reflector electrodes 2013D, 2013E, 2013F may comprise respective active piezoelectric layers (e.g., having respective thicknesses of approximately a quarter acoustic wavelength, e.g., having respective normal piezoelectric axis orientations). For brevity and clarity, these discussions are referenced and incorporated, rather than explicitly repeated here for bottom multi-layer metal distributed Bragg acoustic reflector electrodes 2013D, 2013E, 2013F.

In FIG. 2A, shown directly to the right of the bulk acoustic wave resonator 2001A including the reverse axis piezoelectric layer 201A, is a corresponding diagram 2019A depicting its impedance versus frequency response during its electrical operation, as predicted by simulation. The diagram 2019A depicts the main resonant peak 2021A (e.g., main resonant admittance peak 2021A) of the main resonant mode of the bulk acoustic wave resonator 2001A at its main resonant frequency (e.g., its 24 GHz series resonant frequency). The diagram 2019A also depicts the satellite resonance peaks 2023A, 2025A of the satellite resonant modes of the bulk acoustic wave resonator 2001A at satellite frequencies above and below the main resonant frequency 2021A (e.g., above and below the 24 GHz series resonant frequency). Relatively speaking, the main resonant mode corresponding to the main resonance peak 2021A (e.g., main resonant admittance peak 2021A) is the strongest resonant mode because it is stronger than all other resonant modes of the resonator 2001A, (e.g., stronger than the satellite modes corresponding to relatively lesser satellite resonance peaks 2023A, 2025A).

Similarly, in FIGS. 2A and 2B, shown directly to the right of the bulk acoustic wave resonators 2001B through 2001F are respective corresponding diagrams 2019B through 2019F depicting corresponding impedance versus frequency response during electrical operation, as predicted by simulation. The diagrams 2019B through 2019F depict respective example SHF main resonant peaks 2021B through 2021F (e.g., main resonant admittance peaks 2021B through 2021F) of respective corresponding main resonant modes of bulk acoustic SHF wave resonators 2001B through 2001F at respective corresponding main resonant frequencies (e.g., respective 24 GHz series resonant frequencies). The diagrams 2019B through 2019F also depict respective example satellite resonance peaks 2023B through 2023F, 2025B through 2025F of respective corresponding satellite resonant modes of the bulk acoustic SHF wave resonators 2001B through 2001F at respective corresponding satellite frequencies above and below the respective corresponding main resonant frequencies 2021B through 2021F (e.g., above and below the corresponding respective 24 GHz series resonant frequencies). Relatively speaking, for the corresponding respective main resonant modes, its corresponding respective main resonant peak 2021B through 2021F (e.g., main resonant admittance peaks 2021B through 2021F) is the strongest for its bulk acoustic SHF wave resonators 2001B through 2001F (e.g., stronger than the corresponding respective satellite modes and corresponding respective lesser SHF satellite resonance peaks 2023B, 2025B). Also shown in FIGS. 2A and 2B are respective main parallel resonance peaks 2022A through 2022F For the bulk acoustic SHF wave resonator 2001F having the alternating axis stack of six piezoelectric layers, simulation of the 24 GHz design predicts an average passband quality factor of approximately 1,700. Scaling this 24 GHz, six piezoelectric layer design to a 37 GHz, six piezoelectric layer design for a example EHF resonator 2001F, may have an average passband quality factor of approximately 1,300 as predicted by simulation. Scaling this 24 GHz, six piezoelectric layer design to a 77 GHz, six piezoelectric layer design for another example EHF resonator 2001F, may have an average passband quality factor of approximately 730 as predicted by simulation.

As mentioned previously, FIG. 2C shows additional alternative bulk acoustic wave resonator structures with additional numbers of alternating axis piezoelectric layers. A bulk acoustic wave resonator 2001G includes four reverse axis piezoelectric layers 201G, 203G, 205G, 207G, and four normal axis piezoelectric layers 202G, 204G, 206G, 208G arranged in an eight piezoelectric layer alternating stack arrangement sandwiched between top multi-layer metal distributed Bragg acoustic reflector electrode 2015G and bottom multi-layer metal distributed Bragg acoustic reflector electrode 2013G. A bulk acoustic resonator 2001H includes five reverse axis piezoelectric layers 201H, 203H, 205H, 207H, 209H and five normal axis piezoelectric layers 202H, 204H, 206H, 208H, 210H arranged in a ten piezoelectric layer alternating stack arrangement sandwiched between top multi-layer metal distributed Bragg acoustic reflector electrode 2015H and bottom multi-layer metal distributed Bragg acoustic reflector electrode 2013H. A bulk acoustic wave resonator 2001I includes nine reverse axis piezoelectric layers 201I, 203I, 205I, 207I, 209I, 211I, 213I, 215I, 217I and nine normal axis piezoelectric layers 202I, 204I, 206I, 208I, 210I, 212I, 214I, 216I, 218I arranged in an eighteen piezoelectric layer alternating stack arrangement sandwiched between top multi-layer metal distributed Bragg acoustic reflector electrode 2015I and bottom multi-layer metal distributed Bragg acoustic reflector electrode 2013I.

For the bulk acoustic wave resonator 2001I having the alternating axis stack of eighteen piezoelectric layers, simulation of the 24 GHz design predicts an average passband quality factor of approximately 2,700. Scaling this 24 GHz, eighteen piezoelectric layer design to a 37 GHz, eighteen piezoelectric layer design, may have an average passband quality factor of approximately 2000 as predicted by simulation. Scaling this 24 GHz, eighteen piezoelectric layer design to a 77 GHz, eighteen piezoelectric layer design, may have an average passband quality factor of approximately 1,130 as predicted by simulation.

Bottom multi-layer metal distributed Bragg acoustic reflector electrodes 2013G, 2013H, 2013I may be structured and may be arranged similarly to bottom multi-layer metal distributed Bragg acoustic reflector electrodes discussed previously herein, for example, bottom multi-layer metal distributed Bragg acoustic reflector electrodes 2013A, 2013B, 2013C. For example bottom multi-layer metal distributed Bragg acoustic reflector electrodes 2013G, 2013H, 2013I may comprise respective active piezoelectric layers (e.g., having respective thicknesses of approximately a quarter acoustic wavelength, e.g., having respective normal piezoelectric axis orientations). For brevity and clarity, these discussions are referenced and incorporated, rather than explicitly repeated here for bottom multi-layer metal distributed Bragg acoustic reflector electrodes 2013G, 2013H, 2013I.

In the example resonators, 2001A through 2001I, of FIGS. 2A through 2C, a notional heavy dashed line is used in depicting respective etched edge region, 253A through 253I, associated with the example resonators, 2001A through 2001I. Similarly, in the example resonators, 2001A through 2001I, of FIGS. 2A through 2C, a laterally opposed etched edge region 254A through 254I may be arranged laterally opposite from etched edge region, 253A through 253I. The respective etched edge region may, but need not, assist with acoustic isolation of the resonators, 2001A through 2001I. The respective etched edge region may, but need not, help with avoiding acoustic losses for the resonators, 2001A through 2001I. The respective etched edge region, 253A through 253I, (and the laterally opposed etched edge region 254A through 254I) may extend along the thickness dimension of the respective piezoelectric layer stack. The respective etched edge region, 253A through 253I, (and the laterally opposed etched edge region 254A through 254I) may extend through (e.g., entirely through or partially through) the respective piezoelectric layer stack. The respective etched edge region, 253A through 253I may extend through (e.g., entirely through or partially through) the respective first piezoelectric layer, 201A through 201I. The respective etched edge region, 253B through 253I, (and the laterally opposed etched edge region 254B through 254I) may extend through (e.g., entirely through or partially through) the respective second piezoelectric layer, 202B through 202I. The respective etched edge region, 253C through 253I, (and the laterally opposed etched edge region 254C through 254I) may extend through (e.g., entirely through or partially through) the respective third piezoelectric layer, 203C through 203I. The respective etched edge region, 253D through 253I, (and the laterally opposed etched edge region 254D through 254I) may extend through (e.g., entirely through or partially through) the respective fourth piezoelectric layer, 204D through 204I. The respective etched edge region, 253E through 253I, (and the laterally opposed etched edge region 254E through 254I) may extend through (e.g., entirely through or partially through) the respective additional piezoelectric layers of the resonators, 2001E through 2001I. The respective etched edge region, 253A through 253I, (and the laterally opposed etched edge region 254A through 254I) may extend along the thickness dimension of the respective bottom multi-layer metal distributed Bragg acoustic reflector electrode, 2013A through 2013I, of the resonators, 2001A through 2001I. The respective etched edge region, 253A through 253I, (and the laterally opposed etched edge region 254A through 254I) may extend through (e.g., entirely through or partially through) the respective bottom multi-layer metal distributed Bragg acoustic reflector electrode, 2013A through 2013I. The respective etched edge region, 253A through 253I, (and the laterally opposed etched edge region 254A through 254I) may extend along the thickness dimension of the respective top multi-layer metal distributed Bragg acoustic reflector electrode, 2015A through 2015I of the resonators, 2001A through 2001I. The etched edge region, 253A through 253I, (and the laterally opposed etched edge region 254A through 254I) may extend through (e.g., entirely through or partially through) the respective top multi-layer metal distributed Bragg acoustic reflector electrode, 2015A through 2015I.

As shown in FIGS. 2A through 2C, first mesa structures corresponding to the respective stacks of half acoustic wavelength thick piezoelectric material layers may extend laterally between (e.g., may be formed between) etched edge regions 253A through 253I and laterally opposing etched edge region 254A through 254I. Second mesa structures corresponding to bottom multi-layer metal distributed Bragg acoustic reflector electrode 2013A through 2013I may extend laterally between (e.g., may be formed between) etched edge regions 153A through 153I and laterally opposing etched edge region 154A through 154I. Third mesa structures corresponding to top multi-layer metal distributed Bragg acoustic reflector electrode 2015A through 2015I may extend laterally between (e.g., may be formed between) etched edge regions 153A through 153I and laterally opposing etched edge region 154A through 154I.

In accordance with the teachings herein, various bulk acoustic wave resonators may include: a seven piezoelectric layer alternating axis stack arrangement; a nine piezoelectric layer alternating axis stack arrangement; an eleven piezoelectric layer alternating axis stack arrangement; a twelve piezoelectric layer alternating axis stack arrangement; a thirteen piezoelectric layer alternating axis stack arrangement; a fourteen piezoelectric layer alternating axis stack arrangement; a fifteen piezoelectric layer alternating axis stack arrangement; a sixteen piezoelectric layer alternating axis stack arrangement; and a seventeen piezoelectric layer alternating axis stack arrangement; and that these stack arrangements may be sandwiched between respective top multi-layer metal distributed Bragg acoustic reflector electrodes and respective bottom multi-layer metal distributed Bragg acoustic reflector electrodes. Mass load layers and lateral features (e.g., step features) as discussed previously herein with respect to FIG. 1A are not explicitly shown in the simplified diagrams of the various resonators shown in FIGS. 2A, 2B and 2C. However, such mass load layers may be included, and such lateral features may be included, and may be arranged between, for example, top metal electrode layers of the respective top acoustic reflectors of the resonators shown in FIGS. 2A, 2B and 2C. Further, such mass load layers may be included, and such lateral features may be included, and may be arranged between, for example, top metal electrode layers of the respective top acoustic reflectors in the various resonators having the alternating axis stack arrangements of various numbers of piezoelectric layers, as described in this disclosure.

Further, it should be understood that interposer layers as discussed previously herein with respect to FIG. 1A are explicitly shown in the simplified diagrams of the various resonators shown in FIGS. 2A, 2B and 2C. Such interposers may be included and interposed between adjacent piezoelectric layers in the various resonators shown in FIGS. 2A, 2B and 2C, and further may be included and interposed between adjacent piezoelectric layers in the various resonators having the alternating axis stack arrangements of various numbers of piezoelectric layers, as described in this disclosure.

Figure 3A:
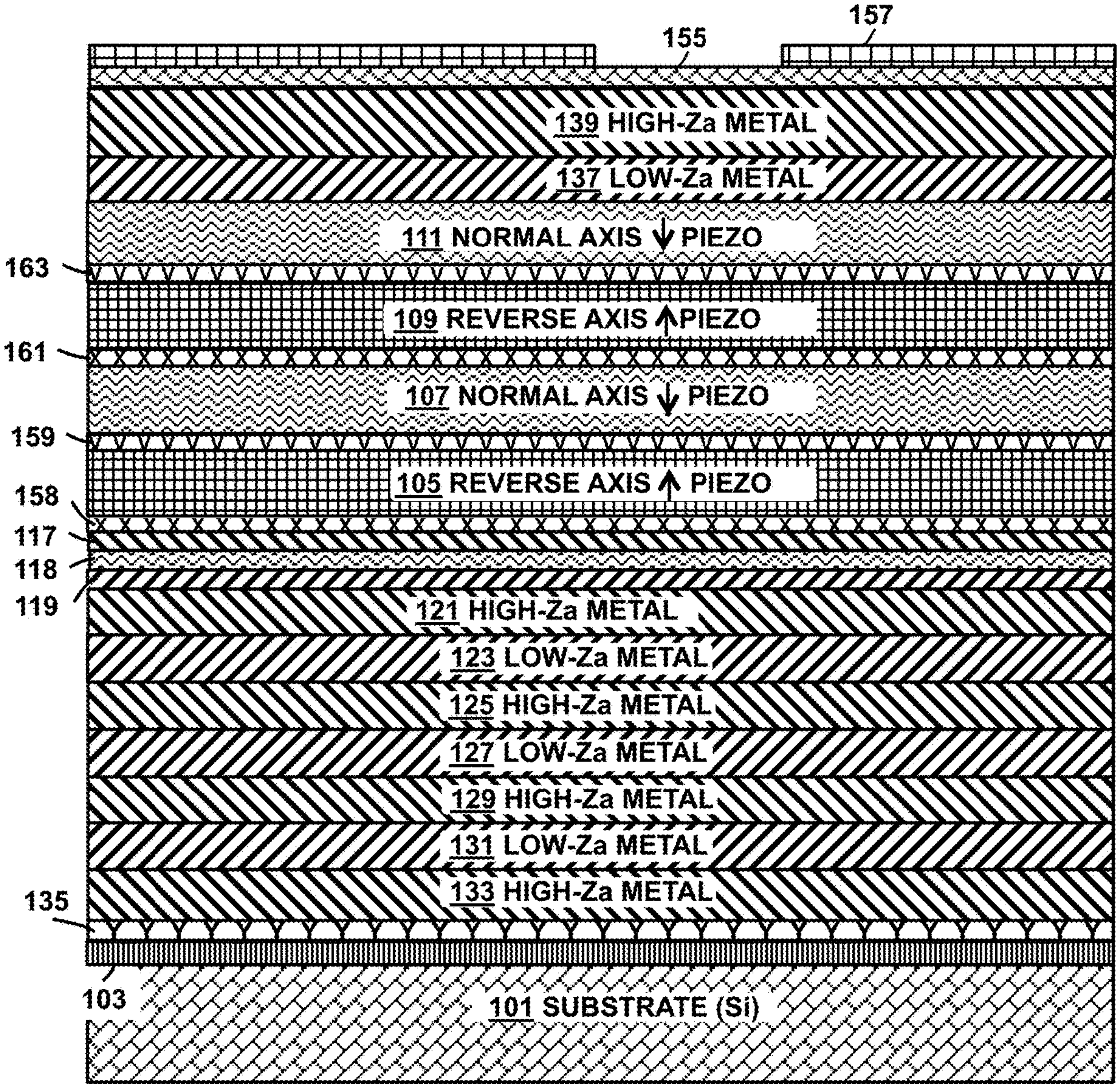
FIGS. 3A through 3E illustrate example integrated circuit structures used to form the example bulk acoustic wave resonator structure of FIG. 1A. Note that although AlN is used as an example piezoelectric layer material, the present disclosure is not intended to be so limited. For example, in some embodiments, the piezoelectric layer material may include other group III material-nitride (III-N) compounds (e.g., any combination of one or more of gallium, indium, and aluminum with nitrogen), and further, any of the foregoing may include doping, for example, of Scandium and/or Magnesium doping.

FIGS. 3A through 3E illustrate example integrated circuit structures used to form the example bulk acoustic wave resonator structure of FIG. 1A. As shown in FIG. 3A, magnetron sputtering may sequentially deposit layers on silicon substrate 101. Initially, a seed layer 103 of suitable material (e.g., aluminum nitride (AlN), e.g., silicon dioxide ($SiO_2$), e.g., aluminum oxide ($Al_2O_3$), e.g., silicon nitride ($Si_3N_4$), e.g., amorphous silicon (a-Si), e.g., silicon carbide (SiC)) may be deposited, for example, by sputtering from a respective target (e.g., from an aluminum, silicon, or silicon carbide target). The seed layer may have a layer thickness in a range from approximately one hundred Angstroms (100 A) to approximately one micron (1 um). In some examples, the seed layer 103 may also be at least partially formed of electrical conductivity enhancing material such as Aluminum (Al) or Gold (Au). Next a bottom current spreading layer 135 may be sputter deposited on the seed layer 103. Bottom current spreading layer 135 may be bilayer. Bottom current spreading layer 135 may comprise a relatively low acoustic impedance metal (e.g., Aluminum) sputtered over a sputter deposited relatively high acoustic impedance metal (e.g., Tungsten). Previous discussions herein, for example, about materials, structures and layer thicknesses for current spreading layers (e.g., top current spreading layer, e.g. bottom current spreading layer) may likewise be applicable to bottom current spreading layer 135. For brevity and clarity, such discussions are referenced and incorporated rather than repeated in full.

Next, successive pairs of alternating layers of high acoustic impedance metal and low acoustic impedance metal may be deposited by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the third pair of bottom metal electrode layers, 133, 131, may be deposited by sputtering the high acoustic impedance metal for a first bottom metal electrode layer 133 of the pair on the current spreading layer 135, and then sputtering the low acoustic impedance metal for a second bottom metal electrode layer 131 of the pair on the first layer 133 of the pair. Similarly, the second pair of bottom metal electrode layers, 129, 127, may then be deposited by sequentially sputtering from the high acoustic impedance metal target and the low acoustic impedance metal target. Similarly, the first pair of bottom metal electrodes 125, 123, may then be deposited by sequentially sputtering from the high acoustic impedance metal target and the low acoustic impedance metal target. Respective layer thicknesses of bottom metal electrode layers of the first, second and third pairs 123, 125, 127, 129, 131, 133 may correspond to approximately a quarter wavelength (e.g., a quarter of an acoustic wavelength) of the resonant frequency at the resonator (e.g., respective layer thickness of about six hundred Angstroms (660 A) for the example 24 GHz resonator). An initial bottom metal electrode layer 121 of high acoustic impedance metal (e.g., Tungsten) may be sputtered over low acoustic impedance metal electrode layer 124 of the first pair of bottom metal electrode layers for the bottom acoustic reflector. Initial bottom metal electrode layer 121 of the high acoustic impedance metal (e.g., Tungsten) is depicted as relatively thinner than thickness of remainder bottom acoustic layers. For example, a thickness of initial bottom metal electrode layer 121 may be, for example, about an eighth wavelength (e.g., an eighth of an acoustic wavelength) of the resonant frequency of the resonator (e.g., layer thickness of about one hundred (100 A) to about three hundred Angstroms (300 A) for the example 24 GHz resonator).

Next, a bilayer relatively low acoustic impedance structure may comprise normal axis piezoelectric (e.g., AlN) layer 118 (e.g., having relatively low acoustic impedance) sputter deposited over sputter deposition of relatively low acoustic impedance (e.g., Titanium (Ti)) bottom metal reflector electrode layer 119. This bilayer structure may have a combined thickness of about quarter acoustic wavelength. In examples of bulk acoustic wave resonators designed for main resonant frequency of about twenty four GigaHertz (24

GHz): bottom low acoustic impedance metal (e.g., Ti) reflector electrode layer 119 may have a thickness of approximately five hundred and twenty five Angstrom (525 A), and relatively low acoustic impedance piezoelectric (e.g., AlN) layer 118 may have a thickness of approximately three hundred Angstrom (300 A). This bilayer relatively low acoustic impedance structure may have a combined thickness of about a quarter acoustic wavelength at the twenty-four GigaHertz (24 GHz) main resonant frequency. Next, about a quarter acoustic wavelength thick, relatively high acoustic impedance metal (e.g., Tungsten (W)) reflector electrode layer 117 may be sputter deposited over normal axis piezoelectric (e.g., AlN) layer 118. The relatively high acoustic impedance metal (e.g., Tungsten (W)) reflector electrode layer 117 may have a thickness of up to approximately five hundred and forty Angstrom (540 A) thick for the example twenty-five GigaHertz (24 GHz) bulk acoustic wave resonator design, e.g., with appropriately adjusted thickness of the bottom piezoelectric layer 105 to achieve the operation of the example bulk acoustic wave resonator structure of FIG. 1A at about 24 GHz.

A stack of four layers of piezoelectric material, for example, four layers of Aluminum Nitride (AlN) having the wurtzite structure may be deposited by sputtering. For example, bottom piezoelectric layer 105, first middle piezoelectric layer 107, second middle piezoelectric layer 109, and top piezoelectric layer 111 may be deposited by sputtering. The four layers of piezoelectric material in the stack 104, may have the alternating axis arrangement in the respective stack 104.

For example the bottom piezoelectric layer 105 may be sputter deposited over a sputter deposition of first polarizing layer 158 to have the reverse axis orientation, which is depicted in FIG. 3A using the upward directed arrow. The first middle piezoelectric layer 107 may be sputter deposited over a sputter deposition of second polarizing layer 159 to have the to have the normal axis orientation, which is depicted in the FIG. 3A using the downward directed arrow. The second middle piezoelectric layer 109 may be sputter deposited over a sputter deposition of third polarizing layer 161 to have the reverse axis orientation, which is depicted in the FIG. 3A using the upward directed arrow. The top piezoelectric layer 111 may be sputter deposited over a sputter deposition of fourth polarizing layer 163 to have the normal axis orientation, which is depicted in the FIG. 3A using the downward directed arrow. As mentioned previously herein, polycrystalline thin film AlN may be selectively grown in the reverse axis orientation or the normal axis orientation perpendicular relative to the substrate surface using reactive magnetron sputtering of the Aluminum target in the nitrogen atmosphere over selected polarizing layers (e.g., first polarizing layer 158, e.g., second polarizing layer 159, e.g., third polarizing layer 161, e.g., fourth polarizing layer 163) to facilitate (e.g., determine) selection of the reverse axis orientation or normal axis orientation.

The first pair of top metal electrode layers, 137, 139, may be deposited by sputtering the low acoustic impedance metal for a first top metal electrode layer 137 of the pair, and then sputtering the high acoustic impedance metal for a second top metal electrode layer 139 of the pair on the first layer 137 of the pair. As shown in the figures, layer thickness may be thinner for the first member 137 of the first pair 137, 139 of top metal electrode layers. For example, the first member 137 of the first pair of top metal electrode layers for the top acoustic reflector is depicted as relatively thinner (e.g., thickness of the first member 137 of the first pair of top metal electrode layers is depicted as relatively thinner) than thickness of remainder top acoustic layers. For example, a thickness of the first member 137 of the first pair of top metal electrode layers may be about 60 Angstroms lesser, e.g., substantially lesser than an odd multiple (e.g., 1×, 3×, etc). of a quarter of a wavelength (e.g., 60 Angstroms lesser than one quarter of the acoustic wavelength) for the first member 137 of the first pair of top metal electrode layers. For example, if Titanium is used as the low acoustic impedance metal for a 24 GHz resonator (e.g., resonator having a main resonant frequency of about 24 GHz), a thickness for the first member 137 of the first pair of top metal electrode layers of the top acoustic reflector may be about 570 Angstroms, while respective layer thicknesses shown in the figures for corresponding members of the other pairs of top metal electrode layers may be substantially thicker. For example, layer thickness for the second member 139 of the first pair 137, 139 of top metal electrode layers of may correspond to approximately a quarter wavelength (e.g., a quarter acoustic wavelength) of the resonant frequency of the resonator (e.g., respective layer thickness of about six hundred Angstroms (600 A) for the example 24 GHz resonator). The optional mass load layer 155 may be sputtered from a high acoustic impedance metal target onto the second top metal electrode layer 139 of the pair. Thickness of the optional mass load layer may be as discussed previously herein. The mass load layer 155 may be an additional mass layer to increase electrode layer mass, so as to facilitate the preselected frequency compensation down in frequency (e.g., compensate to decrease resonant frequency). Alternatively, the mass load layer 155 may be a mass load reduction layer, e.g., ion milled mass load reduction layer 155, to decrease electrode layer mass, so as to facilitate the preselected frequency compensation up in frequency (e.g., compensate to increase resonant frequency). Accordingly, in such case, in FIG. 3A mass load reduction layer 155 may representatively illustrate, for example, an ion milled region of the second member 139 of the first pair of electrodes 137, 139 (e.g., ion milled region of high acoustic impedance metal electrode 139).

The plurality of lateral features 157 (e.g., patterned layer 157) may be formed by sputtering a layer of additional mass loading having a layer thickness as discussed previously herein. The plurality of lateral features 157 (e.g., patterned layer 157) may be made by patterning the layer of additional mass loading after it is deposited by sputtering. The patterning may done by photolithographic masking, layer etching, and mask removal. Initial sputtering may be sputtering of a metal layer of additional mass loading from a metal target (e.g., a target of Tungsten (W), Molybdenum (Mo), Titanium (Ti) or Aluminum (Al)). In alternative examples, the plurality of lateral features 157 may be made of a patterned dielectric layer (e.g., a patterned layer of Silicon Nitride (SiN), Silicon Dioxide (SiO2) or Silicon Carbide (SiC)). For example Silicon Nitride, and Silicon Dioxide may be deposited by reactive magnetron sputtering from a silicon target in an appropriate atmosphere, for example Nitrogen, Oxygen or Carbon Dioxide. Silicon Carbide may be sputtered from a Silicon Carbide target.

Figure 3B:
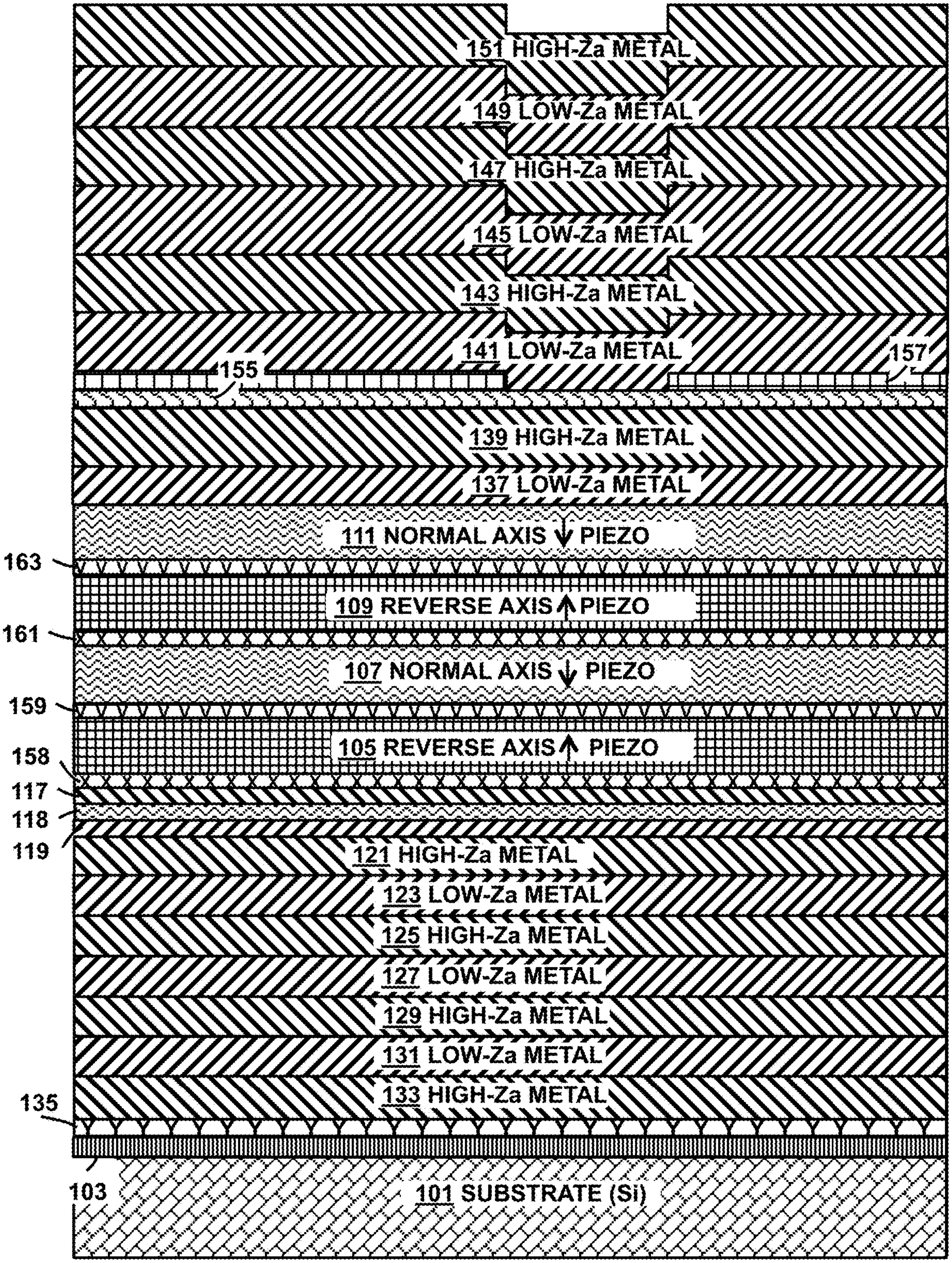

Once the plurality of lateral features 157 have been patterned (e.g., patterned layer 157) as shown in FIG. 3A, sputter deposition of successive additional pairs of alternating layers of high acoustic impedance metal and low acoustic impedance metal may continue as shown in FIG. 3B by alternating sputtering from targets of high acoustic impedance metal and low acoustic impedance metal. For example, sputtering targets of high acoustic impedance metal such as Molybdenum or Tungsten may be used for sputtering the high acoustic impedance metal layers, and sputtering targets of low acoustic impedance metal such as Aluminum or Titanium may be used for sputtering the low acoustic impedance metal layers. For example, the second pair of top metal electrode layers, 141, 143, may be deposited by sputtering the low acoustic impedance metal for a first bottom metal electrode layer 141 of the pair on the plurality of lateral features 157, and then sputtering the high acoustic impedance metal for a second top metal electrode layer 143 of the pair on the first layer 141 of the pair. Similarly, the third pair of top metal electrode layers, 145, 147, may then be deposited by sequentially sputtering from the low acoustic impedance metal target and the high acoustic impedance metal target. Similarly, the fourth pair of top metal electrodes 149, 151, may then be deposited by sequentially sputtering from the low acoustic impedance metal target and the high acoustic impedance metal target. Respective layer thicknesses of top metal electrode layers of the first, second, third and fourth pairs 137, 139, 141, 143, 145, 147, 149, 151 may correspond to approximately a quarter wavelength (e.g., a quarter acoustic wavelength) at the resonant frequency of the resonator (e.g., respective layer thickness of about six hundred Angstroms (600 A) for the example 24 GHz resonator).

Figure 3C:
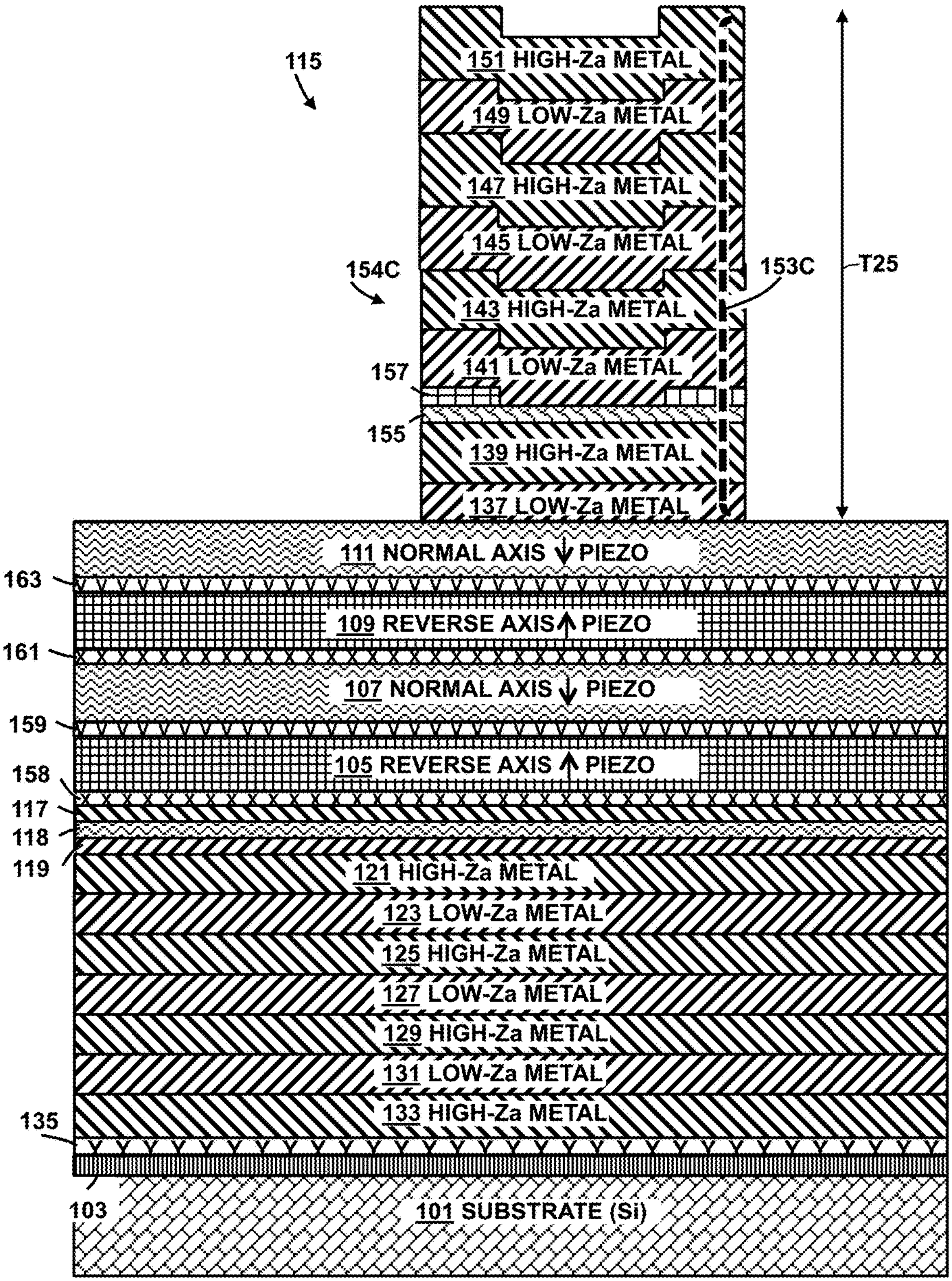

After depositing the fourth pair of top metal electrodes 149, 151 as shown in FIG. 3B, suitable photolithographic masking and etching may be used to form a first portion of etched edge region 153C for the top acoustic reflector 115 as shown in FIG. 3C. A notional heavy dashed line is used in FIG. 3C depicting the first portion of etched edge region 153C associated with the top acoustic reflector 115. The first portion of etched edge region 153C may extend along the thickness dimension T25 of the top acoustic reflector 115. The first portion etched edge region 153C may extend through (e.g., entirely through or partially through) the top acoustic reflector 115. The first portion of the etched edge region 153C may extend through (e.g., entirely through or partially through) the first pair of top metal electrode layers 137, 139. The first portion of the etched edge region 153C may extend through (e.g., entirely through or partially through) the optional mass load layer 155. The first portion of the etched edge region 153C may extend through (e.g., entirely through or partially through) at least one of the lateral features 157 (e.g., through patterned layer 157). The first portion of etched edge region 153C may extend through (e.g., entirely through or partially through) the second pair of top metal electrode layers, 141,143. The first portion etched edge region 153C may extend through (e.g., entirely through or partially through) the third pair of top metal electrode layers, 145, 147. The first portion of etched edge region 153C may extend through (e.g., entirely through or partially through) the fourth pair of top metal electrode layers, 149, 151. The first portion of etched edge region 153C may extend through (e.g., entirely through or partially through) integrated capacitive layer 118.

Just as suitable photolithographic masking and etching may be used to form the first portion of etched edge region 153C at a lateral extremity the top acoustic reflector 115 as shown in FIG. 3C, such suitable photolithographic masking and etching may likewise be used to form another first portion of a laterally opposing etched edge region 154C at an opposing lateral extremity the top acoustic reflector 115, e.g., arranged laterally opposing or opposite from the first portion of etched edge region 153C, as shown in FIG. 3C. The another first portion of the laterally opposing etched edge region 154C may extend through (e.g., entirely through or partially through) the opposing lateral extremity of the top acoustic reflector 115, e.g., arranged laterally opposing or opposite from the first portion of etched edge region 153C, as shown in FIG. 3C. The mesa structure (e.g., third mesa structure) corresponding to the top acoustic reflector 115 may extend laterally between (e.g., may be formed between) etched edge region 153C and laterally opposing etched edge region 154C. Dry etching may be used, e.g., reactive ion etching may be used to etch the materials of the top acoustic reflector. Chlorine based reactive ion etch may be used to etch Aluminum, in cases where Aluminum is used in the top acoustic reflector. Fluorine based reactive ion etch may be used to etch Tungsten (W), Molybdenum (Mo), Titanium (Ti), Silicon Nitride (SiN), Silicon Dioxide (SiO2) and/or Silicon Carbide (SiC) in cases where these materials are used in the top acoustic reflector.

Figure 3D:
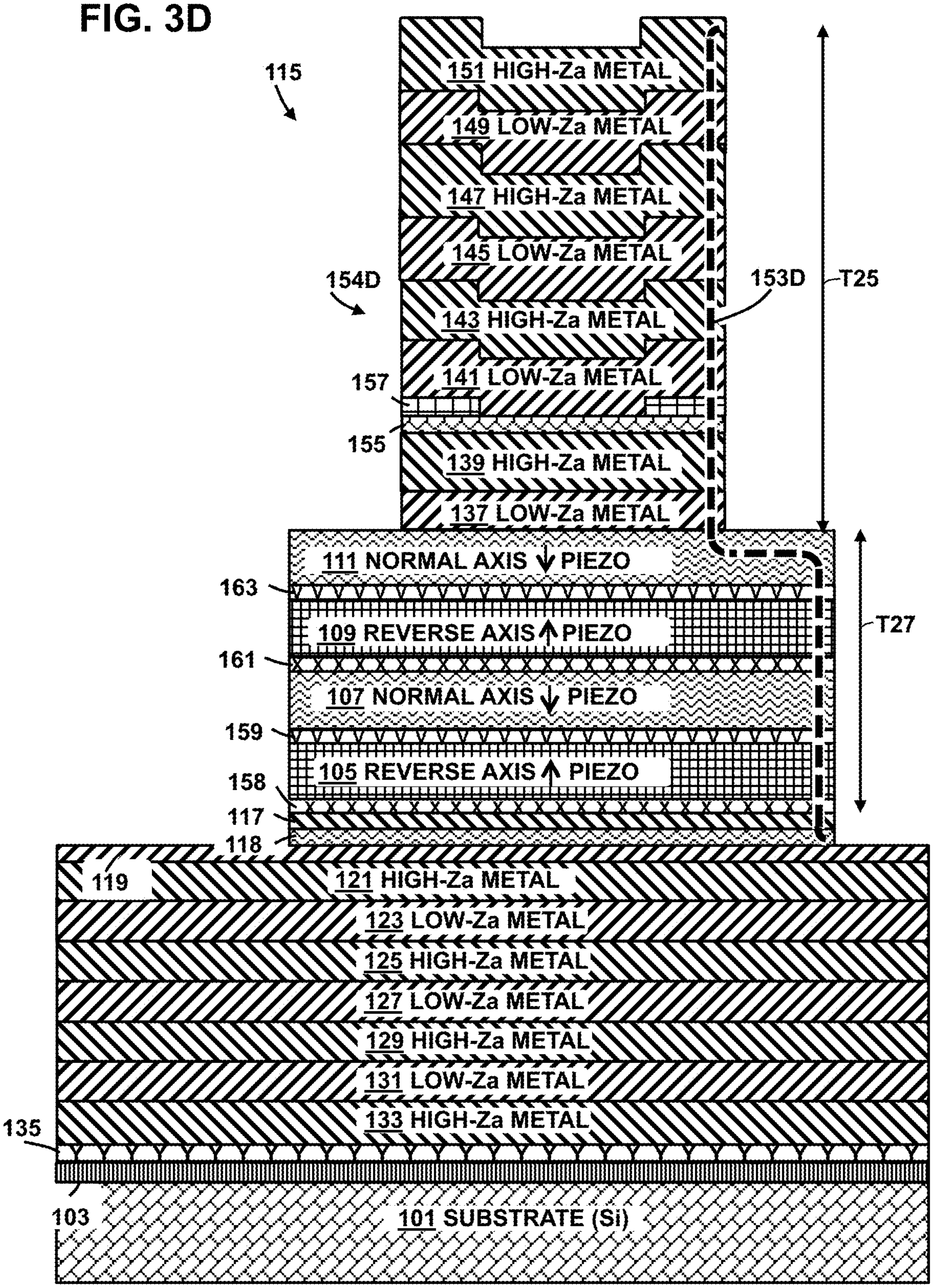

After etching to form the first portion of etched edge region 153C for top acoustic reflector 115 as shown in FIG. 3C, additional suitable photolithographic masking and etching may be used to form elongated portion of etched edge region 153D for the integrated capacitive layer 118, for top acoustic reflector 115 and for the stack 104 of four piezoelectric layers 105, 107, 109, 111 as shown in FIG. 3D. A notional heavy dashed line is used in FIG. 3D depicting the elongated portion of etched edge region 153D associated with the stack 104 of four piezoelectric layers 105, 107, 109, 111 and with the top acoustic reflector 115. Accordingly, the elongated portion of etched edge region 153D shown in FIG. 3D may extend through (e.g., entirely through or partially through) the integrated capacitive layer 118, the fourth pair of top metal electrode layers, 149, 151, the third pair of top metal electrode layers, 145, 147, the second pair of top metal electrode layers, 141,143, at least one of the lateral features 157 (e.g., through patterned layer 157), the optional mass load layer 155, the first pair of top metal electrode layers 137, 139 of the top acoustic reflector 115. The elongated portion of etched edge region 153D may extend through (e.g., entirely through or partially through) the stack 104 of four piezoelectric layers 105, 107, 109, 111. The elongated portion of etched edge region 153D may extend through (e.g., entirely through or partially through) the first polarizing layer 158, the first piezoelectric layer, 105, e.g., having the reverse axis orientation, second polarizing layer 159, first middle piezoelectric layer, 107, e.g., having the normal axis orientation, third polarizing layer 161, second middle interposer layer, 109, e.g., having the reverse axis orientation, fourth polarizing layer 163, and top piezoelectric layer 111, e.g., having the normal axis orientation. The elongated portion of etched edge region 153D may extend along the thickness dimension T25 of the top acoustic reflector 115. The elongated portion of etched edge region 153D may extend along the thickness dimension T27 of the stack 104 of four piezoelectric layers 105, 107, 109, 111. Just as suitable photolithographic masking and etching may be used to form the elongated portion of etched edge region 153D at the lateral extremity the top acoustic reflector 115 and at a lateral extremity of the stack 104 of four piezoelectric layers 105, 107, 109, 111 as shown in FIG. 3D, such suitable photolithographic masking and etching may likewise be used to form another elongated portion of the laterally opposing etched edge region 154D at the opposing lateral extremity the top acoustic reflector 115 and the stack 104 of four piezoelectric layers 105, 107, 109, 111, e.g., arranged laterally opposing or opposite from the elongated portion of etched edge region 153D, as shown in FIG. 3D. The another elongated portion of the laterally opposing etched edge region 154D may extend through (e.g., entirely through or partially through) the opposing lateral extremity of the top acoustic reflector 115 and the stack of four piezoelectric layers 105, 107, 109, 111, e.g., arranged laterally opposing or opposite from the elongated portion of etched edge region 153D, as shown in FIG. 3D. The mesa structure (e.g., third mesa structure) corresponding to the top acoustic reflector 115 may extend laterally between (e.g., may be formed between) etched edge region 153D and laterally opposing etched edge region 154D. The mesa structure (e.g., first mesa structure) corresponding to stack 104 of the example four piezoelectric layers may extend laterally between (e.g., may be formed between) etched edge region 153D and laterally opposing etched edge region 154D. Dry etching may be used, e.g., reactive ion etching may be used to etch the materials of the stack 104 of four piezoelectric layers 105, 107, 109, 111 and polarizing layers. For example, Chlorine based reactive ion etch may be used to etch Aluminum Nitride piezoelectric layers and/or doped Aluminum Nitride piezoelectric layers. For example, Chlorine based reactive ion etch may be used to etch selected polarizing layers (e.g., Aluminum Scandium Nitride polarizing layers, e.g., Aluminum Oxynitride polarizing layers, sputtered Silicon polarizing layers e.g., in cases where Aluminum Scandium Nitride and/or Aluminum Oxynitride and/or sputtered Silicon may be used in polarizing layers). For example, Fluorine based reactive ion etch may be used to etch Tungsten (W), Molybdenum (Mo), Ruthenium (Ru), Titanium (Ti), sputtered Silicon, amorphous Silicon, Silicon Nitride (SiN), Silicon Dioxide (SiO2) and/or Silicon Carbide (SiC) in cases where these materials may be used in polarizing layers.

Figure 3E:
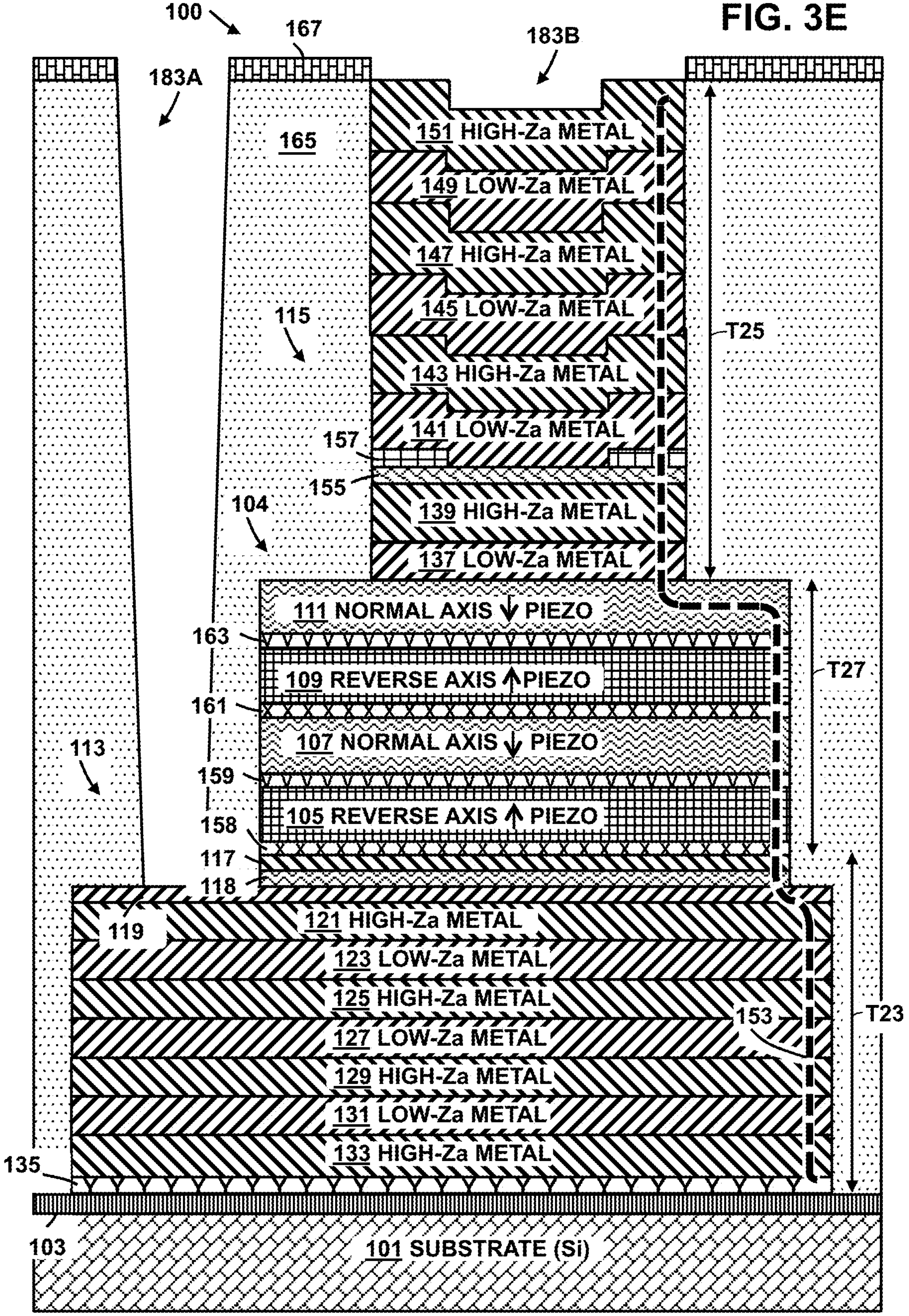

After etching to form the elongated portion of etched edge region 153D for top acoustic reflector 115 and the stack 104 of four piezoelectric layers 105, 107, 109, 111 as shown in FIG. 3D, further additional suitable photolithographic masking and etching may be used to form etched edge region 153D for top acoustic reflector 115 and for the stack 104 of four piezoelectric layers 105, 107, 109, 111 and for bottom acoustic reflector 113 as shown in FIG. 3E. The notional heavy dashed line is used in FIG. 3E depicting the etched edge region 153 associated with the stack 104 of four piezoelectric layers 105, 107, 109, 111 and with the top acoustic reflector 115 and with the bottom acoustic reflector 113. The etched edge region 153 may extend along the thickness dimension T25 of the top acoustic reflector 115. The etched edge region 153 may extend along the thickness dimension T27 of the stack 104 of four piezoelectric layers 105, 107, 109, 111. The etched edge region 153 may extend along the thickness dimension T23 of the bottom acoustic reflector 113. Just as suitable photolithographic masking and etching may be used to form the etched edge region 153 at the lateral extremity the top acoustic reflector 115 and at the lateral extremity of the stack 104 of four piezoelectric layers 105, 107, 109, 111 and at a lateral extremity of the bottom acoustic reflector 113 as shown in FIG. 3E, such suitable photolithographic masking and etching may likewise be used to form another laterally opposing etched edge region 154 at the opposing lateral extremity of the top acoustic reflector 115 and the stack 104 of four piezoelectric layers 105, 107, 109, 111, and the bottom acoustic reflector 113, e.g., arranged laterally opposing or opposite from the etched edge region 153, as shown in FIG. 3E. The laterally opposing etched edge region 154 may extend through (e.g., entirely through or partially through) the opposing lateral extremity of the top acoustic reflector 115 and the stack of four piezoelectric layers 105, 107, 109, 111, and the bottom acoustic reflector 113 e.g., arranged laterally opposing or opposite from the etched edge region 153, as shown in FIG. 3E.

After the foregoing etching to form the etched edge region 153 and the laterally opposing etched edge region 154 of the resonator 100 shown in FIG. 3E, a planarization layer 165 may be deposited. A suitable planarization material (e.g., Silicon Dioxide (SiO2), Hafnium Dioxide (HfO2), Polyimide, or BenzoCyclobutene (BCB)). These materials may be deposited by suitable methods, for example, chemical vapor deposition, standard or reactive magnetron sputtering (e.g., in cases of SiO2 or HfO2) or spin coating (e.g., in cases of Polyimide or BenzoCyclobutene (BCB)). An isolation layer 167 may also be deposited over the planarization layer 165. A suitable low dielectric constant (low-k), low acoustic impedance (low-Za) material may be used for the isolation layer 167, for example polyimide, or BenzoCyclobutene (BCB). These materials may be deposited by suitable methods, for example, chemical vapor deposition, standard or reactive magnetron sputtering or spin coating. After planarization layer 165 and the isolation layer 167 have been deposited, additional procedures of photolithographic masking, layer etching, and mask removal may be done to form a pair of etched acceptance locations 183A, 183B for electrical interconnections. Reactive ion etching or inductively coupled plasma etching with a gas mixture of argon, oxygen and a fluorine containing gas such as tetrafluoromethane (CF4) or Sulfur hexafluoride (SF6) may be used to etch through the isolation layer 167 and the planarization layer 165 to form the pair of etched acceptance locations 183A, 183B for electrical interconnections. Photolithographic masking, sputter deposition, and mask removal may then be used form electrical interconnects in the pair of etched acceptance locations 183A, 183B shown in FIG. 3E, so as to provide for the bottom electrical interconnect 169 and top electrical interconnect 171 that are shown explicitly in FIG. 1A. A suitable material, for example Gold (Au) may be used for the bottom electrical interconnect 169 and top electrical interconnect 171. Top electrical interconnect 171 may be integrally formed with top current spreading layer 171. Integrated inductor 173 may be electrically coupled with top electrical interconnect 171/top current spreading layer 171.

FIGS. 4A through 4G show alternative example bulk acoustic wave resonators 400A through 400G to the example bulk acoustic wave resonator 100 shown in FIG. 1A. For example, the bulk acoustic wave resonator 400A, 400E shown in FIG. 4A, 4E may have a cavity 483A, 483E, e.g., an air cavity 483A, 483E, e.g., extending into substrate 401A, e.g., extending into silicon substrate 401A, e.g., extending over substrate 401E, e.g., arranged below bottom acoustic reflector 413A, 413E. The cavity 483A, 483E may be formed using techniques known to those with ordinary skill in the art. For example, the cavity 483A,483E may be formed by initial photolithographic masking and etching of the substrate 401A, 401E (e.g., silicon substrate 401A, 401E), and deposition of a sacrificial material (e.g., phosphosilicate glass (PSG)). The phosphosilicate glass (PSG) may comprise 8% phosphorous and 92% silicon dioxide. The resonator 400A, 400E may be formed over the sacrificial material (e.g., phosphosilicate glass (PSG)). The sacrificial material may then be selectively etched away beneath the resonator 400A, 400E, leaving cavity 483A, 483E beneath the resonator 400A, 400E. For example phosphosilicate glass (PSG) sacrificial material may be selectively etched away by hydrofluoric acid beneath the resonator 400A, 400E, leaving cavity 483A, 483E beneath the resonator 400A, 400E. The cavity 483A, 483E may, but need not, be arranged to provide acoustic isolation of the structures, e.g., bottom acoustic reflector 413A, 413E, e.g., stack 404A, 404E of piezoelectric layers, e.g., resonator 400A, 400E from the substrate 401A, 401E.

Figure 4A:
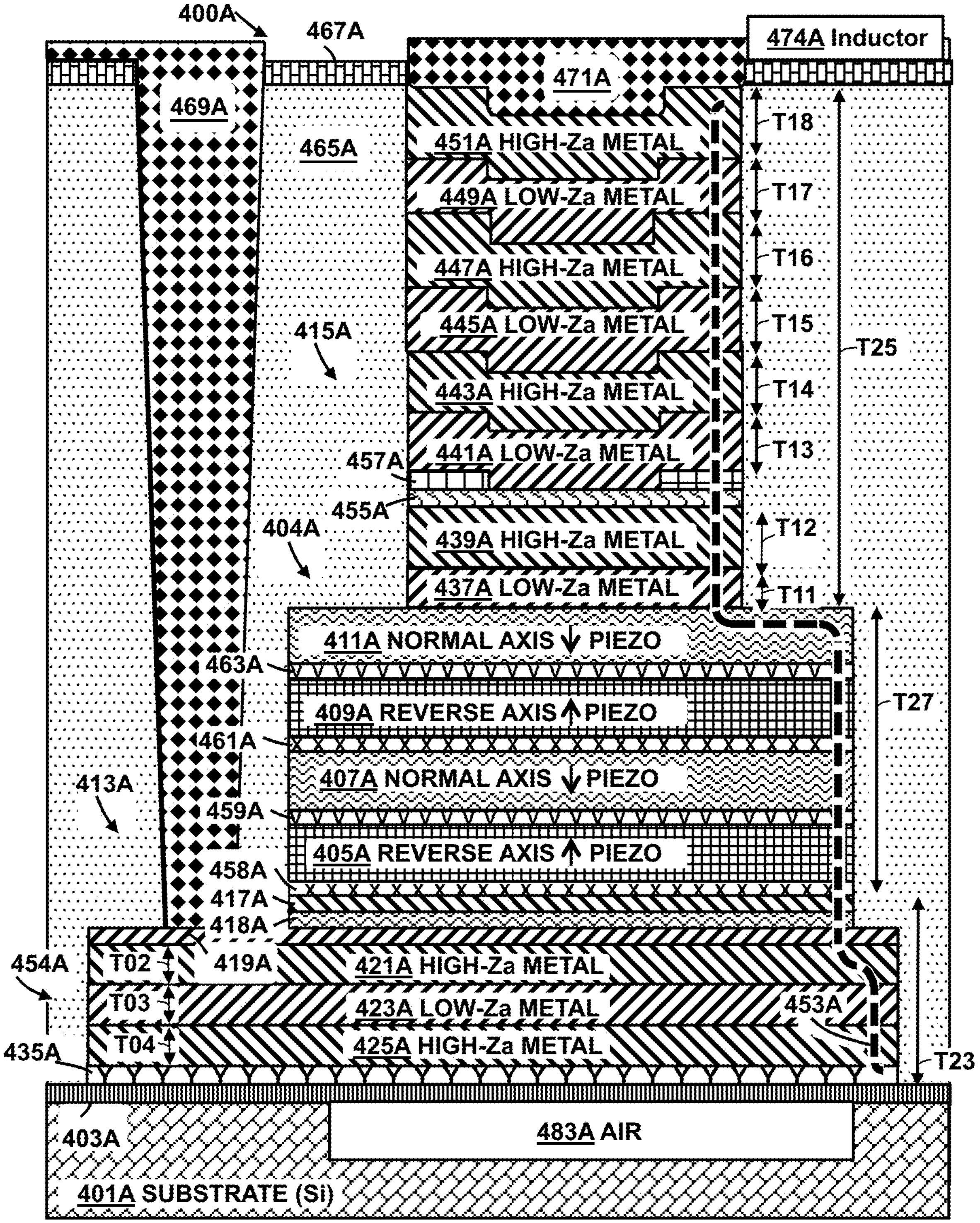
FIGS. 4A through 4G show alternative example bulk acoustic wave resonators to the example bulk acoustic wave resonator structures shown in FIG. 1A.
Figure 4B:
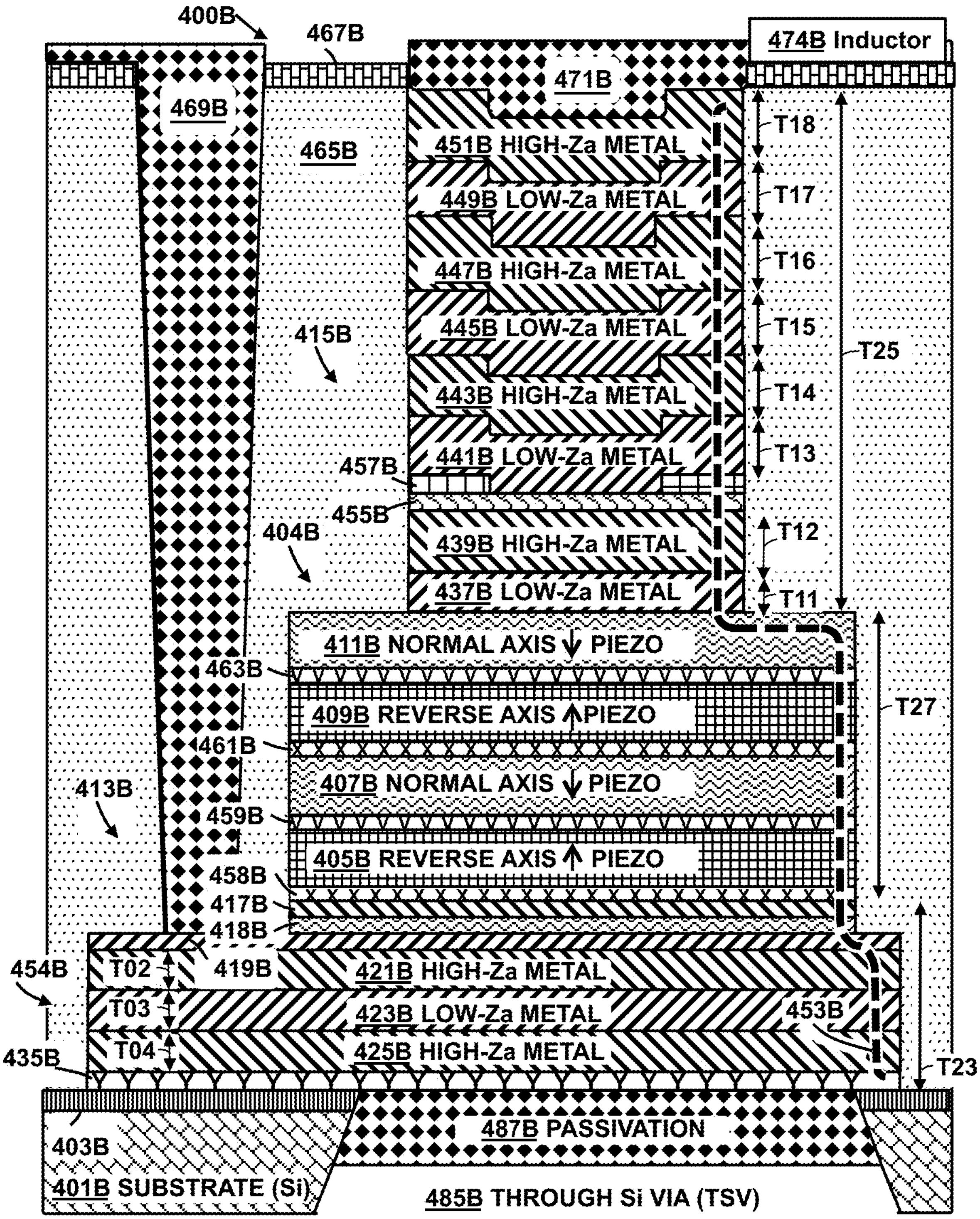
Figure 4C:
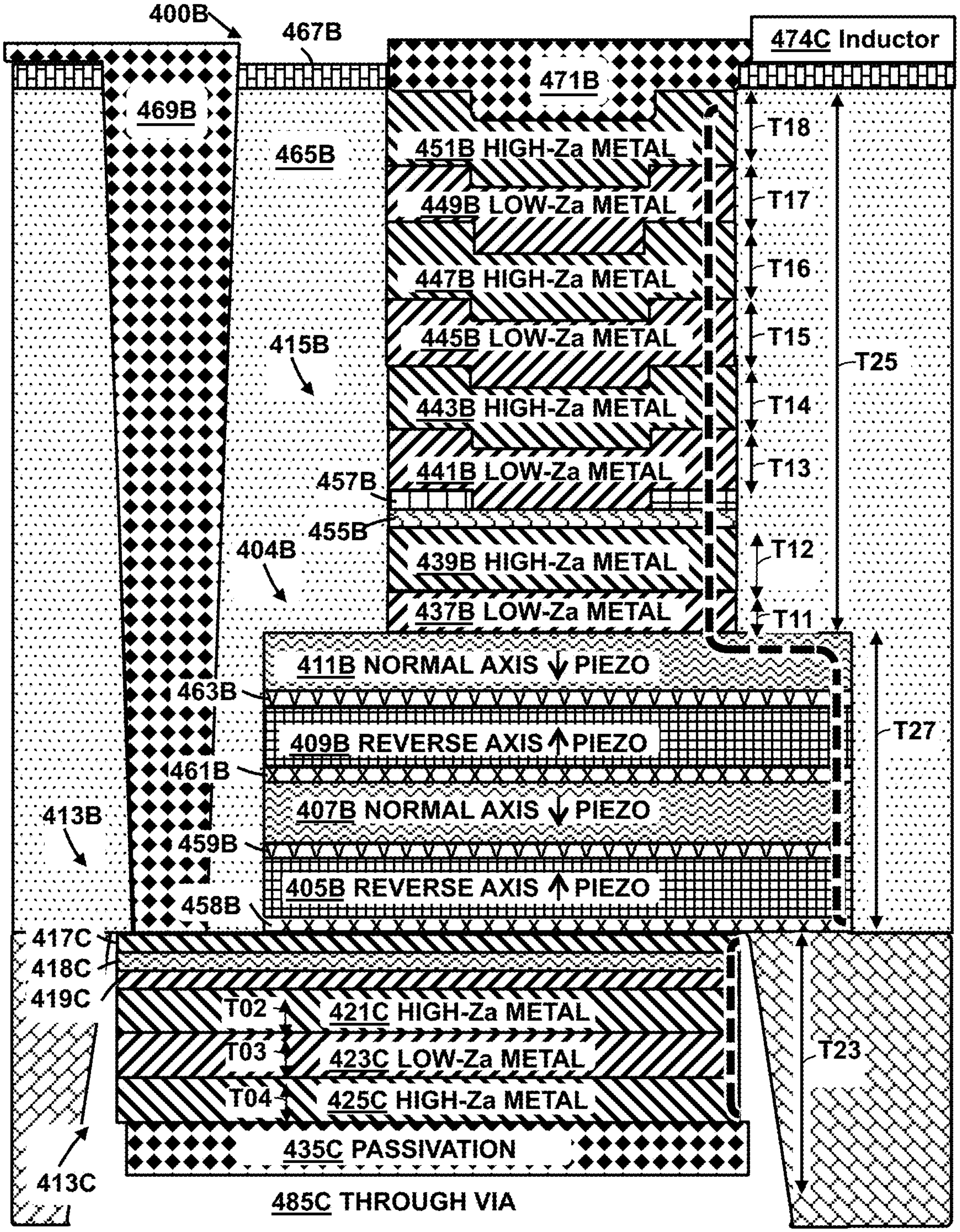
Figure 4D:
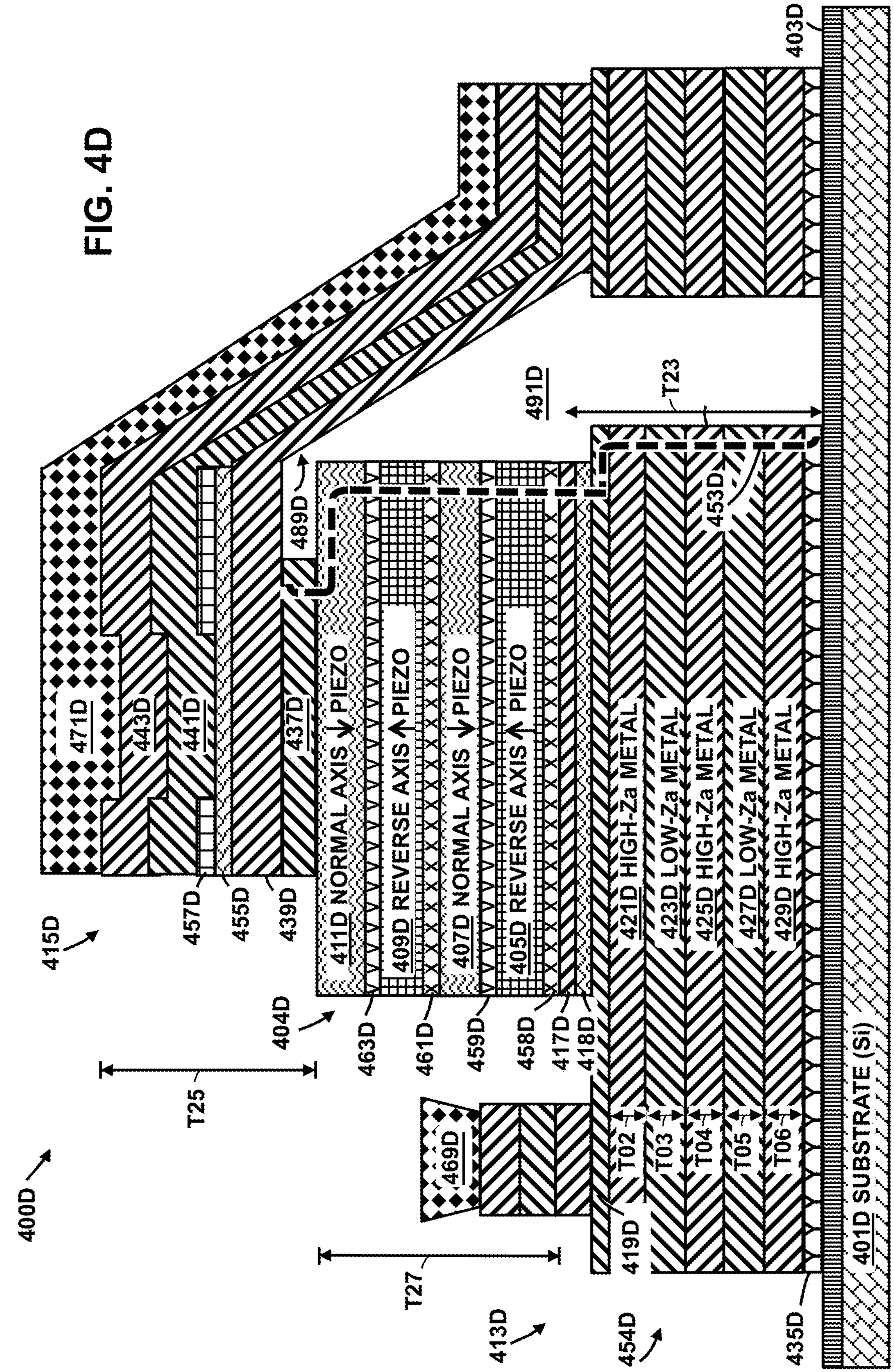
Figure 4E:
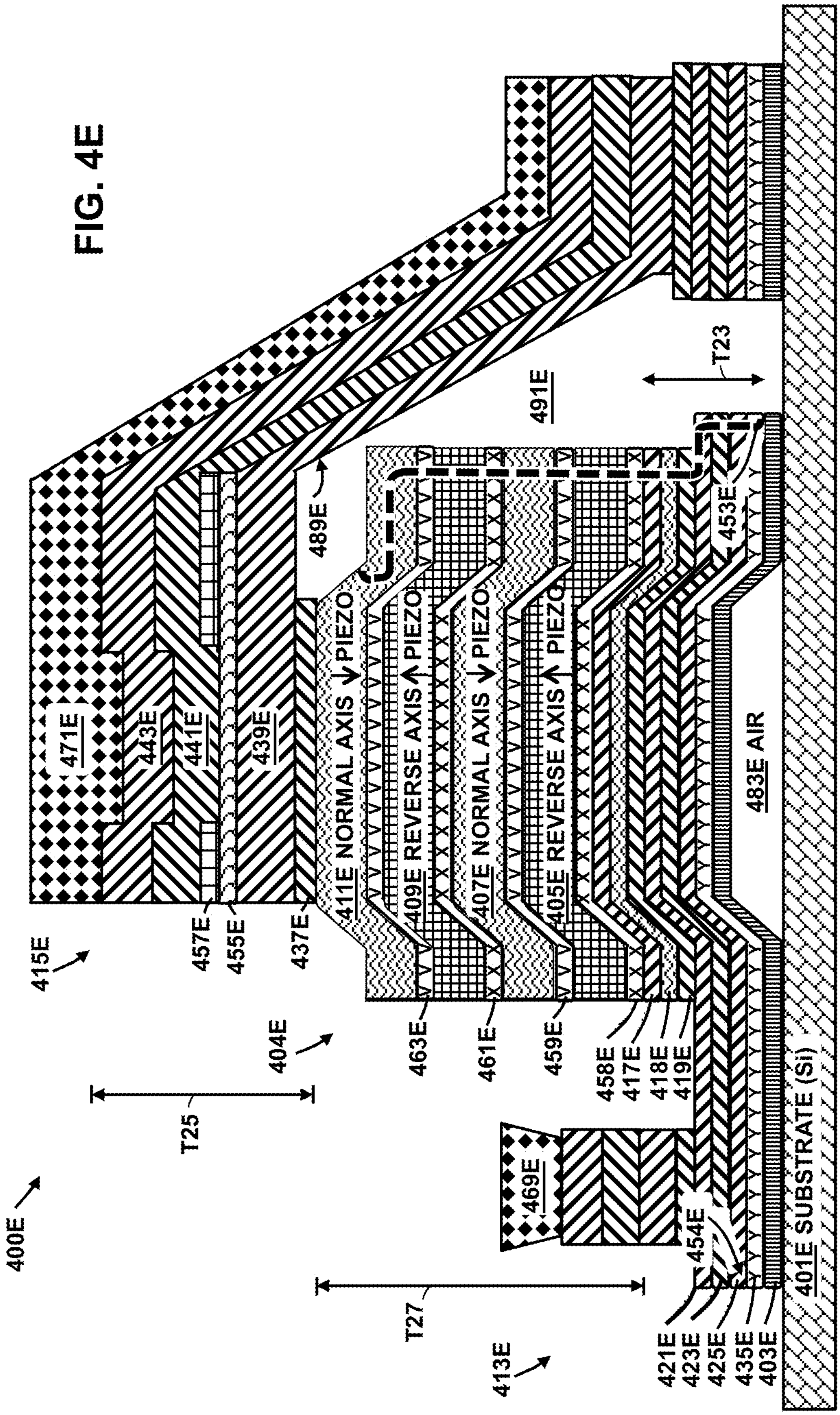
Figure 4F:
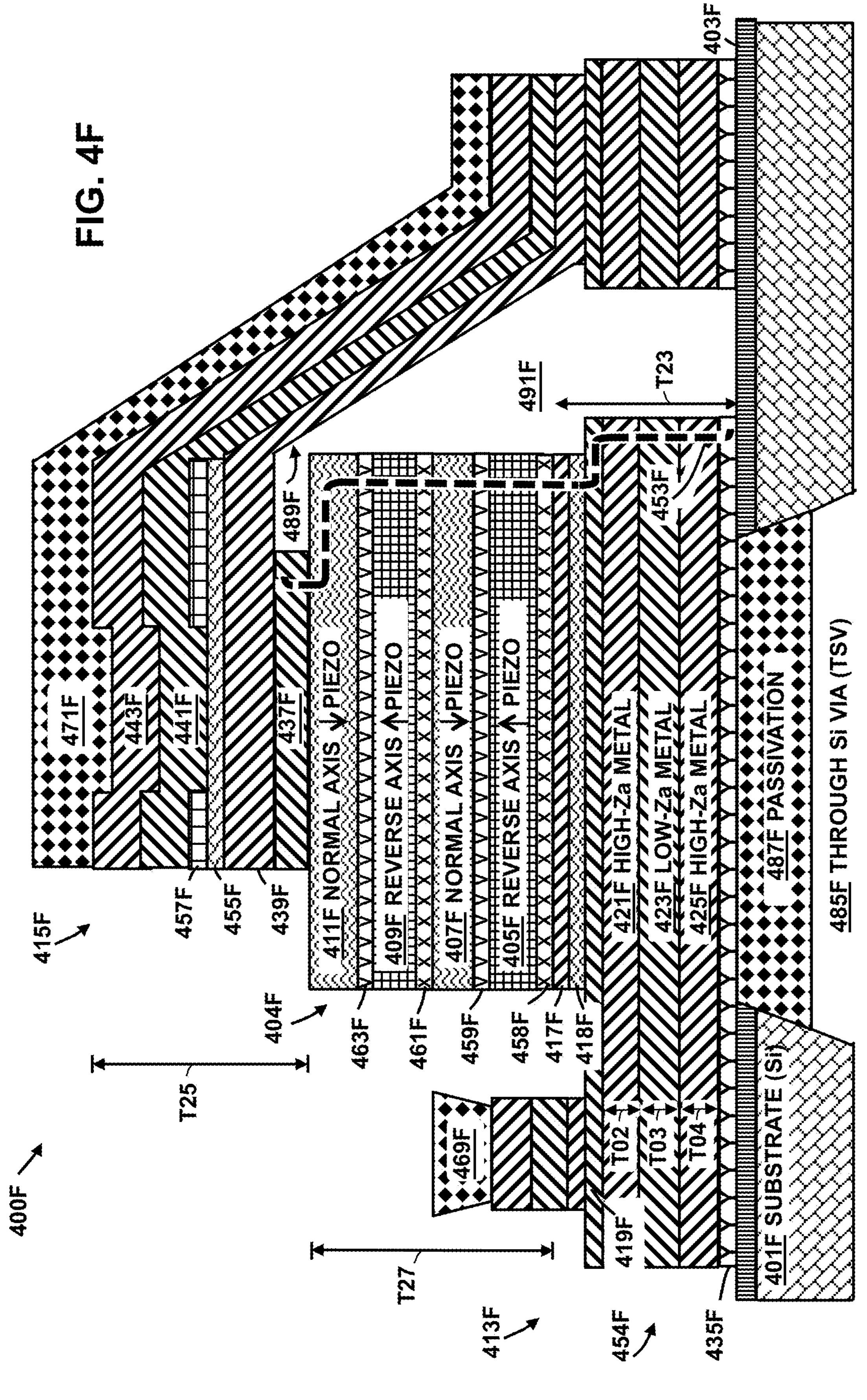
Figure 4G:
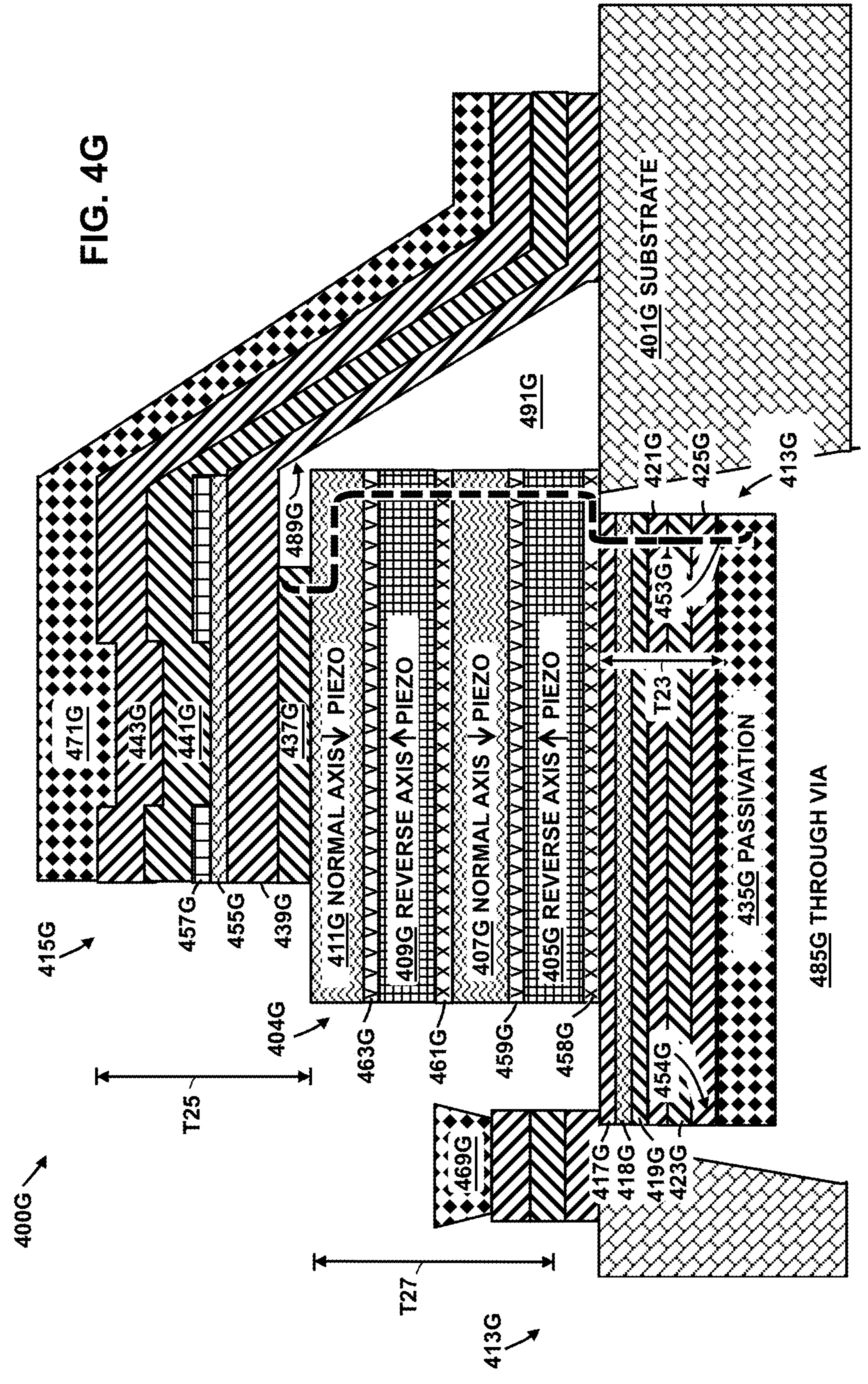

Similarly, in FIGS. 4B, 4C, 4F and 4G, a via 485B, 485C, 485F, 485G (e.g., through silicon via 485B, 485F, e.g., through silicon carbide via 485C, 485G) may, but need not, be arranged to provide acoustic isolation of the structures, e.g., bottom acoustic reflector 413B, 413C, 413F, 413G, e.g., stack 404B, 404C, 404F, 404G, of piezoelectric layers, e.g., resonator 400B, 400C, 400F, 400G from the substrate 401B, 401C, 401F, 401G. The via 485B, 485C, 485F, 485G (e.g., through silicon via 485B, 485F, e.g., through silicon carbide via 485C, 485G) may be formed using techniques (e.g., using photolithographic masking and etching techniques) known to those with ordinary skill in the art. For example, in FIGS. 4B and 4F, backside photolithographic masking and etching techniques may be used to form the through silicon via 485B, 485F, and an additional passivation layer 487B, 487F may be deposited, after the resonator 400B, 400F is formed. For example, in FIGS. 4C and 4G, backside photolithographic masking and etching techniques may be used to form the through silicon carbide via 485C, 485G, after the top acoustic reflector 415C, 415G and stack 404C, 404G of piezoelectric layers are formed. In FIGS. 4C and 4G, after the through silicon carbide via 485C, 485G, is formed, backside photolithographic masking and deposition techniques may be used to form bottom acoustic reflector 413C, 413G, and additional passivation layer 487C, 487G.

In FIGS. 4A, 4B, 4C, 4E, 4F, 4G, bottom acoustic reflector 413A, 413B, 413C, 413E, 413F, 413G, may include the acoustically reflective bottom electrode stack of the plurality of bottom metal electrode layers, in which thicknesses of the bottom metal electrode layers may be related to wavelength (e.g., acoustic wavelength) at the main resonant frequency of the example resonator 400A, 400B, 400C, 400E, 400F, 400G. Respective layer thicknesses, (e.g., T02 through T04, explicitly shown in FIGS. 4A, 4B, 4C) for members of the pairs of bottom metal electrode layers may be about one quarter of the wavelength (e.g., one quarter acoustic wavelength) at the main resonant frequency of the example resonators 400A, 400B, 400C, 400E, 400F, 400G. Relatively speaking, in various alternative designs of the example resonators 400A, 400B, 400C, 400E, 400F, 400G, for relatively lower main resonant frequencies (e.g., five Gigahertz (5 GHz)) and having corresponding relatively longer wavelengths (e.g., longer acoustic wavelengths), may have relatively thicker bottom metal electrode layers in comparison to other alternative designs of the example resonators 400A, 400B, 400C, 400E, 400F, 400G, for relatively higher main resonant frequencies (e.g., twenty-four Gigahertz (24 GHz)). There may be corresponding longer etching times to form, e.g., etch through, the relatively thicker bottom metal electrode layers in designs of the example resonator 400A, 400B, 400C, 400E, 400F, 400G, for relatively lower main resonant frequencies (e.g., five Gigahertz (5 GHz)). Accordingly, in designs of the example resonators 400A, 400B, 400C, 400E, 400F, 400G, for relatively lower main resonant frequencies (e.g., five Gigahertz (5 GHz)) having the relatively thicker bottom metal electrode layers, there may (but need not) be an advantage in etching time in having a relatively fewer number (e.g., four (4)) of bottom metal electrode layers, shown in 4A, 4B, 4C, 4E, 4F, 4G, in comparison to a relatively larger number (e.g., eight (8)) of bottom metal electrode layers, shown in FIG. 1A and in FIG. 4D. The relatively larger number (e.g., eight (8)) of bottom metal electrode layers, shown in FIG. 1A and in FIG. 4D may (but need not) provide for relatively greater acoustic isolation than the relatively fewer number (e.g., four (4)) of bottom metal electrode layers. However, in FIGS. 4A and 4E the cavity 483A, 483E, (e.g., air cavity 483A, 483E) may (but need not) be arranged to provide acoustic isolation enhancement relative to some designs without the cavity 483A, 483E. Similarly, in FIGS. 4B, 4C, 4F, 4G, the via 483B, 483C, 483F, 483G, (e.g., through silicon via 485B, 485F, e.g., through silicon carbide via 485C, 485G) may (but need not) be arranged to provide acoustic isolation enhancement relative to some designs without the via 483B, 483C, 483F, 483G.

In FIGS. 4A and 4E, the cavity 483A, 483E may (but need not) be arranged to compensate for relatively lesser acoustic isolation of the relatively fewer number (e.g., four (4)) of bottom metal electrode layers. In FIGS. 4A and 4E, the cavity 483A, 483E may (but need not) be arranged to provide acoustic isolation benefits, while retaining possible electrical conductivity improvements and etching time benefits of the relatively fewer number (e.g., four (4)) of bottom metal electrode layers, e.g., particularly in designs of the example resonator 400A, 400E, for relatively lower main resonant frequencies (e.g., five Gigahertz (5 GHz)). Similarly, in FIGS. 4B, 4C, 4F, 4G, the via 483B, 483C, 483F, 483G, may (but need not) be arranged to compensate for relatively lesser acoustic isolation of the relatively fewer number (e.g., four (4)) of bottom metal electrode layers. In FIGS. 4B, 4C, 4F, 4G, the via 483B, 483C, 483F, 483G, may (but need not) be arranged to provide acoustic isolation benefits, while retaining possible electrical conductivity improvement benefits and etching time benefits of the relatively fewer number (e.g., four (4)) of bottom metal electrode layers, e.g., particularly in designs of the example resonator 400B, 400C, 400F, 400G, for relatively lower main resonant frequencies (e.g., five Gigahertz (5 GHz), e.g., below six Gigahertz (6 GHz), e.g., below five Gigahertz (5 GHz)).

FIGS. 4D through 4G show alternative example bulk acoustic wave resonators 400D through 400G to the example bulk acoustic wave resonator 100A shown in FIG. 1A, in which the top acoustic reflector, 415D through 415G, may comprise a lateral connection portion, 489D through 489G, (e.g., bridge portion, 489D through 489G), of the top acoustic reflector, 415D through 415G. A gap, 491D through 491G, may be formed beneath the lateral connection portion, 489D through 489G, (e.g., bridge portion, 489D through 489G), of the top acoustic reflector 415D through 415G. The gap, 491D through 491G, may be arranged adjacent to the etched edge region, 453D through 453G, of the example resonators 400D through 400G.

For example, the gap, 491D through 491G, may be arranged adjacent to where the etched edge region, 453D through 453G, extends through (e.g., extends entirely through or extends partially through) the stack 404D through 404G, of piezoelectric layers, for example along the thickness dimension T27 of the stack 404D through 404G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the bottom piezoelectric layer 405D through 405G. For example, the gap, 491D through 491G, may be arranged adjacent to where the etched edge region, 453D through 453G, extends through (e.g., extends entirely through or extends partially through) the first middle piezoelectric layer 407D through 407G. For example, the gap, 491D through 491G, may be arranged adjacent to where the etched edge region, 453D through 453G, extends through (e.g., extends entirely through or extends partially through) the second middle piezoelectric layer 409D through 409G. For example, the gap, 491D through 491G, may be arranged adjacent to where the etched edge region, 453D through 453G, extends through (e.g., extends entirely through or extends partially through) the top piezoelectric layer 411D through 411G. For example, the gap, 491D through 491G, may be arranged adjacent to where the etched edge region, 453D through 453G, extends through (e.g., extends entirely through or extends partially through) one or more polarizing layers (e.g., first interposer polarizing layer, 458D through 458G, second polarizing layer, 459D through 459G, third polarizing layer 461D through 461G, fourth polarizing layer 463D through 463G).

For example, as shown in FIGS. 4D through 4G, the gap, 491D through 491G, may be arranged adjacent to where the etched edge region, 453D through 453G, extends through (e.g., extends partially through) the top acoustic reflector 415D through 415G, for example partially along the thickness dimension T25 of the top acoustic reflector 415D through 415G. For example, the gap, 491D through 491G, may be arranged adjacent to where the etched edge region, 453D through 453G, extends through (e.g., extends entirely through or extends partially through) the first member, 437D through 437G, of the first pair of top electrode layers, 437D through 437G, 439D through 439G.

For example, as shown in FIGS. 4D through 4F, the gap, 491D through 491F, may be arranged adjacent to where the etched edge region, 453D through 453F, extends through (e.g., extends entirely through or extends partially through) the bottom acoustic reflector 413D through 413F, for example along the thickness dimension T23 of the bottom acoustic reflector 413D through 413F. For example, the gap, 491D through 491F, may be arranged adjacent to where the etched edge region, 453D through 453F, extends through (e.g., extends entirely through or extends partially through) the initial bottom electrode layer, 421D through 421F. For example, the gap, 491D through 491F, may be arranged adjacent to where the etched edge region, 453D through 453F, extends through (e.g., extends entirely through or extends partially through) the first pair of bottom electrode layers, 423D through 423F, 425D through 425F.

For example, as shown in FIGS. 4D through 4F, the etched edge region, 453D through 453F, may extend through (e.g., entirely through or partially through) the bottom acoustic reflector, 413D through 413F, and through (e.g., entirely through or partially through) one or more of the piezoelectric layers, 405D through 405F, 407D through 407F, 409D through 409F, 411D through 411F, to the lateral connection portion, 489D through 489G, (e.g., to the bridge portion, 489D through 489G), of the top acoustic reflector, 415D through 415F.

As shown in FIGS. 4D-4G, lateral connection portion, 489D through 489G, (e.g., bridge portion, 489D through 489G), of top acoustic reflector, 415D through 415G, may be a multi-layer lateral connection portion, 415D through 415G, (e.g., a multi-layer metal bridge portion, 415D through 415G, comprising differing metals, e.g., metals having differing acoustic impedances). For example, lateral connection portion, 489D through 489G, (e.g., bridge portion, 489D through 489G), of top acoustic reflector, 415D through 415G, may comprise the second member, 439D through 439G, (e.g., comprising the relatively high acoustic impedance metal) of the first pair of top electrode layers, 437D through 437G, 439D through 439G. For example, lateral connection portion, 489D through 489G, (e.g., bridge portion, 489D through 489G), of top acoustic reflector, 415D through 415G, may comprise the second pair of top electrode layers, 441D through 441G, 443D through 443G.

Gap 491D-491G may be an air gap 491D-491G, or may be filled with a relatively low acoustic impedance material (e.g., BenzoCyclobutene (BCB)), which may be deposited using various techniques known to those with skill in the art. Gap 491D-491G may be formed by depositing a sacrificial material (e.g., phosphosilicate glass (PSG)) after the etched edge region, 453D through 453G, is formed. The lateral connection portion, 489D through 489G, (e.g., bridge portion, 489D through 489G), of top acoustic reflector, 415D through 415G, may then be deposited (e.g., sputtered) over the sacrificial material. The sacrificial material may then be selectively etched away beneath the lateral connection portion, 489D through 489G, (e.g., e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G). For example the phosphosilicate glass (PSG) sacrificial material may be selectively etched away by hydrofluoric acid beneath the lateral connection portion, 489D through 489G, (e.g., beneath the bridge portion, 489D through 489G), of top acoustic reflector, 415D through 415G, leaving gap 491D-491G beneath the lateral connection portion, 489D through 489G, (e.g., beneath the bridge portion, 489D through 489G).

Although in various example resonators, 100A, 400A, 400B, 400D, 400E, 400F, polycrystalline piezoelectric layers (e.g., polycrystalline Aluminum Nitride (AlN)) may be deposited (e.g., by sputtering), in other example resonators 400C, 400G, alternative single crystal or near single crystal piezoelectric layers (e.g., single/near single crystal Aluminum Nitride (AlN)) may be deposited (e.g., by metal organic chemical vapor deposition (MOCVD)). Normal axis piezoelectric layers (e.g., normal axis Aluminum Nitride (AlN) piezoelectric layers) may be deposited by MOCVD using techniques known to those with skill in the art. As discussed previously herein, the polarizing layers may be deposited by sputtering, but alternatively may be deposited by MOCVD. Reverse axis piezoelectric layers (e.g., reverse axis Aluminum Nitride (AlN) piezoelectric layers) may likewise be deposited via MOCVD. For the respective example resonators 400C, 400G shown in FIGS. 4C and 4G, the alternating axis piezoelectric stack 404C, 404G comprised of piezoelectric layers 405C, 407C, 409C, 411C, 405G, 407G, 409G, 411G as well as polarizing layers 458C, 459C, 461C, 463C, 458G, 459G, 461G, 463G extending along stack thickness dimension T27 fabricated using MOCVD on a silicon carbide substrate 401C, 401G. For example, aluminum nitride of piezoelectric layers 405C, 407C, 409C, 411C, 405G, 407G, 409G, 411G the may grow nearly epitaxially on silicon carbide (e.g., 4H SiC) by virtue of the small lattice mismatch between the polar axis aluminum nitride wurtzite structure and specific crystal orientations of silicon carbide. Alternative small lattice mismatch substrates may be used (e.g., sapphire, e.g., aluminum oxide).

By varying the ratio of the aluminum and nitrogen in the deposition precursors, an aluminum nitride film may be produced with the desired polarity (e.g., normal axis, e.g., reverse axis). For example, normal axis aluminum nitride may be synthesized using MOCVD when a nitrogen to aluminum ratio in precursor gases approximately 1000. For example, reverse axis aluminum nitride may synthesized when the nitrogen to aluminum ratio is approximately 27000.

In accordance with the foregoing, FIGS. 4C and 4G show MOCVD synthesized reverse axis piezoelectric layer 405C, 405G, MOCVD synthesized normal axis piezoelectric layer 407C, 407G, MOCVD synthesized reverse axis piezoelectric layer 409C, 409G, and MOCVD synthesized normal axis piezoelectric layer 411C, 411G. For example, a first oxyaluminum nitride polarizing layer, 458C at lower temperature, may be deposited by MOCVD that may reverse axis (e.g., reverse axis polarity) of the growing aluminum nitride under MOCVD growth conditions, and has also been shown to be able to be deposited by itself under MOCVD growth conditions. Increasing the nitrogen to aluminum ratio into the several thousands during the MOCVD synthesis may enable the reverse axis piezoelectric layer 405C, 405G to be synthesized. For example, normal axis piezoelectric layer 407C, 407G may be synthesized by MOCVD in a deposition environment where the nitrogen to aluminum gas ratio is relatively low, e.g., 1000 or less.

For example, second polarizing layer 459C, 459G, for example fourth polarizing layer 463C, 463G, may be oxide layers such as, but not limited to, aluminum oxide or silicon dioxide. This oxide layer may be deposited in a low temperature physical vapor deposition process such as sputtering or in a higher temperature chemical vapor deposition process. Normal axis piezoelectric layer 407C, 407G may be grown by MOCVD on top of second polarizing layer 459C, 459G using MOCVD growth conditions in a deposition environment where the nitrogen to aluminum gas ratio is relatively low, e.g., 1000 or less.

Next an aluminum oxynitride, third polarizing layer 461C, 461G may be deposited in a low temperature MOCVD process followed by a reverse axis piezoelectric layer 409C, 409G, synthesized in a high temperature MOCVD process and an atmosphere of nitrogen to aluminum ratio in the several thousand range.

For example fourth polarizing layer 463C, 463G, may be oxide layers such as, but not limited to, aluminum oxide or silicon dioxide. This oxide layer may be deposited in a low temperature physical vapor deposition process such as sputtering or in a higher temperature chemical vapor deposition process. Normal axis piezoelectric layer 411C, 411G may be grown by MOCVD on top of fourth polarizing layer 463C, 463G using MOCVD growth conditions in a deposition environment where the nitrogen to aluminum gas ratio is relatively low, e.g., 1000 or less. Upon conclusion of these depositions, the piezoelectric stack 404C, 404G shown in FIGS. 4C and 4G may be realized.

Figure 4H:
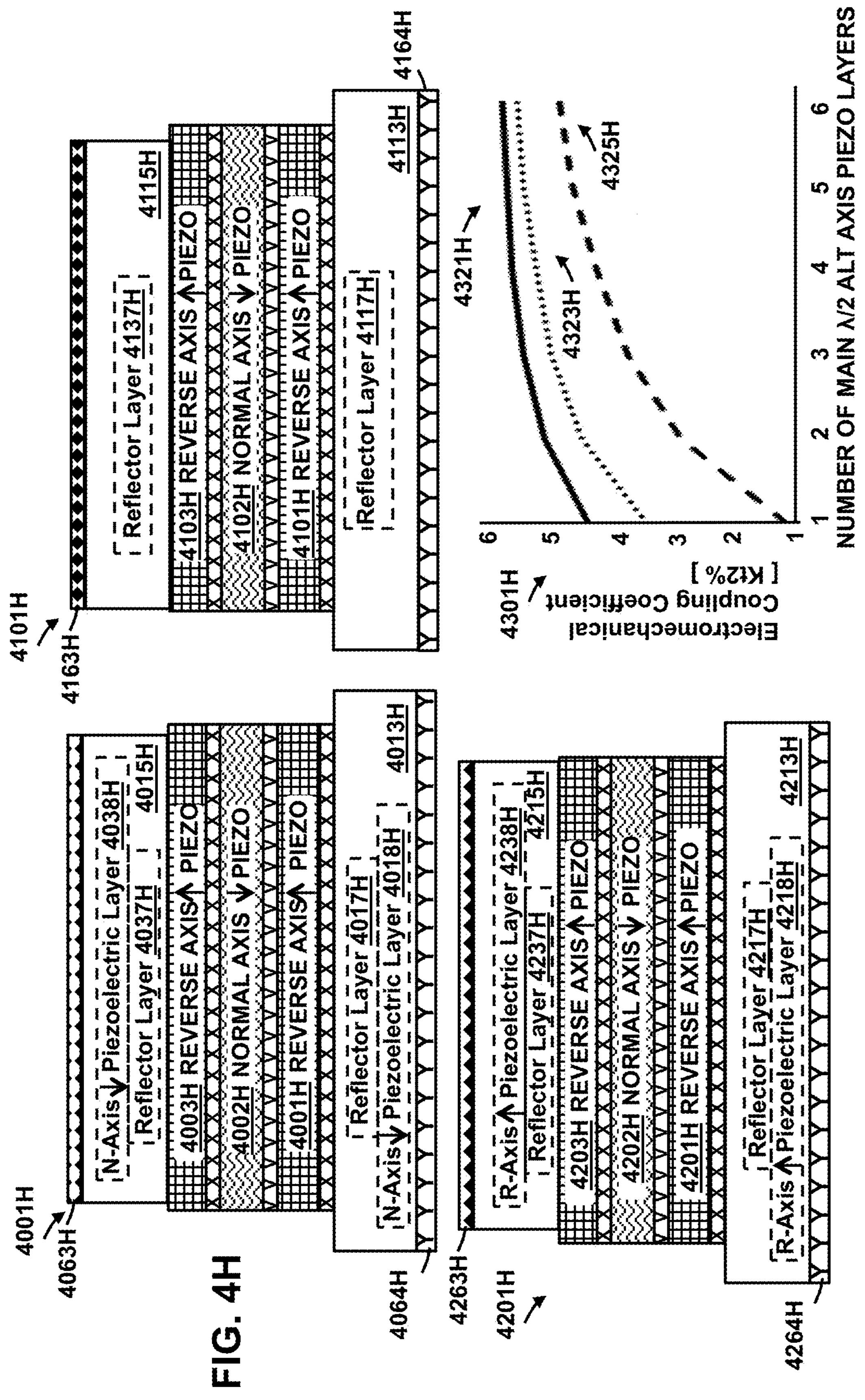
FIG. 4H shows simplified diagrams of three bulk acoustic wave resonator structures along with a corresponding chart showing electromechanical coupling versus number of half acoustic wavelength (e.g., half lambda) thick piezoelectric layers, as expected from simulation.

FIG. 4H shows simplified diagrams of three bulk acoustic wave resonator structures 4001H, 4101H, 4201H along with a corresponding chart 4301H showing electromechanical coupling versus number of half acoustic wavelength (e.g., half lambda) thick piezoelectric layers, as expected from simulation. Example bulk acoustic wave resonator structures 4001H, 4101H, 4201H may comprise respective reverse axis piezoelectric layers 4001H, 4101H, 4201H, respective normal axis piezoelectric layers 4002H, 4102H, 4202H, and another reverse axis piezoelectric layer 4003H, 4103H, 4203H arranged in a three piezoelectric layer alternating stack arrangement sandwiched between respective top multi-layer metal distributed Bragg acoustic reflector electrodes 4015H, 4115H, 4215H and respective bottom multi-layer metal distributed Bragg acoustic reflector electrodes 4013H, 4113H, 4213H. Respective piezoelectric layers 4001H, 4101H, 4201H, 4002H, 4102H, 4202H, 4003H, 4103H, 4203H may have respective thicknesses of approximately a half acoustic wavelength, e.g., to facilitate respective main resonant frequencies of bulk acoustic wave resonator structures 4001H, 4101H, 4201H, e.g., to facilitate a respective twenty-four GigaHertz (24 GHz) main resonant frequency of bulk acoustic wave resonator structures 4001H, 4101H, 4201H.

Bottom multi-layer metal distributed Bragg acoustic reflector electrodes 4013H, 4113H, 4213H may comprise respective bottom electrode layers. Bottom multi-layer metal distributed Bragg acoustic reflector electrodes 4013H, 4113H, 4213H may comprise respective bottom current spreading layers 4064H, 4164H, 4264H. Bottom multi-layer metal distributed Bragg acoustic reflector electrodes 4013H, 4113H, 4213H may comprise respective bottom reflector layers 4017H, 4117H, 4217H (e.g., respective initial bottom reflector layers 4017H, 4117H, 4217H, e.g., respective bottom metal acoustic reflector electrode layers 4017H, 4117H, 4217H, e.g., respective bottom high acoustic impedance metal electrode layers 4017H, 4117H, 4217H, e.g., respective bottom Tungsten (W) electrode layers 4017H, 4117H, 4217H), arranged over respective bottom current spreading layers 4064H, 4164H, 4264H.

Bottom reflector layers 4017H, 4117H, 4217H (e.g., initial bottom reflector layers 4017H, 4117H, 4217H, e.g., bottom metal acoustic reflector electrode layers 4017H, 4117H, 4217H, e.g., bottom high acoustic impedance metal electrode layers 4017H, 4117H, 4217H, e.g., bottom Tungsten (W) electrode layers 4017H, 4117H, 4217H) may have respective thicknesses of approximately a quarter wavelength (e.g., quarter acoustic wavelength) of the main resonant frequency of bulk acoustic wave resonator structures 4001H, 4101H, 4201H, e.g., may have respective thicknesses of approximately a quarter acoustic wavelength of the twenty-four GigaHertz (24 GHz) main resonant frequency of bulk acoustic wave resonator structures 4001H, 4101H, 4201H.

Top multi-layer metal distributed Bragg acoustic reflector electrodes 4015H, 4115H, 4215H may comprise respective top electrode layers. Top multi-layer metal distributed Bragg acoustic reflector electrodes 4015H, 4115H, 4215H may comprise respective top current spreading layers 4063H, 4163H, 4263H. Top multi-layer metal distributed Bragg acoustic reflector electrodes 4015H, 4115H, 4215H may comprise respective top reflector layers 4037H, 4137H, 4237H (e.g., respective initial top reflector layers 4037H, 4137H, 4237H, e.g., respective top metal acoustic reflector electrode layers 4037H, 4137H, 4237H, e.g., respective top high acoustic impedance metal electrode layers 4037H, 4137H, 4237H, e.g., respective top Tungsten (W) electrode layers 4037H, 4137H, 4237H), arranged under respective top current spreading layers 4063H, 4163H, 4263H.

Top reflector layers 4037H, 4137H, 4237H (e.g., initial top reflector layers 4037H, 4137H, 4237H, e.g., top metal acoustic reflector electrode layers 4037H, 4137H, 4237H, e.g., top high acoustic impedance metal electrode layers 4037H, 4137H, 4237H, e.g., top Tungsten (W) electrode layers 4037H, 4137H, 4237H) may have respective thicknesses of approximately a quarter wavelength (e.g., quarter acoustic wavelength) of the main resonant frequency of bulk acoustic wave resonator structures 4001H, 4101H, 4201H, e.g., may have respective thicknesses of approximately a quarter acoustic wavelength of the twenty-four GigaHertz (24 GHz) main resonant frequency of bulk acoustic wave resonator structures 4001H, 4101H, 4201H.

In bulk acoustic wave resonator 4001H shown in a top left corner of FIG. 4H, top multi-layer metal distributed Bragg acoustic reflector electrode 4015H may comprise a top active piezoelectric layer 4038H. In accordance with previous discussions of this disclosure, top active piezoelectric layer 4038H may comprise piezoelectric material e.g., Aluminum Nitride. Top active piezoelectric layer 4038H may have a lower (e.g., contrasting) acoustic impedance than a relatively higher acoustic impedance of the top reflector layer 4037H. For example, top active piezoelectric layer 4038H may have a lower (e.g., contrasting) acoustic impedance than relatively higher acoustic impedance of initial top reflector layer 4037H. For example, top active piezoelectric layer 4038H may have a lower (e.g., contrasting) acoustic impedance than relatively higher acoustic impedance of top metal acoustic reflector electrode layer 4037H. For example, top active piezoelectric layer 4038H may have a lower (e.g., contrasting) acoustic impedance than top high acoustic impedance metal electrode layer 4037H. For example, top Aluminum Nitride active piezoelectric layer 4038H may have a lower (e.g., contrasting) acoustic impedance than top Tungsten (W) electrode layer 4037H).

Further, top quarter acoustic wavelength thick active piezoelectric layer 4038H, e.g., having relatively low acoustic impedance, may be sandwiched between relatively high acoustic impedance, quarter acoustic wavelength thick top metal (e.g., Tungsten) acoustic reflector electrode layer 4037H, and another relatively high acoustic impedance, quarter acoustic wavelength thick top metal (e.g., Tungsten) acoustic reflector electrode layer of the top distributed Bragg acoustic reflector electrode 4015H (e.g., top multi-layer metal acoustic reflector electrode 4015H). In other words, it should be understood that top active piezoelectric layer 4038H may form a portion of top distributed Bragg acoustic reflector electrode 4015H. In particular, since top active piezoelectric layer 4038H may be sandwiched between a pair of relatively high acoustic impedance metal (e.g., Tungsten) reflector electrode layers, and since acoustic impedance of top active piezoelectric layer 4038H (e.g., piezoelectric layer comprising Aluminum Nitride) is substantially lower (e.g., contrasting) relative to the pair of relatively high acoustic impedance metal (e.g., Tungsten) reflector electrode layers, top active piezoelectric layer 4038H may substantially contribute to approximating the top distributed Bragg acoustic reflector electrode 4015H. Moreover, top active piezoelectric layer 4038H may substantially contribute to acoustic wave reflectivity of the top distributed Bragg acoustic reflector electrode 4015H. Further, since top active piezoelectric layer 4038H may have a thickness of approximately a quarter acoustic wavelength sandwiched between the pair of relatively high acoustic impedance metal (e.g., Tungsten) reflector electrode layers having respective thicknesses of approximately the quarter acoustic wavelength, top active piezoelectric layer 4038H may substantially contribute to approximating the top distributed Bragg acoustic reflector electrode 4015H. Moreover, top active piezoelectric layer 4038H may substantially contribute to acoustic wave reflectivity of the top distributed Bragg acoustic reflector electrode 4015H.

Additionally, it should be understood that top active piezoelectric layer 4038H is indeed arranged to be —active-, e.g., when an oscillating electric field may be applied. In addition to forming a portion of top multilayer acoustic reflector 4015H, top-active-piezoelectric layer 4038H may form an —active-portion of an alternating axis piezoelectric volume e.g., further comprising bottom half acoustic wavelength thick reverse axis piezoelectric layer 4001H, e.g., further comprising middle half acoustic wavelength thick normal axis piezoelectric layer 4002H, e.g., further comprising top half acoustic wavelength thick reverse axis piezoelectric layer 4003H. In operation of bulk acoustic wave resonator 4001H, an oscillating electric field may be applied, e.g., via top current spreading layer 4063H and bottom current spreading layer 4064H. This may —activate-responsive piezoelectric acoustic oscillations (e.g., the main resonant mode) in top active piezoelectric layer 4038H and in piezoelectric layers of the alternating axis piezoelectric volume e.g., in bottom half acoustic wavelength thick reverse axis piezoelectric layer 4001H, e.g., in middle half acoustic wavelength thick normal axis piezoelectric layer 4002H, e.g., in top half acoustic wavelength thick reverse axis piezoelectric layer 4003H.

As shown in FIG. 4H and discussed previously herein, third half acoustic wavelength thick piezoelectric layer 4003H has the —reverse-piezoelectric axis orientation (e.g., top half acoustic wavelength thick piezoelectric layer 4003H has the —reverse-piezoelectric axis orientation). The —reverse-piezoelectric axis orientation of top half acoustic wavelength thick piezoelectric layer 4003H is depicted in FIG. 4H using the upward pointing arrow.

However, top active piezoelectric layer 4038H may have a —normal-piezoelectric axis orientation. The —normal-piezoelectric axis orientation (e.g., N-Axis) of top active piezoelectric layer 4038H is depicted in FIG. 4H using the downward pointing arrow. In the alternating axis piezoelectric volume, reflector layer 4037H may be interposed between top active piezoelectric layer 4038H having the normal piezoelectric axis orientation and the adjacent top half acoustic wavelength thick piezoelectric layer 4003H having the reverse piezoelectric axis orientation.

The normal piezoelectric axis orientation of the top active piezoelectric layer 4038H may substantially oppose the reverse piezoelectric orientation of adjacent top half acoustic wavelength thick piezoelectric layer 4003H e.g., of adjacent third half acoustic wavelength thick piezoelectric layer 4003H. It is theorized that this axis opposing arrangement may facilitate an enhanced electromechanical coupling of bulk acoustic wave resonator 4001H. Although bulk acoustic wave resonator 4001H explicitly shows three half wavelength thick piezoelectric layers in an alternating axis arrangement (e.g., in bottom half acoustic wavelength thick reverse axis piezoelectric layer 4001H, e.g., in middle half acoustic wavelength thick normal axis piezoelectric layer 4002H, e.g., in top half acoustic wavelength thick reverse axis piezoelectric layer 4003H) it should be understood that number of half wavelength thick piezoelectric layers may be varied (e.g., from one to six) for various different bulk acoustic wave resonators. When number of half wavelength thick piezoelectric layers may be varied (e.g., from one to six), there may also be variation in piezoelectric axis orientation of various top half acoustic wavelength thick piezoelectric layers. Accordingly, as piezoelectric axis orientation of various adjacent top half acoustic wavelength thick piezoelectric layers may be varied, piezoelectric axis orientation of top active quarter wavelength thick piezoelectric layer may also be varied, in order to maintain the axis opposing arrangement.

For example, a two piezoelectric layer alternating stack arrangement of two half acoustic wavelength thick piezoelectric layers may comprise: a bottom half acoustic wavelength thick reverse axis piezoelectric layer, and a top half acoustic wavelength thick normal axis piezoelectric layer. Accordingly, in this example, a reverse piezoelectric axis orientation may be selected for the top active piezoelectric layer to substantially oppose the normal piezoelectric orientation of adjacent top half acoustic wavelength thick normal axis (e.g., for this two piezoelectric layer alternating stack arrangement example of two half acoustic wavelength thick piezoelectric layers comprising: the bottom half acoustic wavelength thick reverse axis piezoelectric layer, and the top half acoustic wavelength thick normal axis piezoelectric layer).

As piezoelectric axis orientation of various adjacent top half acoustic wavelength thick piezoelectric layers may be varied, piezoelectric axis orientation of top active quarter wavelength thick piezoelectric layer may also be varied, in order to maintain the axis opposing arrangement. It is theorized that this axis opposing arrangement may facilitate an enhanced electromechanical coupling.

In bulk acoustic wave resonator 4001H shown in a top left corner of FIG. 4H, bottom multi-layer metal distributed Bragg acoustic reflector electrode 4013H may comprise a bottom active piezoelectric layer 4018H. In accordance with previous discussions of this disclosure, bottom active piezoelectric layer 4018H may comprise piezoelectric material e.g., Aluminum Nitride. Bottom active piezoelectric layer 4018H may have a lower (e.g., contrasting) acoustic impedance than a relatively higher acoustic impedance of the bottom reflector layer 4017H. For example, bottom active piezoelectric layer 4018H may have a lower (e.g., contrasting) acoustic impedance than relatively higher acoustic impedance of initial bottom reflector layer 4017H. For example, bottom active piezoelectric layer 4018H may have a lower (e.g., contrasting) acoustic impedance than relatively higher acoustic impedance of bottom metal acoustic reflector electrode layer 4017H. For example, bottom active piezoelectric layer 4018H may have a lower (e.g., contrasting) acoustic impedance than bottom high acoustic impedance metal electrode layer 4017H. For example, bottom Aluminum Nitride active piezoelectric layer 4018H may have a lower (e.g., contrasting) acoustic impedance than bottom Tungsten (W) electrode layer 4017H).

Further, bottom quarter acoustic wavelength thick active piezoelectric layer 4018H, e.g., having relatively low acoustic impedance, may be sandwiched between relatively high acoustic impedance, quarter acoustic wavelength thick bottom metal (e.g., Tungsten) acoustic reflector electrode layer 4017H, and another relatively high acoustic impedance, quarter acoustic wavelength thick bottom metal (e.g., Tungsten) acoustic reflector electrode layer of the bottom distributed Bragg acoustic reflector electrode 4013H (e.g., bottom multi-layer metal acoustic reflector electrode 4013H). In other words, it should be understood that bottom active piezoelectric layer 4018H may form a portion of bottom distributed Bragg acoustic reflector electrode 4013H. In particular, since bottom active piezoelectric layer 4018H may be sandwiched between a pair of relatively high acoustic impedance metal (e.g., Tungsten) reflector electrode layers, and since acoustic impedance of bottom active piezoelectric layer 4018H (e.g., piezoelectric layer comprising Aluminum Nitride) is substantially lower (e.g., contrasting) relative to the pair of relatively high acoustic impedance metal (e.g., Tungsten) reflector electrode layers, bottom active piezoelectric layer 4018H may substantially contribute to approximating the bottom distributed Bragg acoustic reflector electrode 4013H. Moreover, bottom active piezoelectric layer 4018H may substantially contribute to acoustic wave reflectivity of the bottom distributed Bragg acoustic reflector electrode 4013H. Further, since bottom active piezoelectric layer 4018H may have a thickness of approximately a quarter acoustic wavelength sandwiched between the pair of relatively high acoustic impedance metal (e.g., Tungsten) reflector electrode layers having respective thicknesses of approximately the quarter acoustic wavelength, bottom active piezoelectric layer 4018H may substantially contribute to approximating the bottom distributed Bragg acoustic reflector electrode 4013H. Moreover, bottom active piezoelectric layer 4018H may substantially contribute to acoustic wave reflectivity of the bottom distributed Bragg acoustic reflector electrode 4013H.

Additionally, it should be understood that bottom active piezoelectric layer 4018H is indeed arranged to be —active-, e.g., when an oscillating electric field may be applied. In addition to forming a portion of bottom multilayer acoustic reflector 4013H, bottom-active-piezoelectric layer 4018H may form an —active-portion of an alternating axis piezoelectric volume e.g., further comprising bottom half acoustic wavelength thick reverse axis piezoelectric layer 4001H, e.g., further comprising middle half acoustic wavelength thick normal axis piezoelectric layer 4002H, e.g., further comprising top half acoustic wavelength thick reverse axis piezoelectric layer 4003H. In operation of bulk acoustic wave resonator 4001H, an oscillating electric field may be applied, e.g., via top current spreading layer 4063H and bottom current spreading layer 4064H. This may —activate-responsive piezoelectric acoustic oscillations (e.g., the main resonant mode) in bottom active piezoelectric layer 4018H and in piezoelectric layers of the alternating axis piezoelectric volume e.g., in bottom half acoustic wavelength thick reverse axis piezoelectric layer 4001H, e.g., in middle half acoustic wavelength thick normal axis piezoelectric layer 4002H, e.g., in top half acoustic wavelength thick reverse axis piezoelectric layer 4003H.

As shown in FIG. 4H and discussed previously herein, first half acoustic wavelength thick piezoelectric layer 4001H has the —reverse-piezoelectric axis orientation (e.g., bottom half acoustic wavelength thick piezoelectric layer 4001H has the —reverse-piezoelectric axis orientation). The —reverse-piezoelectric axis orientation of bottom half acoustic wavelength thick piezoelectric layer 4001H is depicted in FIG. 4H using the upward pointing arrow. However, bottom active piezoelectric layer 4018H may have a —normal-piezoelectric axis orientation. The —normal-piezoelectric axis orientation (e.g., N-Axis) of bottom active piezoelectric layer 4018H is depicted in FIG. 4H using the downward pointing arrow. In the alternating axis piezoelectric volume, bottom reflector layer 4017H may be interposed between bottom active piezoelectric layer 4018H having the normal piezoelectric axis orientation and the adjacent bottom half acoustic wavelength thick piezoelectric layer 4001H having the reverse piezoelectric axis orientation.

The normal piezoelectric axis orientation of the bottom active piezoelectric layer 4018H may substantially oppose the reverse piezoelectric orientation of adjacent bottom half acoustic wavelength thick piezoelectric layer 4001H e.g., of adjacent first half acoustic wavelength thick piezoelectric layer 4001H. It is theorized that this axis opposing arrangement may facilitate an enhanced electromechanical coupling of bulk acoustic wave resonator 4001H. Although bulk acoustic wave resonator 4001H explicitly shows three half wavelength thick piezoelectric layers in an alternating axis arrangement (e.g., in bottom half acoustic wavelength thick reverse axis piezoelectric layer 4001H, e.g., in middle half acoustic wavelength thick normal axis piezoelectric layer 4002H, e.g., in top half acoustic wavelength thick reverse axis piezoelectric layer 4003H) it should be understood that number of half wavelength thick piezoelectric layers may be varied (e.g., from one to six) for various different bulk acoustic wave resonators, and more particularly, for various reasons, there may be variation in piezoelectric axis orientation of various bottom half acoustic wavelength thick piezoelectric layers. Accordingly, as piezoelectric axis orientation of various adjacent bottom half acoustic wavelength thick piezoelectric layers may be varied, piezoelectric axis orientation of bottom active quarter wavelength thick piezoelectric layer may also be varied, in order to maintain the axis opposing arrangement.

For example, a two piezoelectric layer alternating stack arrangement of two half acoustic wavelength thick piezoelectric layers may comprise: a bottom half acoustic wavelength thick normal axis piezoelectric layer, and a top half acoustic wavelength thick reverse axis piezoelectric layer. Accordingly, in this example, a reverse piezoelectric axis orientation may be selected for the bottom active piezoelectric layer to substantially oppose the normal piezoelectric orientation of adjacent bottom half acoustic wavelength thick normal axis (e.g., for this two piezoelectric layer alternating stack arrangement example of two half acoustic wavelength thick piezoelectric layers comprising: the bottom half acoustic wavelength thick normal axis piezoelectric layer, and the top half acoustic wavelength thick reverse axis piezoelectric layer).

As piezoelectric axis orientation of various adjacent bottom half acoustic wavelength thick piezoelectric layers may be varied, piezoelectric axis orientation of bottom active quarter wavelength thick piezoelectric layer may also be varied, in order to maintain the axis opposing arrangement. It is theorized that this axis opposing arrangement may facilitate an enhanced electromechanical coupling.

In bulk acoustic wave resonator 4201H shown in a bottom left corner of FIG. 4H, top multi-layer metal distributed Bragg acoustic reflector electrode 4215H may comprise a top active piezoelectric layer 4238H. In accordance with previous discussions of this disclosure, top active piezoelectric layer 4238H may comprise piezoelectric material e.g., Aluminum Nitride. Top active piezoelectric layer 4238H may have a lower (e.g., contrasting) acoustic impedance than a relatively higher acoustic impedance of the top reflector layer 4237H. For example, top active piezoelectric layer 4238H may have a lower (e.g., contrasting) acoustic impedance than relatively higher acoustic impedance of initial top reflector layer 4237H. For example, top active piezoelectric layer 4238H may have a lower (e.g., contrasting) acoustic impedance than relatively higher acoustic impedance of top metal acoustic reflector electrode layer 4237H. For example, top active piezoelectric layer 4238H may have a lower (e.g., contrasting) acoustic impedance than top high acoustic impedance metal electrode layer 4237H. For example, top Aluminum Nitride active piezoelectric layer 4238H may have a lower (e.g., contrasting) acoustic impedance than top Tungsten (W) electrode layer 4237H).

Further, top quarter acoustic wavelength thick active piezoelectric layer 4238H, e.g., having relatively low acoustic impedance, may be sandwiched between relatively high acoustic impedance, quarter acoustic wavelength thick top metal (e.g., Tungsten) acoustic reflector electrode layer 4237H, and another relatively high acoustic impedance, quarter acoustic wavelength thick top metal (e.g., Tungsten) acoustic reflector electrode layer of the top distributed Bragg acoustic reflector electrode 4215H (e.g., top multi-layer metal acoustic reflector electrode 4215H). In other words, it should be understood that top active piezoelectric layer 4238H may form a portion of top distributed Bragg acoustic reflector electrode 4215H. In particular, since top active piezoelectric layer 4238H may be sandwiched between a pair of relatively high acoustic impedance metal (e.g., Tungsten) reflector electrode layers, and since acoustic impedance of top active piezoelectric layer 4238H (e.g., piezoelectric layer comprising Aluminum Nitride) is substantially lower (e.g., contrasting) relative to the pair of relatively high acoustic impedance metal (e.g., Tungsten) reflector electrode layers, top active piezoelectric layer 4238H may substantially contribute to approximating the top distributed Bragg acoustic reflector electrode 4215H. Moreover, top active piezoelectric layer 4238H may substantially contribute to acoustic wave reflectivity of the top distributed Bragg acoustic reflector electrode 4215H. Further, since top active piezoelectric layer 4238H may have a thickness of approximately a quarter acoustic wavelength sandwiched between the pair of relatively high acoustic impedance metal (e.g., Tungsten) reflector electrode layers having respective thicknesses of approximately the quarter acoustic wavelength, top active piezoelectric layer 4238H may substantially contribute to approximating the top distributed Bragg acoustic reflector electrode 4215H. Moreover, top active piezoelectric layer 4238H may substantially contribute to acoustic wave reflectivity of the top distributed Bragg acoustic reflector electrode 4215H.

Additionally, it should be understood that top active piezoelectric layer 4238H is indeed arranged to be —active-, e.g., when an oscillating electric field may be applied. In addition to forming a portion of top multilayer acoustic reflector 4215H, top-active-piezoelectric layer 4238H may form an —active-portion of an alternating axis piezoelectric volume e.g., further comprising bottom half acoustic wavelength thick reverse axis piezoelectric layer 4201H, e.g., further comprising middle half acoustic wavelength thick normal axis piezoelectric layer 4202H, e.g., further comprising top half acoustic wavelength thick reverse axis piezoelectric layer 4203H. In operation of bulk acoustic wave resonator 4201H, an oscillating electric field may be applied, e.g., via top current spreading layer 4263H and bottom current spreading layer 4264H. This may —activate-responsive piezoelectric acoustic oscillations (e.g., the main resonant mode) in top active piezoelectric layer 4238H and in piezoelectric layers of the alternating axis piezoelectric volume e.g., in bottom half acoustic wavelength thick reverse axis piezoelectric layer 4201H, e.g., in middle half acoustic wavelength thick normal axis piezoelectric layer 4202H, e.g., in top half acoustic wavelength thick reverse axis piezoelectric layer 4203H.

As shown in FIG. 4H and discussed previously herein, third half acoustic wavelength thick piezoelectric layer 4203H has the —reverse-piezoelectric axis orientation (e.g., top half acoustic wavelength thick piezoelectric layer 4203H has the —reverse-piezoelectric axis orientation). The —reverse-piezoelectric axis orientation of top half acoustic wavelength thick piezoelectric layer 4203H is depicted in FIG. 4H using the upward pointing arrow.

Similarly, top active piezoelectric layer 4238H may have a —reverse-piezoelectric axis orientation. The —reverse-piezoelectric axis orientation (e.g., R-Axis) of top active piezoelectric layer 4238H is depicted in FIG. 4H using the upward pointing arrow. In the alternating axis piezoelectric volume, reflector layer 4237H may be interposed between top active piezoelectric layer 4238H having the reverse piezoelectric axis orientation and the adjacent top half acoustic wavelength thick piezoelectric layer 4203H having the reverse piezoelectric axis orientation.

The reverse piezoelectric axis orientation of the top active piezoelectric layer 4238H may be substantially the same as the reverse piezoelectric orientation of adjacent top half acoustic wavelength thick piezoelectric layer 4203H e.g., of adjacent third half acoustic wavelength thick piezoelectric layer 4203H. It is theorized that this same axis arrangement may facilitate a reduced electromechanical coupling (e.g., facilitate an electromechanical coupling reduction) of bulk acoustic wave resonator 4201H. Although bulk acoustic wave resonator 4201H explicitly shows three half wavelength thick piezoelectric layers in an alternating axis arrangement (e.g., in bottom half acoustic wavelength thick reverse axis piezoelectric layer 4201H, e.g., in middle half acoustic wavelength thick normal axis piezoelectric layer 4202H, e.g., in top half acoustic wavelength thick reverse axis piezoelectric layer 4203H) it should be understood that number of half wavelength thick piezoelectric layers may be varied (e.g., from one to six) for various different bulk acoustic wave resonators. When number of half wavelength thick piezoelectric layers may be varied (e.g., from one to six), there may also be variation in piezoelectric axis orientation of various top half acoustic wavelength thick piezoelectric layers. Accordingly, as piezoelectric axis orientation of various adjacent top half acoustic wavelength thick piezoelectric layers may be varied, piezoelectric axis orientation of top active quarter wavelength thick piezoelectric layer may also be varied, in order to maintain the same axis arrangement.

For example, a two piezoelectric layer alternating stack arrangement of two half acoustic wavelength thick piezoelectric layers may comprise: a bottom half acoustic wavelength thick reverse axis piezoelectric layer, and a top half acoustic wavelength thick normal axis piezoelectric layer. Accordingly, in this example, a normal piezoelectric axis orientation may be selected for the top active piezoelectric layer to be substantially same as the normal piezoelectric orientation of adjacent top half acoustic wavelength thick normal axis (e.g., for this two piezoelectric layer alternating stack arrangement example of two half acoustic wavelength thick piezoelectric layers comprising: the bottom half acoustic wavelength thick reverse axis piezoelectric layer, and the top half acoustic wavelength thick normal axis piezoelectric layer).

As piezoelectric axis orientation of various adjacent top half acoustic wavelength thick piezoelectric layers may be varied, piezoelectric axis orientation of top active quarter wavelength thick piezoelectric layer may also be varied, in order to maintain the same axis arrangement. It is theorized that this same axis arrangement may facilitate a reduced electromechanical coupling (e.g., facilitate an electromechanical coupling reduction).

In bulk acoustic wave resonator 4201H shown in a bottom left corner of FIG. 4H, bottom multi-layer metal distributed Bragg acoustic reflector electrode 4213H may comprise a bottom active piezoelectric layer 4218H. In accordance with previous discussions of this disclosure, bottom active piezoelectric layer 4218H may comprise piezoelectric material e.g., Aluminum Nitride. Bottom active piezoelectric layer 4218H may have a lower (e.g., contrasting) acoustic impedance than a relatively higher acoustic impedance of the bottom reflector layer 4217H. For example, bottom active piezoelectric layer 4218H may have a lower (e.g., contrasting) acoustic impedance than relatively higher acoustic impedance of initial bottom reflector layer 4217H. For example, bottom active piezoelectric layer 4218H may have a lower (e.g., contrasting) acoustic impedance than relatively higher acoustic impedance of bottom metal acoustic reflector electrode layer 4217H. For example, bottom active piezoelectric layer 4218H may have a lower (e.g., contrasting) acoustic impedance than bottom high acoustic impedance metal electrode layer 4217H. For example, bottom Aluminum Nitride active piezoelectric layer 4218H may have a lower (e.g., contrasting) acoustic impedance than bottom Tungsten (W) electrode layer 4217H).

Further, bottom quarter acoustic wavelength thick active piezoelectric layer 4218H, e.g., having relatively low acoustic impedance, may be sandwiched between relatively high acoustic impedance, quarter acoustic wavelength thick bottom metal (e.g., Tungsten) acoustic reflector electrode layer 4217H, and another relatively high acoustic impedance, quarter acoustic wavelength thick bottom metal (e.g., Tungsten) acoustic reflector electrode layer of the bottom distributed Bragg acoustic reflector electrode 4213H (e.g., bottom multi-layer metal acoustic reflector electrode 4213H). In other words, it should be understood that bottom active piezoelectric layer 4218H may form a portion of bottom distributed Bragg acoustic reflector electrode 4213H. In particular, since bottom active piezoelectric layer 4218H may be sandwiched between a pair of relatively high acoustic impedance metal (e.g., Tungsten) reflector electrode layers, and since acoustic impedance of bottom active piezoelectric layer 4218H (e.g., piezoelectric layer comprising Aluminum Nitride) is substantially lower (e.g., contrasting) relative to the pair of relatively high acoustic impedance metal (e.g., Tungsten) reflector electrode layers, bottom active piezoelectric layer 4218H may substantially contribute to approximating the bottom distributed Bragg acoustic reflector electrode 4213H. Moreover, bottom active piezoelectric layer 4218H may substantially contribute to acoustic wave reflectivity of the bottom distributed Bragg acoustic reflector electrode 4213H. Further, since bottom active piezoelectric layer 4218H may have a thickness of approximately a quarter acoustic wavelength sandwiched between the pair of relatively high acoustic impedance metal (e.g., Tungsten) reflector electrode layers having respective thicknesses of approximately the quarter acoustic wavelength, bottom active piezoelectric layer 4218H may substantially contribute to approximating the bottom distributed Bragg acoustic reflector electrode 4213H. Moreover, bottom active piezoelectric layer 4218H may substantially contribute to acoustic wave reflectivity of the bottom distributed Bragg acoustic reflector electrode 4213H.

Additionally, it should be understood that bottom active piezoelectric layer 4218H is indeed arranged to be —active-, e.g., when an oscillating electric field may be applied. In addition to forming a portion of bottom multilayer acoustic reflector 4213H, bottom-active-piezoelectric layer 4218H may form an —active-portion of an alternating axis piezoelectric volume e.g., further comprising bottom half acoustic wavelength thick reverse axis piezoelectric layer 4201H, e.g., further comprising middle half acoustic wavelength thick normal axis piezoelectric layer 4202H, e.g., further comprising top half acoustic wavelength thick reverse axis piezoelectric layer 4203H. In operation of bulk acoustic wave resonator 4201H, an oscillating electric field may be applied, e.g., via top current spreading layer 4263H and bottom current spreading layer 4264H. This may —activate-responsive piezoelectric acoustic oscillations (e.g., the main resonant mode) in bottom active piezoelectric layer 4218H and in piezoelectric layers of the alternating axis piezoelectric volume e.g., in bottom half acoustic wavelength thick reverse axis piezoelectric layer 4201H, e.g., in middle half acoustic wavelength thick normal axis piezoelectric layer 4202H, e.g., in top half acoustic wavelength thick reverse axis piezoelectric layer 4203H.

As shown in FIG. 4H and discussed previously herein, first half acoustic wavelength thick piezoelectric layer 4201H has the —reverse-piezoelectric axis orientation (e.g., bottom half acoustic wavelength thick piezoelectric layer 4201H has the —reverse-piezoelectric axis orientation). The —reverse-piezoelectric axis orientation of bottom half acoustic wavelength thick piezoelectric layer 4201H is depicted in FIG. 4H using the upward pointing arrow.

Similarly, bottom active piezoelectric layer 4218H may have a —reverse-piezoelectric axis orientation. The —reverse-piezoelectric axis orientation (e.g., R-Axis) of bottom active piezoelectric layer 4218H is depicted in FIG. 4H using the upward pointing arrow. In the alternating axis piezoelectric volume, bottom reflector layer 4217H may be interposed between bottom active piezoelectric layer 4218H having the reverse piezoelectric axis orientation and the adjacent bottom half acoustic wavelength thick piezoelectric layer 4201H having the reverse piezoelectric axis orientation.

The reverse piezoelectric axis orientation of the bottom active piezoelectric layer 4218H may be substantially the same as the reverse piezoelectric orientation of adjacent bottom half acoustic wavelength thick piezoelectric layer 4201H e.g., of adjacent first half acoustic wavelength thick piezoelectric layer 4201H. It is theorized that this same axis arrangement may facilitate a reduced electromechanical coupling (e.g., facilitate an electromechanical coupling reduction) of bulk acoustic wave resonator 4201H. Although bulk acoustic wave resonator 4201H explicitly shows three half wavelength thick piezoelectric layers in an alternating axis arrangement (e.g., in bottom half acoustic wavelength thick reverse axis piezoelectric layer 4201H, e.g., in middle half acoustic wavelength thick normal axis piezoelectric layer 4202H, e.g., in top half acoustic wavelength thick reverse axis piezoelectric layer 4203H) it should be understood that number of half wavelength thick piezoelectric layers may be varied (e.g., from one to six) for various different bulk acoustic wave resonators, and more particularly, for various reasons, there may be variation in piezoelectric axis orientation of various bottom half acoustic wavelength thick piezoelectric layers. Accordingly, as piezoelectric axis orientation of various adjacent bottom half acoustic wavelength thick piezoelectric layers may be varied, piezoelectric axis orientation of bottom active quarter wavelength thick piezoelectric layer may also be varied, in order to maintain the same axis arrangement.

For example, a two piezoelectric layer alternating stack arrangement of two half acoustic wavelength thick piezoelectric layers may comprise: a bottom half acoustic wavelength thick normal axis piezoelectric layer, and a top half acoustic wavelength thick reverse axis piezoelectric layer. Accordingly, in this example, a normal piezoelectric axis orientation may be selected for the bottom active piezoelectric layer to be substantially the same as the normal piezoelectric orientation of adjacent bottom half acoustic wavelength thick normal axis (e.g., for this two piezoelectric layer alternating stack arrangement example of two half acoustic wavelength thick piezoelectric layers comprising: the bottom half acoustic wavelength thick normal axis piezoelectric layer, and the top half acoustic wavelength thick reverse axis piezoelectric layer).

As piezoelectric axis orientation of various adjacent bottom half acoustic wavelength thick piezoelectric layers may be varied, piezoelectric axis orientation of bottom active quarter wavelength thick piezoelectric layer may also be varied, in order to maintain the same axis arrangement. It is theorized that this same axis arrangement may facilitate the reduced electromechanical coupling (e.g., facilitate an electromechanical coupling reduction).

Chart 4301H of FIG. 4H shows electromechanical coupling versus number of half acoustic wavelength (e.g., half lambda) thick piezoelectric layers, as expected from simulation, corresponding to the three bulk acoustic wave resonator structures similar to bulk acoustic wave resonator structures 4001H, 4101H, 4201H, e.g., having a main resonant frequency of about twenty-four GigaHertz (24 GHz). For example, the top multi-layer metal distributed Bragg acoustic reflector electrodes 4015H, 4115H and 4215H, and bottom top multi-layer metal distributed Bragg acoustic reflector electrodes 4013H, 40113H and 4213H may be formed of alternating pairs, e.g., about five hundred and forty Angstrom (540 A) thick Tungsten (W) quarter wavelength layers, e.g., about six hundred and twenty five Angstrom (625 A) thick Titanium (Ti) quarter wavelength layers. However, for bulk acoustic wave resonator structures 4001H and 4201H, the design of a six hundred and twenty five Angstrom (625 A) thick Titanium (Ti) quarter wavelength layer may be reduced by one hundred Angstroms (100 A), e.g., a reduced portion. In design, this reduced portion may be replaced with a three hundred Angstrom (300 A) thick layer formed of AlN of respective polarity as described above. For example, designs similar to bulk acoustic wave resonator structure 4001H corresponds to solid line trace 4321H showing electromechanical coupling coefficient (e.g., Kt2) increasing and ranging from about four and a half percent (4.5%) to about five and three quarters percent (5.75%) as number of ranges and increases from one of the half acoustic wavelength (e.g., half lambda) thick piezoelectric layers to six of the half acoustic wavelength (e.g., half lambda) thick piezoelectric layers. For example, designs similar to bulk acoustic wave resonator structure 4101H correspond to dotted line trace 4323H showing electromechanical coupling coefficient (e.g., Kt2) increasing and ranging from about three and a half percent (3.5%) to about five and a half percent (5.5%) as number of ranges and increases from one of the half acoustic wavelength (e.g., half lambda) thick piezoelectric layers to six of the half acoustic wavelength (e.g., half lambda) thick piezoelectric layers. For example, designs similar to bulk acoustic wave resonator structure 4201H correspond to dashed line trace 4325H showing electromechanical coupling coefficient (e.g., Kt2) increasing and ranging from about one percent (1%) to about four and eight tenths percent (4.8%) as number of ranges and increases from one of the half acoustic wavelength (e.g., half lambda) thick piezoelectric layers to six of the half acoustic wavelength (e.g., half lambda) thick piezoelectric layers.

Comparing designs similar to bulk acoustic wave resonator structure 4001H to designs similar to bulk acoustic wave resonator structure 4101H may show that designs similar to bulk acoustic wave resonator structure 4001H may comprise top active piezoelectric layer 4038H arranged in top multi-layer metal distributed Bragg acoustic reflector electrode 4015H with opposing piezoelectric axis (relative to top half acoustic wavelength thick piezoelectric layer 4003H), and may comprise bottom active piezoelectric layer 4018H arranged in bottom multi-layer metal distributed Bragg acoustic reflector electrode 4013H with opposing piezoelectric axis (relative to bottom half acoustic wavelength thick piezoelectric layer 4001H). However, comparison shows that active piezoelectric layers may not be present in top multi-layer metal distributed Bragg acoustic reflector electrode 4115H and in bottom multi-layer metal distributed Bragg acoustic reflector electrode 4013H of designs similar to bulk acoustic wave resonator structure 4101H. Results of these structural differences may be seen in comparison of solid line trace 4321H (corresponding e.g., to bulk acoustic wave resonator 4001H) and dotted line trace 4323H (corresponding e.g., to bulk acoustic wave resonator 4101H), showing an enhanced electromechanical coupling (e.g., enhanced electromechanical coupling coefficient) for solid line trace 4321H (corresponding e.g., to bulk acoustic wave resonator 4001H) relative to dotted line trace 4323H (corresponding e.g., to bulk acoustic wave resonator 4101H.

Comparing designs similar to bulk acoustic wave resonator structure 4201H to designs similar to bulk acoustic wave resonator structure 4101H may show that designs similar to bulk acoustic wave resonator structure 4201H may comprise top active piezoelectric layer 4238H arranged in top multi-layer metal distributed Bragg acoustic reflector electrode 4215H with same piezoelectric axis (relative to top half acoustic wavelength thick piezoelectric layer 4203H), and may comprise bottom active piezoelectric layer 4218H arranged in bottom multi-layer metal distributed Bragg acoustic reflector electrode 4213H with same piezoelectric axis (relative to bottom half acoustic wavelength thick piezoelectric layer 4201H). However, comparison shows that active piezoelectric layers may not be present in top multi-layer metal distributed Bragg acoustic reflector electrode 4115H and in bottom multi-layer metal distributed Bragg acoustic reflector electrode 4013H of designs similar to bulk acoustic wave resonator structure 4101H. Results of these structural differences may be seen in comparison of dashed line trace 4325H (corresponding e.g., to bulk acoustic wave resonator 4201H) and dotted line trace 4323H (corresponding e.g., to bulk acoustic wave resonator 4101H), showing a reduced electromechanical coupling (e.g., reduced electromechanical coupling coefficient) for dashed line trace 4325H (corresponding e.g., to bulk acoustic wave resonator 4201H) relative to dotted line trace 4323H (corresponding e.g., to bulk acoustic wave resonator 4101H).

Figure 5:
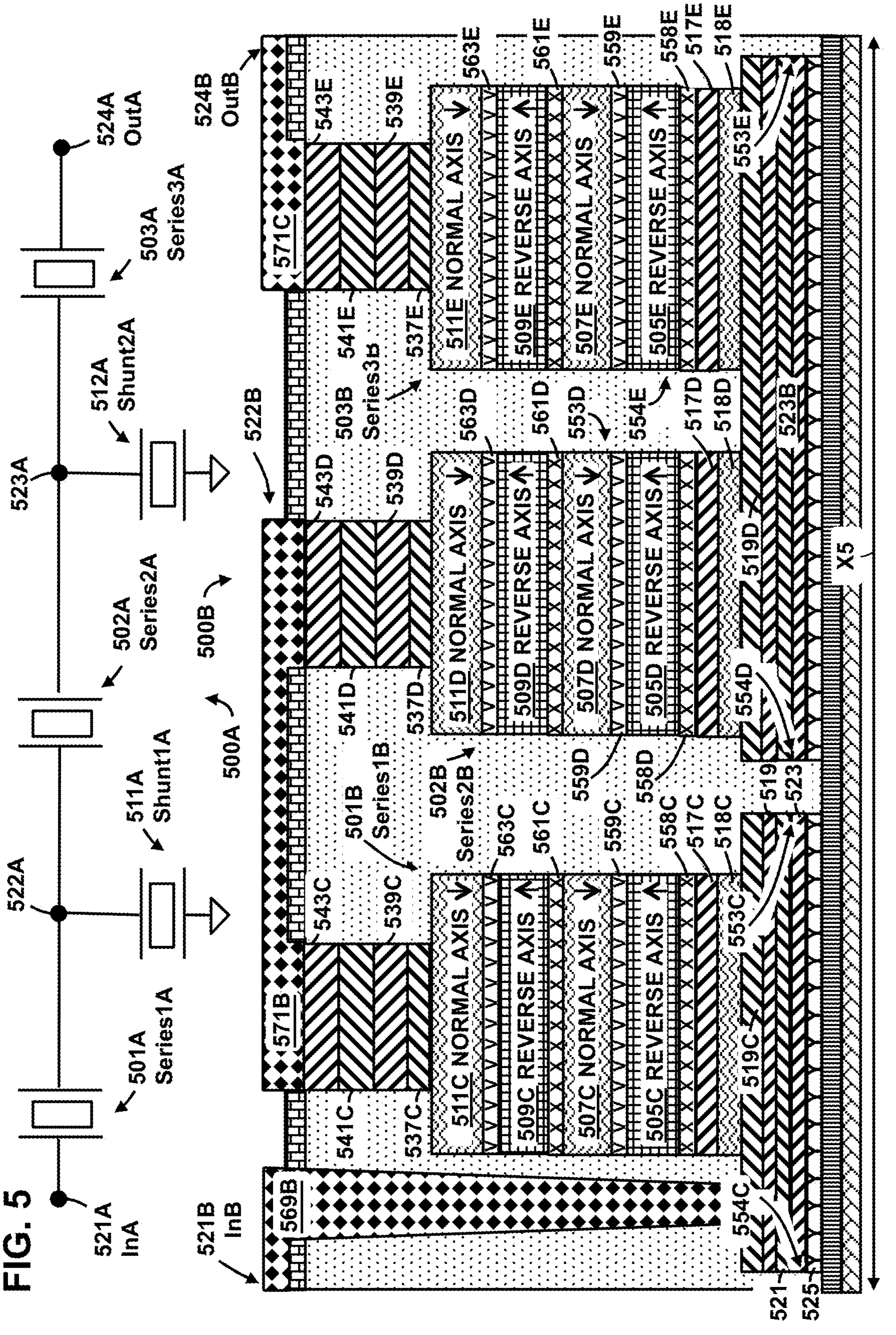
FIG. 5 shows a schematic of an example ladder filter using three series resonators of the bulk acoustic wave resonator structure of FIG. 1A, and two mass loaded shunt resonators of the bulk acoustic wave resonator structure of FIG. 1A, along with a simplified view of the three series resonators.

FIG. 5 shows a schematic of an example ladder filter 500A (e.g., SHF or EHF wave ladder filter 500A) using three series resonators of the bulk acoustic wave resonator structure of FIG. 1A (e.g., three bulk acoustic SHF or EHF wave resonators), and two mass loaded shunt resonators of the bulk acoustic wave resonator structure of FIG. 1A (e.g., two mass loaded bulk acoustic SHF or EHF wave resonators), along with a simplified view of the three series resonators. Accordingly, the example ladder filter 500A (e.g., SHF or EHF wave ladder filter 500A) is an electrical filter, comprising a plurality of bulk acoustic wave (BAW) resonators, e.g., on a substrate, in which the plurality of BAW resonators may comprise a respective first layer (e.g., bottom layer) of piezoelectric material having a respective piezoelectrically excitable resonance mode. The plurality of BAW resonators of the filter 500A may comprise a respective top acoustic reflector (e.g., top acoustic reflector electrode) including a respective first pair of top metal electrode layers electrically and acoustically coupled with the respective first layer (e.g., bottom layer) of piezoelectric material to excite the respective piezoelectrically excitable resonance mode at a respective resonant frequency. For example, the respective top acoustic reflector (e.g., top acoustic reflector electrode) may include the respective first pair of top metal electrode layers, and the foregoing may have a respective quarter wavelength resonant frequency in the Super High Frequency (SHF) band or the Extremely High Frequency (EHF) band that includes the respective resonant frequency of the respective BAW resonator. The plurality of BAW resonators of the filter 500A may comprise a respective bottom acoustic reflector (e.g., bottom acoustic reflector electrode) including a respective first pair of bottom metal electrode layers electrically and acoustically coupled with the respective first layer (e.g., bottom layer) of piezoelectric material to excite the respective piezoelectrically excitable resonance mode at the respective resonant frequency. For example, the respective bottom acoustic reflector (e.g., bottom acoustic reflector electrode) may include the respective first pair of bottom metal electrode layers, and the foregoing may have a respective quarter wavelength resonant frequency in the super high frequency band or the extremely high frequency band that includes the respective resonant frequency of the respective BAW resonator. The respective first layer (e.g., bottom layer) of piezoelectric material may be sandwiched between the respective top acoustic reflector and the respective bottom acoustic reflector. Further, the plurality of BAW resonators may comprise at least one respective additional layer of piezoelectric material, e.g., first middle piezoelectric layer. The at least one additional layer of piezoelectric material may have the piezoelectrically excitable main resonance mode with the respective first layer (e.g., bottom layer) of piezoelectric material. The respective first layer (e.g., bottom layer) of piezoelectric material may have a respective first piezoelectric axis orientation (e.g., reverse axis orientation) and the at least one respective additional layer of piezoelectric material may have a respective piezoelectric axis orientation (e.g., normal axis orientation) that opposes the first piezoelectric axis orientation of the respective first layer of piezoelectric material. Further discussion of features that may be included in the plurality of BAW resonators of the filter 500A is present previously herein with respect to previous discussion of FIG. 1A As shown in the schematic appearing at an upper section of FIG. 5, the example ladder filter 500A may include an input port comprising a first node 521A (InA), and may include a first series resonator 501A (Series1A) (e.g., first bulk acoustic SHF or EHF wave resonator 501A) coupled between the first node 521A (InA) associated with the input port and a second node 522A. The example ladder filter 500A may also include a second series resonator 502A (Series2A) (e.g., second bulk acoustic SHF or EHF wave resonator 502A) coupled between the second node 522A and a third node 523A. The example ladder filter 500A may also include a third series resonator 503A (Series3A) (e.g., third bulk acoustic SHF or EHF wave resonator 503A) coupled between the third node 523A and a fourth node 524A (OutA), which may be associated with an output port of the ladder filter 500A. The example ladder filter 500A may also include a first mass loaded shunt resonator 511A (Shunt1A) (e.g., first mass loaded bulk acoustic SHF or EHF wave resonator 511A) coupled between the second node 522A and ground. The example ladder filter 500A may also include a second mass loaded shunt resonator 512A (Shunt2A) (e.g., second mass loaded bulk acoustic SHF or EHF wave resonator 512A) coupled between the third node 523 and ground.

Appearing at a lower section of FIG. 5 is the simplified view of the three series resonators 501B (Series1B), 502B (Series2B), 503B (Series3B) in a serial electrically interconnected arrangement 500B, for example, corresponding to series resonators 501A, 502A, 503A, of the example ladder filter 500A. The three series resonators 501B (Series1B), 502B (Series2B), 503B (Series3B), may be constructed as shown in the arrangement 500B and electrically interconnected in a way compatible with integrated circuit fabrication of the ladder filter. Although the first mass loaded shunt resonator 511A (Shunt1A) and the second mass loaded shunt resonator 512A are not explicitly shown in the arrangement 500B appearing at a lower section of FIG. 5, it should be understood that the first mass loaded shunt resonator 511A (Shunt1A) and the second mass loaded shunt resonator 512A are constructed similarly to what is shown for the series resonators in the lower section of FIG. 5, but that the first and second mass loaded shunt resonators 511A, 512A may include mass layers, in addition to layers corresponding to those shown for the series resonators in the lower section of FIG. 5 (e.g., the first and second mass loaded shunt resonators 511A, 512A may include respective mass layers, in addition to respective top acoustic reflectors of respective top metal electrode layers, may include respective alternating axis stacks of piezoelectric material layers, and may include respective bottom acoustic reflectors of bottom metal electrode layers). For example, all of the resonators of the ladder filter may be co-fabricated using integrated circuit processes (e.g., Complementary Metal Oxide Semiconductor (CMOS) compatible fabrication processes) on the same substrate (e.g., same silicon substrate). The example ladder filter 500A and serial electrically interconnected arrangement 500B of series resonators 501A, 502A, 503A, may respectively be relatively small in size, and may respectively have a lateral dimension (X5) of less than approximately one millimeter.

For example, the serial electrically interconnected arrangement 500B of three series resonators 501B (Series1B), 502B (Series2B), 503B (Series3B), may include an input port comprising a first node 521B (InB) and may include a first series resonator 501B (Series1B) (e.g., first bulk acoustic SHF or EHF wave resonator 501B) coupled between the first node 521B (InB) associated with the input port and a second node 522B. The first node 521B (InB) may include bottom electrical interconnect 569B electrically contacting a first bottom acoustic reflector of first series resonator 501B (Series1B) (e.g., first bottom acoustic reflector electrode of first series resonator 501B (Series1B)). Accordingly, in addition to including bottom electrical interconnect 569, the first node 521B (InB) may also include the first bottom acoustic reflector of first series resonator 501B (Series1B) (e.g., first bottom acoustic reflector electrode of first series resonator 501B (Series1B)). The first bottom acoustic reflector of first series resonator 501B (Series1B) (e.g., first bottom acoustic reflector electrode of first series resonator 501B (Series1B)) may include bottom initial high acoustic impedance metal (e.g., Tungsten (W)) acoustic reflector electrode 517C over normal axis active piezoelectric layer 518C e.g., arranged over stack of the plurality of bottom metal electrode layers 519 through 523 and bottom current spreading layer 525. The serial electrically interconnected arrangement 500B of three series resonators 501B (Series1B), 502B (Series2B), 503B (Series3B), may include the second series resonator 502B (Series2B) (e.g., second bulk acoustic SHF or EHF wave resonator 502B) coupled between the second node 522B and a third node 523B. The third node 523B may include a second bottom acoustic reflector of second series resonator 502B (Series2B) (e.g., second bottom acoustic reflector electrode of second series resonator 502B (Series2B)). The second bottom acoustic reflector of second series resonator 502B (Series2B) (e.g., second bottom acoustic reflector electrode of second series resonator 502B (Series2B)) may include bottom initial high acoustic impedance metal (e.g., Tungsten (W)) acoustic reflector electrode 517D over normal axis active piezoelectric layer 518D e.g., arranged over an additional stack of an additional plurality of bottom metal electrode layers. The serial electrically interconnected arrangement 500B of three series resonators 501B (Series1B), 502B (Series2B), 503B (Series3B), may also include the third series resonator 503B (Series3B) (e.g., third bulk acoustic SHF or EHF wave resonator 503B) coupled between the third node 523B and a fourth node 524B (OutB). The third node 523B, e.g., including the additional plurality of bottom metal electrode layers, may electrically interconnect the second series resonator 502B (Series2B) and the third series resonator 503B (Series3B). The second bottom acoustic reflector (e.g., second bottom acoustic reflector electrode) of second series resonator 502B (Series2B) of the third node 523B, e.g., including the additional plurality of bottom metal electrode layers, may be a mutual bottom acoustic reflector (e.g., mutual bottom acoustic reflector electrode), and may likewise serve as bottom acoustic reflector (e.g., bottom acoustic reflector) of third series resonator 503B (Series3B). Third series resonator 503B (Series3B) (e.g., third bulk acoustic SHF or EHF wave resonator 503B) may comprise bottom initial high acoustic impedance metal (e.g., Tungsten (W)) acoustic reflector electrode 517E over normal axis active piezoelectric layer 518E e.g., arranged over the mutual bottom acoustic reflector (e.g., mutual bottom acoustic reflector electrode) just discussed.

Bottom initial high acoustic impedance metal (e.g., Tungsten (W)) acoustic reflector electrodes 517C, 517D, 517E respectively arranged over active piezoelectric layers 518C, 518D, 518E e.g., may affect quality factor, e.g., may affect electromechanical coupling, as already discussed in detailed resonator discussions previously herein. Such detailed resonator discussions may likewise be applied to the serial electrically interconnected arrangement 500B, for example, corresponding to series resonators 501A, 502A, 503A, of the example ladder filter 500A. For clarity and brevity, these discussions are referenced and incorporated rather than explicitly repeated.

The fourth node 524B (OutB) may be associated with an output port of the serial electrically interconnected arrangement 500B of three series resonators 501B (Series1B), 502B (Series2B), 503B (Series3B). The fourth node 524B (OutB) may include top current spreading layer 571C, e.g., made integral with top electrical interconnect 571C.

The stack of the plurality of bottom metal electrode layers 519 through 523 and bottom current spreading layer 525 are associated with the first bottom acoustic reflector (e.g., first bottom acoustic reflector electrode) of first series resonator 501B (Series1B). The additional stack of the additional plurality of bottom metal electrode layers (e.g., of the third node 523B) may be associated with the mutual bottom acoustic reflector (e.g., mutual bottom acoustic reflector electrode) of both the second series resonant 502B (Series2B) and the third series resonator 503B (Series3B). Although stacks of respective five bottom metal electrode layers are shown in simplified view in FIG. 5, in should be understood that the stacks may include respective larger numbers of bottom metal electrode layers, e.g., respective nine top metal electrode layers. Further, the first series resonator (Series1B), and the second series resonant 502B (Series2B) and the third series resonator 503B (Series3B) may all have the same, or approximately the same, or different (e.g., achieved by means of additional mass loading layers) resonant frequency (e.g., the same, or approximately the same, or different main resonant frequency). For example, small additional massloads (e.g, a tenth of the main shunt mass-load) of series and shunt resonators may help to reduce pass-band ripples insertion loss, as may be appreciated by one with skill in the art, upon reading this disclosure. The bottom metal electrode layers 519 through 523 and bottom current spreading layer 525 and the additional plurality of bottom metal electrode layers (e.g., of the mutual bottom acoustic reflector, e.g., of the third node 523B) may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner bottom metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker bottom metal electrode layer thicknesses, e.g., scaled thicker with relatively lower resonant frequency (e.g., lower main resonant frequency).

Initial bottom acoustic reflector electrode layers 519 may comprise the relatively high acoustic impedance metal (e.g., Tungsten). For example, respective thicknesses of the initial bottom acoustic reflector electrode layers 519 may be about a quarter of an acoustic wavelength. A first pair of bottom acoustic reflector electrode layers 521, 523 may comprise an alternating layer pair of the relatively low acoustic impedance metal (e.g., Titanium) and the relatively high acoustic impedance metal (e.g., Tungsten). For example, respective thicknesses of the first pair of bottom acoustic reflector electrode layers 521, 523 may about a quarter acoustic wavelength.

The bottom metal electrode layers 519, 521, 523 and current spreading layer 525 and the additional plurality of bottom metal electrode layers (e.g., of the mutual bottom acoustic reflector, e.g., of the third node 523B) may include members of pairs of bottom metal electrodes having respective thicknesses of one quarter wavelength (e.g., one quarter acoustic wavelength) at the resonant frequency (e.g., main resonant frequency) of the series resonators (e.g., first series resonator 501B (Series1B), e.g., second series resonator 502B, e.g., third series resonator (503B)). The stack of bottom metal electrode layers 519 through 523 and bottom current spreading layer 525 and the stack of additional plurality of bottom metal electrode layers (e.g., of the mutual bottom acoustic reflector, e.g., of the third node 523B) may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the first bottom acoustic reflector (e.g., first bottom acoustic reflector electrode) of the first series resonator 501B (Series1B) and the mutual bottom acoustic reflector (e.g., of the third node 523B) of the second series resonator 502B (Series2B) and the third series resonator 503B (Series3B).

A first top acoustic reflector (e.g., first top acoustic reflector electrode) may comprise a first stack of a first plurality of top metal electrode layers 537C through 543C of the first series resonator 501B (Series1B) along with current spreading layer 571B, e.g., made integral with top electrical interconnect 571B. A second top acoustic reflector (e.g., second top acoustic reflector electrode) may comprise a second stack of a second plurality of top metal electrode layers 537D through 543D of the second series resonator 502B (Series2B), along with current spreading layer 571B, e.g., made integral with top electrical interconnect 571B. A third top acoustic reflector (e.g., third top acoustic reflector electrode) may comprise a third stack of a third plurality of top metal electrode layers 537E through 543E of the third series resonator 503B (Series3B), along with current spreading layer 571C, e.g., made integral with top electrical interconnect 571C. Although stacks of respective five top metal electrode layers are shown in simplified view in FIG. 5, it should be understood that the stacks may include respective larger numbers of top metal electrode layers, e.g., respective nine bottom metal electrode layers. Further, the first plurality of top metal electrode layers 537C through 543C, the second plurality of top metal electrode layers 537D through 543D, and the third plurality of top metal electrode layers 537E through 543E may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner top metal electrode thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker top metal electrode layer thicknesses, e.g., scaled thicker with relatively lower resonant frequency (e.g., lower main resonant frequency).

The first pair of top metal electrode layers 537C, 539C of the first top acoustic reflector, the first pair of top metal electrode layers 537D, 539D of the second top acoustic reflector, and the first pair of top metal electrode layers 537E, 539E of the third top acoustic reflector may include members of pairs of top metal electrodes having respective thicknesses of one quarter wavelength (e.g., one quarter acoustic wavelength) of the resonant frequency (e.g., main resonant frequency) of the series resonators (e.g., first series resonator 501B (Series1B), e.g., second series resonator 502B, e.g., third series resonator (503B)). The second pair of top metal electrode layers 541C, 543C of the first top acoustic reflector, the second pair of top metal electrode layers 541D, 543D of the second top acoustic reflector, and the second pair of top metal electrode layers 541E, 543E of the third top acoustic reflector may include members of pairs of top metal electrodes having respective thicknesses of one quarter wavelength (e.g., one quarter acoustic wavelength) of the resonant frequency (e.g., main resonant frequency) of the series resonators (e.g., first series resonator 501B (Series1B), e.g., second series resonator 502B, e.g., third series resonator (503B)). Second top acoustic reflector may further comprise capacitive layer 518D. Third top acoustic reflector may further comprise capacitive layer 518E. The first stack of the first plurality of top metal electrode layers 537C through 543C, the second stack of the second plurality of top metal electrode layers 537D through 543D, and the third stack of the third plurality of top metal electrode layers 537E through 543E may include respective alternating stacks of different metals, e.g., different metals having different acoustic impedances (e.g., alternating relatively high acoustic impedance metals with relatively low acoustic impedance metals). The foregoing may provide acoustic impedance mismatches for facilitating acoustic reflectivity (e.g., SHF or EHF acoustic wave reflectivity) of the top acoustic reflectors (e.g., the first top acoustic reflector of the first series resonator 501B (Series1B), e.g., the second top acoustic reflector of the second series resonator 502B (Series2B), e.g., the third top acoustic reflector of the third series resonator 503B (Series3B)). Although not explicitly shown in the FIG. 5 simplified views of metal electrode layers of the series resonators, respective pluralities of lateral features (e.g., respective pluralities of step features) may be sandwiched between metal electrode layers (e.g., between respective pairs of top metal electrode layers, e.g., between respective first pairs of top metal electrode layers 537C, 539C, 537D, 539D, 537E, 539E, and respective second pairs of top metal electrode layers 541C, 543C, 541D, 543D, 541E, 543E. The respective pluralities of lateral features may, but need not, limit parasitic lateral acoustic modes (e.g., facilitate suppression of spurious modes) of the bulk acoustic wave resonators of FIG. 5 (e.g., of the series resonators, the mass loaded series resonators, and the mass loaded shunt resonators).

The first series resonator 501B (Series1B) may comprise a first alternating axis stack, e.g., an example first stack of four layers of alternating axis piezoelectric material, 505C through 511C. The second series resonator 502B (Series2B) may comprise a second alternating axis stack, e.g., an example second stack of four layers of alternating axis piezoelectric material, 505D through 511D. The third series resonator 503B (Series3B) may comprise a third alternating axis stack, e.g., an example third stack of four layers of alternating axis piezoelectric material, 505E through 511E. The first, second and third alternating axis piezoelectric stacks may comprise layers of Aluminum Nitride (AlN) having alternating C-axis wurtzite structures. For example, piezoelectric layers 505C, 505D, 505E, 509C, 509D, 509E have reverse axis orientation. For example, piezoelectric layers 507C, 507D, 507E, 511C, 511D, 511E have normal axis orientation. Members of the first stack of four layers of alternating axis piezoelectric material, 505C through 511C, and members of the second stack of four layers of alternating axis piezoelectric material, 505D through 511D, and members of the third stack of four layers of alternating axis piezoelectric material, 505E through 511E, may have respective thicknesses that are related to wavelength (e.g., acoustic wavelength) for the resonant frequency (e.g., main resonant frequency) of the series resonators (e.g., first series resonator 501B (Series1B), e.g., second series resonator 502B, e.g., third series resonator (503B)). Various embodiments for series resonators (e.g., first series resonator 501B (Series1B), e.g., second series resonator 502B, e.g., third series resonator (503B)) having various relatively higher resonant frequency (e.g., higher main resonant frequency) may have relatively thinner piezoelectric layer thicknesses, e.g., scaled thinner with relatively higher resonant frequency (e.g., higher main resonant frequency). Similarly, various embodiments of the series resonators (e.g., first series resonator 501B (Series1B), e.g., second series resonator 502B, e.g., third series resonator (503B)) having various relatively lower resonant frequency (e.g., lower main resonant frequency) may have relatively thicker piezoelectric layer thicknesses, e.g., scaled thicker with relatively lower resonant frequency (e.g., lower main resonant frequency). The example first stack of four layers of alternating axis piezoelectric material, 505C through 511C, the example second stack of four layers of alternating axis piezoelectric material, 505D through 511D and the example third stack of four layers of alternating axis piezoelectric material, 505D through 511D may include stack members of piezoelectric layers having respective thicknesses of approximately one half wavelength (e.g., one half acoustic wavelength) at the resonant frequency (e.g., main resonant frequency) of the series resonators (e.g., first series resonator 501B (Series1B), e.g., second series resonator 502B, e.g., third series resonator (503B)).

The example first stack of four layers of alternating axis piezoelectric material, 505C through 511C, may include a first, second, third and fourth polarizing layers 558C, 559C, 561C, 563C respectively arranged below the corresponding four layers of alternating axis piezoelectric material, 505C through 511C. The example second stack of four layers of alternating axis piezoelectric material, 505D through 511D, may include a second set of first, second, third and fourth polarizing layers 558D, 559D, 561D, 563D respectively arranged below the corresponding four layers of alternating axis piezoelectric material, 505D through 511D. The example third stack of four layers of alternating axis piezoelectric material, 505E through 511E, may third set of first, second, third and fourth polarizing layers 558E, 559E, 561D, 563E respectively arranged below the corresponding four layers of alternating axis piezoelectric material, 505E through 511E. The first series resonator 501B (Series1B), the second series resonator 502B (Series2B) and the third series resonator 503B (Series3B) may have respective etched edge regions 553C, 553D, 553E, and respective laterally opposing etched edge regions 554C, 554D, 554E. Reference is made to resonator mesa structures as have already been discussed in detail previously herein. Accordingly, they are not discussed again in detail at this point. Briefly, respective first, second and third mesa structures of the respective first series resonator 501B (Series1B), the respective second series resonator 502B (Series2B) and the respective third series resonator 503B (Series3B) may extend between respective etched edge regions 553C, 553D, 553E, and respective laterally opposing etched edge regions 554C, 554D, 554E of the respective first series resonator 501B (Series1B), the respective second series resonator 502B (Series2B) and the respective third series resonator 503B (Series3B). The second bottom acoustic reflector of second series resonator 502B (Series2B) of the third node 523B, e.g., including the additional plurality of bottom metal electrode layers may be a second mesa structure. For example, this may be a mutual second mesa structure bottom acoustic reflector 523B, and may likewise serve as bottom acoustic reflector of third series resonator 503B (Series3B). Accordingly, this mutual second mesa structure bottom acoustic reflector 523B may extend between etched edge region 553E of the third series resonator 503B (Series3B) and the laterally opposing etched edge region 554D of the third series resonator 503B (Series3B).

For example, in the plurality of top reflector electrodes, respective first members 537C, 537D, 537E having the relatively lower acoustic impedance of the first pairs may be arranged nearest, e.g. may abut, respective first piezoelectric layers (e.g. respective top piezoelectric layers 511C, 511D, 511E of the BAW resonators, e.g., respective piezoelectric stacks of the BAW resonators). For example, in respective top reflector electrodes, the respective first members 537C, 537D, 537E having the relatively lower acoustic impedance of the respective first pairs may be arranged substantially nearest, e.g. may substantially abut, respective first piezoelectric layers (respective top piezoelectric layers 511C, 511D, 511E of the BAW resonators, e.g., respective piezoelectric stacks of the BAW resonators). This may facilitate suppressing parasitic lateral modes. In the plurality of multi-layer metal top reflector electrodes, the respective first members 537C, 537D, 537E having the relatively lower acoustic impedance may be arranged sufficiently proximate to the respective first layers of piezoelectric material (e.g. may be arranged sufficiently proximate to respective top piezoelectric layers 511C, 511D, 511E of the BAW resonators, e.g., may be arranged sufficiently proximate to respective piezoelectric stacks of the BAW resonators), so that the respective first members 537C, 537D, 537E having the relatively lower acoustic impedance may contribute more, e.g., may contribute more to facilitate suppressing parasitic lateral resonances in operation of the respective BAW resonators than is contributed by any other top metal electrode layer of the plurality of multi-layer metal top acoustic reflector electrodes.

In the plurality of multi-layer top reflector electrodes, the respective first members 537C, 537D, 537E having the relatively lower acoustic impedance may be arranged sufficiently proximate to the respective first layer of piezoelectric material (e.g. may be arranged sufficiently proximate to the respective top piezoelectric layers 511C, 511D, 511E of the BAW resonators, e.g., may be arranged sufficiently proximate to respective piezoelectric stacks of the BAW resonators), so that the respective first members having the relatively lower acoustic impedance may contribute more, e.g., may contribute more to facilitate suppressing parasitic lateral resonances in operation of the respective BAW resonators than is contributed by any other top metal electrode layer of the plurality of multi-layer metal top acoustic reflector electrodes.

Figure 6A:
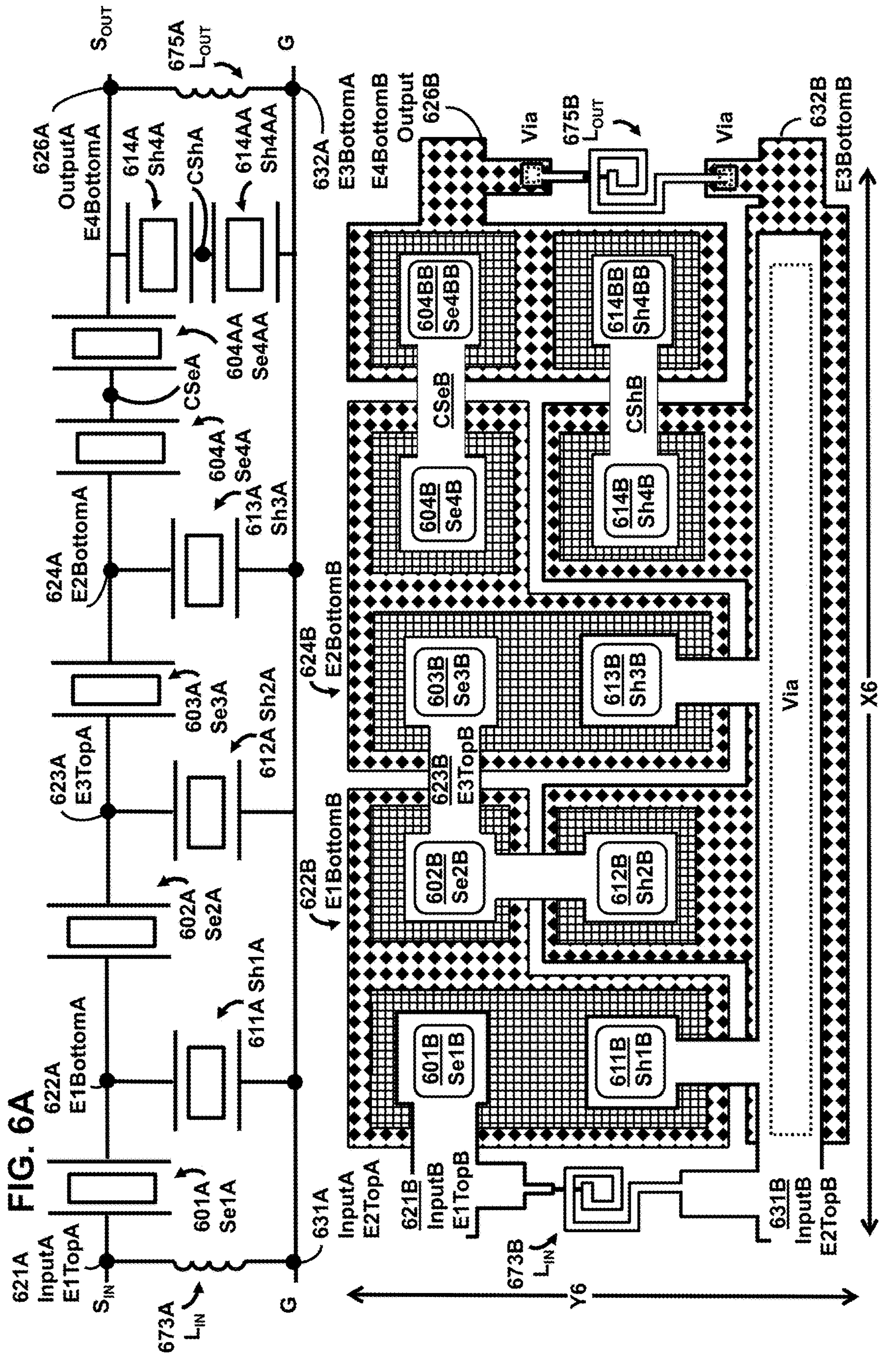
FIG. 6A shows a schematic of an example ladder filter using five series resonators of the bulk acoustic wave resonator structure of FIG. 1A, and five mass loaded shunt resonators of the bulk acoustic wave resonator structure of FIG. 1A, along with a simplified top view of the ten resonators interconnected in the example ladder filter, along with input and output coupled integrated inductors, and lateral dimensions of the example ladder filter.

FIG. 6A shows a schematic of an example ladder filter 600A (e.g., SHF or EHF wave ladder filter 600A) using five series resonators of the bulk acoustic wave resonator structure of FIG. 1A (e.g., five bulk acoustic SHF or EHF wave resonators), and five mass loaded shunt resonators of the bulk acoustic wave resonator structure of FIG. 1A (e.g., five mass loaded bulk acoustic SHF or EHF wave resonators), including schematic representations of input coupled integrated inductor 673A and output coupled integrated inductor 675A. Corresponding to the example ladder filter 600A shown in schematic view, FIG. 6B also shows a simplified top view of the ten resonators interconnected in the example ladder filter 600B, along with input and output coupled integrated inductors 673B, 673B, and lateral dimensions of the example ladder filter 600B.

As shown in the schematic appearing at an upper section of FIG. 6A, the example ladder filter 600A may include an input port comprising a first node 621A (InputA E1TopA), and may include a first series resonator 601A (Se1A) (e.g., first bulk acoustic SHF or EHF wave resonator 601A) coupled between the first node 621A (InputA E1TopA) associated with the input port and a second node 622A (E1BottomA). Input coupled integrated inductor 673A may be coupled between first node 621A (InputA E1TopA) and a first input grounding node 631A (E2TopA).

The example ladder filter 600A may also include a second series resonator 602A (Se2A) (e.g., second bulk acoustic SHF or EHF wave resonator 602A) coupled between the second node 622A (E1BottomA) and a third node 623A (E3TopA). The example ladder filter 600A may also include a third series resonator 603A (Se3A) (e.g., third bulk acoustic SHF or EHF wave resonator 603A) coupled between the third node 623A (E3TopA) and a fourth node 624A (E2BottomA). The example ladder filter 600A may also include a fourth and fifth cascade node coupled series resonators 604A (Se4A), 604AA (Se4AA) (e.g., fourth and fifth cascade node coupled bulk acoustic SHF or EHF wave resonators 604A, 604AA) coupled between the fourth node 624A (E2BottomA) and a sixth node 626A (OutputA E4BottomA). Fourth and fifth cascade node coupled series resonators 604A (Se4A), 604AA (Se4AA) (e.g., fourth and fifth cascade node coupled bulk acoustic SHF or EHF wave resonators 604A, 604AA) may be coupled to one another at cascade series branch node CSeA.

The example ladder filter 600A may also comprise the sixth node 626A (OutputA E4BottomA) and may further comprise a second grounding node 632A (E3BottomA), which may be associated with an output port of the ladder filter 600A. Output coupled integrated inductor 675A may be coupled between the sixth node 626A (OutputA E4BottomA) and the second grounding node 632A (E3BottomA).

The example ladder filter 600A may also include a first mass loaded shunt resonator 611A (Sh1A) (e.g., first mass loaded bulk acoustic SHF or EHF wave resonator 611A) coupled between the second node 622A (E1BottomA) and first grounding node 631A (E2TopA). The example ladder filter 600A may also include a second mass loaded shunt resonator 612A (Sh2A) (e.g., second mass loaded bulk acoustic SHF or EHF wave resonator 612A) coupled between the third node 623A (E3TopA) and second grounding node (E3BottomA). The example ladder filter 600A may also include a third mass loaded shunt resonator 613A (Sh3A) (e.g., third mass loaded bulk acoustic SHF or EHF wave resonator 613A) coupled between the fourth node 624A (E2BottomA) and the first grounding node 631A (E2TopA). The example ladder filter 600A may also include fourth and fifth cascade node coupled mass loaded shunt resonators 614A (Sh4A), 614A (Sh4A) (e.g., fourth and fifth mass loaded bulk acoustic SHF or EHF wave resonators 614A, 614AA) coupled between the sixth node 626A (OutputA E4BottomA) and the second grounding node 632A (E3BottomA). Fourth and fifth cascade node coupled mass loaded shunt resonators 614A (Sh4A), 614A (Sh4A) (e.g., fourth and fifth mass loaded bulk acoustic SHF or EHF wave resonators 614A, 614AA) may be coupled to one another at cascade shunt branch node CShA. The first grounding node 631A (E2TopA) and the second grounding node 632A (E3BottomA) may be interconnected to each other.

Appearing at a lower section of FIG. 6A is the simplified top view of the ten resonators interconnected in the example ladder filter 600B, and lateral dimensions of the example ladder filter 600B. The example ladder filter 600B may include an input port comprising a first node 621B (InputA E1TopB), and may include a first series resonator 601B (Se1B) (e.g., first bulk acoustic SHF or EHF wave resonator 601B) coupled between (e.g., sandwiched between) the first node 621B (InputA E1TopB) associated with the input port and a second node 622B (E1BottomB). Input integrated inductor 673G may be coupled between the first node 621B (InputA E1TopB) associated with the input port and first input grounding node 631B (E2TopB) associated with the input port.

The example ladder filter 600B may also include a second series resonator 602B (Se2B) (e.g., second bulk acoustic SHF or EHF wave resonator 602B) coupled between (e.g., sandwiched between) the second node 622B (E1BottomB) and a third node 623B (E3TopB). The example ladder filter 600B may also include a third series resonator 603B (Se3B) (e.g., third bulk acoustic SHF or EHF wave resonator 603B) coupled between (e.g., sandwiched between) the third node 623B (E3TopB) and a fourth node 624B (E2BottomB). The example ladder filter 600B may also include fourth and fifth cascade node coupled series resonators 604B (Se4B), 604BB (Se4BB) (e.g., fourth and fifth bulk acoustic SHF or EHF wave resonators 604B, 604BB) coupled between (e.g., sandwiched between) the fourth node 624B (E2BottomB) and a sixth node 626A (OutputB E4BottomB). Fourth and fifth cascade node coupled series resonators 604B (Se4B), 604BB (Se4BB) (e.g., fourth and fifth bulk acoustic SHF or EHF wave resonators 604B, 604BB) may be coupled to one another by cascade series branch node CSeB. The example ladder filter 600B may comprise the sixth node 626B (OutputB E4BottomB) and may further comprise a second grounding node 632B (E3BottomB), which may be associated with an output port of the ladder filter 600B. Output coupled integrated inductor 675B may be coupled between the sixth node 626B (OutputB E4BottomB) and the second grounding node 632B (E3BottomB).

The example ladder filter 600B may also include a first mass loaded shunt resonator 611B (Sh1B) (e.g., first mass loaded bulk acoustic SHF or EHF wave resonator 611B) coupled between (e.g., sandwiched between) the second node 622B (E1BottomB) and a first grounding node 631B (E2TopB). The example ladder filter 600B may also include a second mass loaded shunt resonator 612B (Sh2B) (e.g., second mass loaded bulk acoustic SHF or EHF wave resonator 612B) coupled between (e.g., sandwiched between) the third node 623B (E3TopB) and first grounding node 631B (E2TopB). First grounding node 631B (E2TopB) and the second grounding node 632B (E3BottomB) may be electrically coupled to one another through a via. The example ladder filter 600B may also include a third mass loaded shunt resonator 613B (Sh3B) (e.g., third mass loaded bulk acoustic SHF or EHF wave resonator 613B) coupled between (e.g., sandwiched between) the fourth node 624B (E2BottomB) and the second grounding node 632B (E3BottomB). The example ladder filter 600B may also include fourth and fifth cascade node coupled mass loaded shunt resonators 614B (Sh4B), 614BB (Sh4BB) (e.g., fourth and fifth mass loaded bulk acoustic SHF or EHF wave resonators 614B, 614BB) coupled between (e.g., sandwiched between) the sixth node 626B (OutputB E4BottomB) and the second grounding node 623B (E3BottomB). Fourth and fifth cascade node coupled mass loaded shunt resonators 614B (Sh4B), 614BB (Sh4BB) (e.g., fourth and fifth mass loaded bulk acoustic SHF or EHF wave resonators 614B, 614BB) may be coupled to one another by cascade shunt branch node CShB. Output coupled integrated inductor 675B may be coupled between the sixth node 626B (OutputB E4BottomB) and the second grounding node 632B (E3BottomB). The example ladder filter 600B may respectively be relatively small in size, and may respectively have lateral dimensions (X6 by Y6) of less than approximately one millimeter by one millimeter.

For simplicity and clarity, ten resonators are shown as similarly sized in the example ladder filter 600B. However, it should be understood that despite appearances in FIG. 6A, there may be different (e.g., larger) sizing of four cascaded resonators relative to remaining six non-cascaded resonators shown in FIG. 6A. For example, the four cascaded resonators (e.g., fourth and fifth cascade node coupled series resonators 604B (Se4B), 604BB (Se4BB) (e.g., fourth and fifth bulk acoustic SHF or EHF wave resonators 604B, 604BB), e.g., fourth and fifth cascade node coupled mass loaded shunt resonators 614B (Sh4B), 614BB (Sh4BB)) may be differently sized (e.g., larger sized) than the remaining six non-cascaded resonators shown in FIG. 6A. Along with different (e.g., larger) size, the four cascaded resonators (e.g., fourth and fifth cascade node coupled series resonators 604B (Se4B), 604BB (Se4BB) (e.g., fourth and fifth bulk acoustic SHF or EHF wave resonators 604B, 604BB), e.g., fourth and fifth cascade node coupled mass loaded shunt resonators 614B (Sh4B), 614BB (Sh4BB)) may have greater power handling capability than the remaining six non-cascaded resonators shown in FIG. 6A. These and other attributes for cascaded resonators versus non-cascaded resonators, as well as additional alternative arrangements of cascaded resonators versus non-cascaded resonators are discussed in greater detail next with reference to FIG. 6B.

Figure 6B:
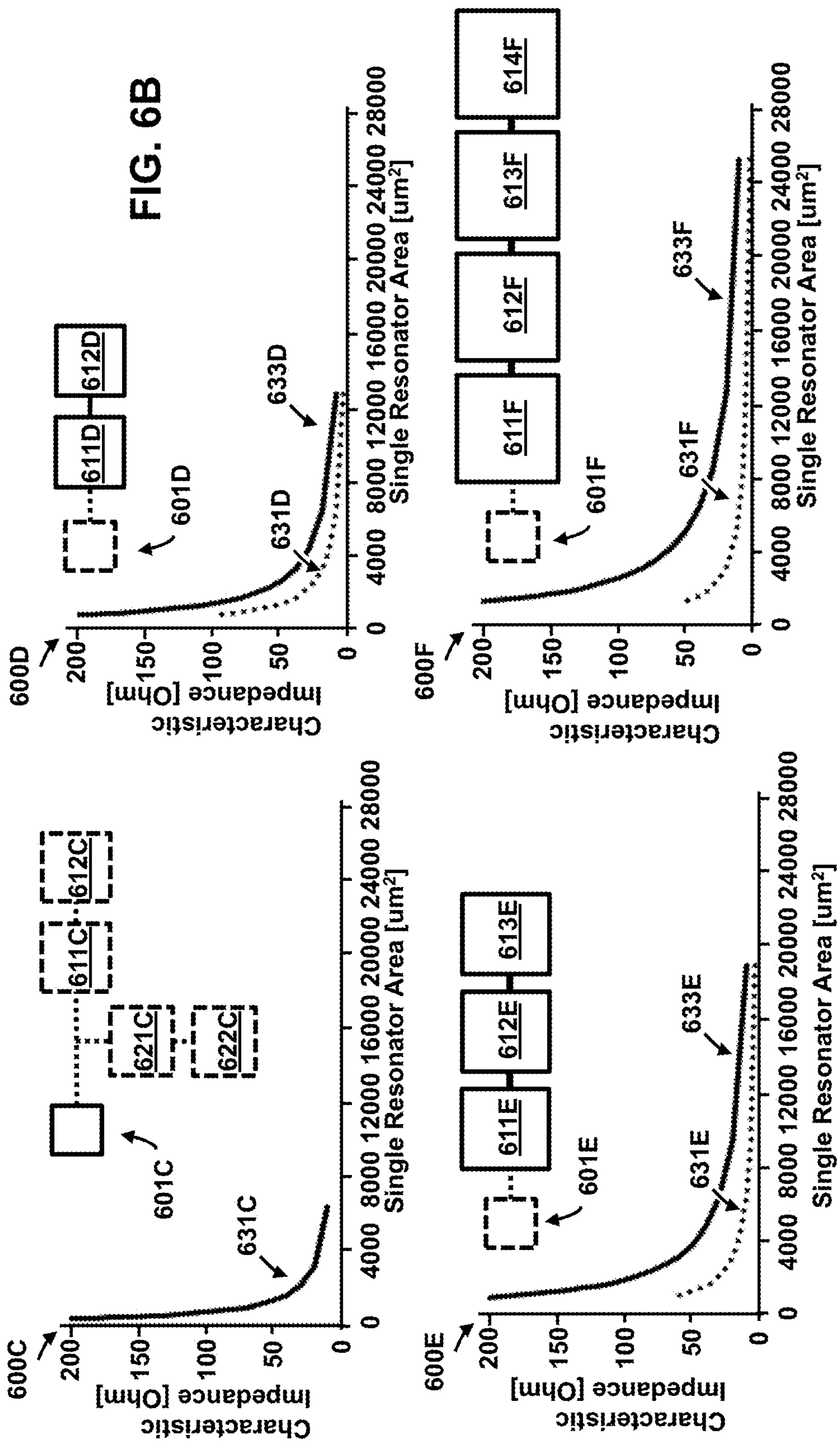
FIG. 6B shows four charts with results as expected from simulation along with corresponding simplified example cascade arrangements of resonators similar to the bulk acoustic wave resonator structure of FIG. 1A.

FIG. 6B shows four charts 600C, 600D, 600E, 600F with results as expected from simulation along with corresponding simplified example cascade arrangements of resonators similar to the bulk acoustic wave resonator structure of FIG. 1A. An upper left hand corner of FIG. 6B shows a simplified view of a non-cascaded resonator 601C in solid line depiction coupled in dotted line to dotted line depictions of a pair of series branch cascade node coupled series resonators 611C, 612C. Non-cascaded resonator 601C in solid line depiction is also coupled in dotted line to dotted line depictions of a pair of shunt branch cascade node coupled shunt resonators 621C, 622C. Lateral size (e.g., lateral area) of respective members of the pair of series branch cascade node coupled series resonators 611C, 612C is depicted as different (e.g., relatively larger, e.g., about twice as large) as non-cascaded resonator 601C. Power handing of respective members of the pair of series branch cascade node coupled series resonators 611C, 612C may be different (e.g., relatively larger, e.g., about twice as large) as power handling of non-cascaded resonator 601C. Lateral size (e.g., lateral area) of respective members of the pair of shunt branch cascade node coupled shunt resonators 621C, 622C is depicted as different (e.g., relatively larger, e.g., about twice as large) as non-cascaded resonator 601C. Power handling of respective members of the pair of shunt branch cascade node coupled shunt resonators 621C, 622C may be different (e.g., relatively larger, e.g., about twice as large) as power handling of non-cascaded resonator 601C.

Electrical characteristic impedance of respective members of the pair of series branch cascade node coupled series resonators 611C, 612C may be different (e.g., relatively smaller, e.g., about half as large) than electrical character impedance of non-cascaded resonator 601C. For example, electrical characteristic impedance of first member 611C of the pair of series branch cascade node coupled series resonators 611C, 612C may be different (e.g., relatively smaller, e.g., about half as large) than electrical character impedance of non-cascaded resonator 601C. For example, electrical characteristic impedance of second member 612C of the pair of series branch cascade node coupled series resonators 611C, 612C may be different (e.g., relatively smaller, e.g., about half as large) than electrical character impedance of non-cascaded resonator 601C. For example, in a case where electrical character impedance of non-cascaded resonator 601C may be about fifty (50) Ohms: electrical characteristic impedance of first member 611C may be about twenty-five (25) Ohms; electrical characteristic impedance of second member 612C may be about twenty-five (25) Ohms. Combined respective electrical characteristic impedance of members of the pair of series branch cascade node coupled series resonators 611C, 612C may approximate (e.g., may substantially match) electrical characteristic impedance of non-cascaded resonator 601C (e.g., 25 Ohms for 611C plus 25 Ohms for 612C may approximate 50 Ohms for 601C). Ladder filters as discussed may have a series branch characteristic impedance e.g., fifty (50) Ohms. Combined respective electrical characteristic impedance of members of the pair of series branch cascade node coupled series resonators 611C, 612C may approximate (e.g., may substantially match) the series branch characteristic impedance (e.g., 25 Ohms for 611C plus 25 Ohms for 612C may approximate 50 Ohms for series branch). More broadly, ladder filters as discussed may have a characteristic impedance e.g., fifty (50) Ohms. Combined respective electrical characteristic impedance of members of the pair of series branch cascade node coupled series resonators 611C, 612C may approximate (e.g., may substantially match) the filter characteristic impedance (e.g., 25 Ohms for 611C plus 25 Ohms for 612C may approximate 50 Ohms for filter).

Similarly, electrical characteristic impedance of respective members of the pair of shunt branch cascade node coupled shunt resonators 621C, 622C may be different (e.g., relatively smaller, e.g., about half as large) than electrical character impedance of non-cascaded resonator 601C. For example, electrical characteristic impedance of first member 621C of the pair of shunt branch cascade node coupled shunt resonators 621C, 622C may be different (e.g., relatively smaller, e.g., about half as large) than electrical character impedance of non-cascaded resonator 601C. For example, electrical characteristic impedance of second member 622C of the pair of shunt branch cascade node coupled shunt resonators 621C, 622C may be different (e.g., relatively smaller, e.g., about half as large) than electrical character impedance of non-cascaded resonator 601C. For example, in a case where electrical character impedance of non-cascaded resonator 601C may be about fifty (50) Ohms: electrical characteristic impedance of first member 621C may be about twenty-five (25) Ohms; electrical characteristic impedance of second member 622C may be about twenty-five (25) Ohms. Combined respective electrical characteristic impedance of members of the pair of shunt branch cascade node coupled shunt resonators 621C, 622C may approximate (e.g., may substantially match) electrical characteristic impedance of non-cascaded resonator 601C (e.g., 25 Ohms for 621C plus 25 Ohms for 622C may approximate 50 Ohms for 601C). Ladder filters as discussed may have a shunt branch characteristic impedance e.g., fifty (50) Ohms. Combined respective electrical characteristic impedance of members of the pair of shunt branch cascade node coupled shunt resonators 621C, 622C may approximate (e.g., may substantially match) the shunt branch characteristic impedance (e.g., 25 Ohms for 621C plus 25 Ohms for 622C may approximate 50 Ohms for shunt branch). More broadly, ladder filters as discussed may have a characteristic impedance e.g., fifty (50) Ohms. Combined respective electrical characteristic impedance of members of the pair of shunt branch cascade node coupled shunt resonators 621C, 622C may approximate (e.g., may substantially match) the filter characteristic impedance (e.g., 25 Ohms for 621C plus 25 Ohms for 622C may approximate 50 Ohms for filter).

In the upper left hand corner of FIG. 6B, corresponding chart 600C shows electrical characteristic impedance of non-cascaded resonator 601C versus single resonator area of non-cascaded resonator 601C. Trace 631C shows electrical characteristic impedance of non-cascaded resonator 601C decreasing and ranging from less than about 200 Ohms to greater than about ten Ohms as single resonator area of non-cascaded resonator 601C increases and ranges from greater than three hundred square microns to less than about six thousand square microns. Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

An upper right hand corner of FIG. 6B shows a simplified view of a non-cascaded resonator 601D in dotted line depiction coupled in dotted line to solid line depictions of a pair of series branch cascade node coupled series resonators 611D, 612D. Lateral size (e.g., lateral area) of respective members of the pair of series branch cascade node coupled series resonators 611D, 612D is depicted as different (e.g., relatively larger, e.g., about one and four tenths times as large) as non-cascaded resonator 601D. Power handing of respective members of the pair of series branch cascade node coupled series resonators 611C, 612C may be different (e.g., relatively larger, e.g., about twice as large) as power handling of non-cascaded resonator 601C.

In the upper right hand corner of FIG. 6B, corresponding chart 600D shows in dotted line trace 631D the electrical characteristic impedance of single cascaded resonator in cascaded pair 611D and 612D versus single resonator area of in cascaded resonator pair 611D and 612D. Trace 631D shows electrical characteristic impedance of a single resonator in cascaded resonator pair 611D and 612D decreasing and ranging from less than about 100 Ohms to greater than about 5 Ohms as single resonator area in cascaded resonator pair 611D and 612D increases and ranges from greater than 600 of square microns to less than about 12000 thousand square microns. In the upper right hand corner of FIG. 6B, corresponding chart 600D also shows in solid line trace 633D the electrical characteristic impedance of cascaded resonator pair 611D and 612D versus single resonator area in cascaded resonator pair 611D and 612D. Trace 633D shows electrical characteristic impedance of cascaded resonator 611D decreasing and ranging from less than about 200 Ohms to greater than about a 10 Ohms as single resonator area in cascaded resonator pair 611D and 612D increases and ranges from greater than 600 of square microns to less than about 12000 thousand square microns. For example, non-cascaded resonator 601D may have an electrical characteristic impedance of about fifty (50) Ohms and a lateral area of about 1260 square microns. For example, cascaded resonator 611D may have an electrical characteristic impedance of about twenty-five (25) Ohms and a lateral area of about 2520 square microns. Similarly cascaded resonator 612D may have an electrical characteristic impedance of about twenty-five (25) Ohms and a lateral area of about 2520 square microns. Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

The lower left hand corner of FIG. 6B shows a simplified view of a non-cascaded resonator 601E in dotted line depiction coupled in dotted line to solid line depictions of a trio of series branch cascade nodes coupled series resonators 611E, 612E, 613E. Lateral size (e.g., lateral area) of respective members of the trio of series branch cascade nodes coupled series resonators 611E, 612E, 613E is depicted as different (e.g., relatively larger, e.g., about one and seven tenths times as large) as non-cascaded resonator 601E. Power handing of respective members of the trio of series branch cascade nodes coupled series resonators 611E, 612E, 613E may be different (e.g., relatively larger, e.g., about three times as large) as power handling of non-cascaded resonator 601E. Electrical characteristic impedance of respective members of the trio of series branch cascade nodes coupled series resonators 611E, 612E, 613E may be different (e.g., relatively smaller, e.g., three times small) than electrical character impedance of non-cascaded resonator 601E. For example, electrical characteristic impedance of first member 611E of the trio of series branch cascade nodes coupled series resonators 611E, 612E, 613E may be different (e.g., relatively smaller, e.g., about three times smaller) than electrical character impedance of non-cascaded resonator 601E. For example, electrical characteristic impedance of second member 612E of the trio of series branch cascade nodes coupled series resonators 611E, 612E, 613E may be different (e.g., relatively smaller, e.g., about three times smaller) than electrical character impedance of non-cascaded resonator 601E. For example, electrical characteristic impedance of third member 613E of the trio of series branch cascade nodes coupled series resonators 611E, 612E, 613E may be different (e.g., relatively smaller, e.g., about a three time smaller) than electrical character impedance of non-cascaded resonator 601E. For example, in a case where electrical character impedance of non-cascaded resonator 601E may be about fifty (50) Ohms: electrical characteristic impedance of first member 611E may be about sixteen and two thirds (16.6) Ohms; electrical characteristic impedance of second member 612E may be about sixteen and two thirds (16.6) Ohms; electrical characteristic impedance of third member 613E may be about sixteen and two thirds (16.6) Ohms. Combined respective electrical characteristic impedance of members of the trio of series branch cascade nodes coupled series resonators 611E, 612E, 613E may approximate (e.g., may substantially match) electrical characteristic impedance of non-cascaded resonator 601E (e.g., 16.6 Ohms for 611E plus 16.6 Ohms for 612E plus 16.6 Ohms for 613E may approximate 50 Ohms for 601E). Ladder filters as discussed may have a series branch characteristic impedance e.g., fifty (50) Ohms. Combined respective electrical characteristic impedance of members of the trio of series branch cascade nodes coupled series resonators 611E, 612E, 613E may approximate (e.g., may substantially match) the series branch characteristic impedance (e.g., 16.6 Ohms for 611E plus 16.6 Ohms for 612E plus 16.6 Ohms for 613E may approximate 50 Ohms for series branch). More broadly, ladder filters as discussed may have a characteristic impedance e.g., fifty (50) Ohms. Combined respective electrical characteristic impedance of members of the trio of series branch cascade nodes coupled series resonators 611E, 612E, 613E may approximate (e.g., may substantially match) the filter characteristic impedance (e.g., 16.6 Ohms for 611E plus 16.6 Ohms for 612E plus 16.6 Ohms for 613E may approximate 50 Ohms for filter). Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

In the lower left hand corner of FIG. 6B, corresponding chart 600E shows in dotted line trace 631E the electrical characteristic impedance of a single cascaded resonator in a resonator trio 611E, 612E and 613E versus single resonator area in a cascaded resonator trio 611E, 612E and 613E. Trace 631E shows electrical characteristic impedance of a single cascaded resonator in a resonator trio 611E, 612E and 613E decreasing and ranging from less than about 67 Ohms to greater than about 3 Ohms as single resonator area of a single cascaded resonator in a resonator trio 611E, 612E and 613E increases and ranges from greater than 940 of square microns to less than about 19000 square microns. In the lower left hand corner of FIG. 6B, corresponding chart 600E also shows in solid line trace 633E the electrical characteristic impedance of cascaded resonator trio 611E, 612E and 613 versus a single cascaded resonator area in a resonator trio 611E, 612E and 613E. Trace 633E shows electrical characteristic impedance of cascaded resonator trio 611E, 612E and 613 decreasing and ranging from less than about 200 Ohms to greater than about a 10 Ohms as single resonator area of cascaded resonator 611E increases and ranges from greater than 940 square microns to less than about 19000 thousand square microns. For example, non-cascaded resonator 601E may have an electrical characteristic impedance of about fifty (50) Ohms and a lateral area of about 1260 square microns. For example, cascaded resonator 611E may have an electrical characteristic impedance of about sixteen and two thirds (16.6) Ohms and a lateral area of about 3780 square microns. Similarly cascaded resonator 612E may have an electrical characteristic impedance of about sixteen and two thirds (16.6) Ohms and a lateral area of about 3780 square microns. Similarly cascaded resonator 613E may have an electrical characteristic impedance of about sixteen and two thirds (16.6) Ohms and a lateral area of about 3780 square microns The lower right hand corner of FIG. 6B shows a simplified view of a non-cascaded resonator 601F in dotted line depiction coupled in dotted line to solid line depictions of a quad of series branch cascade nodes coupled series resonators 611F, 612F, 613F, 614F. Lateral size (e.g., lateral area) of respective members of the quad of series branch cascade nodes coupled series resonators 611F, 612F, 613F, 614F is depicted as different (e.g., relatively larger, e.g., about twice as large) as non-cascaded resonator 601E. Power handing of respective members of the quad of series branch cascade nodes coupled series resonators 611F, 612F, 613F, 614F may be different (e.g., relatively larger, e.g., about four times as large) as power handling of non-cascaded resonator 601F.

Electrical characteristic impedance of respective members of the quad of series branch cascade nodes coupled series resonators 611F, 612F, 613F, 614F may be different (e.g., relatively smaller, e.g., about four times smaller) than electrical character impedance of non-cascaded resonator 601F. For example, electrical characteristic impedance of first member 611E of the quad of series branch cascade nodes coupled series resonators 611F, 612F, 613F, 614F may be different (e.g., relatively smaller, e.g., about a four times smaller) than electrical character impedance of non-cascaded resonator 601F. For example, electrical characteristic impedance of second member 612F of the quad of series branch cascade nodes coupled series resonators 611F, 612F, 613F, 614F may be different (e.g., relatively smaller, e.g., about four times smaller) than electrical character impedance of non-cascaded resonator 601F. For example, electrical characteristic impedance of third member 613F of the quad of series branch cascade nodes coupled series resonators 611F, 612F, 613F, 614F may be different (e.g., relatively smaller, e.g., about four times smaller) than electrical character impedance of non-cascaded resonator 601F. For example, electrical characteristic impedance of fourth member 614F of the quad of series branch cascade nodes coupled series resonators 611F, 612F, 613F, 614F may be different (e.g., relatively smaller, e.g., about four times smaller) than electrical character impedance of non-cascaded resonator 601F. For example, in a case where electrical character impedance of non-cascaded resonator 601F may be about fifty (50) Ohms: electrical characteristic impedance of first member 611F may be about twelve and a half (12.5) Ohms; electrical characteristic impedance of second member 612F may be about twelve and a half (12.5) Ohms; electrical characteristic impedance of third member 613F may be about twelve and a half (12.5) Ohms. Combined respective electrical characteristic impedance of members of the quad of series branch cascade nodes coupled series resonators 611F, 612F, 613F, 614F may approximate (e.g., may substantially match) electrical characteristic impedance of non-cascaded resonator 601F (e.g., 12.5 Ohms for 611F plus 12.5 Ohms for 612F plus 12.5 Ohms for 613F plus 12.5 Ohms for 614F may approximate 50 Ohms for 601F). Ladder filters as discussed may have a series branch characteristic impedance e.g., fifty (50) Ohms. Combined respective electrical characteristic impedance of members of the quad of series branch cascade nodes coupled series resonators 611F, 612F, 613F, 614F may approximate (e.g., may substantially match) the series branch characteristic impedance (e.g., 12.5 Ohms for 611F plus 12.5 Ohms for 612E plus 12.5 Ohms for 613F plus 12.5 Ohms for 614F may approximate 50 Ohms for series branch). More broadly, ladder filters as discussed may have a characteristic impedance e.g., fifty (50) Ohms. Combined respective electrical characteristic impedance of members of the quad of series branch cascade nodes coupled series resonators 611F, 612F, 613F, 614F may approximate (e.g., may substantially match) the filter characteristic impedance (e.g., 12.5 Ohms for 611F plus 12.5 Ohms for 612E plus 12.5 Ohms for 613F plus 12.5 Ohms for 614F may approximate 50 Ohms for filter).

In the lower right hand corner of FIG. 6B, corresponding chart 600F shows in dotted line trace 631E the electrical characteristic impedance of a single resonator in cascaded resonator 611F, 612F, 613F and 614F quad versus single resonator area in cascaded resonator 611F, 612F, 613F and 614F quad. Trace 631F shows electrical characteristic impedance of a single resonator in cascaded resonator 611F, 612F, 613F and 614F quad decreasing and ranging from less than about 50 Ohms to greater than about a 2.5 Ohms as single resonator area in a cascaded resonator 611F, 612F, 613F and 614F quad increases and ranges from greater than 1260 square microns to less than about 25000 square microns. In the lower right hand corner of FIG. 6B, corresponding chart 600F also shows in solid line trace 633F the electrical characteristic impedance of cascaded resonator 611F, 612F, 613F and 614F quad versus single resonator area in a cascaded resonator 611F, 612F, 613F and 614F quad. Trace 633E shows electrical characteristic impedance of cascaded resonator 611F, 612F, 613F and 614F quad decreasing and ranging from less than about 200 Ohms to greater than about a 12.5 Ohms as single resonator area in a cascaded resonator 611F, 612F, 613F and 614F quad increases and ranges from greater than 1260 square microns to less than about 25000 square microns. For example, non-cascaded resonator 601F may have an electrical characteristic impedance of about fifty (50) Ohms and a lateral area of about 1260 square microns. For example, cascaded resonator 611F may have an electrical characteristic impedance of about twelve and a half (12.5) Ohms and a lateral area of about 5040 square microns. Similarly cascaded resonator 612F may have an electrical characteristic impedance of about twelve and a half (12.5) Ohms and a lateral area of about 5040 square microns. Similarly cascaded resonator 613F may have an electrical characteristic impedance of about twelve and a half (12.5) Ohms and a lateral area of about 5040 square microns. Cascaded bulk acoustic wave resonators with different than fifty (50) Ohm electrical characteristic impedances in shunt or series branches may facilitate particular acoustic filter design goals, e.g., steeper roll-off, e.g., larger out-of-band rejection. This may be facilitated with resonators having characteristic impedance substantially different than approximately fifty (50) Ohm electrical characteristic impedance. For illustrative but non-limiting purposes, the example area ranges presented corresponds to a bulk acoustic waver resonator similar to what is shown in FIG. 1A and designed to operate at about 24 GHz. However various other area ranges are possible for various alternative bulk acoustic wave resonators of this disclosure and various bulk acoustic wave resonators of this disclosure configured to operate at different frequencies than 24 GHz, as will be appreciated by one skilled in the art upon reading this disclosure.

Figure 6C:
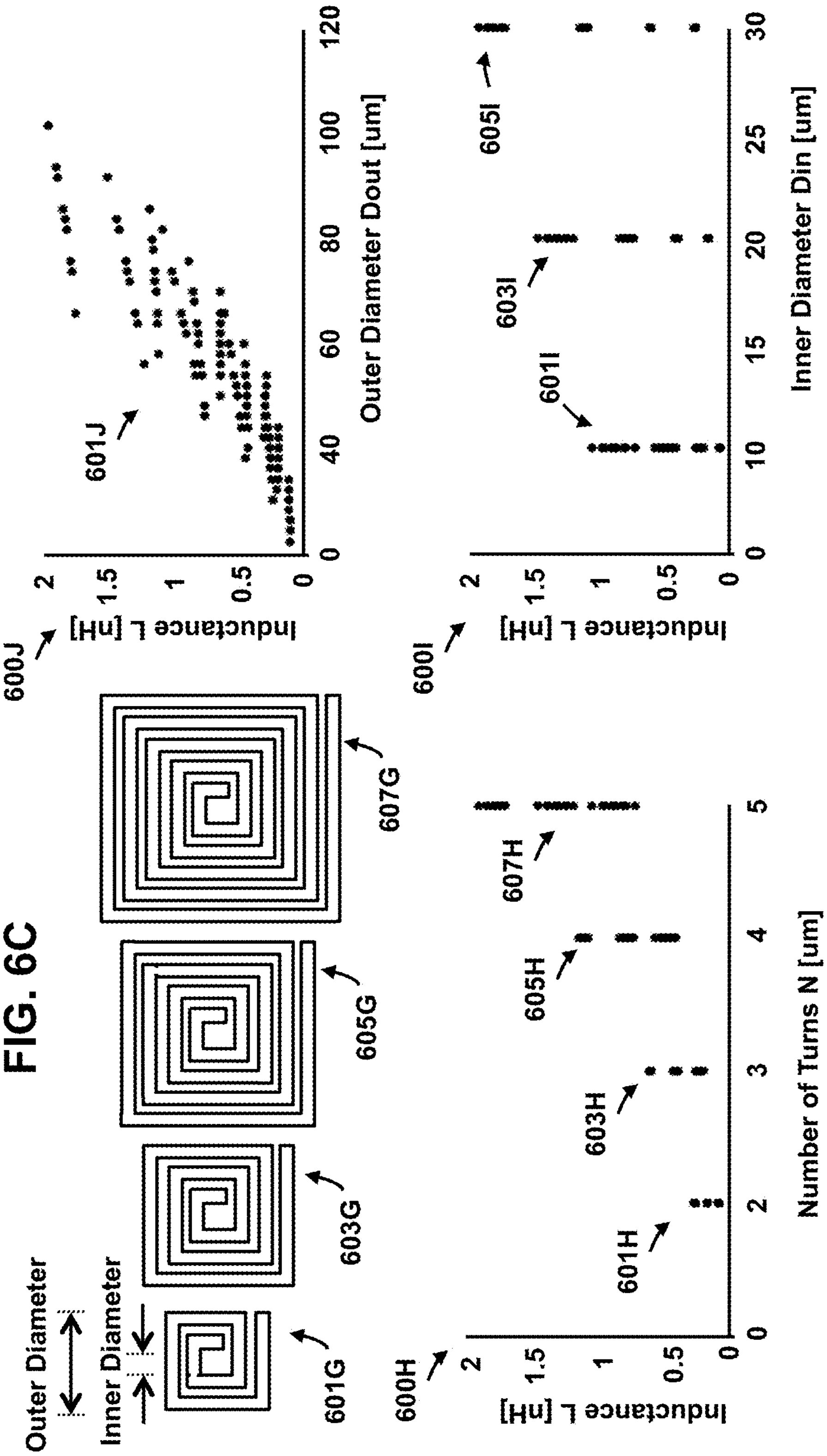
FIG. 6C shows four alternative example integrated inductors along with three corresponding inductance charts showing versus number of turns, showing versus inner diameter and showing versus outer diameter, with results as expected from simulation.

FIG. 6C shows four alternative example integrated inductors 601G, 603G, 605G, 607G along with three corresponding inductance charts showing versus number of turns (Chart 600H), showing versus inner diameter (Chart 600I) and showing versus outer diameter (Chart 600J), with results as expected from approximate simulations. Example integrated inductor 601G may comprise two turns. Example integrated inductor 603G may comprise three turns. Example integrated inductor 605G may comprise four turns. Example integrated inductor 607G may comprise five turns. Example integrated inductors 601G, 603G, 605G, 607G may be spiral. Example integrated inductors 601G, 603G, 605G, 607G may be substantially planar. Example integrated inductors 601G, 603G, 605G, 607G may have respective inner diameters. Example integrated inductors 601G, 603G, 605G, 607G may have respective outer diameters.

Chart 600H shows inductance versus number of turns. For two turns, trace 601H shows inductance increasing and ranging from greater than about 0.09 nanoHenries to less than about 0.28 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns. For three turns, trace 603H shows inductance increasing and ranging from greater than about 0.23 nanoHenries to less than about 0.62 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns. For four turns, trace 605H shows inductance increasing and ranging from greater than about 0.43 nanoHenries to less than about 1.17 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns. For five turns, trace 605H shows inductance increasing and ranging from greater than about 0.74 nanoHenries to less than about 2 nanoHenries for various metal trace separations increasing and ranging from greater than about 2 microns to less than about 4 microns, metal trace widths increasing and ranging from greater than about 2 microns to less than about 4 microns and inner diameters increasing and ranging from greater than about 10 microns to less than about 30 microns.

Chart 600I shows inductance versus inner diameter. Inner diameter may range from about ten (10) microns or greater to about thirty (30) microns or less. For inner diameter of approximately ten (10) microns, trace 601I shows inductance increasing and ranging from greater than about 0.09 nanoHenries to less than about 1.07 nanoHenries for various metal trace separations increasing and ranging from greater than about 2 microns to less than about 4 microns, metal trace widths increasing and ranging from greater than about 2 microns to less than about 4 microns and number of turns increasing and ranging from greater than 1 to less than 6. For inner diameter of approximately twenty (20) microns, trace 603I shows inductance increasing and ranging from greater than about 0.19 nanoHenries to less than about 1.5 nanoHenries for various metal trace separations increasing and ranging from greater than about 2 microns to less than about 4 microns, metal trace widths increasing and ranging from greater than about 2 microns to less than about 4 microns and number of turns increasing and ranging from greater than 1 to less than 6. For inner diameter of approximately thirty (30) microns, trace 605I shows inductance increasing and ranging from greater than about 0.28 nanoHenries to less than about 2 nanoHenries for various metal trace separations increasing and ranging from greater than about 2 microns to less than about 4 microns, metal trace widths increasing and ranging from greater than about 2 microns to less than about 4 microns and number of turns increasing and ranging from greater than 1 to less than 6.

Chart 600J shows inductance versus outer diameter. Outer diameter may range from about 22 microns or greater to about a hundred (100) microns or less, for various integrated inductor embodiments. Plot 601J shows various inductances for various integrated inductor embodiments ranging form greater than about 0.09 nanoHenries to less than about two (2) nanoHenries.

Figure 7:
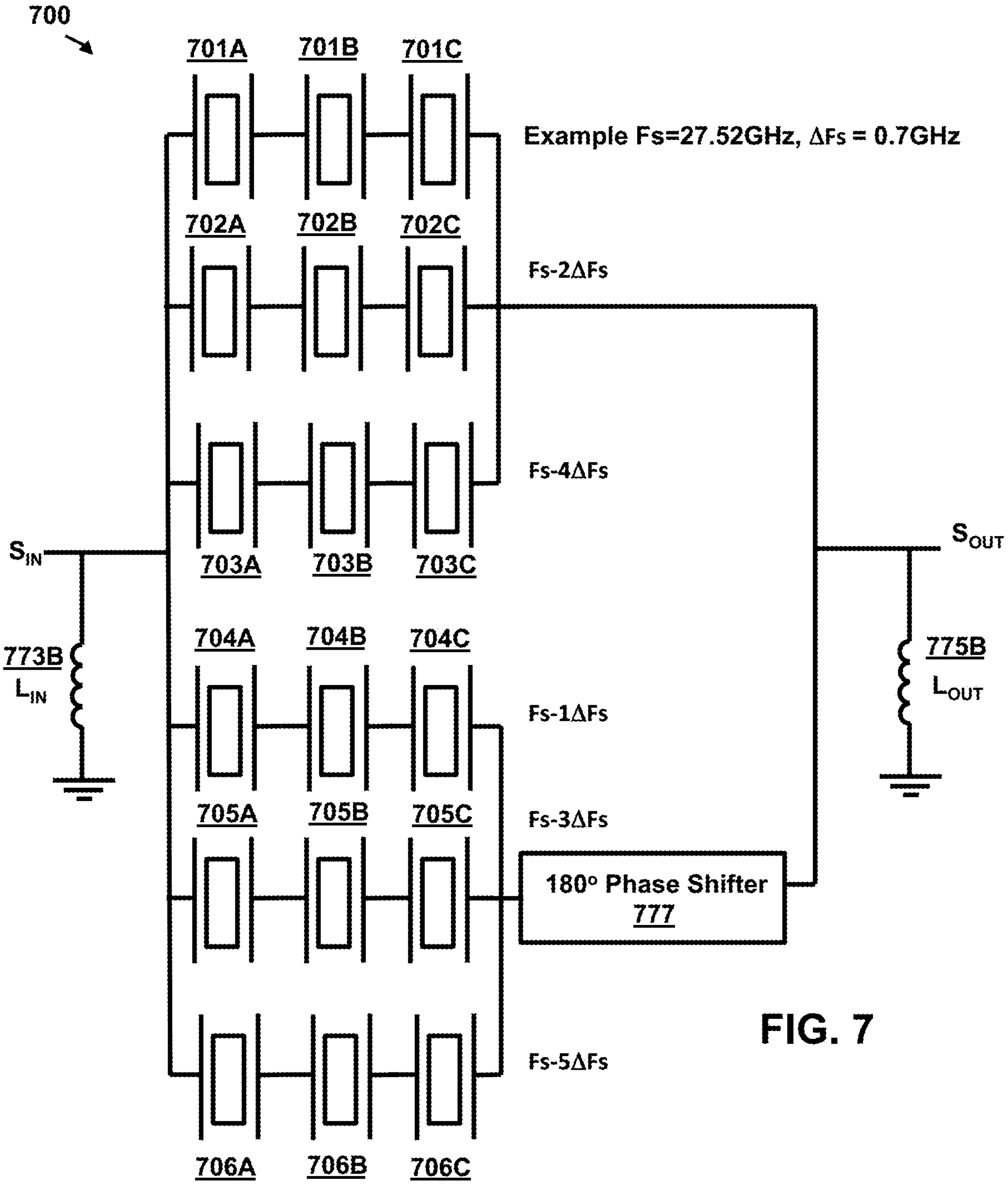
FIG. 7 shows an example millimeter acoustic wave transversal filter using bulk acoustic millimeter wave resonator structures similar to those shown in FIG. 1A.

FIG. 7 shows an example millimeter acoustic wave transversal filter 700 using bulk acoustic millimeter wave resonator structures similar to those shown in FIG. 1A. Transversal filter 700 may comprise: a first series branch of three series coupled bulk acoustic millimeter wave resonator 701A, 701B, 701C; a second series branch of three series coupled bulk acoustic millimeter wave resonator 702A, 702B, 702C; a third series branch of three series coupled bulk acoustic millimeter wave resonator 703A, 703B, 703C; a fourth series branch of three series coupled bulk acoustic millimeter wave resonator 704A, 704B, 704C; a fifth series branch of three series coupled bulk acoustic millimeter wave resonator 705A, 705B, 705C; and a sixth series branch of three series coupled bulk acoustic millimeter wave resonator 705A, 705B, 705C. The three series coupled bulk acoustic millimeter wave resonators 701A, 701B, 701C of the first series branch may have respective main series resonant frequencies (Fs) of twenty seven and fifty two hundredths GigaHertz (27.52 GHz). The three series coupled bulk acoustic millimeter wave resonators 702A, 702B, 702C of the second series branch may be mass loaded to shift respective main series resonant frequencies (Fs) down by twice of seven tenths of a GigaHertz (twice delta Fs=twice 0.7 GHz=1.4 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 703A, 703B, 703C of the third series branch may be further mass loaded to shift respective main series resonant frequencies (Fs) down by four times seven tenths of a GigaHertz (four times delta Fs=four times 0.7 GHz=2.8 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 704A, 704B, 704C of the fourth series branch may be further mass loaded to shift respective main series resonant frequencies (Fs) down by seven tenths of a GigaHertz (delta Fs=0.7 GHz=2.1 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 705A, 705B, 705C of the fifth series branch may be further mass loaded to shift respective main series resonant frequencies (Fs) down by three times seven tenths of a GigaHertz (three times delta Fs=three times 0.7 GHz=2.1 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch. The three series coupled bulk acoustic millimeter wave resonators 706A, 706B, 706C of the sixth series branch may be further mass loaded to shift respective main series resonant frequencies (Fs) down by five times seven tenths of a GigaHertz (five times delta Fs=five times 0.7 GHz=3.5 GHz) from the respective main series resonant frequencies (Fs) of twenty seven and fifty two hundredths GigaHertz (27.52 GHz) of the three series coupled bulk acoustic millimeter wave resonators 701A, 701B, 701C of the first series branch.

An input signal Sin may be coupled to a common input node of the first, second, third, fourth, fifth and sixth series branches of transversal filter 700. An input inductor 773B (e.g., input integrated inductor 773B, e.g., fifteen hundredths (0.15) NanoHenry inductor) may be coupled between ground and the common input node of the first, second, third, fourth, fifth and sixth series branches of transversal filter 700. A first common output node of the first, second, and third series branches of transversal filter 700 may be coupled to a summing output node to provide an output signal Sout of transversal filter 700. A one hundred and eighty (180) degree phase shifter 777 may be coupled between a second common output node of the first, second, and third series branches of transversal filter 700 and the summing output node to provide the output signal Sout of transversal filter 700. An output inductor 775B (e.g., output integrated inductor 775B, e.g., fifteen hundredths (0.15) NanoHenry inductor) may be coupled between ground and the summing output node to provide the output signal Sout of transversal filter 700.

In the example transversal filter 700, the eighteen bulk acoustic millimeter wave resonators 701A, 701B, 701C, 702A, 702B, 702C, 703A, 703B, 703C, 704A, 704B, 704C, 705A, 705B, 705C, 706A, 706B, 706C may have respective electrical characteristic impedances of about fifty (50) Ohms. The first, second, third, fourth, fifth and sixth series branches may have respective electrical characteristic impedances of about one hundred and fifty (150) Ohms. Parallel electrical characteristic impedance of a first parallel grouping of first, second, and third series branches may be about fifty (50) Ohms. Parallel electrical characteristic impedance of a second parallel grouping of fourth, fifth and sixth series branches may be about fifty (50) Ohms. The eighteen bulk acoustic millimeter wave resonators 701A, 701B, 701C, 702A, 702B, 702C, 703A, 703B, 703C, 704A, 704B, 704C, 705A, 705B, 705C, 706A, 706B, 706C may have respective electromechanical coupling coefficient (Kt2) of about six and a half percent (6.5%). Various other frequency and electrical characteristic impedance arrangements of eighteen bulk acoustic millimeter wave resonators 701A, 701B, 701C, 702A, 702B, 702C, 703A, 703B, 703C, 704A, 704B, 704C, 705A, 705B, 705C, 706A, 706B, 706C may be possible to achieve specific filter performance goals, as would be appreciated by one with skill in the art upon reading this disclosure. Moreover, fewer than six branches (e.g., four branches, e.g., two branches) or more than 6 branches (e.g., 8 branches, e.g., 10 branches, etc). may be used. In addition, fewer or more than 3 resonators per branch may be used to achieve specific filter performance goals.

Figure 8:
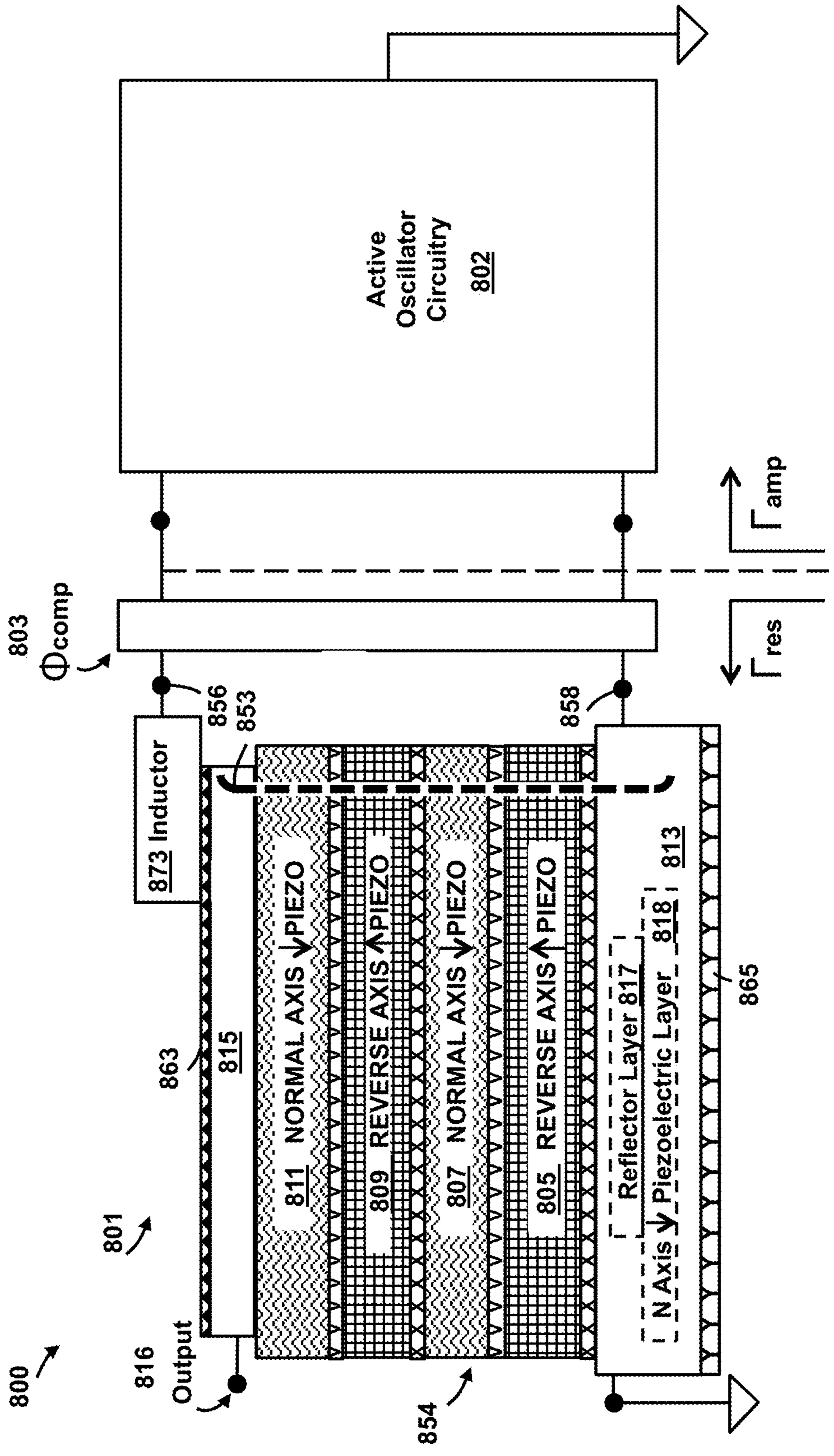
FIG. 8 shows an example oscillator using bulk acoustic wave resonator similar to the bulk acoustic wave resonator structure of FIG. 1A.

FIG. 8 shows an example oscillator 800 (e.g., millimeter wave oscillator 800, e.g., Super High Frequency (SHF) wave oscillator 800, e.g., Extremely High Frequency (EHF) wave oscillator 800) using bulk acoustic wave resonator similar to the bulk acoustic wave resonator structure of FIG. 1A. For example, FIG. 8 shows a simplified view of bulk acoustic wave resonator 801 electrically coupled via coupling nodes 856, 858 with electrical oscillator circuitry (e.g., active oscillator circuitry 802) through phase compensation circuitry 803 (Φcomp). An integrated inductor 873 may be coupled between coupling node 856 and a top current spreading layer 863 of bulk acoustic wave resonator 801. The example oscillator 800 may be a negative resistance oscillator, e.g., in accordance with a one-port model as shown in FIG. 8. The electrical oscillator circuitry, e.g., active oscillator circuitry may include one or more suitable active devices (e.g., one or more suitably configured amplifying transistors) to generate a negative resistance commensurate with resistance of the bulk acoustic wave resonator 801. In other words, energy lost in bulk acoustic wave resonator 801 may be replenished by the active oscillator circuitry, thus allowing steady oscillation, e.g., steady SHF or EHF wave oscillation. To ensure oscillation start-up, active gain (e.g., negative resistance) of active oscillator circuitry 802 may be greater than one. As illustrated on opposing sides of a notional dashed line in FIG. 8, the active oscillator circuitry 802 may have a complex reflection coefficient of the active oscillator circuitry (Γamp), and the bulk acoustic wave resonator 801 together with the phase compensation circuitry 803 (Φcomp) may have a complex reflection coefficient (Γres). To provide for the steady oscillation, e.g., steady SHF or EHF wave oscillation, a magnitude may be greater than one for |Γamp Γres|, e.g., magnitude of a product of the complex reflection coefficient of the active oscillator circuitry (Γamp) and the complex reflection coefficient (Γres) of the resonator to bulk acoustic wave resonator 801 together with the phase compensation circuitry 803 (Φcomp) may be greater than one. Further, to provide for the steady oscillation, e.g., steady SHF or EHF wave oscillation, phase angle may be an integer multiple of three-hundred-sixty degrees for ∠Γamp Γres, e.g., a phase angle of the product of the complex reflection coefficient of the active oscillator circuitry (Γamp) and the complex reflection coefficient (Γres) of the resonator to bulk acoustic wave resonator 801 together with the phase compensation circuitry 803 (Φcomp) may be an integer multiple of three-hundred-sixty degrees. The foregoing may be facilitated by phase selection, e.g., electrical length selection, of the phase compensation circuitry 803 (Φcomp).

In the simplified view of FIG. 8, the bulk acoustic wave resonator 801 (e.g., bulk acoustic SHF or EHF wave resonator) includes first reverse axis piezoelectric layer 805, first normal axis piezoelectric layer 807, and another reverse axis piezoelectric layer 809, and another normal axis piezoelectric layer 811 arranged in a four piezoelectric layer alternating axis stack arrangement sandwiched between top multi-layer metal distributed Bragg acoustic reflector electrode 815 and bottom multi-layer metal distributed Bragg acoustic reflector electrode 813.

Top multi-layer metal distributed Bragg acoustic reflector electrode 815, may include the top current spreading layer 863. Bottom multi-layer metal distributed Bragg acoustic reflector electrode 813 may include a bottom current spreading layer 865. General structures and applicable teaching of this disclosure for the top multi-layer metal distributed Bragg acoustic reflector electrode 815 and bottom multi-layer metal distributed Bragg acoustic reflector electrode 813, as well as bottom current spreading layer 865 and top current spreading layer 863, have already been discussed in detail previously herein, for example, with respect to FIGS. 1A and 4A through 4G. For example, in accordance such prior discussions: bottom multi-layer metal distributed Bragg acoustic reflector electrode 813 may comprise bottom reflector layer 817 (e.g., initial bottom reflector layer 817, e.g., bottom metal acoustic reflector electrode layer 817, e.g., bottom high acoustic impedance metal electrode layer 817, e.g., bottom Tungsten (W) electrode layer 817); and bottom multi-layer metal distributed Bragg acoustic reflector electrode 813 may comprise active piezoelectric layer 1018F (e.g., having quarter wavelength thickness, e.g., having a normal piezoelectric axis orientation opposing reverse piezoelectric orientation of adjacent bottom half acoustic wavelength thick bottom piezoelectric layer 805). For brevity and clarity, these discussions are referenced and incorporated, rather than explicitly repeated fully here.

As already discussed, top multi-layer metal distributed Bragg acoustic reflector electrode 815 and bottom multi-layer metal distributed Bragg acoustic reflector electrode 813 may comprise respective pairs of metal electrode layers, in which a first member of the pair has a relatively low acoustic impedance (relative to acoustic impedance of an other member of the pair), in which the other member of the pair has a relatively high acoustic impedance (relative to acoustic impedance of the first member of the pair), and in which the respective pairs of metal electrode layers have layer thicknesses corresponding to approximately one quarter wavelength (e.g., approximately one quarter acoustic wavelength) at a main resonant frequency of the resonator.

Top metal electrode layers top multi-layer metal distributed Bragg acoustic reflector electrode 815 may be electrically and acoustically coupled with the four piezoelectric layer alternating axis stack arrangement (e.g., with the first reverse axis piezoelectric layer 805, e.g., with first normal axis piezoelectric layer 807, e.g., with another reverse axis piezoelectric layer 809, e.g., with another normal axis piezoelectric layer 811) to excite the piezoelectrically excitable resonance mode at the main resonant frequency. These four piezoelectric layers may have respective half acoustic wavelength thicknesses. For example, top multi-layer metal distributed Bragg acoustic reflector electrode 815 may have a respective peak acoustic reflectivity in the Super High Frequency (SHF) band or the Extremely High Frequency (EHF) band that includes the respective resonant frequency of the respective BAW resonator.

Similarly, bottom active piezoelectric layer 818 and bottom metal electrode layers of the bottom multi-layer metal distributed Bragg acoustic reflector electrode 813 may be electrically and acoustically coupled with the four piezoelectric layer alternating axis stack arrangement (e.g., with the first reverse axis piezoelectric layer 805, e.g, with first normal axis piezoelectric layer 807, e.g., with another reverse axis piezoelectric layer 809, e.g., with another normal axis piezoelectric layer 811) to excite the piezoelectrically excitable resonance mode at the resonant frequency. For example, bottom multi-layer metal distributed Bragg acoustic reflector electrode 813 may have a respective peak acoustic reflectivity in the Super High Frequency (SHF) band or the Extremely High Frequency (EHF) band that includes the respective resonant frequency of the respective BAW resonator.

An output 816 of the oscillator 800 may be coupled with the bulk acoustic wave resonator 801 (e.g., top multi-layer metal distributed Bragg acoustic reflector electrode 815). Interposer layers as discussed previously herein, for example, with respect to FIG. 1A are explicitly shown in the simplified view the example resonator 801 shown in FIG. 8. Such interposer layers may be included and interposed between adjacent piezoelectric layers. For example, first patterned interposer layer 859 comprising first central feature 860 may be arranged between first normal axis piezoelectric layer 805 and first reverse axis piezoelectric layer 807. For example, second patterned interposer layer 861 comprising second central feature 862 may be arranged between first reverse axis piezoelectric layer 807 and another normal axis piezoelectric layer 809. For example, a third interposer may be arranged between the another normal axis piezoelectric layer 809 and another reverse axis piezoelectric layer 807. As discussed previously herein, such interposer may be metal and/or dielectric, and may, but need not provide various benefits, as discussed previously herein. Alternatively or additionally, one or more (e.g., one or a plurality of) interposer layers may comprise metal and dielectric for respective interposer layers.

A notional heavy dashed line is used in depicting an etched edge region 853 associated with example resonator 801. The example resonator 801 may also include a laterally opposing etched edge region 854 arranged opposite from the etched edge region 853. The etched edge region 853 (and the laterally opposing etch edge region 854) may similarly extend through various members of the example resonator 801 of FIG. 8. As shown in FIG. 8, a first mesa structure corresponding to the stack of four piezoelectric material layers 805, 807, 809, 811 may extend laterally between (e.g., may be formed between) etched edge region 853 and laterally opposing etched edge region 854. A second mesa structure corresponding to bottom multi-layer metal distributed Bragg acoustic reflector electrode 813 may extend laterally between (e.g., may be formed between) etched edge region 853 and laterally opposing etched edge region 854. Third mesa structure corresponding to top multi-layer metal distributed Bragg acoustic reflector electrode 815 may extend laterally between (e.g., may be formed between) etched edge region 853 and laterally opposing etched edge region 854.

Figure 9A:
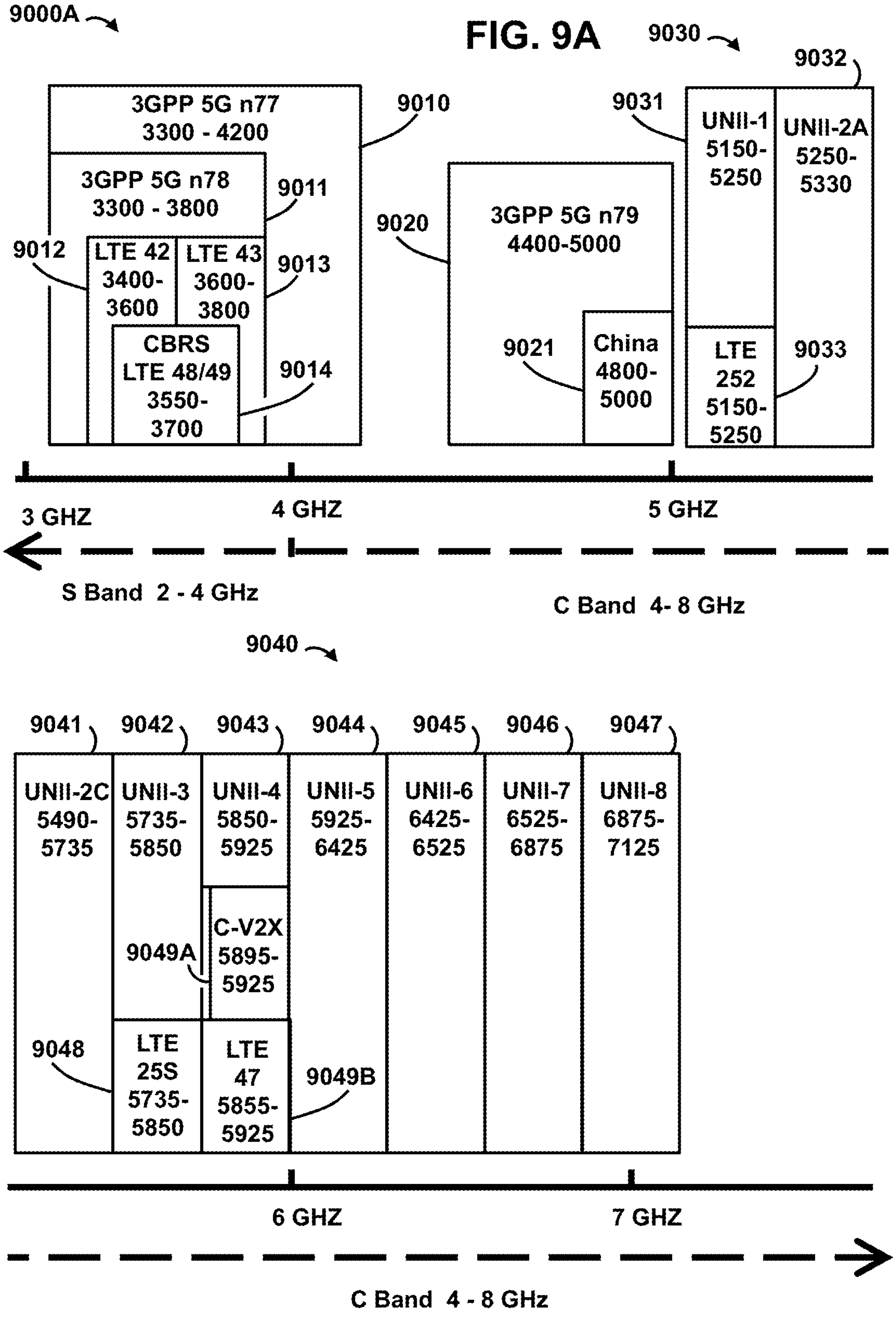
FIGS. 9A and 9B are simplified diagrams of a frequency spectrum illustrating application frequencies and application frequency bands of the example bulk acoustic wave resonators, for example, shown in FIG. 1A and FIGS. 4A through 4G, and the example filters shown in FIGS. 5 and 6A and 7, and the example oscillators shown in FIG. 8.
Figure 9B:
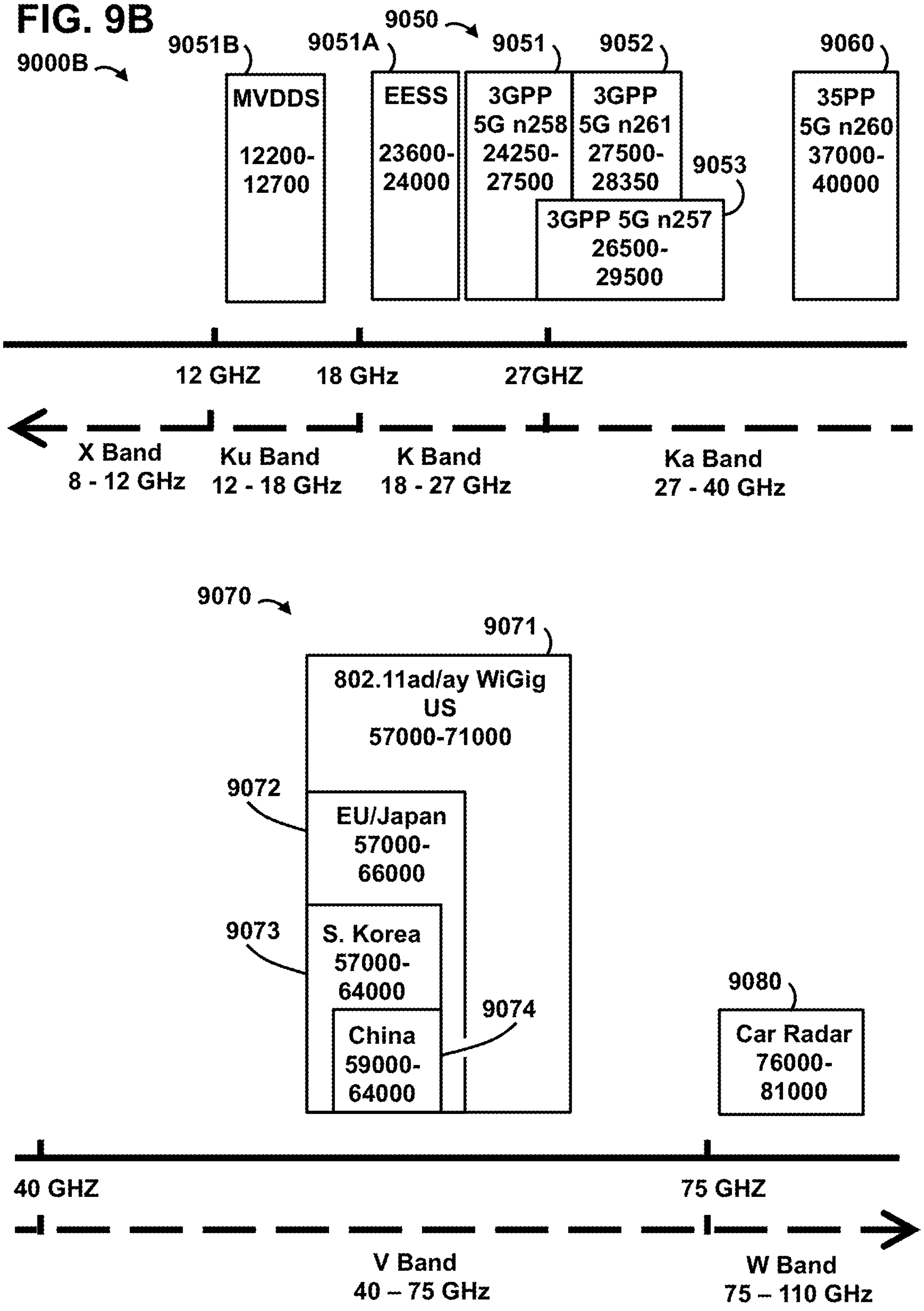

FIGS. 9A and 9B are simplified diagrams of a frequency spectrum illustrating application frequencies and application frequency bands of the example bulk acoustic wave resonators shown in FIG. 1A and FIGS. 4A through 4G, and the example filters shown in FIGS. 5 and 6A and 7A, and the example oscillator shown in FIG. 7B.

A widely used standard to designate frequency bands in the microwave range by letters is established by the United States Institute of Electrical and Electronic Engineers (IEEE). In accordance with standards published by the IEEE, as defined herein, and as shown in FIGS. 9A and 9B are application bands as follows: S Band (2 GHz-4 GHz), C Band (4 GHz-8 GHz), X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). FIG. 9A shows a first frequency spectrum portion 9000A in a range from three Gigahertz (3 GHz) to eight Gigahertz (8 GHz), including application bands of S Band (2 GHz-4 GHz) and C Band (4 GHz-8 GHz). As described subsequently herein, the 3rd Generation Partnership Project standards organization (e.g., 3GPP) has standardized various 5G frequency bands. For example, included is a first application band 9010 (e.g., 3GPP 5G n77 band) (3.3 GHz-4.2 GHz) configured for fifth generation broadband cellular network (5G) applications. As described subsequently herein, the first application band 9010 (e.g., 5G n77 band) includes a 5G sub-band 9011 (3.3 GHz-3.8 GHz). The 3GPP 5G sub-band 9011 includes Long Term Evolution broadband cellular network (LTE) application sub-bands 9012 (3.4 GHz-3.6 GHz), 9013 (3.6 GHz-3.8 GHz), and 9014 (3.55 GHz-3.7 GHz). A second application band 9020 (4.4 GHz-5.0 GHz) includes a sub-band 9021 for China specific applications. Discussed next are Unlicensed National Information Infrastructure (UNII) bands. A third application band 9030 includes a UNII-1 band 9031 (5.15 GHz-5.25 GHz) and a UNII-2A band 9032 (5.25 GHz 5.33 GHz). An LTE band 9033 (LTE Band 252) overlaps the same frequency range as the UNII-1 band 6031. A fourth application band 9040 includes a UNII-2C band 9041 (5.490 GHz-5.735 GHz), a UNII-3 band 9042 (5.735 GHz-5.85 GHz), a UNII-4 band 9043 (5.85 GHz-5.925 GHz), a UNII-5 band 9044 (5.925 GHz-6.425 GHz), a UNII-6 band 9045 (6.425 GHz-6.525 GHz), a UNII-7 band 9046 (6.525 GHz-6.875 GHz), and a UNII-8 band 9047 (6.875 GHz-7125 GHz). An LTE band 9048 overlaps the same frequency range (5.490 GHz-5.735 GHz) as the UNII-3 band 9042. A sub-band 9049A shares the same frequency range as the UNII-4 band 9043 (e.g., cellular vehicle-to-everything (c-V2X) 9049A in a thirty MegaHertz (30 MHz) band extending from 5.895 GHz to 5.925 GHz). An LTE band 9049B shares a subsection of the same frequency range (5.855 GHz-5.925 GHz).

FIG. 9B shows a second frequency spectrum portion 9000B in a range from eight Gigahertz (8 GHz) to one-hundred and ten Gigahertz (110 GHz), including application bands of X Band (8 GHz-12 GHz), Ku Band (12 GHz-18 GHz), K Band (18 GHz-27 GHz), Ka Band (27 GHz-40 GHz), V Band (40 GHz-75 GHz), and W Band (75 GHz-110 GHz). A fifth application band 9050 includes 3GPP 5G bands configured for fifth generation broadband cellular network (5G) applications, e.g., 3GPP 5G n258 band 9051 (24.25 GHz-27.5 GHz), e.g., 3GPP 5G n261 band 9052 (27.5 GHz-28.35 GHz), e.g., 3GPP 5G n257 band 9053 (26.5 GHz-29.5). FIG. 9B shows a MVDDS (Multi-channel Video Distribution and Data Service) band 9051B (12.2 GHz-12.7 GHz). FIG. 9B shows an EESS (Earth Exploration Satellite Service) band 9051A (23.6 GHz-24 GHz) adjacent to the 3GPP 5G n258 band 9051 (24.25 GHz-27.5 GHz). As will be discussed in greater detail subsequently herein, an example EESS notch filter of the present disclosure may facilitate protecting the EESS (Earth Exploration Satellite Service) band 9051A (23.6 GHz-24 GHz) from energy leakage from the adjacent 3GPP 5G n258 band 9051 (24.25 GHz-27.5 GHz). For example, this may facilitate satisfying (e.g., facilitate compliance with) a specification of a standards setting organization, e.g., International Telecommunications Union (ITU) specifications, e.g., ITU-R SM.329 Category A/B levels of −20 db W/200 MHz, e.g., 3rd Generation Partnership Project (3GPP) 5G specifications, e.g., 3GPP 5G, unwanted (out-of-band & spurious) emission levels, worst case of −20 db W/200 MHz. Alternatively or additionally, this may facilitate satisfying (e.g., facilitate compliance with) a regulatory requirement, e.g., a government regulatory requirement, e.g., a Federal Communications Commission (FCC) decision or requirement, e.g., a European Commission decision or requirement of −42 db W/200 MHz for 200 MHz for Base Stations (BS) and −38 db W/200 MHz for User Equipment (UE), e.g., European Commission Decision (EU) 2019/784 of 14 May 2019 on harmonization of the 24.25-27.5 GHz frequency band for terrestrial systems capable of providing wireless broadband electronic communications services in the Union, published May 16, 2019, which is hereby incorporated by reference in its entirety, e.g., a European Organization for the Exploitation of Meteorological Satellites (EUMETSAT) decision, requirement, recommendation or study, e.g., a ESA/EUMETSAT/EUMETNET study result of −54.2 db W/200 MHz for Base Stations (BS) and 50.4 db W/200 MHz for User Equipment (UE), e.g., the United Nations agency of the World Meteorological Organization (WMO) decision, requirement, recommendation or study, e.g., the WMO decision of −55 db W/200 MHz for Base Stations (BS) and −51 db W/200 MHz for User Equipment (UE). These specifications and/or decisions and/or requirements may be directed to suppression of energy leakage from an adjacent band, e.g., energy leakage from an adjacent 3GPP 5G band, e.g., suppression of transmit energy leakage from the adjacent 3GPP 5G n258 band 9051 (24.250 GHz-27.500 GHz), e.g. limiting of spurious out of n258 band emissions. A sixth application band 9060 includes the 3GPP 5G n260 band 9060 (37 GHz-40 GHz). A seventh application band 9070 includes United States WiGig Band for IEEE 802.11ad and IEEE 802.11ay 9071 (57 GHz-71 GHz), European Union and Japan WiGig Band for IEEE 802.11ad and IEEE 802.11ay 9072 (57 GHz-66 GHz), South Korea WiGig Band for IEEE 802.11ad and IEEE 802.11ay 9073 (57 GHz-64 GHz), and China WiGig Band for IEEE 802.11ad and IEEE 802.11ay 9074 (59 GHz-64 GHz). An eighth application band 9080 includes an automobile radar band 9080 (76 GHz-81 GHz).

Accordingly, it should be understood from the foregoing that the acoustic wave devices (e.g., resonators, e.g., filters, e.g., oscillators) of this disclosure may be implemented in the respective application frequency bands just discussed. For example, the layer thicknesses of the acoustic reflector electrodes and piezoelectric layers in alternating axis arrangement for the example acoustic wave devices (e.g., the example 24 GHz bulk acoustic wave resonators) of this disclosure may be scaled up and down as needed to be implemented in the respective application frequency bands just discussed. This is likewise applicable to the example filters (e.g., bulk acoustic wave resonator based filters) and example oscillators (e.g., bulk acoustic wave resonator based oscillators) of this disclosure to be implemented in the respective application frequency bands just discussed. The following examples pertain to further embodiments for acoustic wave devices, including but not limited to, e.g., bulk acoustic wave resonators, e.g., bulk acoustic wave resonator based filters, e.g., bulk acoustic wave resonator based oscillators, and from which numerous permutations and configurations will be apparent.

A first example is an acoustic wave device (e.g., a bulk acoustic wave resonator) comprising a substrate, a piezoelectric resonant volume having a main resonant frequency, and a first distributed Bragg acoustic reflector including a first active piezoelectric layer.

A second example is an acoustic wave device as described in the first example, in which the resonant frequency of the acoustic wave device is in a 3rd Generation Partnership Project (3GPP) band.

A third example is an acoustic wave device as described in the first example in which the resonant frequency of the acoustic wave device is in a 3rd Generation Partnership Project (3GPP) band.

A fourth example is an acoustic wave device as the first example, in which the resonant frequency of the acoustic wave device is in a 3GPP n77 band 9010 as shown in FIG. 9A.

A fifth example is an acoustic wave device as described in the first example, in which the resonant frequency of the acoustic wave device is in a 3GPP n79 band 9020 as shown in FIG. 9A.

A sixth example is an acoustic wave device as described in the first example, in which the resonant frequency of the acoustic wave device is in a 3GPP n258 band 9051 as shown in FIG. 9B.

A seventh example is an acoustic wave device as described in the first example, in which the resonant frequency of the acoustic wave device is in a 3GPP n261 band 9052 as shown in FIG. 9B.

An eighth example is an acoustic wave device as described in the first example, in which the resonant frequency of the acoustic wave device is in a 3GPP n260 band as shown in FIG. 9B.

An ninth example is an acoustic wave device as described in the first example, in which the resonant frequency of the acoustic wave device is in an Institute of Electrical and Electronic Engineers (IEEE) C band as shown in FIG. 9A.

A tenth example is an acoustic wave device as described in the first example, in which the resonant frequency of the acoustic wave device is in an Institute of Electrical and Electronic Engineers (IEEE) X band as shown in FIG. 9B.

An eleventh example is an acoustic wave device as described in the first example, in which the resonant frequency of the acoustic wave device is in an Institute of Electrical and Electronic Engineers (IEEE) Ku band as shown in FIG. 9B.

A twelfth example is an acoustic wave device as described in the first example, in which the resonant frequency of the acoustic wave device is in an Institute of Electrical and Electronic Engineers (IEEE) X band as shown in FIG. 9B.

A thirteenth example is an acoustic wave device as described in the first example, in which the resonant frequency of the acoustic wave device is in an Institute of Electrical and Electronic Engineers (IEEE) K band as shown in FIG. 9B.

A fourteenth example is an acoustic wave device as described in the first example, in which the resonant frequency of the acoustic wave device is in an Institute of Electrical and Electronic Engineers (IEEE) Ka band as shown in FIG. 9B.

A fifteenth example is an acoustic wave device as described in the first example, in which the resonant frequency of the acoustic wave device is in an Institute of Electrical and Electronic Engineers (IEEE) V band as shown in FIG. 9B.

A sixteenth example is an acoustic wave device as described in the first example, in which the resonant frequency of the acoustic wave device is in an Institute of Electrical and Electronic Engineers (IEEE) W band as shown in FIG. 9B.

A seventeenth example is an acoustic wave device as described in the first example, in which the resonant frequency of the acoustic wave device is in UNII-1 band 9031, as shown in FIG. 9A.

An eighteenth example is an acoustic wave device as described in the first example, in which the resonant frequency of the acoustic wave device is in UNII-2A band 9032, as shown in FIG. 9A.

A nineteenth example is an acoustic wave device as described in the first example, in which the resonant frequency of the acoustic wave device is in UNII-2C band 9041, as shown in FIG. 9A.

A twentieth example is an acoustic wave device as described in the first example, in which the resonant frequency of the acoustic wave device is in UNII-3 band 9042, as shown in FIG. 9A.

A twenty first example is an acoustic wave device as described in the first example, in which the resonant frequency of the acoustic wave device is in UNII-4 band 9043, as shown in FIG. 9A.

A twenty second example is an acoustic wave device as described in the first example, in which the resonant frequency of the acoustic wave device is in UNII-5 band 9044, as shown in FIG. 9A.

A twenty third example is an acoustic wave device as described in the first example, in which the resonant frequency of the acoustic wave device is in UNII-6 band 9045, as shown in FIG. 9A.

A twenty fourth example is an acoustic wave device as described in the first example, in which the resonant frequency of the acoustic wave device is in UNII-7 band 9046, as shown in FIG. 9A.

A twenty fifth example is an acoustic wave device as described in the first example, in which the resonant frequency of the acoustic wave device is in UNII-8 band 9047, as shown in FIG. 9A.

A twenty sixth example is an acoustic wave device as described in the first example, in which the resonant frequency of the acoustic wave device is the MVDDS (Multi-channel Video Distribution and Data Service) band 9051B, as shown in FIG. 9B.

A twenty seventh example is an acoustic wave device as described in the first example, in which the resonant frequency of the acoustic wave device is the EESS (Earth Exploration Satellite Service) band 9051A, as shown in FIG. 9B.

A twenty eighth example is an acoustic wave device as described in the first example, in which the first patterned layer comprises a step mass feature.

A twenty ninth example is an acoustic wave device as described in the first example, in which: the active piezoelectric volume has a lateral perimeter; and the step mass feature of the first patterned layer is proximate to the lateral perimeter of the active piezoelectric volume.

A thirtieth example is an acoustic wave device as described in the first example, in which the first and second piezoelectric layers have respective thicknesses to facilitate the main resonant frequency.

A thirty first example is an acoustic wave device as described in the first example, in which an acoustic reflector electrode is electrically and acoustically coupled with the first and second piezoelectric layers to excite a piezoelectrically excitable main resonant mode at the main resonant frequency of the acoustic wave device.

A thirty second example is an acoustic wave device as described in the thirty first example, in which the acoustic reflector electrode comprises a first pair of metal electrode layers including first and second metal electrode layers electrically and acoustically coupled with the first and second piezoelectric layers.

A thirty third example is an acoustic wave device as described in the thirty second example, in which the acoustic reflector electrode includes a second pair of metal electrode layers electrically and acoustically coupled with the first and second piezoelectric layers to excite the piezoelectrically excitable main resonant mode at the main resonant frequency; and members of the first and second pairs of metal electrode layers have respective acoustic impedances in an alternating arrangement, e.g., to provide a plurality of reflective acoustic impedance mismatches.

A thirty fourth example is an electrical oscillator in which an acoustic wave device as described in any one of the first through thirty third examples forms a portion of the electrical oscillator.

A thirty fifth example is an electrical filter in which an acoustic wave device as described in any one of the first through thirty third examples forms a portion of the electrical filter.

A thirty sixth example is an antenna device in which an acoustic wave device as described in any one of the first through thirty third examples forms a portion of the antenna device.

A thirty seventh example is an antenna device as in the thirty sixth example in which the antenna device comprises: a plurality of antenna elements supported over the substrate, an integrated circuit supported on one side of the substrate, a first millimeter wave acoustic filter coupled with the integrated circuit, in which the first millimeter wave acoustic filter comprises the acoustic wave device, and antenna feed(s) coupled with the plurality of antenna elements.

The United States Federal Communications Commission (FCC) has designated a MVDDS (Multi-channel Video Distribution and Data Service) band, for example, MVDDS (Multi-channel Video Distribution and Data Service) band 9051B (12.2 GHz-12.7 GHz), as discussed previously herein with respect to FIG. 9B. For example, an example millimeter wave filter having the simulated band pass characteristics 9101 as shown in FIG. 9C may be a MVDDS band filter (e.g., filter having pass band, e.g. filter having a pass band center frequency, within the FIG. 9B MVDDS (Multi-channel Video Distribution and Data Service) band 9051B (12.2 GHz-12.7 GHz), e.g., millimeter wave filter having band pass characteristic, e.g., pass band, that is configured for MVDDS band).

Figure 9C:
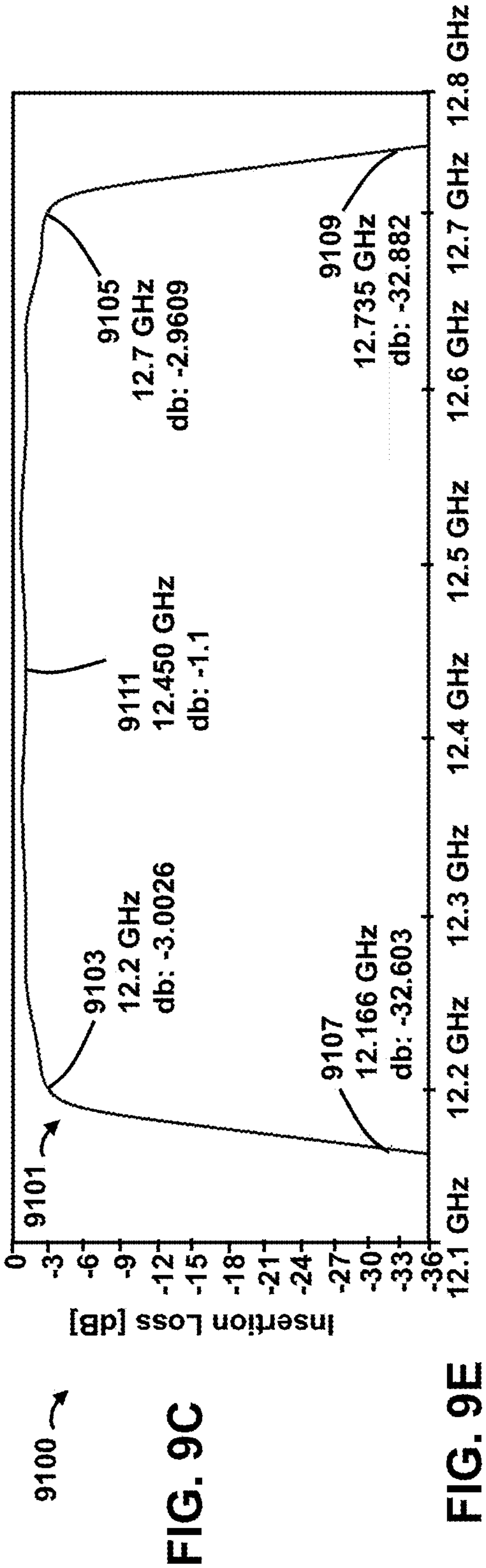
FIGS. 9C and 9D are diagrams illustrating simulated band pass filter characteristics of insertion loss versus frequency for respective additional example band pass filters employing acoustic resonators of this disclosure.

For example, the simulated band pass characteristic 9101 depicted in solid line (e.g., pass band 9101) of chart 9100 in FIG. 9C shows a first band edge feature 9103 having an insertion loss of −3.0026 decibels (dB) at an initial 12.2 GHz extremity of the pass band 9101. For example, the simulated band pass characteristic 9101 of FIG. 9C shows an opposing band edge feature 9105 of the pass band 9101, having an insertion loss of −2.9609 decibels (dB) at an opposing 12.7 GHz extremity of the pass band 9101. This may be within about five hundred MegaHertz (500 MHz) of bandwidth for the −3 decibel pass band width extending between the first band edge feature 9103 (having the insertion loss of −3.0026 decibels (dB) at the initial 12.2 GHz extremity of the pass band 9101) and the opposing band edge feature 9105 (having the insertion loss of −2.9609 decibels (dB) at the opposing 12.7 GHz extremity of the pass band 9101). Pass band 9101 may have an insertion loss of −1.1 decibels (dB) at a 12.450 GHz frequency at a center 9111 of the pass band 9101. The five hundred MegaHertz (500 MHz) of bandwidth for the −3 decibel pass band width just discussed may be about 4 percent of the 12.450 GHz frequency at the center 9111 of the pass band 9101. Accordingly, the example millimeter acoustic wave filter corresponding to band pass characteristic 9101 may have the five hundred MegaHertz (500 MHz) of bandwidth for the −3 decibel pass band width, which may be about 4 percent of the 12.450 GHz frequency at the center 9111 of the pass band 9101.

For example, the simulated band pass characteristic 9101 of FIG. 9C shows a pass band roll off feature 9107 having an insertion loss of 32.603 decibels (dB) at an initial 12.166 GHz roll off extremity 9107 of the pass band 9101. At the initial 12.166 GHz roll off extremity 9107 of the pass band 9101, the pass band roll off feature 9107 may provide more than about minus twenty nine dB of roll off (e.g., −29.6 dB of roll off) at less than about forty MHz (e.g., 34 MHz) from the first band edge feature 9103, at the initial 12.166 GHz roll off extremity 9107 of the pass band 9101.

For example, the simulated band pass characteristic 9101 of FIG. 9C shows an opposing pass band roll off feature 9109 having an insertion loss of −32.882 decibels (dB) at an opposing 12.735 GHz roll off extremity 9109 of the pass band 9101. At the opposing 12.735 GHz roll off extremity 9109 of the pass band 9101, the opposing pass band roll off feature 9109 may provide more than about minus twenty-nine dB of roll off (e.g., −29.9211 dB of roll off) at less than about 40 MHz (e.g., 35 MHz) from the opposing band edge feature 9105, at the opposing 12.735 GHz roll off extremity 9109 of the pass band 9101.

Figure 9D:
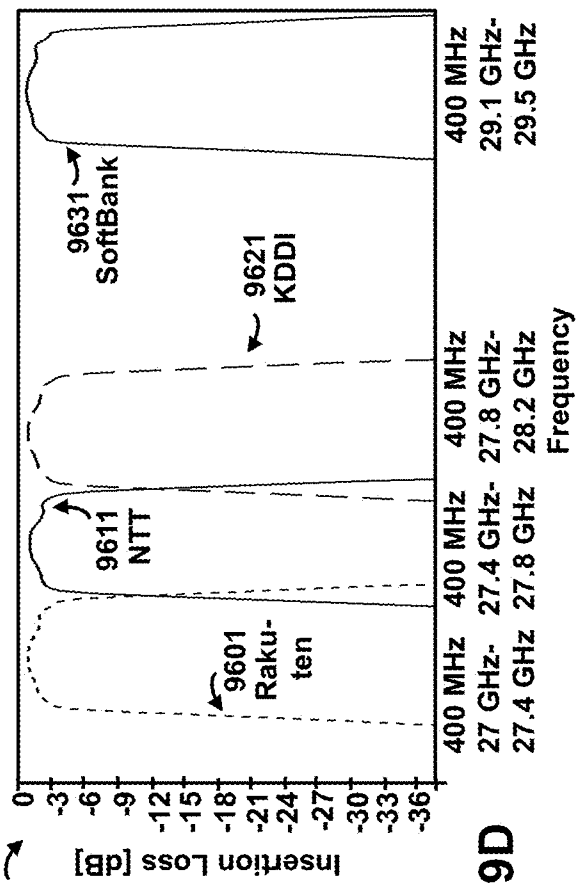

For example, FIG. 9D is a diagram 9600 illustrating simulated band pass characteristics 9601, 9611, 9621, 9631 of insertion loss versus frequency for four additional example millimeter wave band pass filters (e.g., first, second, third and fourth example millimeter wave band pass filters). These example filters may be respectively configured with two external shunt inductors modifying the example ladder filter similar to the one shown in FIG. 6 (e.g., an input port shunt inductor and an output port shunt inductor modifying the ladder configuration using five series resonators of the bulk acoustic wave resonator structure of FIG. 1A, and five mass loaded shunt resonators of the bulk acoustic wave resonator structure of FIG. 1A). The shunt inductors may be, for example, about 1 nanohenry inductors having a quality factor of twenty (Q of 20).

For example, the four example band pass millimeter wave filters respectively associated with the simulated band pass characteristics 9601, 9611, 9621, 9631 of FIG. 9D may overlap at least portions of a 3GPP 5G n257 band (e.g., filters corresponding to channels overlapping at least portions of the FIG. 9B 3GPP 5G n257 band 9054 (26.500 GHz-29.500 GHz)).

For example, two example band pass millimeter wave filters respectively associated with the simulated band pass characteristics 9601, 9611 of FIG. 9D may overlap at least portions of a 3GPP 5G n258 band (e.g., filters corresponding to channels overlapping at least portions of the FIG. 9B 3GPP 5G n258 band 9051 (24.25 GHz-27.5 GHz)).

For example, the four example millimeter wave filters respectively associated with the simulated band pass characteristic 9601, 9611, 9621, 9631 as shown in FIG. 9D may be respective 400 hundred Megahertz (400 MHz) channel filters of at least portions of the 3GPP 5G n257 band, e.g., the filter may have a fractional bandwidth of about one and four tenths percent (1.4%), and may include resonators having electromechanical coupling coefficient (Kt2) of about two and eight tenths percent (2.8%).

The first example band pass millimeter filter may have a bandwidth that is licensed by a regulatory authority to a first entity associated with a first mobile network operator (e.g., first cellular carrier, e.g., first wireless carrier, e.g., first mobile phone operator). For example, the first example band pass millimeter wave filter may have a bandwidth of about four hundred Megahertz (400 MHz) extending from about 27 GHz to about 27.4 GHz (e.g., may have the first simulated band pass characteristics 9601 as shown in FIG. 9D) that is licensed by a regulatory authority (e.g., by the applicable Japanese regulatory authority, e.g., by the Japanese Ministry of Internal Affairs and Communications) to the first entity associated with the first mobile network operator (e.g., Rakuten e.g., Rakuten Mobile Inc., e.g., Rakuten Mobile, Inc. having a principal place of business located in Setagaya-Ku, Tokyo, Japan).

Similarly, the second example band pass millimeter filter may have a bandwidth that is licensed by the regulatory authority to a second entity associated with a second mobile network operator (e.g., second cellular carrier, e.g., second wireless carrier, e.g., second mobile phone operator). For example, the second example band pass millimeter wave filter may have a bandwidth of about four hundred Megahertz (400 MHz) extending from about 27.4 GHz to about 27.8 GHz (e.g., may have the second simulated band pass characteristics 9611 as shown in FIG. 9D) that is licensed by the regulatory authority (e.g., by the applicable Japanese regulatory authority, e.g., by the Japanese Ministry of Internal Affairs and Communications) to the second entity associated with the second mobile network operator (e.g., NTT, e.g., NTT Docomo Inc. e.g., NTT Docomo Inc having a principle Sanno Park Tower, Nagatacho, Chiyoda-Ku, Tokyo, Japan).

Similarly, the third example band pass millimeter filter may have a bandwidth that is licensed by the regulatory authority to a third entity associated with a third mobile network operator (e.g., third cellular carrier, e.g., third wireless carrier, e.g., third mobile phone operator). For example, the third example band pass millimeter wave filter may have a bandwidth of about four hundred Megahertz (400 MHz) extending from about 27.8 GHz to about 28.2 GHz (e.g., may have the third simulated band pass characteristics 9621 as shown in FIG. 9D) that is licensed by the regulatory authority (e.g., by the applicable Japanese regulatory authority, e.g., by the Japanese Ministry of Internal Affairs and Communications) to the third entity associated with the third mobile network operator (e.g., KDDI, e.g., KDDI Corporation, e.g., KDDI Corporation having a principal place of business at the Garden Air Tower in Iidabashi, Chiyoda-Ku, Tokyo, Japan).

Similarly, the fourth example band pass millimeter filter may have a bandwidth that is licensed by the regulatory authority to a fourth entity associated with a fourth mobile network operator (e.g., fourth cellular carrier, e.g., fourth wireless carrier, e.g., fourth mobile phone operator). For example, the fourth example band pass millimeter wave filter may have a bandwidth of about four hundred Megahertz (400 MHz) extending from about 29.1 GHz to about 29.5 GHz (e.g., may have the fourth simulated band pass characteristics 9631 as shown in FIG. 9D) that is licensed by the regulatory authority (e.g., by the applicable Japanese regulatory authority, e.g., by the Japanese Ministry of Internal Affairs and Communications) to the fourth entity associated with the fourth mobile network operator (e.g., SoftBank, e.g., SoftBank Group Corp., e.g., SoftBank Group Corp. having a principal place of business in Minato, Tokyo, Japan).

Accordingly, the first entity associated with the first mobile network operator may be different than the second entity associated with the second mobile network operator. The first entity associated with the first mobile network operator may be different than the third entity associated with the third mobile network operator. The first entity associated with the first mobile network operator may be different than the fourth entity associated with the fourth mobile network operator. The second entity associated with the second mobile network operator may be different than the third entity associated with the third mobile network operator. The second entity associated with the second mobile network operator may be different than the fourth entity associated with the fourth mobile network operator. The third entity associated with the third mobile network operator may be different than the fourth entity associated with the fourth mobile network operator.

Figure 10:
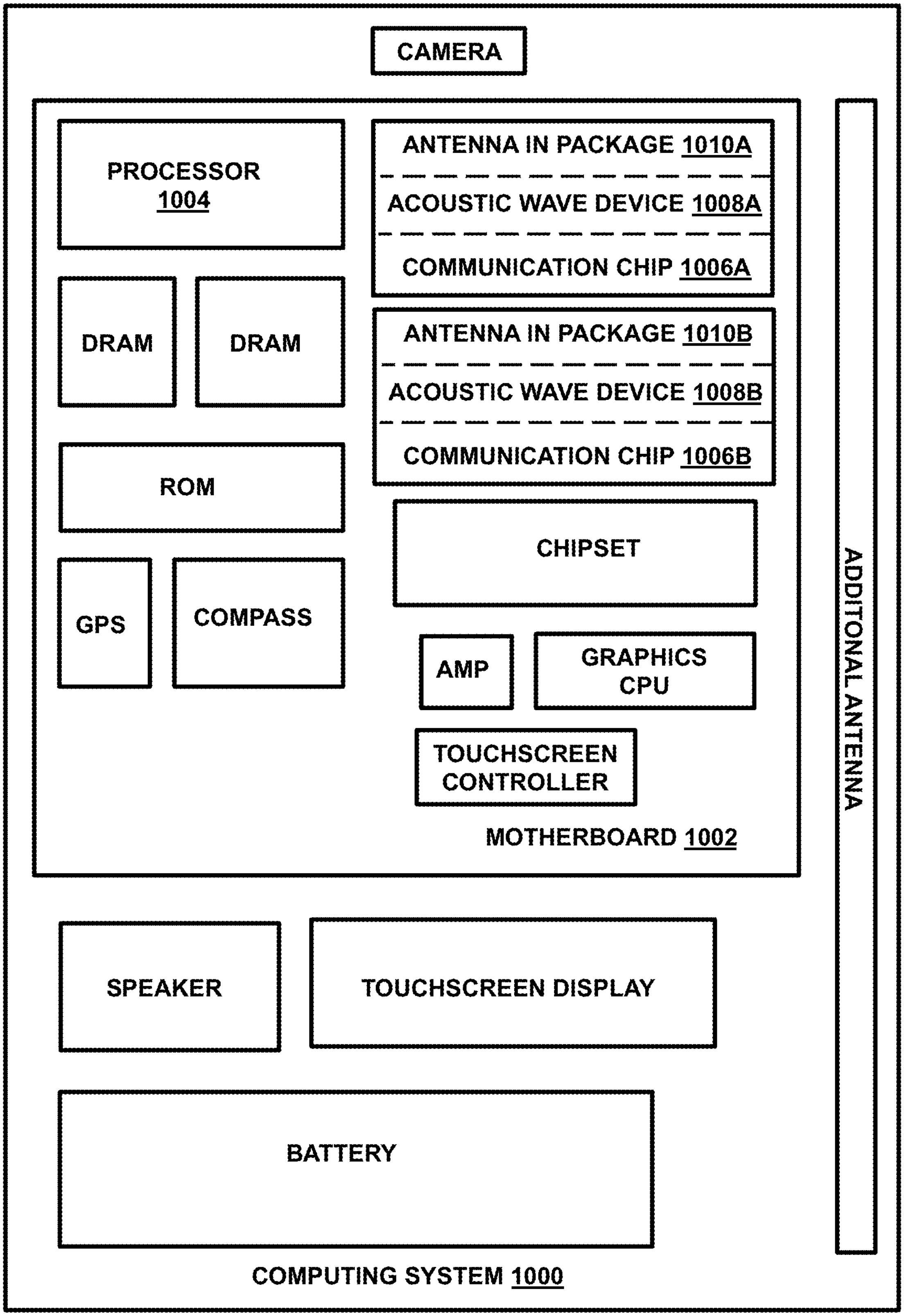
FIG. 10 illustrates a computing system implemented with integrated circuit structures or devices formed using the techniques disclosed herein, in accordance with an embodiment of the present disclosure.

The first, second, third and fourth example millimeter wave band pass filters respectively associated with simulated band pass characteristics 9601, 9611, 9621, 9631 as shown in FIG. 9D may comprise acoustic wave devices 1008A, 1008B of computing device 1000 (e.g., mobile phone 1000) shown in FIG. 10. The first example millimeter wave band pass filter associated with the first simulated band pass characteristic 9601 shown in FIG. 9D may facilitate wireless communication (e.g., wireless operation, e.g., wireless compatibility) of the computing device 1000 (e.g., mobile phone 1000) shown in FIG. 10 with the first mobile network operator (e.g., Rakuten e.g., Rakuten Mobile Inc., e.g., Rakuten Mobile, Inc. having a principal place of business located in Setagaya-Ku, Tokyo, Japan). For example, the first band pass millimeter wave filter may facilitate wireless communication (e.g., wireless operation, e.g., wireless compatibility) of the computing device 1000 (e.g., mobile phone 1000) shown in FIG. 10 with the first mobile network operator using the bandwidth of about four hundred Megahertz (400 MHz) extending from about 27 GHz to about 27.4 GHz that is licensed by the regulatory authority (e.g., by the applicable Japanese regulatory authority, e.g., by the Japanese Ministry of Internal Affairs and Communications) to the first entity associated with the first mobile network operator (e.g., Rakuten e.g., Rakuten Mobile Inc., e.g., Rakuten Mobile, Inc. having a principal place of business located in Setagaya-Ku, Tokyo, Japan).

The second example millimeter wave band pass filter associated with the second simulated band pass characteristic 9611 shown in FIG. 9D may facilitate wireless communication (e.g., wireless operation, e.g., wireless compatibility) of the computing device 1000 (e.g., mobile phone 1000) shown in FIG. 10 with the second mobile network operator (e.g., NTT, e.g., NTT Docomo Inc. e.g., NTT Docomo Inc having a principle Sanno Park Tower, Nagatacho, Chiyoda-Ku, Tokyo, Japan). For example, the second band pass millimeter wave filter may facilitate wireless communication (e.g., wireless operation, e.g., wireless compatibility) of the computing device 1000 (e.g., mobile phone 1000) shown in FIG. 10 with the second mobile network operator using the bandwidth of about four hundred Megahertz (400 MHz) extending from about 27.4 GHz to about 27.8 GHz that is licensed by the regulatory authority (e.g., by the applicable Japanese regulatory authority, e.g., by the Japanese Ministry of Internal Affairs and Communications) to the second entity associated with the second mobile network operator (e.g., NTT, e.g., NTT Docomo Inc. e.g., NTT Docomo Inc having a principle Sanno Park Tower, Nagatacho, Chiyoda-Ku, Tokyo, Japan).

The third example millimeter wave band pass filter associated with the third simulated band pass characteristic 9621 shown in FIG. 9D may facilitate wireless communication (e.g., wireless operation, e.g., wireless compatibility) of the computing device 1000 (e.g., mobile phone 1000) shown in FIG. 10 with the third mobile network operator (e.g., KDDI, e.g., KDDI Corporation, e.g., KDDI Corporation having a principal place of business at the Garden Air Tower in Iidabashi, Chiyoda-Ku, Tokyo, Japan). For example, the third band pass millimeter wave filter may facilitate wireless communication (e.g., wireless operation, e.g., wireless compatibility) of the computing device 1000 (e.g., mobile phone 1000) shown in FIG. 10 with the third mobile network operator using the bandwidth of about four hundred Megahertz (400 MHz) extending from about 27.8 GHz to about 28.2 GHz that is licensed by the regulatory authority (e.g., by the applicable Japanese regulatory authority, e.g., by the Japanese Ministry of Internal Affairs and Communications) to the third entity associated with the third mobile network operator (e.g., KDDI, e.g., KDDI Corporation, e.g., KDDI Corporation having a principal place of business at the Garden Air Tower in Iidabashi, Chiyoda-Ku, Tokyo, Japan).

The fourth example millimeter wave band pass filter associated with the third simulated band pass characteristic 9631 shown in FIG. 9D may facilitate wireless communication (e.g., wireless operation, e.g., wireless compatibility) of the computing device 1000 (e.g., mobile phone 1000) shown in FIG. 10 with the fourth mobile network operator (e.g., SoftBank, e.g., SoftBank Group Corp., e.g., SoftBank Group Corp. having a principal place of business in Minato, Tokyo, Japan). For example, the fourth band pass millimeter wave filter may facilitate wireless communication (e.g., wireless operation, e.g., wireless compatibility) of the computing device 1000 (e.g., mobile phone 1000) shown in FIG. 10 with the fourth mobile network operator using the bandwidth of about four hundred Megahertz (400 MHz) extending from about 29.1 GHz to about 29.5 GHz that is licensed by the regulatory authority (e.g., by the applicable Japanese regulatory authority, e.g., by the Japanese Ministry of Internal Affairs and Communications) to the fourth entity associated with the fourth mobile network operator (e.g., SoftBank, e.g., SoftBank Group Corp., e.g., SoftBank Group Corp. having a principal place of business in Minato, Tokyo, Japan).

The three of the four example millimeter wave filters just discussed may have respective pass bands that may be adjacent to one another (e.g., may be contiguous with one another), corresponding to the three simulated band pass characteristics 9601, 9611, 9621 that may be adjacent to one another (e.g., may be contiguous with one another) as shown in FIG. 9D. For example, the three example millimeter wave filters may have respective pass bands of about four hundred Megahertz (400 MHz) that may be adjacent to one another (e.g., may be contiguous with one another). The respective pass bands of the four filters may facilitate attenuation, for example, proximate to respective pass band edges of the respective pass bands. The four example millimeter wave filters may facilitate suppression of energy leakage (e.g., facilitate suppression of millimeter wave energy leakage) among adjacent (e.g., contiguous) bandwidths of millimeter wave spectrum licensed to the differing entities associated with the differing mobile network operators (e.g., differing cellular carrier, e.g., differing wireless carriers, e.g., differing mobile phone operators). This may facilitate satisfying (e.g., facilitate compliance with) a government regulatory requirement, and/or a spectrum licensing requirement, which may be directed to suppression of energy leakage, e.g., suppression of transmit energy leakage, from a licensed bandwidth of millimeter wave spectrum into adjacent (e.g., contiguous) bandwidths of millimeter wave spectrum. In other words, the four example millimeter wave filters may facilitate limiting of spurious emissions out of the respective pass bands of the four filters into adjacent (e.g., in some cases, contiguous) bandwidths of millimeter wave spectrum.

For example, the first millimeter wave filter may have a first pass band, e.g., of about 400 hundred Megahertz (400 MHz) extending from about 27 GHz to about 27.4 GHz, corresponding to a first 400 MHz bandwidth of millimeter wave spectrum licensed to the first entity associated with the first mobile network operator (e.g., Rakuten). This first 400 MHz bandwidth of millimeter wave spectrum licensed to the first entity associated with the first mobile network operator (e.g., Rakuten) may be adjacent to (e.g., may be contiguous with) a second 400 MHz bandwidth of millimeter wave spectrum licensed to the second entity associated with the second mobile network operator (e.g., NTT). The second millimeter wave filter may have a second pass band, e.g., of about four hundred Megahertz (400 MHz) extending from about 27.4 GHz to about 27.8 GHz, corresponding to the second 400 MHz bandwidth of millimeter wave spectrum licensed to the second entity associated with the second mobile network operator (e.g., NTT). This second 400 MHz bandwidth of millimeter wave spectrum licensed to the second entity associated with the second mobile network operator (e.g., NTT) may be adjacent to (e.g., may be contiguous with) a third 400 MHz bandwidth of millimeter wave spectrum licensed to the third entity associated with the third mobile network operator (e.g., KDDI). The third millimeter wave filter may have a third pass band, e.g., of about four hundred Megahertz (400 MHz) extending from about 27.8 GHz to about 28.2 GHz, corresponding to the third 400 MHz bandwidth of millimeter wave spectrum licensed to the third entity associated with the third mobile network operator (e.g., KDDI).

The first millimeter wave filter having the first pass band, for example, corresponding to a first 400 MHz bandwidth of millimeter wave spectrum licensed to the first entity associated with the first mobile network operator (e.g., Rakuten) may facilitate suppression of energy leakage therefrom into an adjacent (e.g., contiguous) second 400 MHz bandwidth of millimeter wave spectrum, which may be licensed to the second entity associated with the second mobile network operator (e.g., NTT). Conversely, the second millimeter wave filter having the second pass band, for example, corresponding to the second 400 MHz bandwidth of millimeter wave spectrum licensed to the second entity associated with the second mobile network operator (e.g., NTT) may facilitate suppression of energy leakage therefrom into an adjacent (e.g., contiguous) first 400 MHz bandwidth of millimeter wave spectrum, which may be licensed to the first entity associated with the first mobile network operator (e.g., Rakuten).

Similarly, the second millimeter wave filter having the second pass band, for example, corresponding to the second 400 MHz bandwidth of millimeter wave spectrum licensed to the second entity associated with the second mobile network operator (e.g., NTT) may facilitate suppression of energy leakage therefrom into an adjacent (e.g., contiguous) third 400 MHz bandwidth of millimeter wave spectrum, which may be licensed to the third entity associated with the third mobile network operator (e.g., KDDI). Conversely, the third millimeter wave filter having the third pass band, for example, corresponding to the third 400 MHz bandwidth of millimeter wave spectrum licensed to the third entity associated with the third mobile network operator (e.g., KDDI) may facilitate suppression of energy leakage therefrom into an adjacent (e.g., contiguous) second 400 MHz bandwidth of millimeter wave spectrum, which may be licensed to the second entity associated with the second mobile network operator (e.g., NTT).

The plurality of millimeter wave band pass filters may facilitate respective wireless communication (e.g., wireless operation, e.g., wireless compatibility) of the computing device 1000 (e.g., mobile phone 1000) shown in FIG. 10 with the respective plurality of mobile network operators. The first and second example millimeter wave band pass filters respectively associated with first and second simulated band pass characteristics 9601, 9611 shown in FIG. 9D may facilitate respective wireless communication (e.g., wireless operation, e.g., wireless compatibility) of the computing device 1000 (e.g., mobile phone 1000) shown in FIG. 10 with the first mobile network operator (e.g., Rakuten) and with the second mobile network operator (e.g., NTT). Similarly, the first, second and third example millimeter wave band pass filters respectively associated with first, second and third simulated band pass characteristics 9601, 9611, 9621 shown in FIG. 9D may facilitate respective wireless communication (e.g., wireless operation, e.g., wireless compatibility) of the computing device 1000 (e.g., mobile phone 1000) shown in FIG. 10 with the first mobile network operator (e.g., Rakuten and with the second mobile network operator (e.g., NTT), and with the third mobile network operator (e.g., KDDI).

Figure 9E:
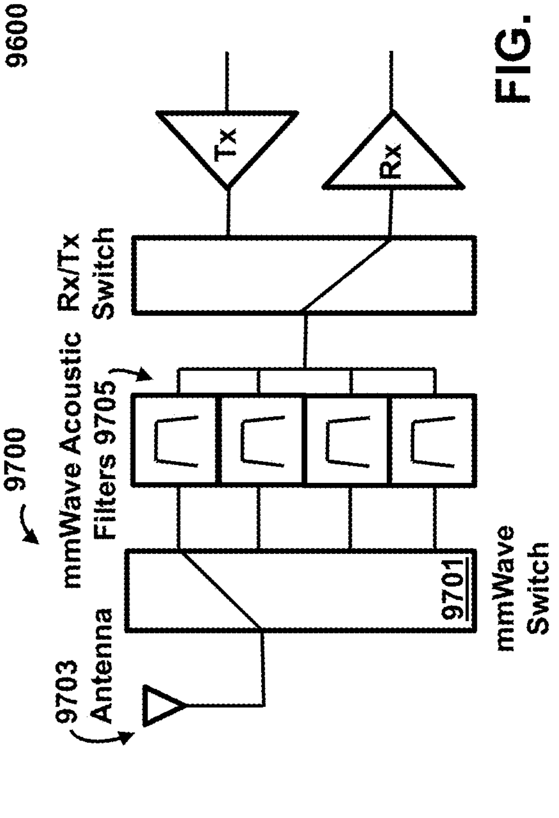
FIG. 9E is a simplified block diagram illustrating an example of a switchplexer comprising a switch to select coupling with alternative examples of a first band pass filter, and/or with the second band pass filter, and/or with the third band pass filter, respectively corresponding to the simulated band pass filter characteristics of FIGS. 9C and/or 9D.

Selecting from among the plurality of millimeter wave band pass filters just discussed may facilitate selecting wireless communication (e.g., wireless operation, e.g., wireless compatibility) of the computing device 1000 (e.g., mobile phone 1000) shown in FIG. 10 with a selected one of a plurality of mobile network operator (e.g., a plurality of mobile network operator that may be different from one another). For example, FIG. 9E is a simplified block diagram illustrating a switchplexer 9700. The switchplexer 9700 may comprise a switch (e.g., millimeter wave electrical switch 9701) to select coupling between an antenna 9703 a respective one of four millimeter acoustic wave electrical filters 9705, e.g., alternative examples of a first band pass filter, and/or with the second band pass filter, and/or with the third band pass filter, and/or with the fourth band pass filter, respectively corresponding to the simulated band pass filter characteristics of FIG. 9D. In a TDD (Time Division Duplex) example shown in FIG. 9E, a receive/transmit switch (Rx/Tx switch) may selectively coupled transmit and receive amplifiers (Tx and Rx amplifiers) to millimeter acoustic wave electrical filters 9705.

The switchplexer 9700 shown in FIG. 9E may select (e.g., may select electrical coupling) from among the plurality of millimeter wave band pass filters discussed previously herein and may facilitate selecting wireless communication (e.g., wireless operation, e.g., wireless compatibility) of the computing device 1000 (e.g., mobile phone 1000) shown in FIG. 10 with a selected mobile network operator (e.g., a selected one of a plurality of mobile network operators). For example, the switchplexer 9700 shown in FIG. 9E may select (e.g., may select electrical coupling) from among the first, second, third and fourth example millimeter wave band pass filters respectively associated with first, second, third, and fourth simulated band pass characteristics 9601, 9611, 9621, 9631 shown in FIG. 9D. This may facilitate may facilitate selecting wireless communication (e.g., wireless operation, e.g., wireless compatibility) of the computing device 1000 (e.g., mobile phone 1000) shown in FIG. 10 with the first wireless mobile network operator (e.g., Rakuten) and with the second mobile network operator (e.g., NTT), and with the third mobile network operator (e.g., KDDI) and with the fourth mobile network operator (e.g., SoftBank).

Accordingly, at a first time, e.g., a time of manufacture, the computing device 1000 (e.g., mobile phone 1000) may comprise the plurality of millimeter wave band pass filters. This may facilitate respective wireless communication (e.g., wireless operation, e.g., wireless compatibility) of the computing device 1000 (e.g., mobile phone 1000) shown in FIG. 10 with the respective plurality of mobile network operators. At a second time, e.g., at a configuration time, after the first time, e.g., after the time of manufacture, the switchplexer 9700 shown in FIG. 9I may select (e.g., may select electrical coupling) from among the first, second, third and fourth example millimeter wave band pass filters respectively associated with first, second, and third fourth (e.g., simulated) band pass characteristics 9601, 9611, 9621, 9631 shown in FIG. 9D. This may facilitate configuration of the computing device 1000 (e.g., mobile phone 1000), e.g., by selecting wireless communication (e.g., wireless operation, e.g., wireless compatibility) of the computing device 1000 (e.g., mobile phone 1000) shown in FIG. 10 with the first wireless mobile network operator (e.g., Rakuten) and/or with the second mobile network operator (e.g., NTT), and/or with the third mobile network operator (e.g., KDDI), and/or with the fourth mobile network operator (e.g., SoftBank).

Further, the foregoing configuration may be changed (e.g., may be reconfigured) at a subsequent time. For example, at a third time, e.g., at a reconfiguration time, after the second time and after the first time, e.g., after the configuration time (and after the time of manufacture), the switchplexer 9700 shown in FIG. 9E may further select (e.g., may further select electrical coupling) from among the first, second, third, and fourth example millimeter wave band pass filters respectively associated with first, second, third, and fourth (e.g., simulated) band pass characteristics 9601, 9611, 9621, 9631 shown in FIG. 9D. This may facilitate reconfiguration of the computing device 1000 (e.g., mobile phone 1000), e.g., by further selecting wireless communication (e.g., wireless operation, e.g., wireless compatibility) of the computing device 1000 (e.g., mobile phone 1000) shown in FIG. 10 with the first wireless mobile network operator (e.g., Rakuten) and/or with the second mobile network operator (e.g., NTT), and/or with the third mobile network operator (e.g., KDDI), and/or with the fourth mobile network operator (e.g., SoftBank).

FIG. 10 illustrates a computing system implemented with integrated circuit structures or devices formed using the techniques disclosed herein, in accordance with an embodiment of the present disclosure. As may be seen, the computing system 1000 houses a motherboard 1002. The motherboard 1002 may include a number of components, including, but not limited to, a processor 1004 and at least one communication chip 1006A, 1006B each of which may be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, additional antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions may be integrated into one or more chips (e.g., for instance, note that the communication chips 1006A, 1006B may be part of or otherwise integrated into the processor 1004).

The communication chips 1006A, 1006B enable wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chips 1006A, 1006B may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006A, 1006B. For instance, a first communication chip 1006A may be dedicated to shorter range wireless communications such as Wi-Fi and Bluetooth and a second communication chip 1006B may be dedicated to longer range wireless communications such as GPS, EDGE, GPRS, CDMA, WiMAX, LTE, Ev-DO, 5G and others. In some embodiments, communication chips 1006A, 1006B may include one or more acoustic wave devices 1008A, 1008B (e.g., resonators, filters and/or oscillators 1008A, 1008B) as variously described herein (e.g., acoustic wave devices including a stack of alternating axis piezoelectric material). Acoustic wave devices 1008A, 1008B may be included in various ways, e.g., one or more resonators, e.g., one or more filters, e.g., one or more oscillators. For example, acoustic wave devices 1008A, 1008B may be included in one or more filters with communications chips 1006A, 1006B, in combination with respective antenna in package(s) 1010A, 1010B.

Further, such acoustic wave devices 1008A, 1008B, e.g., resonators, e.g., filters, e.g., oscillators may be configured to be Super High Frequency (SHF) acoustic wave devices 1008A, 1008B or Extremely High Frequency (EHF) acoustic wave devices 1008A, 1008B, e.g., resonators, filters, and/or oscillators (e.g., operating at greater than 3, 4, 5, 6, 7, or 8 GHz, e.g., operating at greater than 23, 24, 25, 26, 27, 28, 29, or 30 GHz, e.g., operating at greater than 36, 37, 38, 39, or 40 GHz). Further still, such Super High Frequency (SHF) acoustic wave devices or Extremely High Frequency (EHF) resonators, filters, and/or oscillators may be included in the RF front end of computing system 1000 and they may be used for 5G wireless standards or protocols, for example.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chips 1006A, 1006B also may include an integrated circuit die packaged within the communication chips 1006A, 1006B. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any communication chips 1006A, 1006B is integrated into processor 1004, rather than having separate communication chips). Further note that processor 1004 may be a chip set having such wireless capability. In short, any number of processor 1004 and/or communication chips 1006A, 1006B may be used. Likewise, any one chip or chip set may have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, a streaming media device, an entertainment control unit, a digital camera, a portable music player, a digital video recorder, or any other electronic device that processes data or employs one or more integrated circuit structures or devices formed using the disclosed techniques, as variously described herein.

Figure 11A:
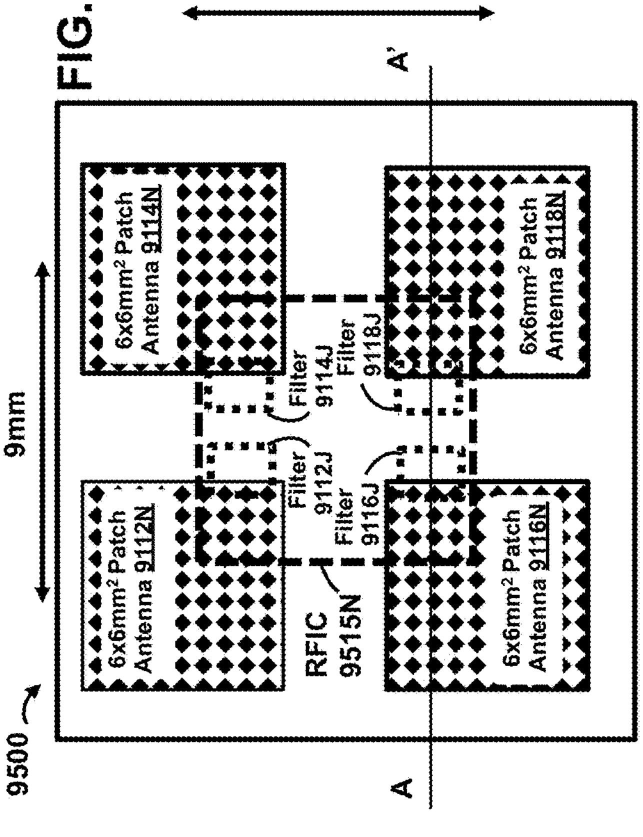
FIG. 11A shows a top view of an antenna device of the present disclosure.

FIG. 11A shows a top view an antenna device 9500 of the present disclosure. The antenna device 9500 may be an antenna in package 9500. The antenna device may comprise an integrated circuit 9515N (e.g., a radio frequency integrated circuit 9515N, e.g., RFIC 9515N). The integrated circuit 9515N may comprise a communication chip 9515N. The integrated circuit 9515N may be operable for 5G wireless communications, for example, in a millimeter wave frequency band, e.g. band including 24 GigaHertz. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Integrated circuit 9515N may be coupled with antenna elements 9112N, 9114N, 9116N, 9118N (e.g., patch antennas 9112N, 9114N, 9116N, 9118N) to facilitate wireless communication. Integrated circuit 9515N may be coupled with bulk acoustic wave resonator based filters 9112J, 9114J, 9116J, 9118J of this disclosure (e.g. bulk acoustic millimeter wave resonator based millimeter wave filters 9112J, 9114J, 9116J, 9118J of this disclosure). The millimeter wave filters 9112J, 9114J, 9116J, 9118J may be band pass millimeter wave filters 9112J, 9114J, 9116J, 9118J to pass a millimeter wave frequency. In some examples, millimeter wave filters 9112J, 9114J, 9116J, 9118J may be two pairs of similar filters, e.g., to address two orthogonal polarizations of patch antennas 9112N, 9114N, 9116N, 9118N.

Patch antennas 9112N, 9114N, 9116N, 9118N may be arranged in a patch antenna array, e.g., having lateral array dimensions (e.g., pitch in a first lateral dimension of, for example, about nine millimeters, e.g., pitch in a second lateral dimension, substantially orthogonal to the first lateral dimension of, for example, about nine millimeters).

The antenna device 9500 may be an antenna in package 9500 may be relatively small in size. This may facilitate: e.g., a relatively small array pitch of patch antennas 9112N, 9114N, 9116N, 9118N (e.g., nine millimeters), e.g., a relatively small respective area of patch antennas 9112N, 9114N, 9116N, 9118N (e.g., six millimeters by six millimeters). The foregoing may be related to frequency, e.g., the millimeter wave frequency band, e.g. band including 24 GigaHertz employed for wireless communication. For example, the array pitch may be approximately one electrical wavelength of the millimeter wave frequency.

For example, as shown in FIG. 11A: a first millimeter wave acoustic filter 9112J may be arranged below the array pitch, e.g., between lateral extremities of the array pitch; a second millimeter wave acoustic filter 9114J may be arranged below the array pitch, e.g., between lateral extremities of the array pitch; a third millimeter wave acoustic filter 9116J may be arranged below the array pitch, e.g., between lateral extremities of the array pitch; and a fourth millimeter wave acoustic filter 9118J may be arranged below the array pitch, e.g., between lateral extremities of the array pitch.

First and second millimeter wave acoustic filters 9112J, 9114J may be arranged below the array pitch between a first pair of the patch antennas 9112N, 9114N. Third and fourth millimeter wave acoustic filters 9116J, 9118J may be arranged below the array pitch between a second pair of the patch antennas 9116N, 9118N. First, second, third and fourth millimeter wave acoustic filters 9112J, 9114J, 9116J, 9118J may be arranged below the array pitch between the quartet of the patch antennas 9112N, 9114N, 9116N, 9118N.

The first millimeter wave acoustic filter 9112J may have an area of about one square millimeter or less, e.g., may have a lateral dimension that is less than the array pitch, e.g., less than nine millimeters. Similarly, the second millimeter wave acoustic filter 9114J may have an area of about one square millimeter or less, e.g., may have a lateral dimension that is less than the array pitch, e.g., less than nine millimeters. The third millimeter wave acoustic filter 9116J may have an area of about one square millimeter or less, e.g., may have a lateral dimension that is less than the array pitch, e.g., less than nine millimeters. The fourth millimeter wave acoustic filter 9118J may have an area of about one square millimeter or less, e.g., may have a lateral dimension that is less than the array pitch, e.g., less than nine millimeters.

The millimeter wave frequency may comprise approximately 24 GigaHertz. The millimeter wave frequency may comprise approximately 28 GigaHertz. The millimeter wave frequency comprises at least one of approximately 39 GigaHertz, approximately 42 GigaHertz, approximately 60 GigaHertz, approximately 77 GigaHertz, and approximately 100 GigaHertz.

Respective pass bands of millimeter wave acoustic filters 9112J, 9114J, 9116J, 9118J may be directed to differing frequency pass bands. For example the first millimeter wave acoustic filter 9112J may have a first pass band comprising at least a lower portion of a 3GPP n258 band. For example, the second millimeter wave acoustic filter 9114J may have a second pass band comprising at least an upper portion of a 3GPP n258 band. For example, the third millimeter wave acoustic filter 9116J may have a third pass band comprising at least a lower portion of a 3GPP n261 band. For example, the fourth millimeter wave acoustic filter 9116J may have a pass band comprising at least an upper portion of a 3GPP n261 band.

Figure 11B:
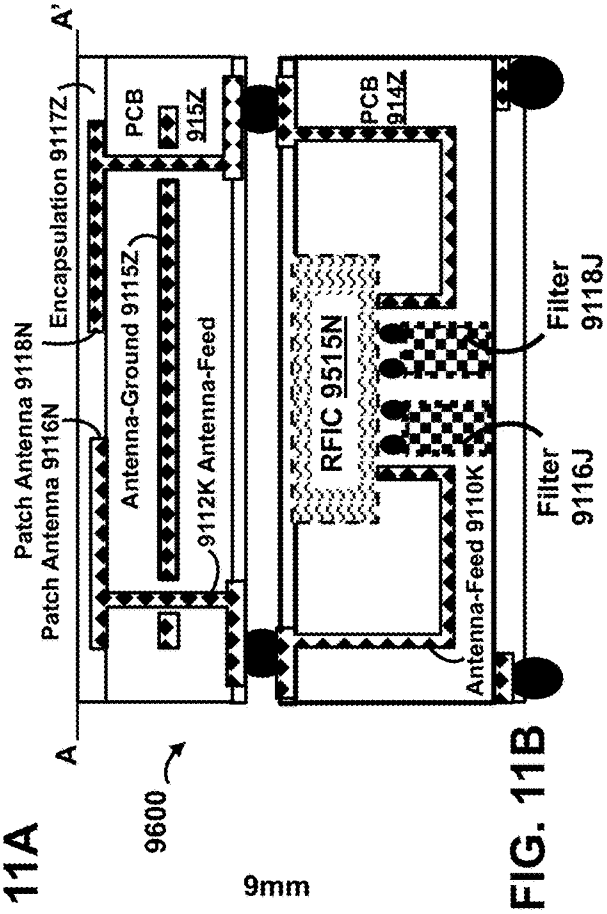
FIG. 11B shows a cross sectional view of the antenna device shown in FIG. 11A.

FIG. 11B shows a cross sectional view 9600 of the antenna device 9500 shown in FIG. 11A comprising millimeter wave acoustic filters 9116J, 9118J coupled (e.g., flip-chip coupled) with integrated circuit 9515N. (In other examples, millimeter wave acoustic filters 9116J, 9118J may alternatively or additionally be millimeter wave acoustic resonators, e.g., of this disclosure, coupled (e.g., flip-chip coupled) with oscillator circuitry of integrated circuit 9515N, e.g., to provide one or more millimeter wave oscillators, as discussed in detail elsewhere herein.) Integrated circuit 9515N may be coupled with antenna elements 9116N, 9118N (e.g., patch antenna elements 9116N, 9118N) via antenna feeds (e.g., metallic antenna feeds 9110K, 9112K). A first antenna feed 9110K may extend through package substrate 914Z, e.g., printed circuit board 914Z. An antenna substrate 915Z, e.g., printed circuit board 915Z, may comprise an antenna ground plane 9115Z. Antenna elements 9116N, 9118N (e.g., patch antennas 9116N, 9118N may be arranged over substrate 915Z. Antenna elements 9116N, 9118N may be encapsulated with a suitable encapsulation 9117Z.

Figure 11C:
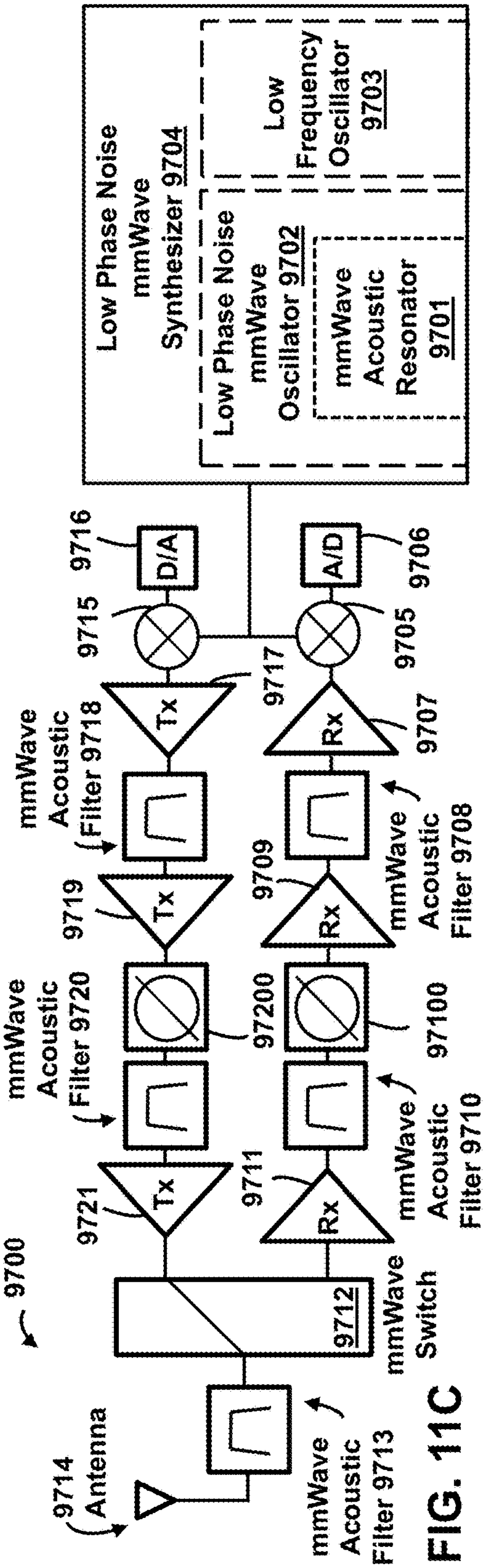
FIG. 11C shows a schematic of a millimeter wave transceiver employing millimeter wave filters and a millimeter wave oscillator respectively employing millimeter wave resonators of this disclosure.

FIG. 11C shows a schematic of a millimeter wave transceiver 9700 employing millimeter wave filters, and a millimeter wave oscillator respectively employing millimeter wave resonators of this disclosure. The circuitry (e.g., any portions thereof) shown in the FIG. 11C schematic of the millimeter wave transceiver 9700 employing millimeter wave filters, and the millimeter wave oscillator respectively employing millimeter wave resonators may be included in the integrated circuit 9515N shown in FIGS. 11A and 11B, or coupled with the integrated circuit 9515N shown in FIGS. 11A and 11B in the antenna in package 9500 shown in FIG. 11A. The integrated circuit 9515N shown in FIGS. 11A and 11B may be plurality of integrated circuits 9515N.

As shown in FIG. 11C, a millimeter wave acoustic resonator 9701 may be employed in a low phase noise millimeter wave oscillator 9702, for example as discussed in detail previously herein. The low phase noise millimeter wave oscillator 9702 comprising the millimeter wave acoustic resonator 9701 may be employed as a high frequency reference 9702 (e.g., millimeter wave frequency reference 9702) for a low phase noise millimeter wave frequency synthesizer 9704. The low phase noise millimeter wave frequency synthesizer 9704 may comprise a frequency multiplication circuit coupled with the low phase noise millimeter wave oscillator 9702 comprising the millimeter wave acoustic resonator 9701. The low phase noise millimeter wave frequency synthesizer 9704 may comprise a frequency division circuit coupled with the low phase noise millimeter wave oscillator 9702 comprising the millimeter wave acoustic resonator 9701. The low phase noise millimeter wave frequency synthesizer 9704 may comprise direct digital synthesis circuitry coupled with the low phase noise millimeter wave oscillator 9702 comprising the millimeter wave acoustic resonator 9701. The low phase noise millimeter wave frequency synthesizer 9704 may comprise direct digital to time converter coupled with the low phase noise millimeter wave oscillator 9702 comprising the millimeter wave acoustic resonator 9701. The low phase noise millimeter wave frequency synthesizer 9704 may comprise frequency mixing circuitry coupled with the low phase noise millimeter wave oscillator 9702 comprising the millimeter wave acoustic resonator 9701. The low phase noise millimeter wave frequency synthesizer 9704 may comprise phase-locked loop circuitry (e.g., a plurality of phase-locked loops) coupled with the low phase noise millimeter wave oscillator 9702 comprising the millimeter wave acoustic resonator 9701.

The foregoing may further be coupled with a low frequency oscillator 9703, e.g., comprising a crystal oscillator, e.g., comprising a quartz crystal oscillator, e.g., as a low frequency reference. For example, the frequency oscillator 9703 may provide the low frequency reference having a relatively low frequency, e.g., about 100 MHz or lower (e.g, or below 10 MHz, e.g., or below 1 MHz, e.g., or below 100 KHz). The low frequency reference 9703 may have an enhanced long term stability, e.g., an enhanced temperature stability relative to the high frequency reference 9702 (e.g., relative to the low phase noise millimeter wave oscillator 9702 comprising the millimeter wave acoustic resonator 9701). The low phase noise millimeter wave frequency synthesizer 9704 may comprise frequency comparison circuitry coupled with the low frequency reference 9703 and with the high frequency reference 9702 to compare an output of the low frequency reference 9703 and an output of the high frequency reference 9702 to generate a frequency comparison signal. The low phase noise millimeter wave frequency synthesizer 9704 may comprise frequency error detection circuitry coupled with the frequency comparison circuitry to receive the frequency comparison signal and coupled with the low frequency reference 9703 and with the high frequency reference 9702 to generate a frequency error signal based at least in part on the frequency comparison signal. The low phase noise millimeter wave frequency synthesizer 9704 may comprise frequency correction circuitry coupled with frequency error detection circuitry to receive the frequency error signal and coupled with the low frequency reference 9703 and with the high frequency reference 9702 to correct frequency errors (e.g. long term stability errors, e.g., temperature dependent frequency drift errors) which would otherwise be present in an output of the low phase noise millimeter wave frequency synthesizer 9704.

Alternatively or additionally, relative to the high frequency reference 9702, the low frequency reference 9703 may have a relatively smaller close-in phase noise contribution to the output of the low phase noise millimeter wave frequency synthesizer 9704, e.g., close-in phase noise within a 100 KiloHertz bandwidth of the output carrier, e.g., close-in phase noise within a 1 MegaHertz bandwidth of the output carrier, e.g., close-in phase noise within 10 MegaHertz bandwidth of the output carrier. Relative the low frequency reference 9703, the high frequency reference 9702, may have a relatively smaller farther-out phase noise contribution to the output of the low phase noise millimeter wave frequency synthesizer 9704, e.g., phase noise within a 100 MegaHertz bandwidth of the output carrier, e.g., phase noise within a 1 GigaHertz bandwidth of the output carrier, e.g., close-in phase noise within a 10 GigaHertz bandwidth of the output carrier. Accordingly, by employing the frequency comparison circuitry, the frequency error detection circuitry, and the frequency correction circuitry, the output of the low phase noise millimeter wave frequency synthesizer 9704 may provide the relatively smaller close-in phase noise contribution derived from the low frequency reference 9703, and may also provide the relatively smaller farther-out phase noise contribution derived from the high frequency reference 9702 (e.g., derived from the low phase noise millimeter wave oscillator 9702 comprising the millimeter wave acoustic resonator 9701). For example, the low phase noise millimeter wave frequency synthesizer 9704 may employ phase lock circuitry to phase lock a signal derived from the high frequency reference 9702 with a signal derived from low frequency reference 9703.

The low phase noise millimeter wave frequency synthesizer 9704 may be coupled with a frequency down converting mixer 9705 to provide the millimeter wave frequency output of the low phase noise millimeter wave frequency synthesizer 9704 to the frequency down converting mixer 9705. The frequency down converting mixer 9705 may be coupled with an analog to digital converter 9706 to provide a down converted signal to be digitized by the analog to digital converter 9706. A receiver band pass millimeter wave acoustic filter 9708 of this disclosure may be coupled between a pair of receiver amplifiers 9707, 9709 to generate a filtered amplified millimeter wave signal. This may be coupled with the frequency down converting mixer 9705 to down covert the filtered amplified millimeter wave signal. Another receiver band pass millimeter wave acoustic filter 9710 may be coupled between another receiver amplifier 9711 and a receiver phase shifter 97100 to provide an amplified phase shifted millimeter wave signal. This may be coupled with a first member 9709 if the pair of receivers 9709, 9707 for amplification. Yet another band pass millimeter wave acoustic filter 9713 may be coupled between antenna 9714 and millimeter wave switch 9712. Time Division Duplexing (TDD) may be employed using millimeter wave switch 9712 to switch between the receiver chain (just discussed) and a transmitter chain of millimeter wave transceiver 9700, to be discussed next.

The low phase noise millimeter wave frequency synthesizer 9704 may be coupled with a frequency up converting mixer 9715 to provide the millimeter wave frequency output of the low phase noise millimeter wave frequency synthesizer 9704 to the frequency up converting mixer 9715. The frequency up converting mixer 9715 may be coupled with a digital to analog converter 9716 to provide a signal to be up converted to millimeter wave for transmission. A transmitter band pass millimeter wave acoustic filter 9718 may be coupled between a pair of transmitter amplifiers 9717, 9719. This may be coupled with the frequency up converting mixer 9715 to receive the up converted millimeter wave signal to be transmitted and to generate a filtered and amplified transmit signal. Another transmitter band pass millimeter wave acoustic filter 9720 may be coupled between a transmit phase shifter 97200 and another transmit amplifier 9721. This may be coupled with a first member 9719 of the pair of transmit amplifiers 9719, 9718 to receive the filtered and amplified transmit signal and to generate a filtered, amplified and phase shifted signal. This may be coupled with the yet another band pass millimeter wave acoustic filter 9713 and antenna 9714 via millimeter wave switch 9712 for transmission.

Further Example Embodiments

The following examples pertain to further embodiments, from which numerous permutations and configurations will be apparent. The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An acoustic wave device comprising:
a substrate;
a piezoelectric resonant volume having a main resonant frequency; and
a first distributed Bragg acoustic reflector including at least:
a first metal layer;
a second metal layer; and
a first piezoelectric layer coupled between the first metal layer and the second metal layer.

2. The acoustic wave device as in claim 1 in which the first piezoelectric layer is to facilitate a quality factor of the acoustic wave device.

3. The acoustic wave device as in claim 1 in which:
the piezoelectric resonant volume includes at least an adjacent piezoelectric layer that is adjacent to the first piezoelectric layer of the first distributed Bragg acoustic reflector;
the first piezoelectric layer has a first piezoelectric axis orientation; and
the adjacent piezoelectric layer has a piezoelectric axis orientation that substantially opposes the first piezoelectric axis orientation.

4. The acoustic wave device as in claim 3 in which the piezoelectric axis of the adjacent piezoelectric layer substantially opposing the first piezoelectric axis is to facilitate an electromechanical coupling of the acoustic wave device.

5. The acoustic wave device as in claim 1 in which:
the piezoelectric resonant volume includes at least an adjacent piezoelectric layer that is adjacent to the first piezoelectric layer of the first distributed Bragg acoustic reflector;
the first piezoelectric layer has a first piezoelectric axis oriented in a first direction; and
the adjacent piezoelectric layer has a piezoelectric axis oriented in the first direction.

6. The acoustic wave device as in claim 5 in which the piezoelectric axis of the adjacent piezoelectric layer being oriented in the first direction is to facilitate limiting an electromechanical coupling of the acoustic wave device.

7. The acoustic wave device as in claim 1 in which the first piezoelectric layer of the first distributed Bragg acoustic reflector has a thickness within a range from about five percent to about twenty-five percent of an acoustic wavelength of the main resonant frequency.

8. The acoustic wave device as in claim 1 in which the piezoelectric resonant volume at least partially overlaps the first distributed Bragg acoustic reflector.

9. The acoustic wave device as in claim 1 in which the piezoelectric resonant volume at least partially overlaps the first piezoelectric layer of the first distributed Bragg acoustic reflector.

10. The acoustic wave device as in claim 1 in which the first metal layer and the second metal layer have respective thicknesses within a range from approximately five percent to about forty-five percent of an acoustic wavelength of the main resonant frequency.

11. The acoustic wave device as in claim 1 in which:
- the first distributed Bragg acoustic reflector is a bottom distributed Bragg acoustic reflector;
- the first metal layer is a first bottom metal layer over the first active piezoelectric layer; and
- the piezoelectric resonant volume includes at least an adjacent piezoelectric layer that interfaces with the first bottom metal layer.

12. The acoustic wave device as in claim 1 in which:
- the first distributed Bragg acoustic reflector includes at least a third metal layer having a third acoustic impedance; and
- the second metal layer has a second acoustic impedance that is different than the third acoustic impedance.

13. The acoustic wave device as in claim 1 in which the first distributed Bragg acoustic reflector includes at least:
- a third metal layer having a third electrical conductivity; and
- a first current spreading layer having an electrical conductivity that is greater than the third electrical conductivity of the third metal layer.

14. The acoustic wave device as in claim 13 comprising an integrated inductor electrically coupled with the piezoelectric resonant volume via the first current spreading layer.

15. The acoustic wave device as in claim 1 in which the main resonant frequency is in one of a Ku band, a K band, a Ka band, a V band, and a W band.

16. An electrical oscillator comprising:
- electrical oscillator circuitry; and
- an acoustic resonator coupled with the electrical oscillator circuitry to excite electrical oscillation in the acoustic resonator, in which the acoustic resonator includes at least:
- a piezoelectric resonant volume having a main resonant frequency; and
- a first distributed Bragg acoustic reflector including at least:
- a first metal layer;
- a second metal layer; and
- a first reflector piezoelectric layer coupled between the first metal layer and the second metal layer.

17. The electrical oscillator as in claim 16 in which the main resonant frequency is in one of a Ku band, a K band, a Ka band, a V band, and a W band.

18. A resonator filter comprising a plurality of acoustic resonators, in which a first acoustic resonator of the plurality of acoustic resonators includes at least:
- a piezoelectric resonant volume having a main resonant frequency; and
- a first distributed Bragg acoustic reflector including at least:
- a first metal layer;
- a second metal layer; and
- a first piezoelectric layer coupled between the first metal layer and the second metal layer.

19. The resonator filter as in claim 18 in which;
- the piezoelectric resonant volume includes at least an adjacent piezoelectric layer that is adjacent to the first piezoelectric layer of the first distributed Bragg acoustic reflector;
- the first piezoelectric layer has a first piezoelectric axis orientation; and
- the adjacent piezoelectric layer has a piezoelectric axis orientation that substantially opposes the first piezoelectric axis orientation.

20. The resonator filter as in claim 18 in which the main resonant frequency is in one of a Ku band, a K band, a Ka band, a V band, and a W band.

* * * * *